United States Patent
Li et al.

(10) Patent No.: US 12,133,453 B2
(45) Date of Patent: Oct. 29, 2024

(54) POLYMER, COMPOSITION FOR ORGANIC ELECTROLUMINESCENT ELEMENT, ORGANIC ELECTROLUMINESCENT ELEMENT, ORGANIC EL DISPLAY DEVICE, ORGANIC EL LIGHTING, AND MANUFACTURING METHOD FOR ORGANIC ELECTROLUMINESCENT ELEMENT

(71) Applicant: Mitsubishi Chemical Corporation, Tokyo (JP)

(72) Inventors: Yanjun Li, Tokyo (JP); Tomokazu Umemoto, Tokyo (JP); Hideki Gorohmaru, Tokyo (JP); Koichiro Iida, Tokyo (JP); Kouji Adachi, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 18/499,254

(22) Filed: Nov. 1, 2023

(65) Prior Publication Data
US 2024/0107870 A1 Mar. 28, 2024

Related U.S. Application Data

(63) Continuation of application No. 17/022,243, filed on Sep. 16, 2020, now Pat. No. 11,943,997, which is a
(Continued)

(30) Foreign Application Priority Data

Mar. 16, 2018 (JP) ................................ 2018-048724
Apr. 25, 2018 (JP) ................................ 2018-083826
Feb. 8, 2019 (JP) ................................ 2019-021417

(51) Int. Cl.
*H01L 51/50* (2006.01)
*C08G 73/02* (2006.01)
(Continued)

(52) U.S. Cl.
CPC ......... *H10K 85/115* (2023.02); *C08G 73/026* (2013.01); *C09K 11/06* (2013.01);
(Continued)

(58) Field of Classification Search
None
See application file for complete search history.

(56) References Cited

U.S. PATENT DOCUMENTS

2004/0262574 A1  12/2004  Suzuki et al.
2006/0241278 A1  10/2006  Suzuki et al.
(Continued)

FOREIGN PATENT DOCUMENTS

CN  1914957 A  2/2007
CN  101743265 A  6/2010
(Continued)

OTHER PUBLICATIONS

Fang et al., Ladder-type oligo(p-phenylene)s with D-p-A architectures: design, synthesis, optical gain properties, and stabilized amplified spontaneous emission; 2017; J. Mater. Chem. C, 2017, 5, 5797-5809 (Year: 2017).*
(Continued)

*Primary Examiner* — Gregory D Clark
(74) *Attorney, Agent, or Firm* — Oblon, McClelland, Maier & Neustadt, L.L.P.

(57) ABSTRACT

Provided are: a highly durable polymer having a high hole-injection/transport capacity; and a composition for an organic electroluminescent element, which contains the polymer. The polymer contains a repeating unit represented
(Continued)

by the following Formula (1) or a repeating unit represented by the following Formula (2) (wherein, $Ar^1$ and $Ar^2$ each represent an aromatic hydrocarbon group optionally having a substituent, or an aromatic heterocyclic group optionally having a substituent; X represents —$C(R^7)(R^8)$—, —$N(R^9)$—, or —$C(R^{11})(R^{12})$—$C(R^{13})(R^{14})$—; $R^1$ and $R^2$ as well as $R^3$ and $R^6$ each independently represent an alkyl group optionally having a substituent; $R^4$ and $R^5$ each independently represent an alkyl group optionally having a substituent, an alkoxy group optionally having a substituent, or an aralkyl group optionally having a substituent; and $R^7$ to $R^9$ and $R^{11}$ to $R^{14}$ each independently represent hydrogen, an alkyl group optionally having a substituent, an aralkyl group optionally having a substituent, or an aromatic hydrocarbon group optionally having a substituent).

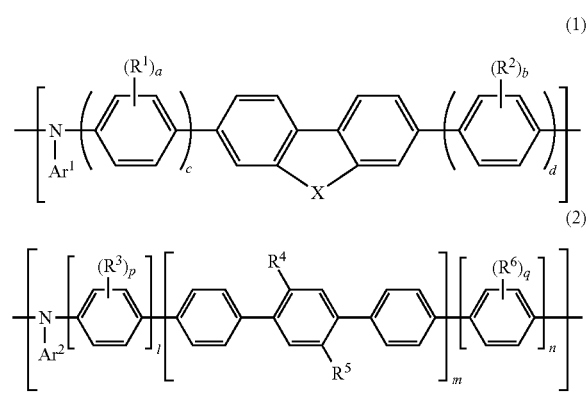

37 Claims, 1 Drawing Sheet

Related U.S. Application Data continuation of application No. PCT/JP2019/011229, filed on Mar. 18, 2019.

(51) Int. Cl.
| | | |
|---|---|---|
| C09K 11/06 | (2006.01) | |
| H10K 85/10 | (2023.01) | |
| H10K 50/11 | (2023.01) | |
| H10K 50/15 | (2023.01) | |
| H10K 50/17 | (2023.01) | |
| H10K 71/00 | (2023.01) | |
| H10K 71/12 | (2023.01) | |
| H10K 85/60 | (2023.01) | |

(52) U.S. Cl.
CPC .......... H10K 85/151 (2023.02); *H10K 50/11* (2023.02); *H10K 50/15* (2023.02); *H10K 50/17* (2023.02); *H10K 71/00* (2023.02); *H10K 71/12* (2023.02); *H10K 85/615* (2023.02)

(56) References Cited

U.S. PATENT DOCUMENTS

| 2008/0071049 A1 | 3/2008 | Radu et al. |
| 2009/0174311 A1 | 7/2009 | Patel et al. |
| 2010/0156284 A1 | 6/2010 | Fukushima et al. |
| 2010/0276637 A1 | 11/2010 | Tanaka et al. |
| 2011/0017983 A1 | 1/2011 | Mizuki et al. |
| 2011/0108814 A1 | 5/2011 | Iida et al. |
| 2011/0309341 A1 | 12/2011 | Ohuchi et al. |
| 2012/0123073 A1 | 5/2012 | Tanaka et al. |
| 2012/0211707 A1 | 8/2012 | Konno et al. |
| 2012/0326095 A1 | 12/2012 | Yoshida et al. |
| 2013/0020562 A1 | 1/2013 | Iida et al. |
| 2013/0082251 A1 | 4/2013 | Park et al. |
| 2013/0137818 A1 | 5/2013 | Schulte et al. |
| 2013/0200337 A1 | 8/2013 | Iida et al. |
| 2014/0302230 A1 | 10/2014 | Tanaka et al. |
| 2015/0188069 A1 | 7/2015 | Patel et al. |
| 2015/0207077 A1 | 7/2015 | Asada et al. |
| 2016/0133842 A1 | 5/2016 | Fujiyama et al. |
| 2017/0040539 A1 | 2/2017 | Park et al. |
| 2017/0253795 A1 | 9/2017 | Yoshioka et al. |
| 2018/0315928 A1 | 11/2018 | Hayashi et al. |

FOREIGN PATENT DOCUMENTS

| CN | 102216366 A | 10/2011 |
| CN | 103068878 A | 4/2013 |
| CN | 105452326 A | 3/2016 |
| CN | 105683255 A | 6/2016 |
| CN | 107534093 A | 1/2018 |
| JP | 2004-292782 A | 10/2004 |
| JP | 2005-285749 A | 10/2005 |
| JP | 2007-520858 A | 7/2007 |
| JP | 2010-034496 A | 2/2010 |
| JP | 2010-155985 A | 7/2010 |
| JP | 2010-192473 A | 9/2010 |
| JP | 2013-045986 A | 3/2013 |
| JP | 2013-531658 A | 8/2013 |
| JP | 2013-197323 A | 9/2013 |
| JP | 5304301 B2 | 10/2013 |
| JP | 2014-503983 A | 2/2014 |
| JP | 2014-220248 A | 11/2014 |
| JP | 2015-127375 A | 7/2015 |
| JP | 2016-084370 A | 5/2016 |
| JP | 2017-002287 A | 1/2017 |
| JP | 2017-45889 A | 3/2017 |
| WO | WO 2008/126393 A1 | 10/2008 |
| WO | WO 2009/063757 A1 | 5/2009 |
| WO | WO 2009/110360 A1 | 9/2009 |
| WO | WO 2009/123269 A1 | 10/2009 |
| WO | WO 2011/024761 A1 | 3/2011 |
| WO | WO 2011/099531 A1 | 8/2011 |
| WO | WO 2013/191088 A1 | 12/2013 |
| WO | WO 2016/031639 A1 | 3/2016 |
| WO | WO 2016/140205 A1 | 9/2016 |
| WO | WO 2017/119203 A1 | 7/2017 |

OTHER PUBLICATIONS

Combined Chinese Notice of Grant and Search Report issued Sep. 22, 2023 in Chinese Patent Application No. 201980019707.8 (with unedited computer-generated English Translation), 12 pages.
Pan et al., "Synthesis and Characterization of P Type Moiety-Containing 9,9'-Diarylfluorene Polymers" Journal of Functional Polymers, vol. 24, No. 1, Mar. 2011, pp. 82-88 ( total 20 pages) (with unedited computer-generated English Translation).
Pan et al., "Synthesis and Characterization of Aryl aryl Forks and their polymers from 9-position cavity-containing wood", Journal of Functional Polymers, vol. 24, No. 1, Mar. 2011, pp. 82-88 ( total 20 pages) (with unedited computer-generated English Translation).
Chinese Office Action dated Apr. 29, 2024 issued in corresponding Chinese Patent Application No. 202310356803.X, 17 pages.
Korean Office Action dated May 14, 2024 issued in corresponding Korean Patent Application No. 10-2020-7029528, citing documents previously filed on a Form PTO-1449 on Nov. 1, 2023, 14 pages.
International Search Report issued Jun. 4, 2019 in PCT/JP2019/011229 filed on Mar. 18, 2019, 2 pages.
International Preliminary Report on Patentability issued Sep. 22, 2020 in PCT/JP2019/011229 (submitting English translation only), 11 pages.

(56) References Cited

OTHER PUBLICATIONS

Japanese Office Action issued on Jun. 7, 2022 in Japanese Patent Application No. 2020-506687 (with unedited computer- generated English translation), 12 pages.
Extended European Search Report issued Nov. 18, 2021 in European Patent Application No. 19768105.9, 11 pages.
Combined Taiwanese Office Action and Search Report issued on May 24, 2023 in Taiwanese Patent Application No. 108109193 (with unedited computer-generated English translation), 61 pages.
Combined Chinese Office Action and Search Report issued on Sep. 20, 2022 in Chinese Patent Application No. 201980019707.8 (with English translation), 42 pages.
Notice of Reasons for Refusal issued Aug. 1, 2023 in Japanese Patent Application No. 2022-178604 (with English machine translation), 12 pages.

\* cited by examiner

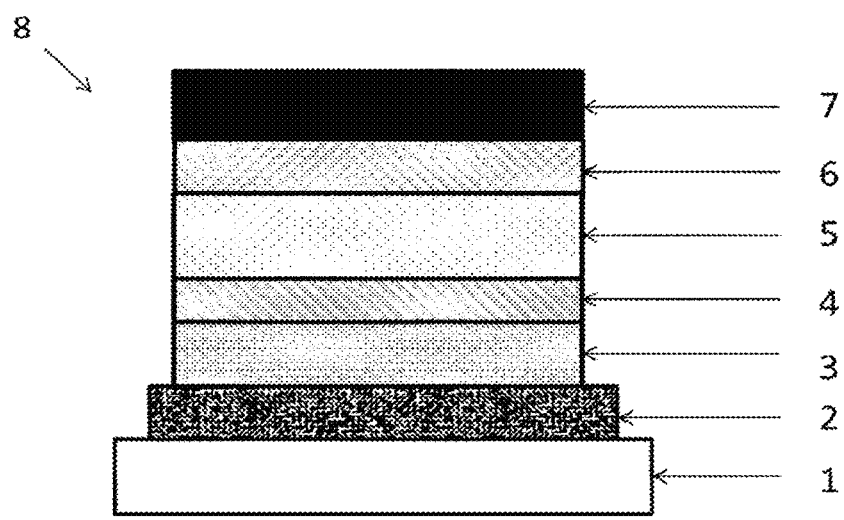

POLYMER, COMPOSITION FOR ORGANIC ELECTROLUMINESCENT ELEMENT, ORGANIC ELECTROLUMINESCENT ELEMENT, ORGANIC EL DISPLAY DEVICE, ORGANIC EL LIGHTING, AND MANUFACTURING METHOD FOR ORGANIC ELECTROLUMINESCENT ELEMENT

CROSS-REFERENCE TO RELATED APPLICATION

This is a continuation of U.S. application Ser. No. 17/022,243 filed Sep. 16, 2020, which is a continuation of International Application PCT/JP2019/011229, filed on Mar. 18, 2019 and designated the U.S., and claims priority from Japanese Patent Application 2018-048724 which was filed on Mar. 16, 2018, Japanese Patent Application 2018-083826 which was filed on Apr. 25, 2018 and Japanese Patent Application 2019-021417 which was filed on Feb. 8, 2019, the entire contents of which are incorporated herein by reference.

TECHNICAL FIELD

The present invention relates to: a polymer, more particularly a polymer useful as a charge transporting material of an organic electroluminescent element; a composition for an organic electroluminescent element, which contains the polymer; an organic electroluminescent element including a layer formed from the composition; an organic EL display device and an organic EL lighting, which include the organic electroluminescent element; and a method of producing an organic electroluminescent element.

BACKGROUND ART

Examples of a method of forming an organic layer in an organic electroluminescent element include a vacuum vapor deposition method and a wet film-forming method. It is easy to perform lamination by a vacuum vapor deposition method; therefore, this method is advantageous in that it improves charge injection from an anode and/or or a cathode and makes it easy to entrap excitons in a light-emitting layer. Meanwhile, in a wet film-forming method, a vacuum process is not required and it is easy to increase the area of the resulting film, and this method is advantageous in that, for example, by using a coating solution obtained by mixing plural materials having various functions, a layer containing the plural materials having various functions can be easily formed.

However, it is difficult to perform lamination by a wet film-forming method; therefore, as compared to those elements produced by a vacuum vapor deposition method, elements produced by a wet film-forming method have poor working stability and have not reached a practical level with a few exceptions.

In order to perform lamination by a wet film-forming method, a charge transporting polymer having a crosslinkable group is desired, and such polymers have been developed. For example, Patent Documents 1 to 3 each disclose an organic electroluminescent element which contains a polymer having a specific repeating unit and is laminated by a wet film-forming method.

Patent Documents 4 and 5 each disclose a hole injection/transport material having a structure in which a fluorene ring or a carbazole ring, and a substituent-free phenylene ring are bound to a polymer main chain.

Patent Document 6 describes that it is preferred to incorporate a fluorene ring into the main chain of a polymer having a triarylamine repeating unit, and it is also described to further incorporate a phenylene group having a substituent into the main chain of the polymer and thereby generate a distortion so as to increase the triplet energy of the polymer.

Patent Document 7 discloses a compound in which a phenylene group having a substituent is linked between nitrogen atoms of amines in the main chain of an arylamine polymer or oligomer.

In Patent Document 8, it is disclosed to form a mixed layer containing an arylamine polymer or oligomer having a polymerizable substituent as a hole transport layer. In addition, Patent Document 8 describes effects that polymerization of the polymer or monomer can improve the thermal stability of the resulting layer, and that the polymerized layer does not dissolve when a light-emitting layer is applied thereon.

Moreover, Patent Documents 9 to 12 each disclose a polymer having an arylamine structure that contains a carbazole structure in a side chain structure. Patent Documents 9 to 11 disclose that a single carbazole is contained in the side chain structure, Patent Documents 9 and 12 disclose that the carbazole in the side chain structure is directly bound to an amine nitrogen atom of the main chain, and Patent Document 12 discloses a structure containing two carbazoles in the side chain structure.

CITATION LIST

Patent Documents

[Patent Document 1] WO 2009/123269
[Patent Document 2] Japanese Unexamined Patent Application Publication No. 2013-045986
[Patent Document 3] WO 2013/191088
[Patent Document 4] Japanese Unexamined Patent Application Publication No. 2016-084370
[Patent Document 5] Japanese Unexamined Patent Application Publication No. 2017-002287
[Patent Document 6] Japanese Unexamined Patent Application Publication (Translation of PCT Application) No. 2007-520858
[Patent Document 7] Japanese Unexamined Patent Application Publication (Translation of PCT Application) No. 2013-531658
[Patent Document 8] Japanese Unexamined Patent Application Publication No. 2010-034496
[Patent Document 9] WO 2011/099531
[Patent Document 10] WO 2016/031639
[Patent Document 11] WO 2009/110360
[Patent Document 12] WO 2008/126393

SUMMARY OF INVENTION

Technical Problem

However, according to the studies conducted by the present inventors, it was found that the above-described technologies disclosed in Patent Documents 1 to 12 each have the following problems.

The elements disclosed in Patent Documents 1 to 3 have problems of having a low brightness and a short working life. Therefore, it is demanded to improve the charge injection/transport capacity and the durability of a charge transporting material.

The polymers disclosed in Patent Documents 4 and 5 have problems in that they have a low excited singlet energy level ($S_1$) and a low excited triplet energy level ($T_1$) due to the spread of n-conjugated system in their main chains, and cause a reduction in the luminous efficiency due to quenching caused by energy transfer from a light-emitting material or a light-emitting exciton. Therefore, a charge transporting material having a high $S_1$ level and a high $T_1$ level is demanded.

Patent Document 6 discloses, in the section of Examples, F8-TFB (fluorene+triphenylamine system) as an arylamine polymer containing a fluorene ring in the main chain; however, F8-TFB does not have distortion due to the absence of a substituent on the phenylene between the nitrogen atoms of fluorene and amine, and thus has a problem of having poor electron durability due to the spread of LUMO to the vicinity of the amine nitrogen atom.

The compound disclosed in Patent Document 7 has a problem of having poor electron durability since it contains neither a fluorene ring nor a carbazole structure in the main chain.

Patent Document 8 discloses an arylamine polymer or oligomer which contains a fluorenyl group or a carbazole group in the main chain; however, it yields an element having insufficient durability.

Furthermore, the polymers disclosed in Patent Documents 9 to 12 do not have a structure in which two carbazole groups have a linking group between their nitrogen atoms and thus, as described below, do not yield an element having sufficient durability.

In view of the above, an object of the present invention is to provide: a highly durable polymer having a high hole injection/transport capacity; and a composition for an organic electroluminescent element, which contains the polymer. Another object of the present invention is to provide an organic electroluminescent element having a high brightness and a long working life.

Solution to Problem

The present inventors intensively studied to discover that the above-described problems can be solved by using a polymer having a specific repeating unit in which a fluorene skeleton, a carbazole skeleton or a dihydrophenanthrene skeleton is linked with a substituted phenylene group and an aromatic amine structure, or by using a polymer having a specific repeating unit in which a structure formed by alkyl group-containing phenylene groups that are bound in a distorted manner is linked with a substituted phenylene group, thereby completing the present invention.

That is, the gist of the present invention encompasses the following [1] to [34].

[1] A polymer, containing a repeating unit represented by the following Formula (1) or a repeating unit represented by the following Formula (2):

(1)

(2)

(in Formula (1), $Ar^1$ represents an aromatic hydrocarbon group optionally having a substituent, or an aromatic heterocyclic group optionally having a substituent;

X represents —C($R^7$)($R^8$)—, —N($R^9$)—, or —C($R^{11}$)($R^{12}$)—C($R^{13}$)($R^{14}$)—;

$R^1$ and $R^2$ each independently represent an alkyl group optionally having a substituent;

$R^7$ to $R^9$ and $R^{11}$ to $R^{14}$ each independently represent hydrogen, an alkyl group optionally having a substituent, an aralkyl group optionally having a substituent, or an aromatic hydrocarbon group optionally having a substituent;

a and b each independently represent an integer of 0 to 4, with (a+b) being 1 or larger;

c represents an integer of 1 to 3;

d represents an integer of 0 to 4; and when there are plural $R^1$s and $R^2$s in the repeating unit, the $R^1$s and the $R^2$s are optionally the same or different)

(in Formula (2), $Ar^2$ represents an aromatic hydrocarbon group optionally having a substituent, or an aromatic heterocyclic group optionally having a substituent;

$R^3$ and $R^6$ each independently represent an alkyl group optionally having a substituent;

$R^4$ and $R^5$ each independently represent an alkyl group optionally having a substituent, an alkoxy group optionally having a substituent, or an aralkyl group optionally having a substituent;

l represents 0 or 1;

m represents 1 or 2;

n represents 0 or 1;

p represents 0 or 1;

q represents 0 or 1; and p and q are not 0 simultaneously).

[2] The polymer according to [1], wherein the polymer contains the repeating unit represented by Formula (1), and at least one $Ar^1$ is a 2-fluorenyl group optionally having a substituent.

[3] The polymer according to [1] or [2], wherein the polymer contains the repeating unit represented by Formula (1), and at least one $Ar^1$ is represented by the following Formula (10):

(10)

(wherein,

Ar$^{11}$ and Ar$^{12}$ each independently represent a divalent aromatic hydrocarbon group optionally having a substituent, or an aromatic heterocyclic group optionally having a substituent;

Ar$^{13}$ to Ar$^{15}$ each independently represent a hydrogen atom or a substituent; and

* represents a binding position).

[4] The polymer according to any one of [1] to [3], further containing a repeating unit represented by the following Formula (4):

(4)

(wherein,

Ar$^3$ represents an aromatic hydrocarbon group optionally having a substituent, or an aromatic heterocyclic group optionally having a substituent; and Ar$^4$ represents a divalent aromatic hydrocarbon group optionally having a substituent, a divalent aromatic heterocyclic group optionally having a substituent, or a divalent group formed by plural aromatic hydrocarbon groups optionally having a substituent and/or plural aromatic heterocyclic groups optionally having a substituent that are linked together directly or via a linking group).

[5] The polymer according to [4], wherein at least one Ar$^3$ is represented by the following Formula (10):

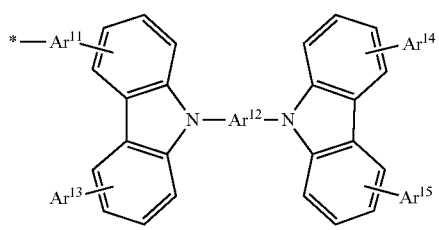

(10)

(wherein,

Ar$^{11}$ and Ar$^{12}$ each independently represent a divalent aromatic hydrocarbon group optionally having a substituent, or an aromatic heterocyclic group optionally having a substituent;

Ar$^{13}$ to Ar$^{15}$ each independently represent a hydrogen atom or a substituent; and

* represents a binding position).

[6] The polymer according to [4] or [5], wherein at least one Ar$^3$ is a 2-fluorenyl group optionally having a substituent.

[7] The polymer according to any one of [1] to [6], further containing a repeating unit represented by the following Formula (5):

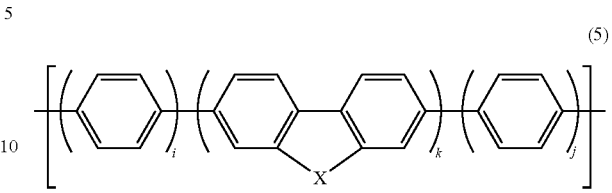

(5)

(wherein, i and j each independently represent an integer of 0 to 3;

(i+j) is 1 or larger;

k represents 0 or 1;

X represents —C(R$^7$)(R$^8$)—, —N(R$^9$)—, or —C(R$^{11}$)(R$^{12}$)—C(R$^{13}$)(R$^{14}$)—; and R$^7$ to R$^9$ and R$^{11}$ to R$^{14}$ each independently represent hydrogen, an alkyl group optionally having a substituent, an aralkyl group optionally having a substituent, or an aromatic hydrocarbon group optionally having a substituent).

[8] The polymer according to [7], wherein Ar$^4$ in Formula (4) is the repeating unit represented by Formula (5) wherein k is 1, and the repeating unit represented by Formula (5) is linked with N in Formula (4).

[9] The polymer according to [7] or [8], containing a repeating unit represented by the following Formula (14):

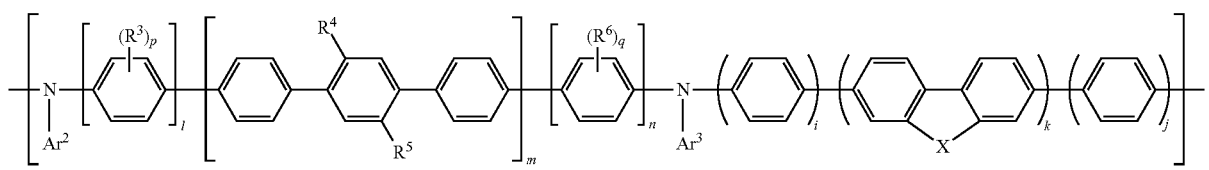

(14)

(wherein, Ar$^2$, R$^3$, R$^4$, R$^5$, R$^6$, p, q, l, m, n, Ar$^3$, X, i, j, and k are each the same as in Formula (2), (4) or (5)).

[10] The polymer according to [9], wherein, in Formula (14),

X is —C(CH$_3$)(CH$_3$)—, i=j=k=1, and

Ar$^2$ and Ar$^3$ are each independently the following Formula (15) or the following Formula (16), with a proviso that Formulae (15) and (16) each optionally have a substituent and * represents a bond with N in Formula (14):

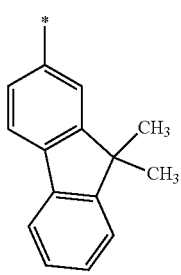

(15)

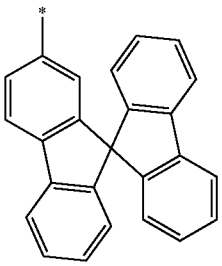
(16)

[11] The polymer according to [10], wherein Formula (15) or (16) has a substituent that is at least one selected from substituents Z and cross-linkable groups.

Substituents Z: an alkyl group, an alkenyl group, an alkynyl group, an alkoxy group, an aryloxy group, a heteroaryloxy group, an alkoxycarbonyl group, a dialkylamino group, a diarylamino group, an arylalkylamino group, an acyl group, a halogen atom, haloalkyl group, an alkylthio group, an arylthio group, a silyl group, a siloxy group, a cyano group, an aromatic hydrocarbon group, and an aromatic heterocyclic groups; these substituents optionally contain a linear, branched, or cyclic structure.

[12] The polymer according to any one of [1] to [11], further containing a repeating unit represented by the following Formula (6):

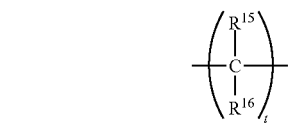
(6)

(wherein, t represents an integer of 1 to 10;

$R^{15}$ and $R^{16}$ each independently represent a hydrogen atom, an alkyl group optionally having a substituent, an aromatic hydrocarbon group optionally having a substituent, or an aromatic heterocyclic group optionally having a substituent; and when there are plural $R^{15}$s and $R^{16}$s, the $R^{15}$s and the $R^{16}$s are optionally the same or different).

[13] The polymer according to any one of [1] to [12], further containing a repeating unit represented by the following Formula (7):

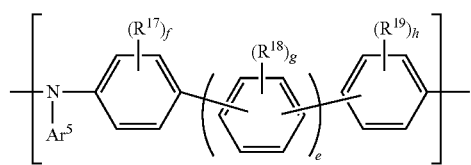
(7)

(wherein, $Ar^5$ represents an aromatic hydrocarbon group optionally having a substituent, or an aromatic heterocyclic group optionally having a substituent;

$R^{17}$ to $R^{19}$ each independently represent an alkyl group optionally having a substituent, an alkoxy group optionally having a substituent, an aralkyl group optionally having a substituent, an aromatic hydrocarbon group optionally having a substituent, or an aromatic heterocyclic group optionally having a substituent;

f, g, and h each independently represent an integer of 0 to 4, with (f+g+h) being 1 or larger; and e represents an integer of 0 to 3).

[14] The polymer according to any one of [1] to [13], wherein a terminal group of the polymer is an aromatic hydrocarbon group optionally having a substituent composed of a hydrocarbon.

[15] The polymer according to any one of [1] to [14], containing a crosslinkable group as a substituent.

[16] The polymer according to [15], wherein the crosslinkable group is a group that contains a cyclobutene ring condensed with an aromatic ring, or an alkenyl group bound to an aromatic ring.

[17] The polymer according to any one of [1] to [16], having a weight-average molecular weight (Mw) of not less than 10,000, and a degree of dispersion (Mw/Mn) of 3.5 or lower.

[18] A composition for an organic electroluminescent element, containing the polymer according to any one of [1] to [17].

[19] A composition for an organic electroluminescent element, containing the polymer according to any one of [1] to [17], and an organic solvent.

[20] A method of producing an organic electroluminescent element that includes, on a substrate: an anode; a cathode; and organic layers between the anode and the cathode, wherein the method includes the step of forming at least one of the organic layers by a wet film-forming method using the composition for an organic electroluminescent element according to [18] or [19].

[21] The method of producing an organic electroluminescent element according to [20], wherein a layer formed by the wet film-forming method is at least one of a hole injection layer and a hole transport layer.

[22] The method of producing an organic electroluminescent element according to [20] or [21], wherein the organic electroluminescent element includes a hole injection layer, a hole transport layer, and a light-emitting layer between the anode and the cathode, and the hole injection layer, the hole transport layer, and the light-emitting layer are all formed by the wet film-forming method.

[23] An organic electroluminescent element, including a layer that contains the polymer according to any one of [1] to [17], or a polymer obtained by crosslinking the polymer when the polymer contains a crosslinkable group.

[24] An organic EL display device, including the organic electroluminescent element according to [23].

[25] An organic EL lighting, including the organic electroluminescent element according to [23].

[26] A polymer, containing a structure represented by the following Formula (11) as a side chain:

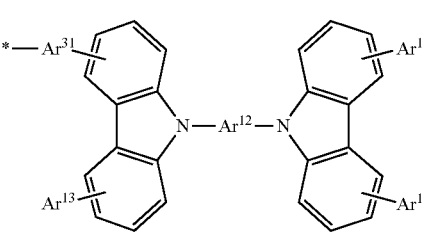
(11)

(wherein,

Ar$^{31}$ represents a divalent group linked with a main chain;

Ar$^{12}$ represents a divalent aromatic hydrocarbon group optionally having a substituent, or a divalent aromatic heterocyclic group optionally having a substituent;

Ar$^{13}$ to Ar$^{15}$ each independently represent a hydrogen atom or a substituent; and

* represents a position of binding with an atom constituting the main chain).

[27] The polymer according to [26], having a structure represented by the following Formula (13):

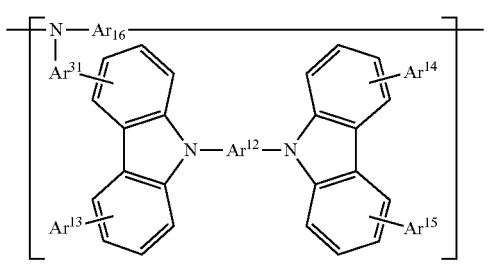

(13)

(wherein,

Ar$^{12}$ to Ar$^{15}$ and Ar$^{31}$ are each the same as in Formula (11); and

Ar$^{16}$ represents a structure constituting the main chain of the polymer).

[28] A composition for an organic electroluminescent element, containing the polymer according to [26] or [27].

[29] A composition for an organic electroluminescent element, containing: the polymer according to [26] or [27]; and an organic solvent.

[30] A method of producing an organic electroluminescent element that includes, on a substrate: an anode; a cathode; and organic layers between the anode and the cathode, wherein the method includes the step of forming at least one of the organic layers by a wet film-forming method using the composition for an organic electroluminescent element according to [28] or [29].

[31] The method of producing an organic electroluminescent element according to [30], wherein a layer formed by the wet film-forming method is at least one of a hole injection layer and a hole transport layer.

[32] An organic electroluminescent element, including a layer that contains the polymer according to [26] or [27].

[33] An organic EL display device, including the organic electroluminescent element according to [32].

[34] An organic EL lighting, including the organic electroluminescent element according to [32].

Advantageous Effects of Invention

According to the present invention, a highly durable polymer having a high hole-injection/transport capacity; and a composition for an organic electroluminescent element, which contains the polymer, can be provided. In addition, an organic electroluminescent element having a high brightness and a long working life can be provided.

The polymer according to a first embodiment of the present invention, which contains a distorted structure in its main chain, has a structure in which a molecular conformational change is inhibited; therefore, even when the polymer is in the state of an exciton, the energy of the exciton is hardly thermally consumed as a result of a change in the molecular conformation. In other words, it is believed that the difference between an excited singlet energy level ($S_1$) and an excited triplet energy level ($T_1$) is characteristically small.

As in the present invention, a carrier transport material whose exciton has a small energy loss exhibits only a limited change in the energy level difference and thus smoothly performs carrier injection into a light-emitting layer, so that an increase in the driving voltage is inhibited, which is preferred in terms of the luminous efficiency of an element.

In addition, when the material has a structure in which nitrogen atoms of two carbazole rings are linked together via a divalent aromatic hydrocarbon group or an aromatic heterocyclic group, it is believed that LUMO is distributed in the aromatic hydrocarbon group or the aromatic heterocyclic group between the nitrogen atoms of the two carbazole rings, whereby the durability against electrons and excitons tends to be improved. Accordingly, the working life of an organic electroluminescent element using the polymer of the present embodiment is believed to be improved.

Further, in a layer formed by a wet film-forming method using a composition for an organic electroluminescent element which contains the polymer according to one embodiment of the present invention, cracking and the like are inhibited, and the layer is flat. Consequently, the organic electroluminescent element of the present invention which includes this layer has a high brightness and a long working life.

The polymer according to one embodiment of the present invention has excellent electrochemical stability; therefore, an element that includes a layer formed from this polymer is considered to be applicable to flat panel displays (e.g., flat panel displays for OA computers and wall-mounted televisions), vehicle on-board display devices, cell phone displays, light sources utilizing the features of a planar light emitter (e.g., light sources of copying machines, and backlight sources of liquid-crystal displays and instruments), sign boards, and marker lamps, and thus has a great technical value.

BRIEF DESCRIPTION OF THE DRAWING

The FIGURE is a schematic cross-sectional view illustrating a structural example of the organic electroluminescent element of the present invention.

DESCRIPTION OF EMBODIMENTS

The polymer according to one embodiment of the present invention and the composition for an organic electroluminescent element that contains the polymer, which is another embodiment, as well as embodiments of an organic electroluminescent element including a layer formed from the composition, an organic EL display device that includes the organic electroluminescent element, an organic EL lighting that includes the organic electroluminescent element, and a method of producing the organic electroluminescent element will now be described in detail; however, the following descriptions are merely examples (representative examples) of the embodiments of the present invention, and the present invention is not restricted thereto within the gist of the present invention.

<Polymer>

The polymer according to the first embodiment of the present invention contains a repeating unit represented by the following Formula (1) or (2).

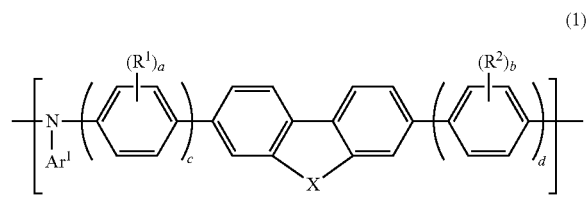

(in Formula (1)), $Ar^1$ represents an aromatic hydrocarbon group optionally having a substituent, or an aromatic heterocyclic group optionally having a substituent;

X represents $-C(R^7)(R^8)-$, $-N(R^9)-$, or $-C(R^{11})(R^{12})-C(R^{13})(R^{14})-$;

$R^1$ and $R^2$ each independently represent an alkyl group optionally having a substituent;

$R^7$ to $R^9$ and $R^{11}$ to $R^{14}$ each independently represent hydrogen, an alkyl group optionally having a substituent, an aralkyl group optionally having a substituent, or an aromatic hydrocarbon group optionally having a substituent;

a and b each independently represent an integer of 0 to 4, with (a+b) being 1 or larger;

c represents an integer of 1 to 3;

d represents an integer of 0 to 4; and when there are plural $R^1$s and $R^2$s in the repeating unit, the $R^1$s and the $R^2$s are optionally the same or different).

The reason why the polymer of the present invention that contains the repeating unit represented by Formula (1) exerts the above-described effects is not clear; however, it is presumed as follows.

In the polymer of the present invention that contains the repeating unit represented by Formula (1), a fluorene ring, a carbazole ring or a dihydrophenanthrene skeleton contained in the main chain has a phenylene group that is bound to at least either one of the 2-position and the 7-position. A phenylene bound to at least either one of the 2-position and the 7-position of the fluorene ring, the carbazole ring or the dihydrophenanthrene structure makes the fluorene ring, the carbazole ring or the dihydrophenanthrene structure more electrically stable. Particularly, it is believed that the electron durability is improved and the working life of the element is thus extended. In this case, when the phenylene ring has a substituent, due to steric hinderance caused by the substituent, the phenylene ring has a greater distortion with the adjacent fluorene ring, carbazole ring or dihydrophenanthrene skeleton as compared to a case where the phenylene ring is unsubstituted. The polymer of the present invention has a main chain structure in which expansion of π-conjugated system is inhibited by the steric hindrance caused by the substituent; therefore, the polymer of the present invention has a high excited singlet energy level ($S_1$) and a high excited triplet energy level ($T_1$), and exhibits an excellent luminous efficiency since quenching caused by energy transfer from a light-emitting exciton is inhibited. Particularly, because of the high excited triplet energy level ($T_1$), an excellent effect is obtained when a light-emitting layer contains a phosphorescent material that emits light from an excited triplet energy level ($T_1$).

Moreover, the fluorene ring, the carbazole ring or the dihydrophenanthrene skeleton, which is a polycyclic structure, has a high electron acceptability and LUMO is likely to be distributed therein; however, because of the distorted structure, LUMO is not distributed to the vicinity of the nitrogen atom that is weak against electrons and excitons, so that excellent durability is attained.

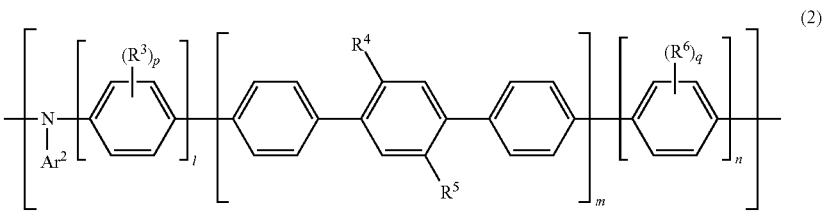

(in Formula (2), $Ar^2$ represents an aromatic hydrocarbon group optionally having a substituent, or an aromatic heterocyclic group optionally having a substituent;

$R^3$ and $R^6$ each independently represent an alkyl group optionally having a substituent;

$R^4$ and $R^5$ each independently represent an alkyl group, an alkoxy group or an aralkyl group, which optionally has a substituent;

l represents 0 or 1;

m represents 1 or 2;

n represents 0 or 1;

p represents 0 or 1;

q represents 0 or 1; and p and q are not 0 simultaneously).

It is noted here that the above-described Formula (2) and the following Formula (2') are substantially the same and, since $R^3$ and $R^6$ are defined by the same structure, the above-described Formula (2) and the following Formula (2") are also substantially the same.

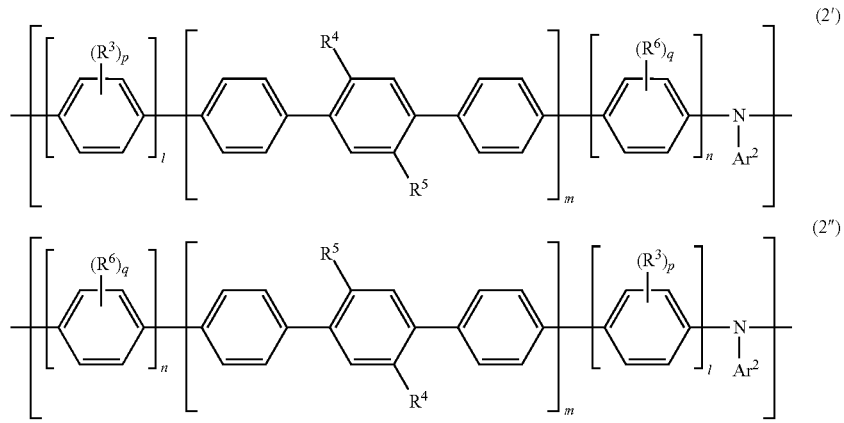

The polymer containing the repeating unit represented by Formula (2) has an alkyl group, an alkoxy group, or an aralkyl group on the phenylene groups of the main chain; therefore, the polymer has a more distorted structure as compared to a case where the phenylenes of the main chain are linked in an unsubstituted state.

Such a structure in which the phenylenes linked in the main chain are more distorted has a high excited singlet energy level ($S_1$) and, when the polymer of the present invention that contains the repeating unit represented by Formula (2) is used as a charge transport layer adjacent to a light-emitting layer, quenching caused by energy transfer thereto from an exciton of the adjacent light-emitting material is inhibited, so that excellent luminous efficiency is attained.

Further, in the structure in which the phenylenes linked in the main chain are more distorted, a change in the molecular conformation is unlikely to occur, and the energy difference between an excited triplet level ($T_1$) and an excited singlet level ($S_1$), which involves a conformational change, is thus small; therefore, usually, the excited triplet level ($T_1$) which is lower than the excited singlet level ($S_1$) is close to the excited singlet level ($S_1$) and energetically high. Accordingly, particularly when the light-emitting layer emits light from this excited triplet energy level ($T_1$), quenching caused by energy transfer from an exciton of the light-emitting material is further inhibited, so that excellent luminous efficiency is attained.

Moreover, even when the excited exciton has an energy level lower than the excited singlet level ($S_1$), a change in the molecular conformation causes hardly any thermal consumption of the energy of the exciton.

The "repeating unit represented by Formula (1)" and the "repeating unit represented by Formula (2)" will now be described in detail.

[Repeating Unit Represented by Formula (1)]
($R^1$ and $R^2$)

In the repeating unit represented by Formula (1), $R^1$ and $R^2$ each independently represent a linear, branched or cyclic alkyl group optionally having a substituent. The number of carbon atoms of the alkyl group is not particularly restricted; however, in order to maintain the solubility of the polymer, it is preferably 1 to 8, more preferably 6 or less, still more preferably 3 or less, and the alkyl group is yet still more preferably a methyl group or an ethyl group.

When there are plural $R^1$s and $R^2$s in the repeating unit, the $R^1$s and the $R^2$s are optionally the same or different; however, all of the $R^1$s and $R^2$s are preferably the same groups since this allows a charge to be distributed uniformly around the nitrogen atom and makes the synthesis easy.

($R^7$ to $R^9$ and $R^{11}$ to $R^{14}$)

$R^7$ to $R^9$ and $R^{11}$ to $R^{14}$ each independently represent an alkyl group optionally having a substituent, an aralkyl group optionally having a substituent, or an aromatic hydrocarbon group optionally having a substituent.

The alkyl group is not particularly restricted; however, the number of carbon atoms thereof is preferably 1 to 24, more preferably 8 or less, still more preferably 6 or less, since the solubility of the polymer tends to be thereby improved. The alkyl group may have a linear, branched, or cyclic structure.

Specific examples of the alkyl group include a methyl group, an ethyl group, an n-propyl group, an i-propyl group, an n-butyl group, an i-butyl group, a sec-butyl group, a tert-butyl group, an n-hexyl group, an n-octyl group, a cyclohexyl group, and a dodecyl group.

The aralkyl group is not particularly restricted; however, the number of carbon atoms thereof is preferably 5 to 60, more preferably 40 or less, since the solubility of the polymer tends to be thereby improved.

Specific examples of the aralkyl group include a 1,1-dimethyl-1-phenylmethyl group, a 1,1-di(n-butyl)-1-phenylmethyl group, a 1,1-di(n-hexyl)-1-phenylmethyl group, a 1,1-di(n-octyl)-1-phenylmethyl group, a phenylmethyl group, a phenylethyl group, a 3-phenyl-1-propyl group, a 4-phenyl-1-n-butyl group, a 1-methyl-1-phenylethyl group, a 5-phenyl-1-n-propyl group, a 6-phenyl-1-n-hexyl group, a 6-naphthyl-1-n-hexyl group, a 7-phenyl-1-n-heptyl group, a 8-phenyl-1-n-octyl group, and a 4-phenylcyclohexyl group.

The aromatic hydrocarbon group is not particularly restricted; however, the number of carbon atoms thereof is preferably 6 to 60, more preferably 30 or less, since the solubility of the polymer tends to be thereby improved.

Specific examples of the aromatic hydrocarbon group include 6-membered monocyclic or 2- to 5-fused-ring monovalent groups, and groups constituted by a plurality of such monovalent groups that are linked together, such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, and a fluorene ring.

From the standpoint of improving the charge transportability and the durability, $R^7$ and $R^8$ are each preferably a methyl group or an aromatic hydrocarbon group, $R^7$ and $R^8$ are more preferably methyl groups and $R^9$ is more preferably a phenyl group.

From the standpoint of attaining excellent charge transportability while improving the solubility, $R^3$ and $R^4$ are each preferably an alkyl group having 3 to 6 carbon atoms, or an aralkyl group having 9 to 40 carbon atoms.

The alkyl group of $R^1$ and $R^2$ as well as the alkyl group, aralkyl group and aromatic hydrocarbon group of $R^7$ to $R^9$ and $R^{11}$ to $R^{14}$ optionally have a substituent. Examples of the optional substituent include those groups that are exemplified above as preferred for the alkyl group, aralkyl group and aromatic hydrocarbon group of $R^7$ to $R^9$ and $R^{11}$ to $R^{14}$, and the below-described crosslinkable group.

From the standpoint of voltage reduction, it is most preferred that the alkyl group of $R^1$ and $R^2$ as well as the alkyl group, aralkyl group and aromatic hydrocarbon group of $R^7$ to $R^9$ and $R^{11}$ to $R^{14}$ have no substituent.

Further, from the standpoint of insolubilization, the alkyl group, aralkyl group and aromatic hydrocarbon group of $R^7$ to $R^9$ and $R^{11}$ to $R^{14}$ preferably contain at least one of the below-described crosslinkable group as a substituent.

(a, b, c and d)

In the repeating unit represented by Formula (1), a and b are each independently an integer of 0 to 4, and (a+b) is 1 or larger. It is preferred that a and b be each 2 or smaller, and it is more preferred that a and b be both 1.

In the repeating unit represented by Formula (1), c is an integer of 1 to 3, and d is an integer of 0 to 4. It is preferred that c and d be each 2 or smaller, it is more preferred that c and d be the same, and it is still more preferred that c and d be both 1 or 2.

In the repeating unit represented by Formula (1), when c and d are both 1 or 2 and a and b are both 2 or 1, it is most preferred that $R^1$ and $R^2$ be bound at positions symmetrical to each other.

The phrase "$R^1$ and $R^2$ are bound at positions symmetrical to each other" means that the binding positions of $R^1$ and $R^2$ are symmetrical about a fluorene ring or a carbazole ring in Formula (1). In this case, structures that are rotated by 180° about a main chain are regarded as the same structure. For example, in Formula (1a), Ria and $R^2$a are symmetrical and $R^{1b}$ and $R^{2b}$ are symmetrical; therefore, Formula (1a) and Formula (1b) are regarded as the same structure.

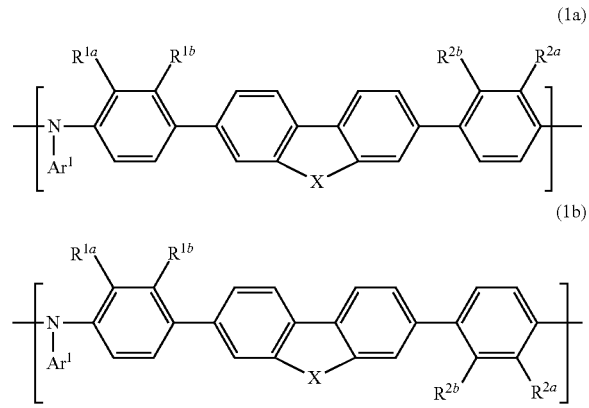

($Ar^1$)

In the repeating unit represented by Formula (1), $Ar^1$ represents an aromatic hydrocarbon group optionally having a substituent, or an aromatic heterocyclic group optionally having a substituent, and at least one $Ar^1$ is preferably a group represented by the below-described Formula (10).

The aromatic hydrocarbon group preferably has 6 to 60 carbon atoms, and specific examples of the aromatic hydrocarbon group include 6-membered monocyclic or 2- to 5-fused-ring monovalent groups, and groups constituted by a plurality of such monovalent groups that are linked together, such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, and a fluorene ring. For example, a "benzene-ring monovalent group" means a "benzene ring having a free valence of one", namely a phenyl group.

The aromatic heterocyclic group preferably has 3 to 60 carbon atoms, and specific examples of the aromatic heterocyclic group include 5- or 6-membered monocyclic or 2- to 4-fused-ring monovalent groups, and groups constituted by a plurality of such monovalent groups that are linked together, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, and a quinazolinone ring.

From the standpoint of attaining excellent charge transportability and excellent durability, $Ar^1$ is preferably an aromatic hydrocarbon group optionally having a substituent, more preferably a benzene-ring or fluorene-ring monovalent group optionally having a substituent, namely a phenyl or fluorenyl group optionally having a substituent, still more preferably a fluorenyl group optionally having a substituent, particularly preferably a 2-fluorenyl group optionally having a substituent.

The optional substituent of the aromatic hydrocarbon group or aromatic heterocyclic group of $Ar^1$ is not particularly restricted as long as it does not markedly deteriorate the properties of the polymer. The optional substituent is preferably, for example, a group selected from the below-described substituents Z and the below-described crosslinkable group, more preferably an alkyl group, an alkoxy group, an aromatic hydrocarbon group, an aromatic heterocyclic group or any of the below-described crosslinkable group, still more preferably an alkyl group.

From the standpoint of the solubility in coating solvents, $Ar^1$ is preferably a fluorenyl group substituted with an alkyl group having 1 to 24 carbon atoms, particularly preferably a 2-fluoroenyl group substituted with an alkyl group having 4 to 12 carbon atoms. $Ar^1$ is also preferably a 9-alkyl-2-fluorenyl group which is a 2-fluorenyl group substituted with an alkyl group at the 9-position, particularly preferably a 9,9-dialkyl-2-fluorenyl group substituted with two alkyl groups. When $Ar^1$ is a fluorenyl group in which at least one of the 9-position and the 9'-position is substituted with an alkyl group, the solubility in solvents and the durability of the fluorene ring tend to be improved. Moreover, when $Ar^1$ is a fluorenyl group in which both of the 9-position and the 9'-position are substituted with an alkyl group, the solubility in solvents and the durability of the fluorene ring tend to be further improved.

From the standpoint of the solubility in coating solvents, $Ar^1$ is also preferably a spirobifluorenyl group.

[Substituents Z]

The substituents Z are a group consisting of alkyl groups, alkenyl groups, alkynyl groups, alkoxy groups, aryloxy groups, heteroaryloxy groups, alkoxycarbonyl groups, dialkylamino groups, diarylamino groups, arylalkylamino groups, acyl groups, halogen atoms, haloalkyl groups, alkylthio groups, arylthio groups, silyl groups, siloxy groups, a cyano group, aromatic hydrocarbon groups, and aromatic heterocyclic groups. These substituents may contain a linear, branched, or cyclic structure.

More specific examples of the substituents Z include the following structures:

linear, branched, or cyclic alkyl groups having usually 1 or more, preferably 4 or more, but usually 24 or less, preferably 12 or less, more preferably 8 or less, still more preferably 6 or less carbon atoms, such as a methyl group, an ethyl group, an n-propyl group, an i-propyl group, an n-butyl group, an i-butyl group, a sec-butyl group, a tert-butyl group, an n-hexyl group, a cyclohexyl group, and a dodecyl group;

linear, branched, or cyclic alkenyl groups having usually 2 or more, but usually 24 or less, preferably 12 or less carbon atoms, such as a vinyl group;

linear or branched alkynyl groups having usually 2 or more, but usually 24 or less, preferably 12 or less carbon atoms, such as an ethynyl group;

alkoxy groups having usually 1 or more, but usually 24 or less, preferably 12 or less carbon atoms, such as a methoxy group and an ethoxy group;

aryloxy groups and heteroaryloxy groups having usually 4 or more, preferably 5 or more, but usually 36 or less, preferably 24 or less carbon atoms, such as a phenoxy group, a naphthoxy group, and a pyridyloxy group;

alkoxycarbonyl groups having usually 2 or more, but usually 24 or less, preferably 12 or less carbon atoms, such as a methoxycarbonyl group and an ethoxycarbonyl group;

dialkylamino groups having usually 2 or more, but usually 24 or less, preferably 12 or less carbon atoms, such as a dimethylamino group and a diethylamino group;

diarylamino groups having usually 10 or more, preferably 12 or more, but usually 36 or less, preferably 24 or less carbon atoms, such as a diphenylamino group, a ditolylamino group, and an N-carbazolyl group;

arylalkylamino groups having usually 7 or more, but usually 36 or less, preferably 24 or less carbon atoms, such as a phenylmethylamino group;

acyl groups having usually 2 or more, but usually 24 or less, preferably 12 or less carbon atoms, such as an acetyl group and a benzoyl group;

halogen atoms, such as a fluorine atom and a chlorine atom;

haloalkyl groups having usually 1 or more, but usually 12 or less, preferably 6 or less carbon atoms, such as a trifluoromethyl group;

alkylthio groups having usually 1 or more, but usually 24 or less, preferably 12 or less carbon atoms, such as a methylthio group and an ethylthio group;

arylthio groups having usually 4 or more, preferably 5 or more, but usually 36 or less, preferably 24 or less carbon atoms, such as a phenylthio group, a naphthylthio group, and a pyridylthio group;

silyl groups having usually 2 or more, preferably 3 or more, but usually 36 or less, preferably 24 or less carbon atoms, such as a trimethylsilyl group and a triphenylsilyl group;

siloxy groups having usually 2 or more, preferably 3 or more, but usually 36 or less, preferably 24 or less carbon atoms, such as a trimethylsiloxy group and a triphenylsiloxy group;

a cyano group;

aromatic hydrocarbon groups having usually 6 or more, but usually 36 or less, preferably 24 or less carbon atoms, such as a phenyl group and a naphthyl group; and aromatic heterocyclic groups having usually 3 or more, preferably 4 or more, but usually 36 or less, preferably 24 or less carbon atoms, such as a thienyl group and a pyridyl group.

The above-described substituents may contain a linear, branched, or cyclic structure.

Among the substituents Z, alkyl groups, alkoxy groups, aromatic hydrocarbon groups, and aromatic heterocyclic groups are preferred. From the standpoint of the charge transportability, it is more preferred that Z have no substituent.

The substituents Z may each further have a substituent. Examples of this substituent include the same ones as those exemplified above (substituents Z) and the below-described crosslinkable group. It is preferred that the substituents Z have no further substituent, or have an alkyl group having 8 or less carbon atoms, an alkoxy group having 8 or less carbon atoms, a phenyl group or any of the below-described crosslinkable group, and it is more preferred that the substituents Z each have an alkyl group having 6 or less carbon atoms, an alkoxy group having 6 or less carbon atoms, a phenyl group, or any of the below-described crosslinkable group. From the standpoint of the charge transportability, it is still more preferred that the substituents Z have no further substituent.

From the standpoint of insolubilization, the polymer of the present invention preferably contains the repeating unit represented by Formula (1) that contains at least one of the below-described crosslinkable group as a further substituent, and this crosslinkable group is preferably further substituted with a substituent that is optionally contained in the aromatic hydrocarbon group or aromatic heterocyclic group represented by $Ar^1$.

(Other Preferred $Ar^1$)

In the repeating unit represented by Formula (1), at least one $Ar^1$ is also preferably a group represented by the following Formula (10). It is believed that LUMO is distributed in an aromatic hydrocarbon group or an aromatic heterocyclic group between the nitrogen atoms of two carbazole structures in Formula (10), whereby the durability against electrons and excitons tends to be improved.

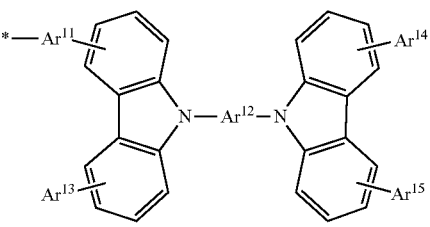

(10)

(wherein, $Ar^{11}$ and $Ar^{12}$ each independently represent a divalent aromatic hydrocarbon group optionally having a substituent, or a divalent aromatic heterocyclic group optionally having a substituent; and $Ar^{13}$ to $Ar^{15}$ each independently represent a hydrogen atom or a substituent)

($Ar^{13}$ to $Ar^{15}$)

$Ar^{13}$ to $Ar^{15}$ each independently represent a hydrogen atom or a substituent. When $Ar^{13}$ to $Ar^{15}$ are substituents, the substituents are not particularly restricted; however, they are each preferably an aromatic hydrocarbon group optionally having a substituent, or an aromatic heterocyclic group optionally having a substituent. Preferred structures of these substituents are the same as those of the groups exemplified above for $Ar^1$.

When $Ar^{13}$ to $Ar^{15}$ are substituents, from the standpoint of improving the durability, the substituents are preferably bound at the 3- or 5-position of each carbazole.

From the standpoints of the ease of synthesis and the charge transportability, $Ar^{13}$ to $Ar^{15}$ are preferably hydrogen atoms.

From the standpoint of improving the durability and the charge transportability, $Ar^{13}$ to $Ar^{15}$ are each preferably an aromatic hydrocarbon group optionally having a substituent, or an aromatic heterocyclic group optionally having a substituent, more preferably an aromatic hydrocarbon group optionally having a substituent.

When $Ar^{13}$ to $Ar^{15}$ are each an aromatic hydrocarbon group optionally having a substituent, or an aromatic heterocyclic group optionally having a substituent, examples of the substituent are the same as those exemplified above as the substituents Z and the below-described crosslinkable group, and preferred substituents and substituents that may be further contained therein are also the same.

Further, from the standpoint of insolubilization, the polymer of the present invention preferably contains a group represented by Formula (10) that contains at least one of the below-described crosslinkable group as a substituent.

($Ar^{12}$)

$Ar^{12}$ is a divalent aromatic hydrocarbon group optionally having a substituent, or a divalent aromatic heterocyclic group optionally having a substituent.

The aromatic hydrocarbon group has preferably 6 to 60 carbon atoms, more preferably 10 to 50 carbon atoms, particularly preferably 12 to 40 carbon atoms. Specific examples of the aromatic hydrocarbon group include 6-membered monocyclic or 2- to 5-fused-ring divalent groups, and groups constituted by a plurality of such divalent groups that are linked together, such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, and a fluorene ring. When a plurality of these groups are linked together, $Ar^{12}$ is preferably a group in which the linked plural divalent aromatic hydrocarbon groups are conjugated with each other.

The aromatic heterocyclic group preferably has 3 to 60 carbon atoms, and specific examples of the aromatic heterocyclic group include 5- or 6-membered monocyclic or 2 to 4-fused-ring divalent groups, and groups constituted by a plurality of such divalent groups that are linked together, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, and a quinazolinone ring.

Examples of the optional substituent of these aromatic hydrocarbon groups or aromatic heterocyclic groups include the same alkyl groups, aralkyl groups and aromatic hydrocarbon groups that are exemplified above for $Ar^1$, and preferred ranges thereof are also the same. $Ar^{12}$ preferably has no substituent when the structure of $Ar^{12}$ is distorted by a steric effect of a substituent, while $Ar^{12}$ preferably has a substituent when the structure of $Ar^{12}$ is not distorted by a steric effect of the substituent.

The specific structure is preferably a divalent group of a benzene ring, a naphthalene ring, an anthracene ring or a fluorene ring, or a group constituted by a plurality of these rings that are linked together; more preferably a divalent group of a benzene ring, or a group constituted by a plurality of benzene rings that are linked together; particularly preferably a 1,4-phenylene group in which benzene rings are linked at two positions of 1 and 4, a 2,7-fluorenylene group in which fluorene rings are linked at two positions of 2 and 7, or a group constituted by a plurality of these groups that are linked together; most preferably a group that contains -1,4-phenylene group-2,7-fluorenylene group-1,4-phenylene group-. In these preferred structures, it is preferred that the phenylene groups have no substituent except at their linking positions since this prevents $Ar^{12}$ from being distorted by a steric effect of a substituent. Further, from the standpoint of improving the solubility and the durability of the fluorene structures, the fluorenylene group more preferably has substituents at the 9- and 9'-positions.

When $Ar^{12}$ has the above-described structure, the aromatic hydrocarbon group between the nitrogen atoms of two carbazole structure has a conjugated structure, so that LUMO is likely to be distributed on the conjugated aromatic hydrocarbon group. This consequently makes LUMO unlikely to expand to the vicinity of the nitrogen atom of the main chain that is weak against electrons and excitons; therefore, the durability is believed to be improved.

In addition, when $Ar^{12}$ contains an aromatic heterocyclic group, since the electron-withdrawing nature increases and LUMO is likely to be distributed thereon, LUMO is unlikely to expand to the vicinity of the nitrogen atom of the main chain that is weak against electrons and excitons, so that the durability is believed to be improved.

($Ar^{11}$)

$Ar^{11}$ is a divalent group that is linked with the amine nitrogen atom of the main chain of Formula (1). $Ar^{11}$ is not particularly restricted; however, it is preferably a divalent aromatic hydrocarbon group optionally having a substituent, or a divalent aromatic heterocyclic group optionally having a substituent.

The aromatic hydrocarbon group of $Ar^{11}$ has preferably 6 to 60 carbon atoms, more preferably 10 to 50 carbon atoms, particularly preferably 12 to 40 carbon atoms. Specific examples of the aromatic hydrocarbon group include 6-membered monocyclic or 2- to 5-fused-ring divalent groups, and groups constituted by a plurality of such divalent groups that are linked together, such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, and a fluorene ring.

The aromatic heterocyclic group of $Ar^{11}$ preferably has 3 to 60 carbon atoms. Specific examples of the aromatic heterocyclic group include 5- or 6-membered monocyclic or 2 to 4-fused-ring divalent groups, and groups constituted by a plurality of such divalent groups that are linked together, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, and a quinazolinone ring.

Examples of the optional substituent of these aromatic hydrocarbon groups or aromatic heterocyclic groups include the same alkyl groups, aralkyl groups and aromatic hydrocarbon groups that are exemplified above for $Ar^1$, and preferred ranges thereof are the same as $Ar^{12}$.

to expand to the main chain, and LUMO is thus unlikely to be distributed in the vicinity of the nitrogen atom of the main chain that is weak against electrons and excitons, so that the durability is believed to be improved.

In the polymer of the present embodiment that contains the repeating unit represented by Formula (1), when there are plural $Ar^1$s, $R^1$s, $R^2$s and Xs, the $Ar^1$s, $R^1$s, $R^2$s and Xs may each be the same or different. Preferably, the polymer contains plural repeating units represented by Formula (1) that have the same structure. In this case, since the plural repeating units of the same structure have the same HOMO and LUMO, it is believed that an electric charge is not concentrated at a specific low level to cause a trap, so that excellent charge transportability is attained and the durability is improved.

(X)

From the standpoint of attaining high stability during charge transport, X in Formula (1) is preferably —C($R^7$)($R^8$)— or —N($R^9$)—, more preferably —C($R^7$)($R^8$)—.

The repeating unit represented by Formula (1) is particularly preferably a repeating unit represented by any of the following Formulae.

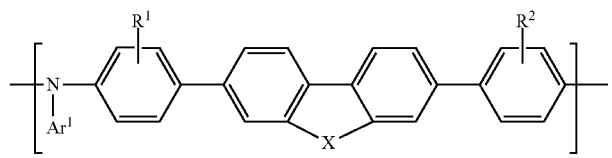

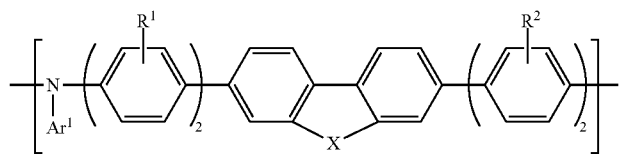

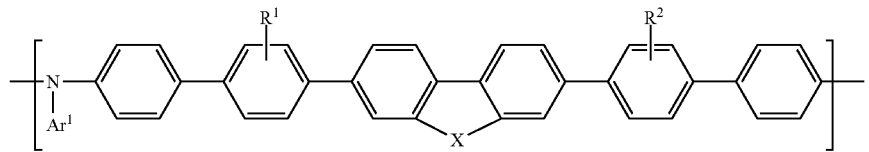

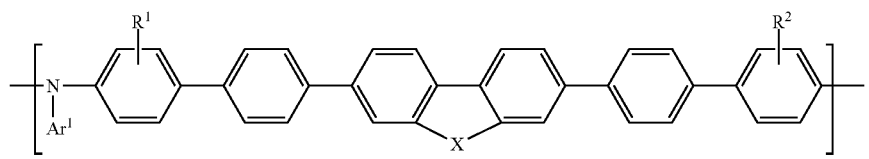

When a plurality of these divalent aromatic hydrocarbon groups or divalent aromatic heterocyclic groups are linked together, $Ar^{11}$ is preferably a group in which the linked plural divalent aromatic hydrocarbon groups are bound such that they are not conjugated with each other. Specifically, $Ar^{11}$ preferably contains a 1,3-phenylene group, or a group that contains a substituent and has a distorted structure due to a steric effect of the substituent. By incorporating such a linking group, LUMO distributed on $Ar^{12}$ is made unlikely In the above Formulae, $R^1$ and $R^2$ are the same, and $R^1$ and $R^2$ are bound at positions symmetrical to each other.

[Specific Examples of Main Chain of Repeating Unit Represented by Formula (1)]

The nitrogen atom-excluding main chain structure of Formula (1) is not particularly restricted, and examples thereof include the following structures.

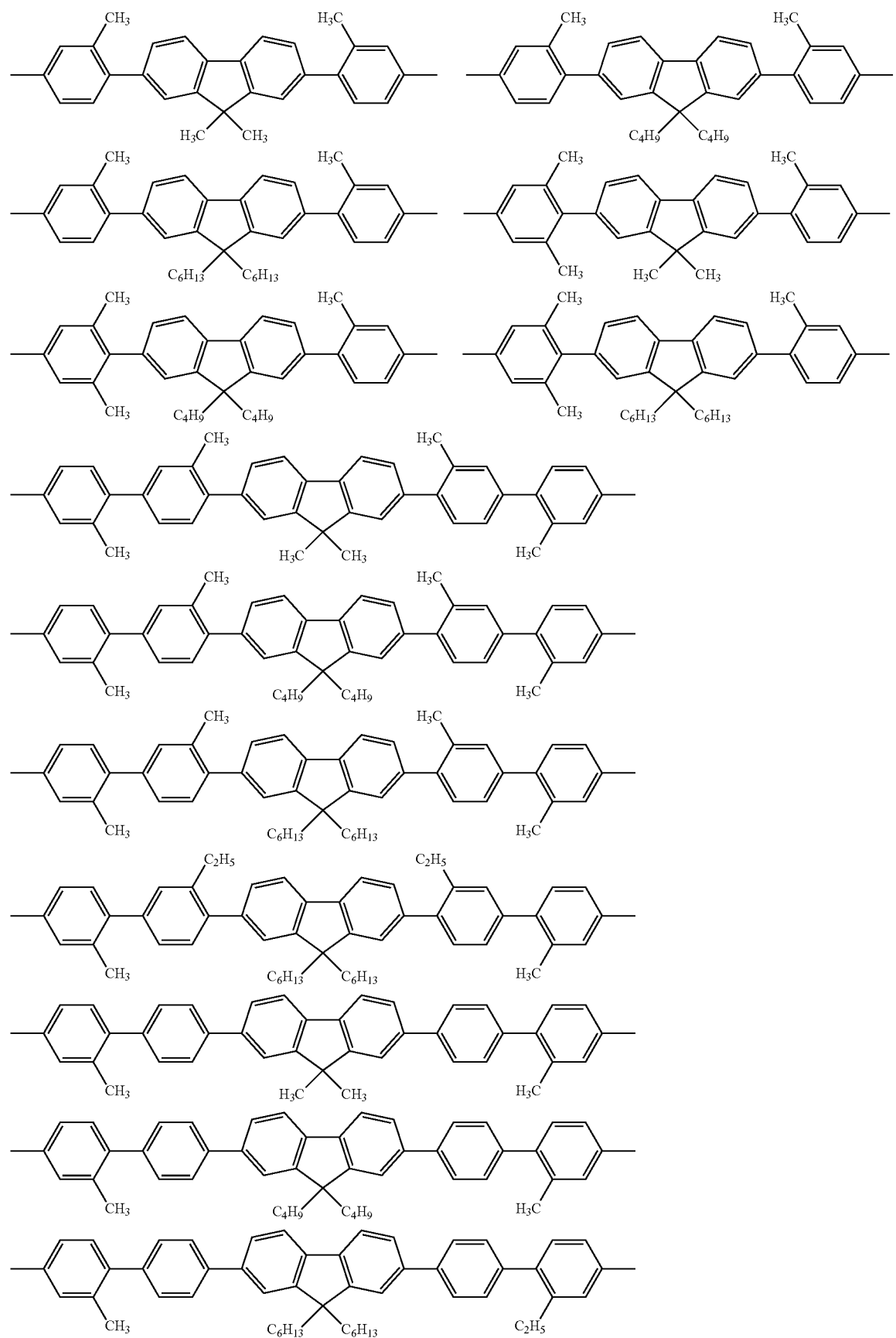

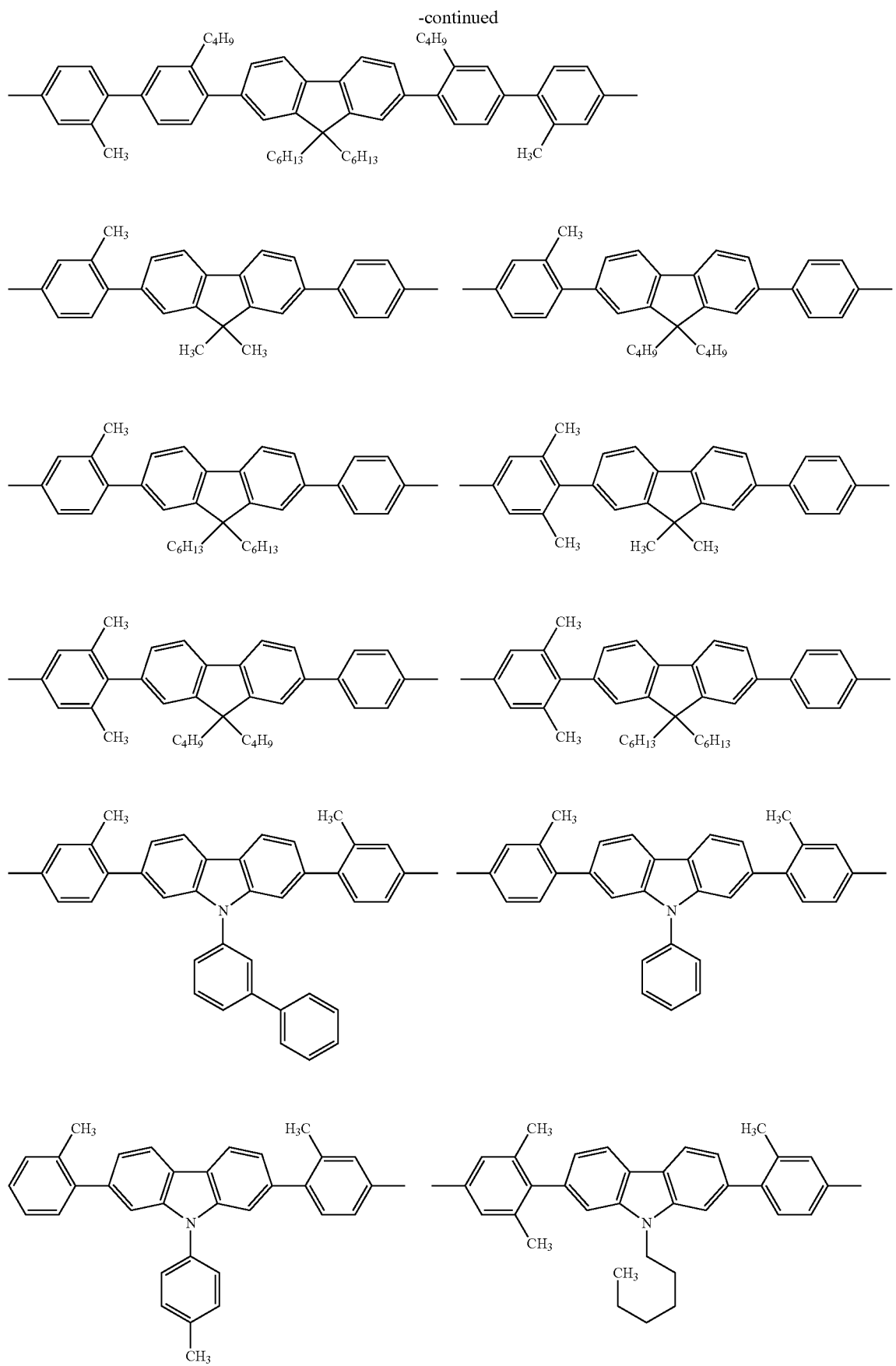

27
28
-continued
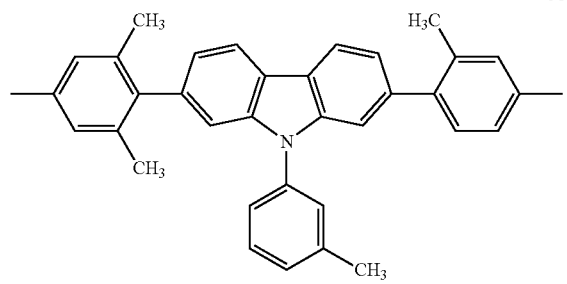
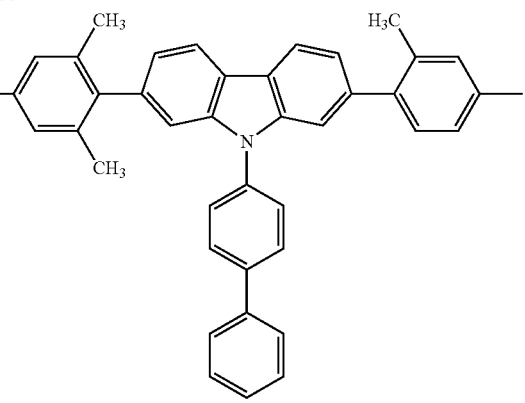
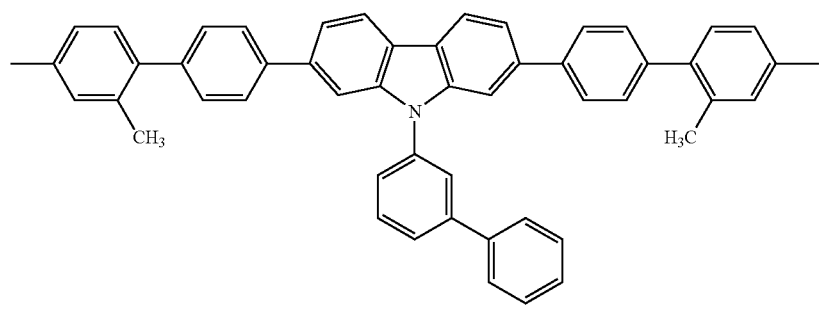
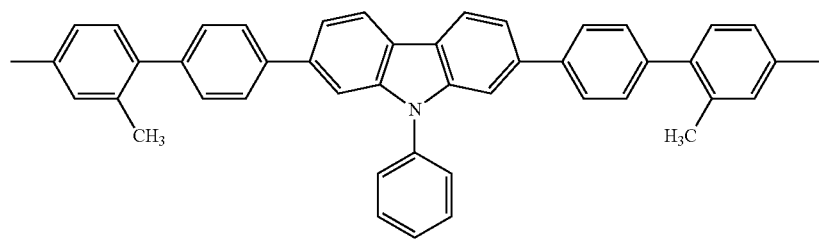
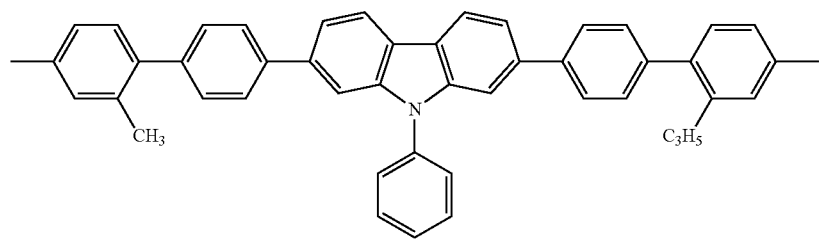
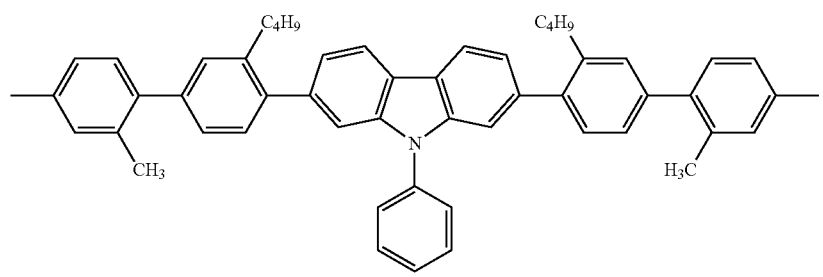

-continued

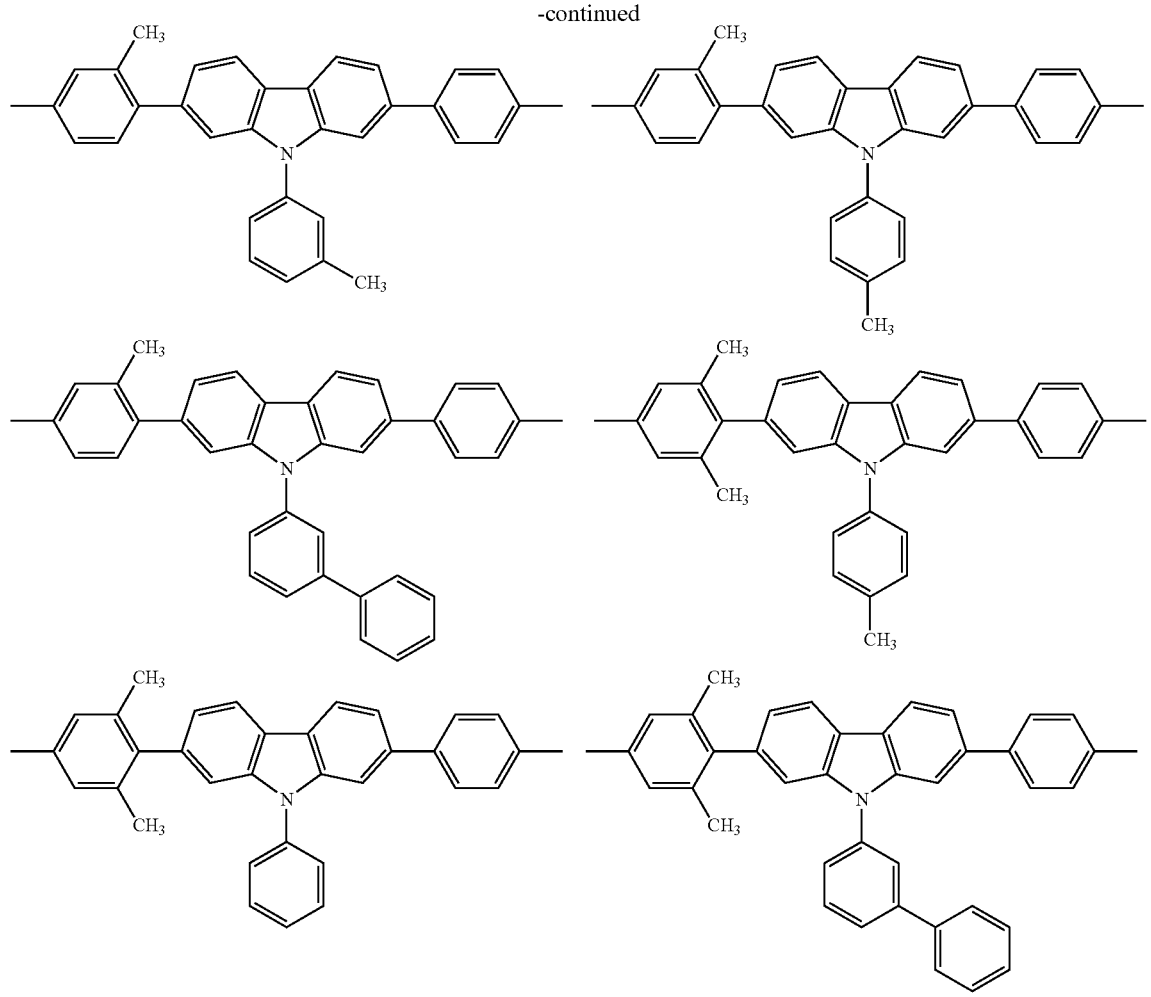

[Content of Repeating Unit Represented by Formula (1)]

In the polymer of the present embodiment, the content of the repeating unit represented by Formula (1) is not particularly restricted; however, the repeating unit represented by Formula (1) is contained in the polymer in an amount of usually not less than 10% by mole, preferably not less than 30% by mole, more preferably not less than 40% by mole, still more preferably not less than 50% by mole. In the polymer of the present invention, repeating units may consist of only the repeating unit represented by Formula (1); however, in order to attain a good balance of various performance when the polymer is used in an organic electroluminescent element, the polymer may also contain a repeating unit other than the one represented by Formula (1) and, in such a case, the content of the repeating unit represented by Formula (1) in the polymer is usually 99% by mole or less, preferably 95% by mole or less.

[Terminal Group]

The term "terminal group" used herein refers to a terminal structure of a polymer which is formed by an end-capping agent used at the completion of polymerizing the polymer. In the polymer of the present embodiment, a terminal group of the polymer having the repeating unit represented by Formula (1) is preferably a hydrocarbon group. From the standpoint of the charge transportability, the hydrocarbon group has preferably 1 to 60, more preferably 1 to 40, still more preferably 1 to 30 carbon atoms.

Preferred examples of the hydrocarbon group include:
linear, branched, or cyclic alkyl groups having usually 1 or more, preferably 4 or more, but usually 24 or less, preferably 12 or less carbon atoms, such as a methyl group, an ethyl group, an n-propyl group, an i-propyl group, an n-butyl group, an i-butyl group, a sec-butyl group, a tert-butyl group, an n-hexyl group, a cyclohexyl group, and a dodecyl group;
linear, branched, or cyclic alkenyl groups having usually 2 or more, but usually 24 or less, preferably 12 or less carbon atoms, such as a vinyl group;
linear or branched alkynyl groups having usually 2 or more, but usually 24 or less, preferably 12 or less carbon atoms, such as an ethynyl group; and
aromatic hydrocarbon groups having usually 6 or more, but usually 36 or less, preferably 24 or less carbon atoms, such as a phenyl group and a naphthyl group.

These hydrocarbon groups may further have a substituent which is preferably an alkyl group or an aromatic hydrocarbon group and, when the hydrocarbon groups have plural substituents, the substituents are optionally bound with each other to form a ring.

From the standpoint of the charge transportability and the durability, the terminal group is preferably an alkyl group or an aromatic hydrocarbon group, more preferably an aromatic hydrocarbon group.

[Repeating Unit Represented by Formula (2)]
($R^3$ and $R^6$)

In the repeating unit represented by Formula (2), $R^3$ and $R^6$ each independently represent an alkyl group optionally having a substituent. Examples of the structure of the alkyl group are the same as those exemplified above for $R^1$ and $R^2$, and examples of the optional substituent and a preferred structure thereof are also the same as those exemplified above.

($R^4$ and $R^5$)

In Formula (2), $R^4$ and $R^5$ each independently represent an alkyl group, an alkoxy group or an aralkyl group, which optionally has a substituent.

The alkyl group may have a linear, branched or cyclic structure and is not particularly restricted; however, the number of carbon atoms of the alkyl group is preferably 1 to 24, more preferably 8 or less, still more preferably 6 or less, since this tends to improve the solubility of the polymer.

Specific examples of the alkyl group include a methyl group, an ethyl group, an n-propyl group, an i-propyl group, an n-butyl group, an i-butyl group, a sec-butyl group, a tert-butyl group, an n-hexyl group, an n-octyl group, a cyclohexyl group, and a dodecyl group.

The alkoxy group is not particularly restricted, and the R group of the alkoxy group (—OR) may have a linear, branched or cyclic structure and has preferably 1 to 24, more preferably 12 or less carbon atoms, since this tends to improve the solubility of the polymer.

Specific examples of the alkoxy group include a methoxy group, an ethoxy group, an n-propoxy group, an n-butoxy group, a hexyloxy group, a 1-methylpentyloxy group, and a cyclohexyloxy group.

The aralkyl group is not particularly restricted; however, the number of carbon atoms of the aralkyl group is preferably 5 to 60, more preferably 40 or less, since this tends to improve the solubility of the polymer.

Specific examples of the aralkyl group include a 1,1-dimethyl-1-phenylmethyl group, a 1,1-di(n-butyl)-1-phenylmethyl group, a 1,1-di(n-hexyl)-1-phenylmethyl group, a 1,1-di(n-octyl)-1-phenylmethyl group, a phenylmethyl group, a phenylethyl group, a 3-phenyl-1-propyl group, a 4-phenyl-1-n-butyl group, a 1-methyl-1-phenylethyl group, a 5-phenyl-1-n-propyl group, a 6-phenyl-1-n-hexyl group, a 6-naphthyl-1-n-hexyl group, a 7-phenyl-1-n-heptyl group, a 8-phenyl-1-n-octyl group, and a 4-phenylcyclohexyl group.

(l, m, and n)

In Formula (2), l represents 0 or 1, and n represents 0 or 1.

The l and the n are independent to each other, and (l+n) is preferably 1 or 2, more preferably 2. By controlling (l+n) to be in this range, the solubility of the polymer of the present invention is improved, and precipitation of the composition for an organic electroluminescent element, which contains the polymer, thus tends to be inhibited.

Further, m represents 1 or 2, and m is preferably 1 since this allows the organic electroluminescent element of the present invention to operate at a low voltage, and tends to improve the hole injection/transport capacity as well as the durability.

(p and q)

In Formula (2), p represents 0 or 1, q represents 0 or 1, and p and q are not 0 simultaneously when l=n=1. By controlling p and q not to be 0 simultaneously, the solubility of the polymer of the present invention is improved, and precipitation of the composition for an organic electroluminescent element, which contains the polymer, thus tends to be inhibited.

($Ar^2$)

In the repeating unit represented by Formula (2), $Ar^2$ represents an aromatic hydrocarbon group optionally having a substituent, or an aromatic heterocyclic group optionally having a substituent, and plural $Ar^2$s contained in the polymer may be the same or different. Examples of the structure of the aromatic hydrocarbon group optionally having a substituent and that of the aromatic heterocyclic group optionally having a substituent are the same as those exemplified above for $Ar^1$, and examples of the optional substituents and preferred structures thereof are also the same as those exemplified above.

$Ar^2$ is also preferably a spirobifluorenyl group from the standpoint of the solubility in coating solvents.

$Ar^2$ is particularly preferably a group represented by Formula (15), or a group represented by Formula (16).

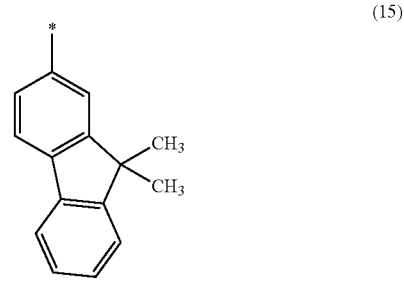

(15)

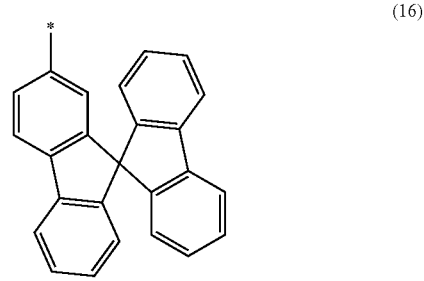

(16)

In Formulae (15) and (16), * represents a bond with N in Formula (2).

From the standpoint of insolubilization, the polymer preferably contains, as a further substituent, the repeating unit represented by Formula (2) that contains at least one crosslinkable group described below, and the crosslinkable group preferably further substitutes a substituent that is optionally contained in the aromatic hydrocarbon group or aromatic heterocyclic group represented by $Ar^2$.

[Group Represented by Formula (10) (Group Having Biscarbazole Structure)]

In the same manner as $Ar^1$, at least one $Ar^2$ is preferably a group represented by Formula (10). When at least one $Ar^2$ is a group represented by Formula (10), preferred structures of Formula (10) and optional substituents thereof are the same as in the case where at least one $Ar^1$ is a group represented by Formula (10).

[Specific Examples of Main Chain of Repeating Unit Represented by Formula (2)]

The N atom-excluding main chain structure of the repeating unit represented by Formula (2) is not particularly restricted, and examples thereof include the following structures.

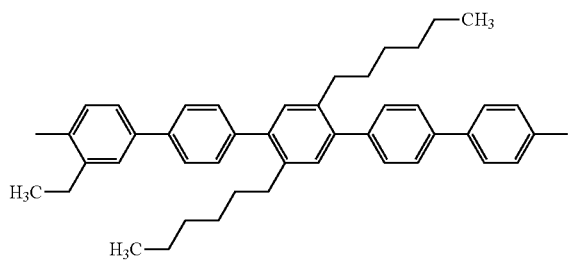
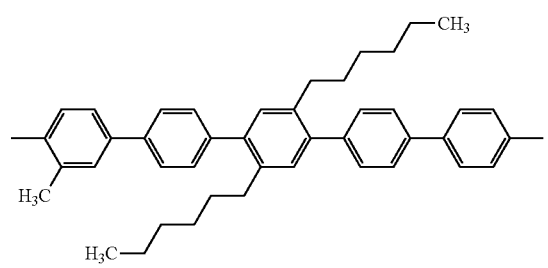
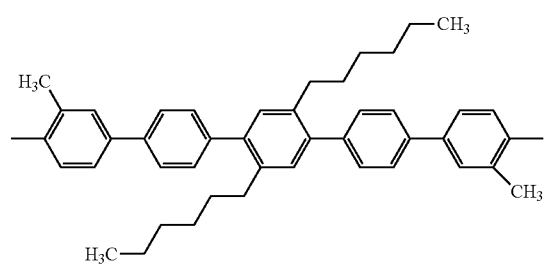
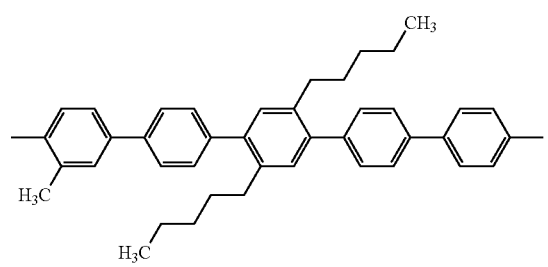
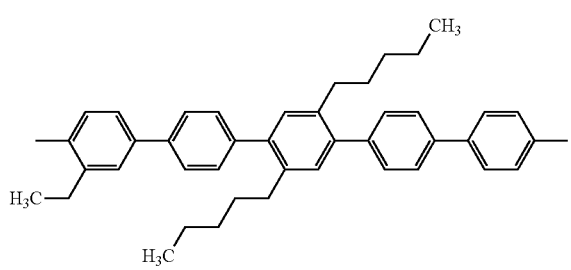
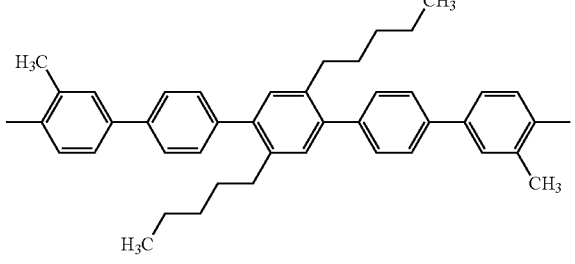
-continued
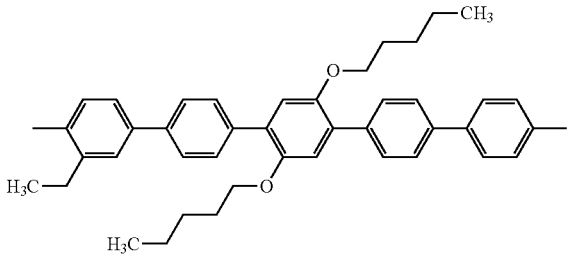
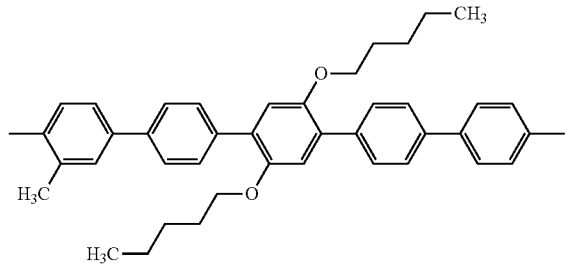
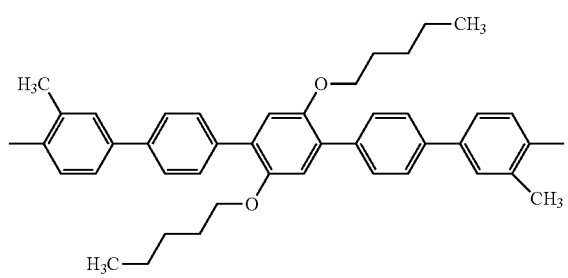
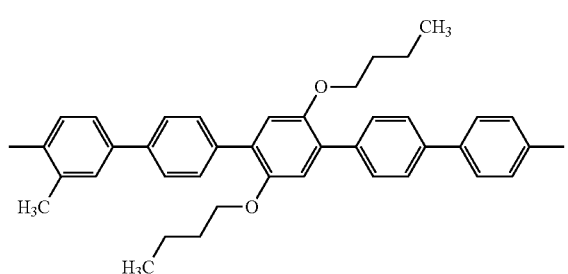
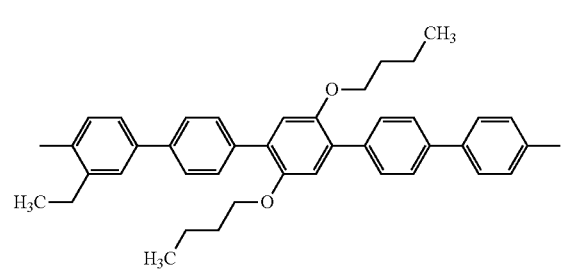
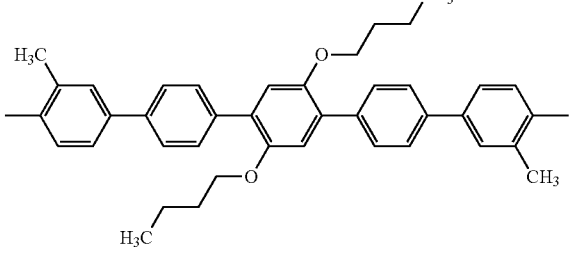

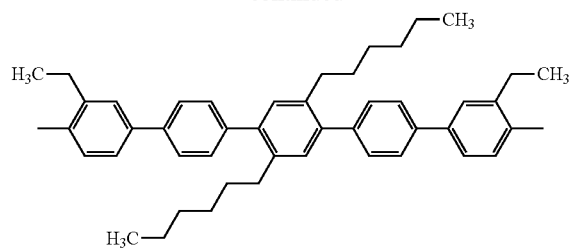
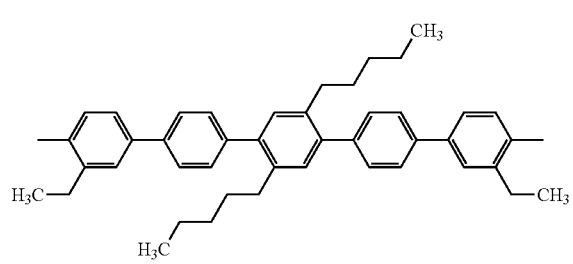
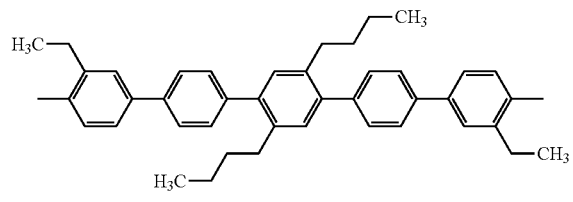
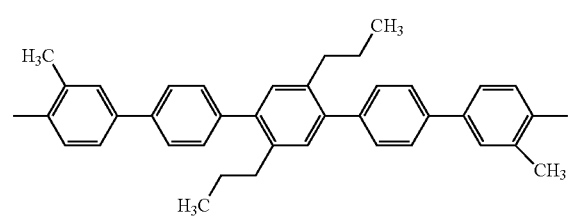
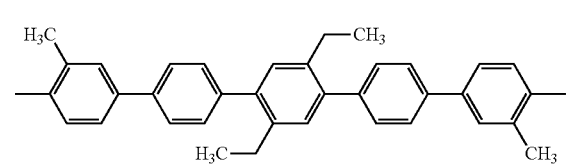
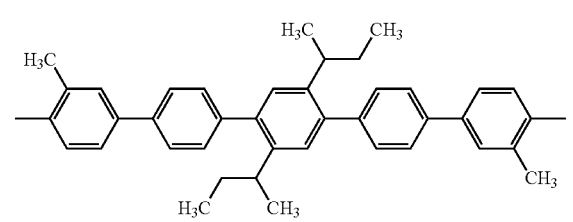
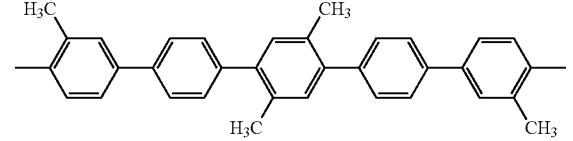
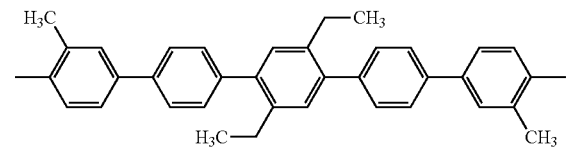
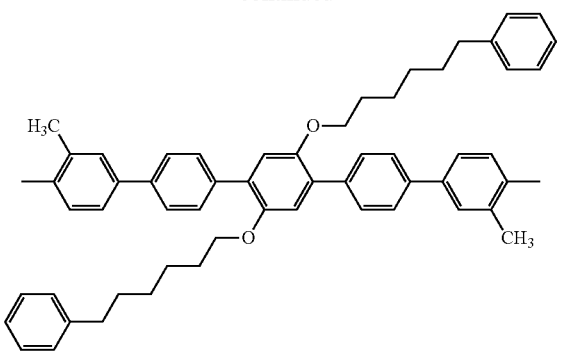
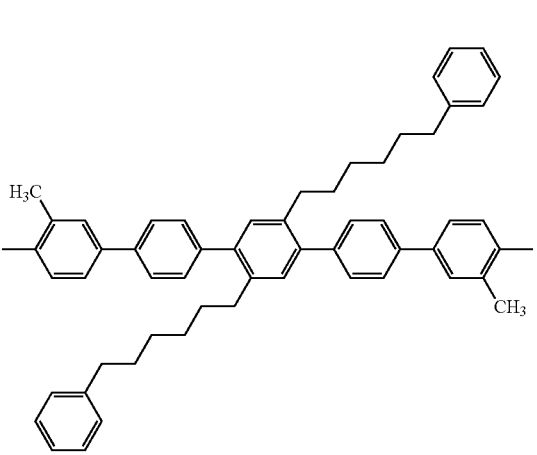
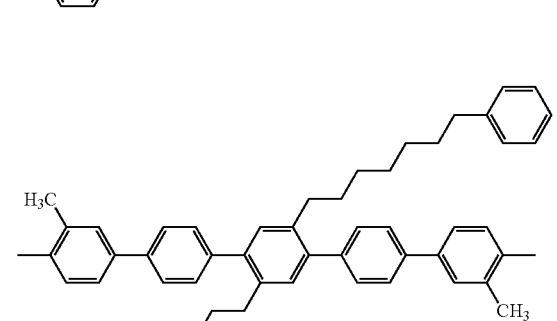
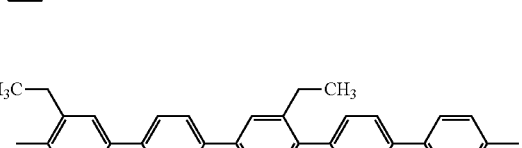
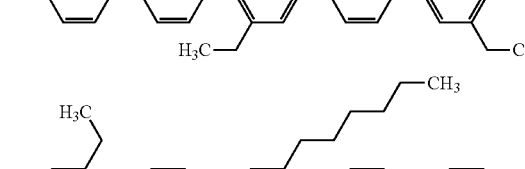
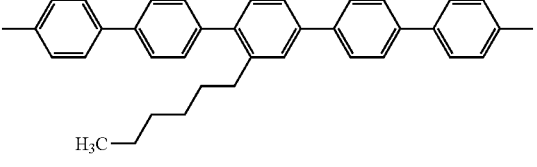

37
-continued
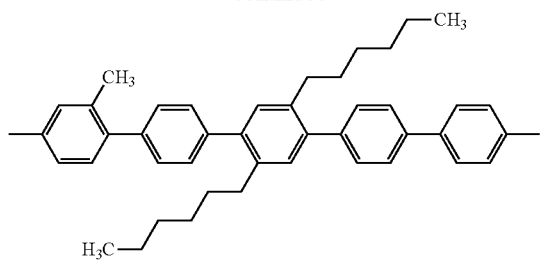
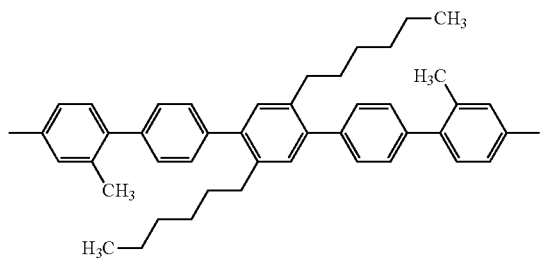
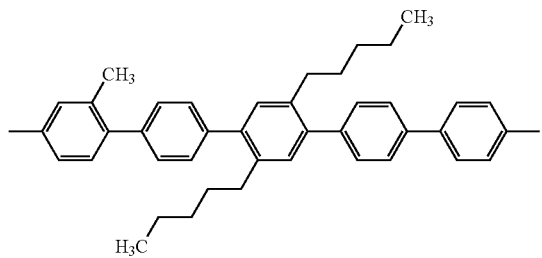
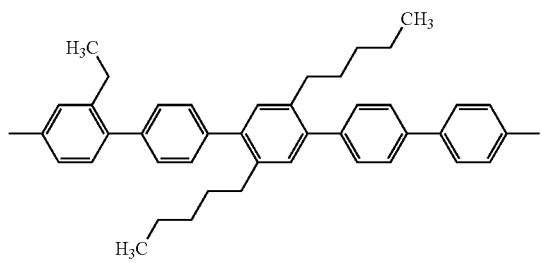
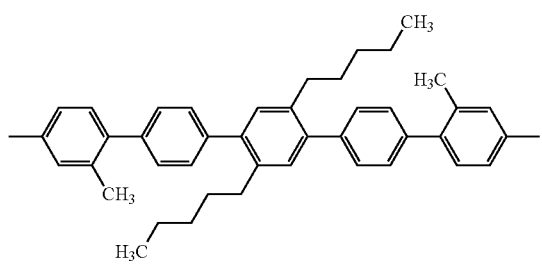
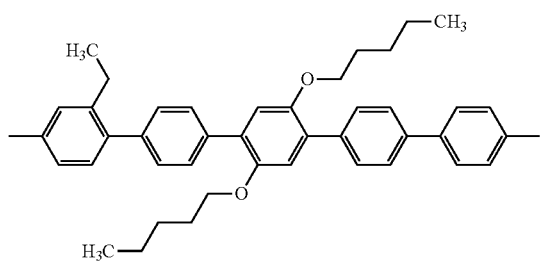
38
-continued
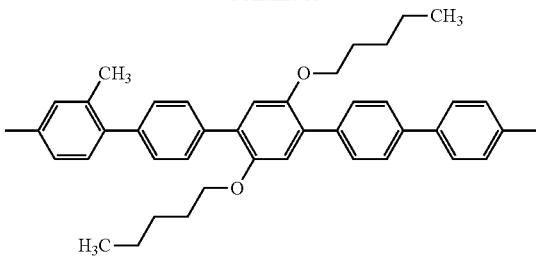
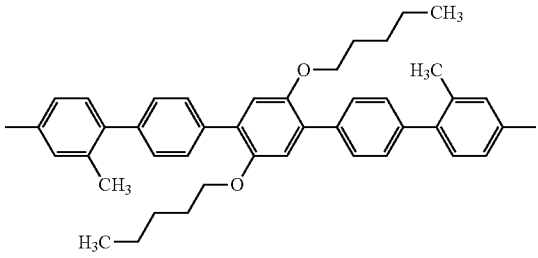
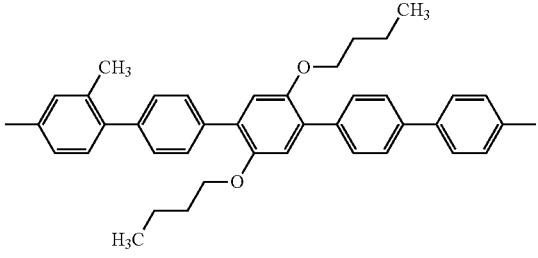
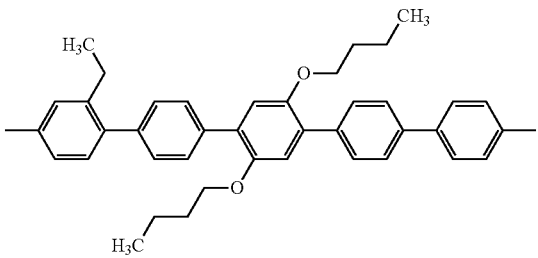
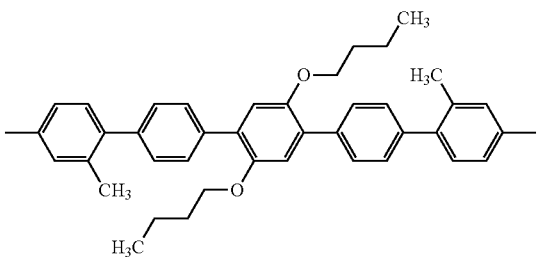
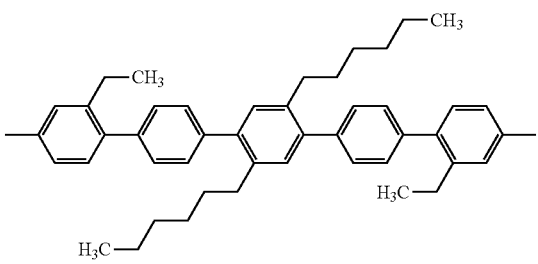

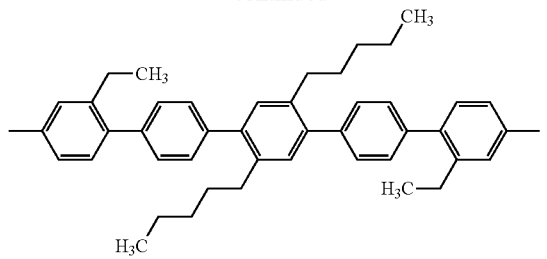
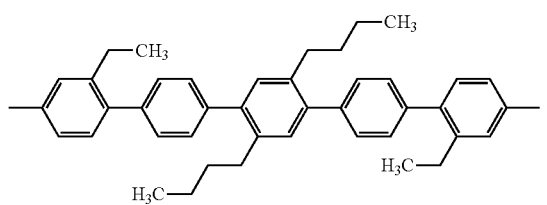
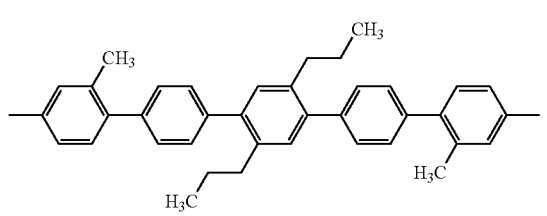
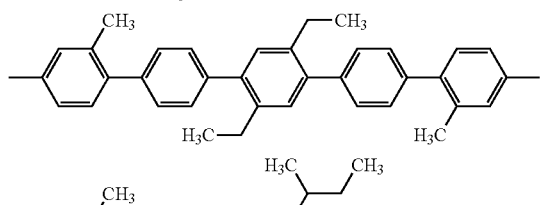
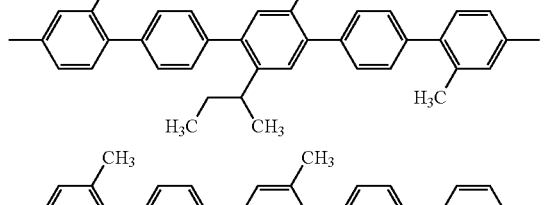
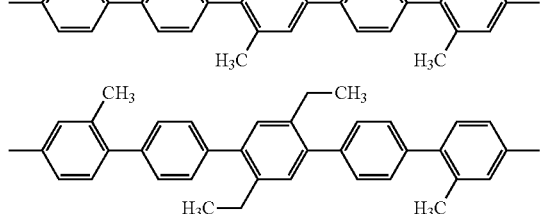
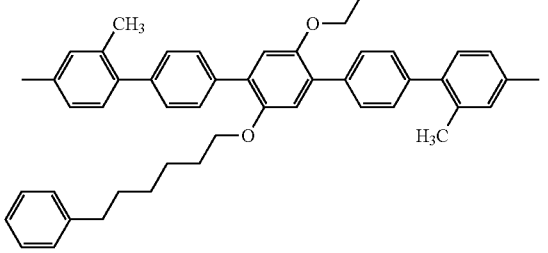

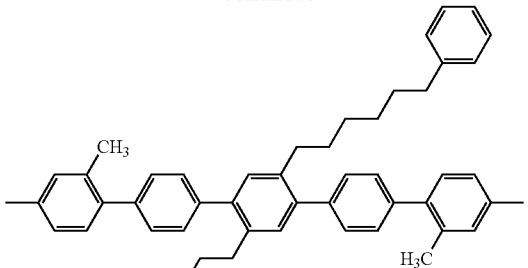
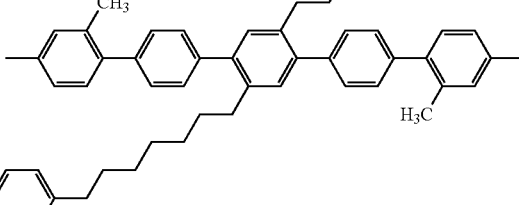
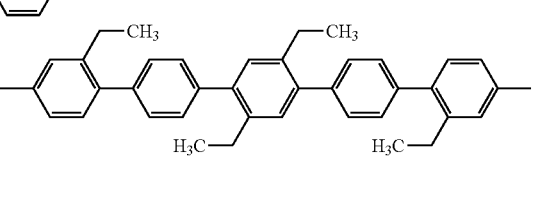

[Content of Repeating Unit Represented by Formula (2)]

In the polymer of the present embodiment, the content of the repeating unit represented by Formula (2) is not particularly restricted; however, the repeating unit represented by Formula (2) is contained in the polymer in an amount of usually not less than 10% by mole, preferably not less than 30% by mole, more preferably not less than 40% by mole, particularly preferably not less than 50% by mole. In the polymer of the present embodiment, repeating units may consist of only the repeating unit represented by Formula (2); however, in order to attain a good balance of various performance when the polymer is used in an organic electroluminescent element, the polymer may also contain a repeating unit other than the one represented by Formula (2) and, in such a case, the content of the repeating unit represented by Formula (2) in the polymer is usually 99% by mole or less, preferably 95% by mole or less.

[Terminal Group]

In the polymer of the present embodiment, a terminal group of the polymer having the repeating unit represented by Formula (2) is preferably a hydrocarbon group in the same manner as the terminal group of the polymer having the repeating unit represented by Formula (1). Preferred hydrocarbon groups and optional substituents thereof are also the same as those exemplified above for the terminal group of the polymer having the repeating unit represented by Formula (1).

Repeating units and the like of the present embodiment other than those represented by Formula (1) or (2) will now be described.

[Other Repeating Units]

The polymer of the present embodiment may further contain other repeating unit in addition to the repeating unit represented by Formula (1) or (2).

As the other repeating unit, from the standpoint of the charge transportability and the durability, a repeating unit represented by Formula (4) is preferred. It is noted here that the repeating unit represented by the following Formula (4) may be the same as a part of the structure of the repeating unit represented by Formula (1) or (2); however, the "repeating unit represented by Formula (4)" only means a structure other than the repeating unit represented by Formula (1) or (2).

(wherein, $Ar^3$ represents an aromatic hydrocarbon group optionally having a substituent, or an aromatic heterocyclic group optionally having a substituent; and $Ar^4$ represents a divalent aromatic hydrocarbon group optionally having a substituent, a divalent aromatic heterocyclic group optionally having a substituent, or a divalent group in which aromatic hydrocarbon group(s) optionally having a substituent and/or aromatic heterocyclic group(s) optionally having a substituent are linked together directly or via a linking group).

($Ar^3$ and $Ar^4$)

Examples of the aromatic hydrocarbon group and the aromatic heterocyclic group that are represented by $Ar^3$ and $Ar^4$ include: for $Ar^3$, the same groups as those exemplified above for $Ar^1$ of Formula (1) or $Ar^2$ of Formula (2); and, for $Ar^4$, the same groups as those exemplified above for $Ar^1$ of Formula (1) or $Ar^2$ of Formula (2), which are divalent. Further, substituent that may be contained in these groups are preferably the same as the above-described substituents Z and the below-described crosslinkable group, and substituents that may be further contained therein are the same as the above-described substituents Z.

From the standpoint of attaining excellent charge transportability, excellent durability, and excellent hole injection from the anode side, $Ar^4$ is preferably a group represented by the following Formula (5).

[Other Preferred Main Chain (Formula (5))]

From the standpoint of attaining excellent charge transportability, excellent durability, and excellent hole injection from the anode side, the polymer of the present embodiment preferably contains a group represented by the following Formula (5).

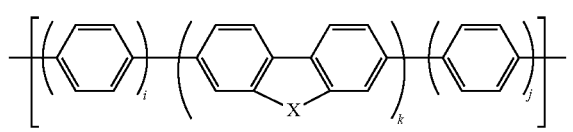

In Formula (5), i and j each independently represent an integer of 0 to 3, with (i+j) being 1 or larger;

k represents an integer of 0 or 1;

X is defined the same as X in the above-described repeating unit represented by Formula (1) and represents —C($R^7$)($R^8$)—, —N($R^9$)—, or —C($R^{11}$)($R^{12}$)—C($R^{13}$)($R^{14}$)—; and $R^7$ to $R^9$ and $R^{11}$ to $R^{14}$ are defined the same as $R^7$ to $R^9$ and $R^{11}$ to $R^{14}$ that constitute X in the above-described repeating unit represented by Formula (1), each independently representing an alkyl group optionally having a substituent, an aralkyl group optionally having a substituent, or an aromatic hydrocarbon group optionally having a substituent, and their preferred structures and optional substituents are also the same. Further, X of Formula (5) may be the same as or different from X of Formula (1).

(i, j and k)

In Formula (5), from the standpoint of attaining excellent electron durability, (i+j) is preferably 2 or more, more preferably 3 or more.

Further, i is preferably 1 or larger, and a bond is preferably formed with N in Formula (4) via this phenylene group. It is more preferred that i and j be both 1, or that i and j be both 2 or larger.

From the standpoint of allowing the polymer to have excellent solubility in solvents, k is more preferably 1.

(Linking Group)

The polymer of the present embodiment preferably also contains a repeating unit represented by the following Formula (6).

Particularly, when plural aromatic hydrocarbon groups and aromatic heterocyclic groups are linked via a linking group in the above-described Formula (4), specific examples of the linking group include divalent linking groups in which 1 to 30, preferably 1 to 5, more preferably 1 to 3 groups selected from a —O— group, a —C(=O) group, and a —CH$_2$— group, whose hydrogen atoms are optionally substituted, are linked in any order.

From the standpoint of attaining excellent hole injection into a light-emitting layer, $Ar^4$ in Formula (4) is preferably a plurality of aromatic hydrocarbon groups or aromatic heterocyclic groups that are linked via a linking group represented by the following Formula (6).

(wherein, t represents an integer of 1 to 10;

$R^{15}$ and $R^{16}$ each independently represent a hydrogen atom, or an alkyl, aromatic hydrocarbon or aromatic heterocyclic group, which optionally has a substituent; and when there are plural $R^{15}$s and $R^{16}$s, the $R^{15}$s and the $R^{16}$s are optionally the same or different).

($R^{15}$ and $R^{16}$)

The alkyl groups represented by $R^{15}$ and $R^{16}$ are the same as the alkyl groups exemplified above for $R^1$, $R^2$, $R^3$ and $R^6$, and the aromatic hydrocarbon groups and the aromatic heterocyclic groups are the same as those exemplified above for $Ar^1$ and $Ar^2$. Further, substituent that may be contained in these groups are preferably the same as the above-described substituents Z and the below-described crosslinkable group, and substituents that may be further contained therein are the same as the above-described substituents Z.

[Other Repeating Unit (2)]

The other repeating unit that may be contained in the polymer of the present embodiment is preferably a repeating unit represented by the following Formula (7). The repeating unit represented by Formula (7) tends to have a high excited singlet energy level and a high excited triplet energy level because of distortion of the aromatic rings. In addition, steric hindrance caused by the distortion of the aromatic rings allows the polymer to have excellent solubility in solvents, and a coating film thereof formed by a wet film-forming method and subsequently heat-treated tends to have excellent insolubility in solvents.

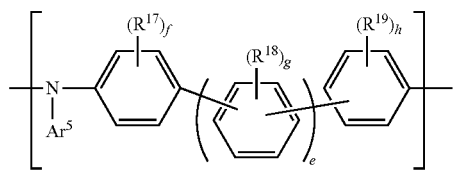

(7)

(wherein, $Ar^5$ represents an aromatic hydrocarbon group optionally having a substituent, or an aromatic heterocyclic group optionally having a substituent;

$R^{17}$ to $R^{19}$ each independently represent an alkyl group optionally having a substituent, an alkoxy group optionally having a substituent, an aralkyl group optionally having a substituent, an aromatic hydrocarbon group optionally having a substituent, or an aromatic heterocyclic group optionally having a substituent;

f, g, and h each independently represent an integer of 0 to 4, with (f+g+h) being 1 or larger; and e represents an integer of 0 to 3).

($Ar^5$ and $R^{17}$ to $R^{19}$)

The aromatic hydrocarbon groups and the aromatic heterocyclic groups that are represented by $Ar^5$ and $R^{17}$ to $R^{19}$ are each independently the same as any of the groups exemplified above for $Ar^1$ and $Ar^2$. Further, substituent that may be contained in these groups are preferably the same as the above-described substituents Z and the below-described crosslinkable group.

The alkyl groups and the aralkyl groups that are represented by $R^{17}$ to $R^{19}$ are the same as those exemplified above for $R^7$, and substituents that may be contained in these groups are preferably the same as those exemplified above for $R^7$.

The alkoxy groups represented by $R^{17}$ to $R^{19}$ are preferably the alkoxy groups exemplified above for the substituents Z, and substituents that may be contained in these groups are also the same as the above-described substituents Z.

(f, g, and h)

In Formula (7), f, g, and h each independently represent an integer of 0 to 4, with (f+g+h) being 1 or larger.

It is preferred that (f+h) be 1 or larger;

it is more preferred that (f+h) be 1 or larger, and f, g and h be each 2 or smaller;

it is still more preferred that (f+h) be 1 or larger, and f and h be each 1 or smaller; and it is most preferred that f and h be both 1.

When f and h are both 1, $R^{17}$ and $R^{19}$ are preferably bound at positions symmetrical to each other.

In addition, $R^{17}$ and $R^{19}$ are preferably the same.

It is more preferred that g be 2.

When g is 2, it is most preferred that two $R^{18}$s be bound at the para-positions to each other, and that two $R^{18}$s be the same.

The phrase "$R^{17}$ and $R^{19}$ are bound at positions symmetrical to each other" refers to the below-described binding position. It is noted here that, in terms of notation, structures that are rotated by 180° about a main chain are regarded as the same structure.

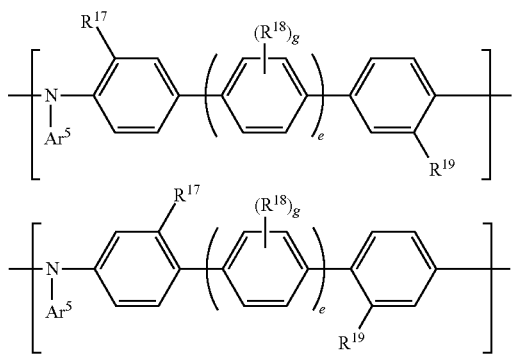

When the polymer of the present embodiment contains the repeating unit represented by Formula (7), the mole ratio of the repeating unit represented by Formula (7) and the repeating unit represented by Formula (1) (Repeating unit represented by Formula (7)/Repeating unit represented by Formula (1)) is preferably 0.1 or higher, more preferably 0.3 or higher, still more preferably 0.5 or higher, yet still more preferably 0.9 or higher, particularly preferably 1.0 or higher, but preferably 2.0 or lower, more preferably 1.5 or lower, still more preferably 1.2 or lower.

The above-described repeating unit represented by Formula (4) is preferably a repeating unit represented by the following Formula (8).

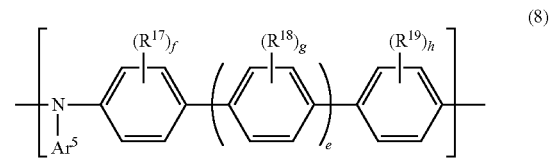

(8)

In the case of the repeating unit represented by Formula (8), g is preferably 0 or 2. When g=2, the binding positions are the 2-position and the 5-position. When g=0 (i.e. when there is no steric hindrance caused by $R^{18}$), and when g=2 and the binding positions are the 2-position and the 5-position (i.e. when steric hindrance occurs at diagonal positions of the benzene ring to which two $R^{18}$s are bound), $R^{17}$ and $R^{19}$ can be bound at positions symmetrical to each other.

The repeating unit represented by Formula (8) is more preferably a repeating unit represented by the following Formula (9), wherein e=3.

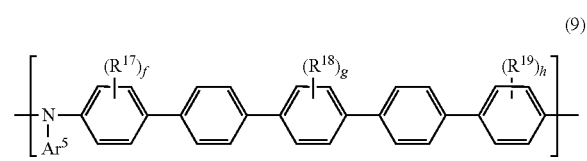

(9)

In the case of the repeating unit represented by Formula (9), g is preferably 0 or 2. When g=2, the binding positions are the 2-position and the 5-position. When g=0 (i.e. when there is no steric hindrance caused by $R^{18}$), and when g=2 and the binding positions are the 2-position and the 5-position (i.e. when steric hindrance occurs at diagonal positions of the benzene ring to which two $R^{18}$s are bound), $R^{17}$ and $R^{19}$ can be bound at positions symmetrical to each other.

[Preferred Combination of Repeating Units]

In the polymer of the present invention, a combination of repeating units is not particularly restricted; however, from the standpoint of improving the charge transportability and the durability, the polymer preferably has a repeating unit represented by Formula (12), which contains the repeating unit represented by Formula (1) and the repeating unit represented by Formula (4) wherein $Ar^4$ is Formula (5).

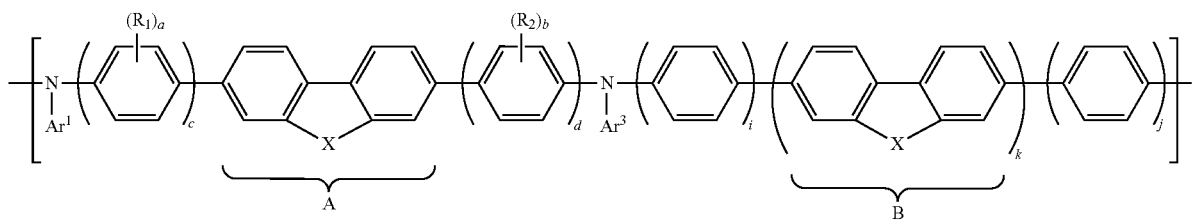

(12)

In Formula (12), $Ar^1$, $Ar^3$, X, $R^1$, $R^2$, a, b, c, d, i, j, and k are each the same as in Formula (1), Formula (4), or Formula (5).

Their preferred structures, ranges and the like are also the same as in Formula (1), Formula (4), or Formula (5).

More preferably, c=d=i=j, and k=1.

In Formula (12), when a fluorene ring, a carbazole ring or a dihydrophenanthrene skeleton that is close to the phenylenes having a substituent is denoted as "A" while a fluorene ring, a carbazole ring or a dihydrophenanthrene skeleton that is close to the phenylenes having no substituent is denoted as "B", the A having non-conjugated bonds with amines is not conjugated with the amines; therefore, LUMO is unlikely to be distributed therein, and the durability tends to be improved. Further, since the B conjugated with an amine has a broader conjugation, the hole transportability is improved and the polymer tends to be stable.

It is more preferred that X of the A and X of the B be —C($R^7$)($R^8$)—, —N($R^9$)—, or —C($R^{11}$)($R^{12}$)—C($R^{13}$)($R^{14}$)—. In this case, $R^7$, $R^8$, $R^9$, $R^{11}$, $R^{12}$, $R^{13}$ and $R^{14}$ of the A and those of the B may be the same or different.

When X of the A and X of the B are —C($R^7$)($R^8$)—, —N($R^9$)—, or —C($R^{11}$)($R^{12}$)—C($R^{13}$)($R^{14}$)—, the repeating core contained in the polymer are the same; therefore, it is believed that a level acting as a charge trap is unlikely to be generated, so that excellent charge transportability and excellent durability are attained.

It is still more preferred that the A and the B be the same, it is yet still more preferred that X be —C($R^3$)($R^4$)— in both A and B, and it is particularly preferred that X of the A and X of the B be both —C($R^3$)($R^4$)— and the same.

The structure of the repeating unit represented by Formula (12) is not particularly restricted, and examples thereof include the following structures.

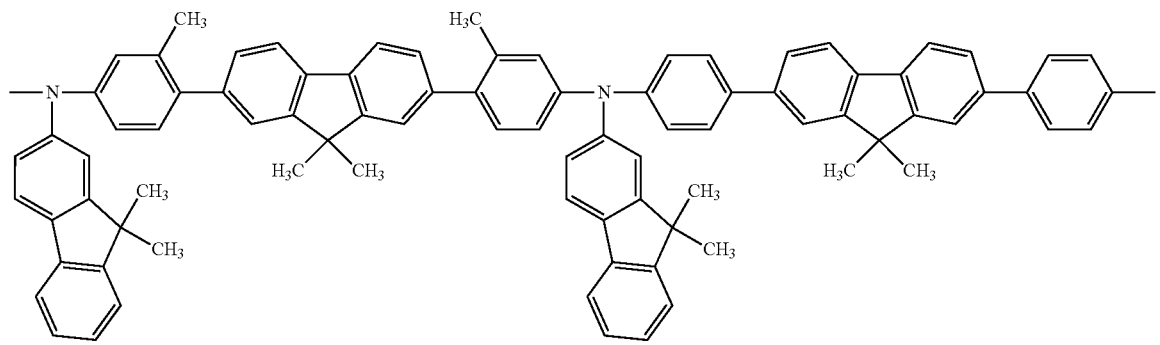

-continued
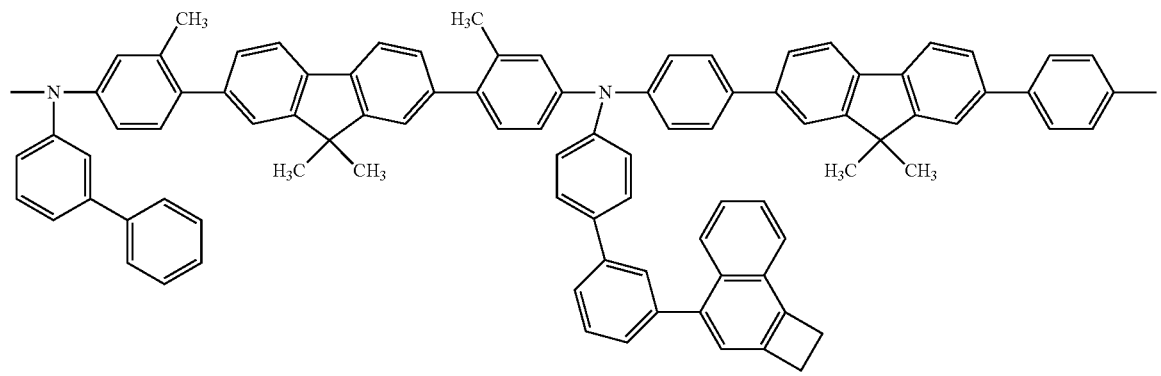
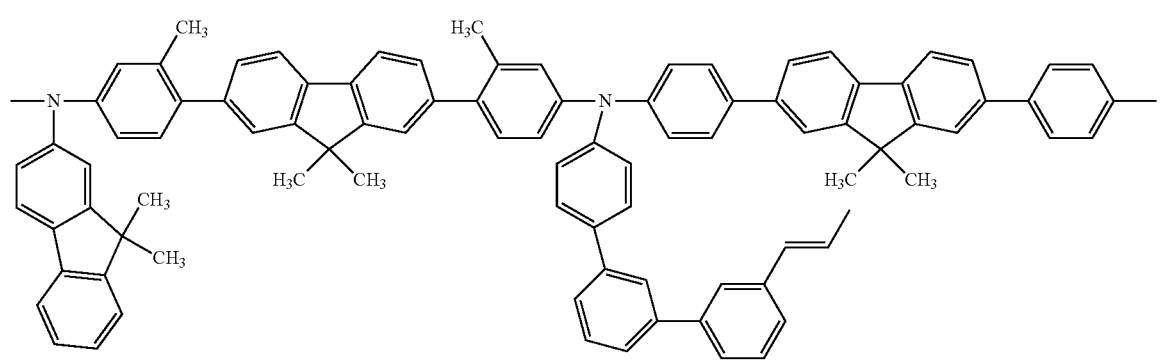
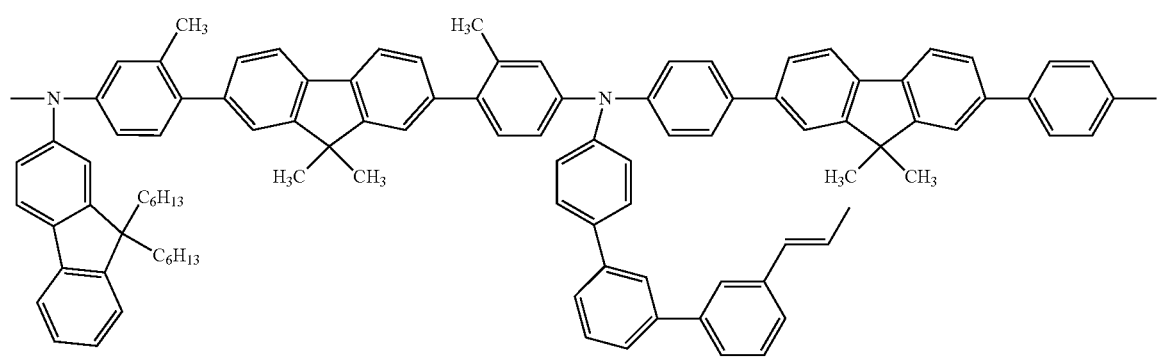
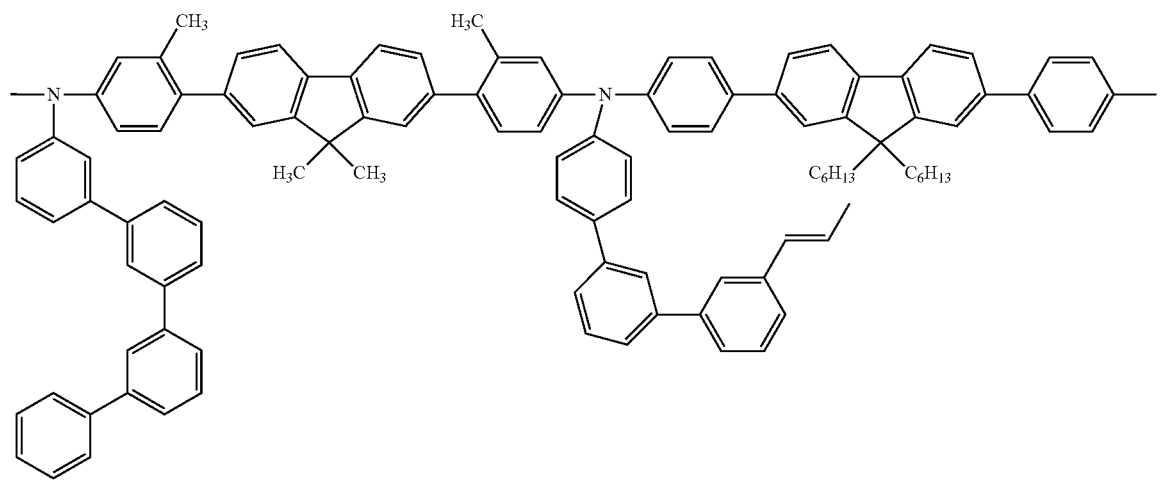

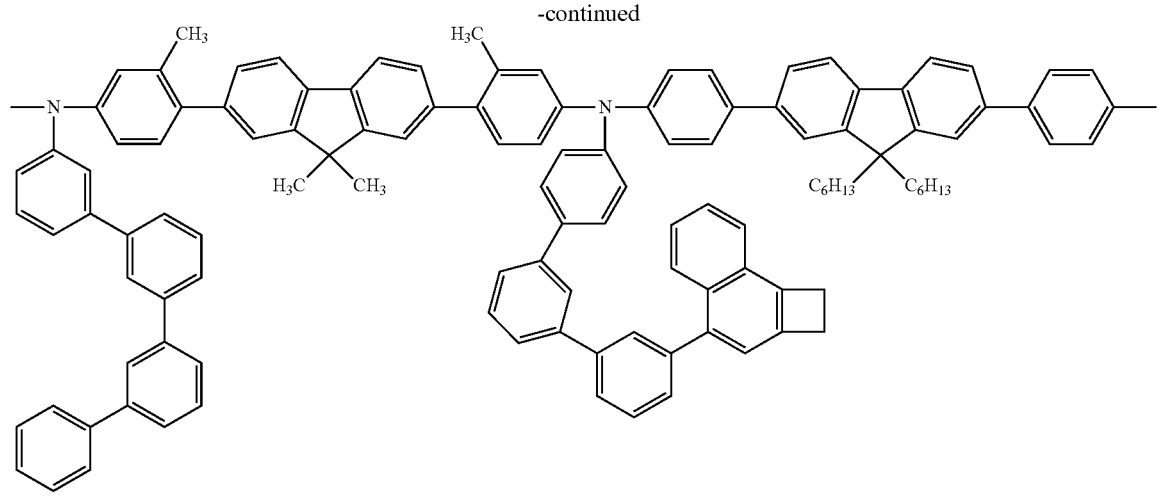
When Ar¹ of Formula (1) is represented by Formula (10), examples of the repeating unit represented by Formula (12) in which Ar¹ is the repeating unit represented by Formula (10) and which contains the repeating unit represented by Formula (4) wherein Ar⁴ is Formula (5) include, but not particularly limited to, the following structures.
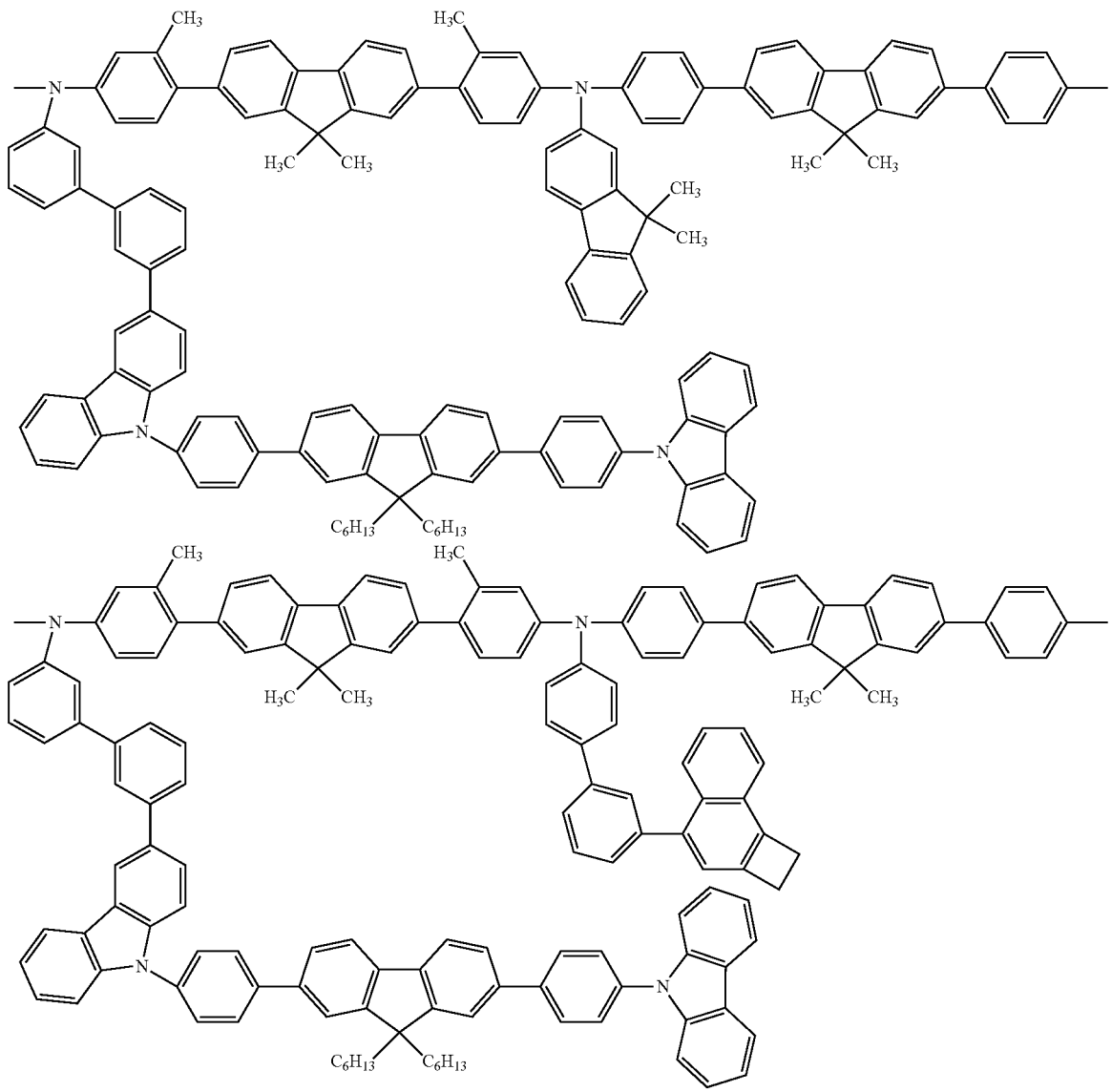

-continued

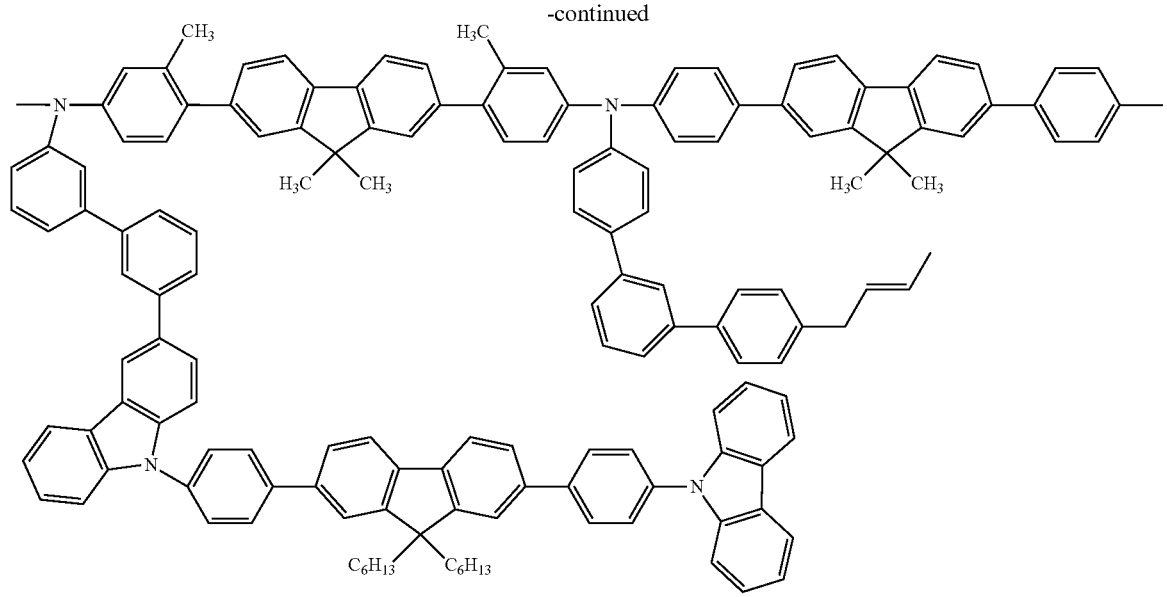

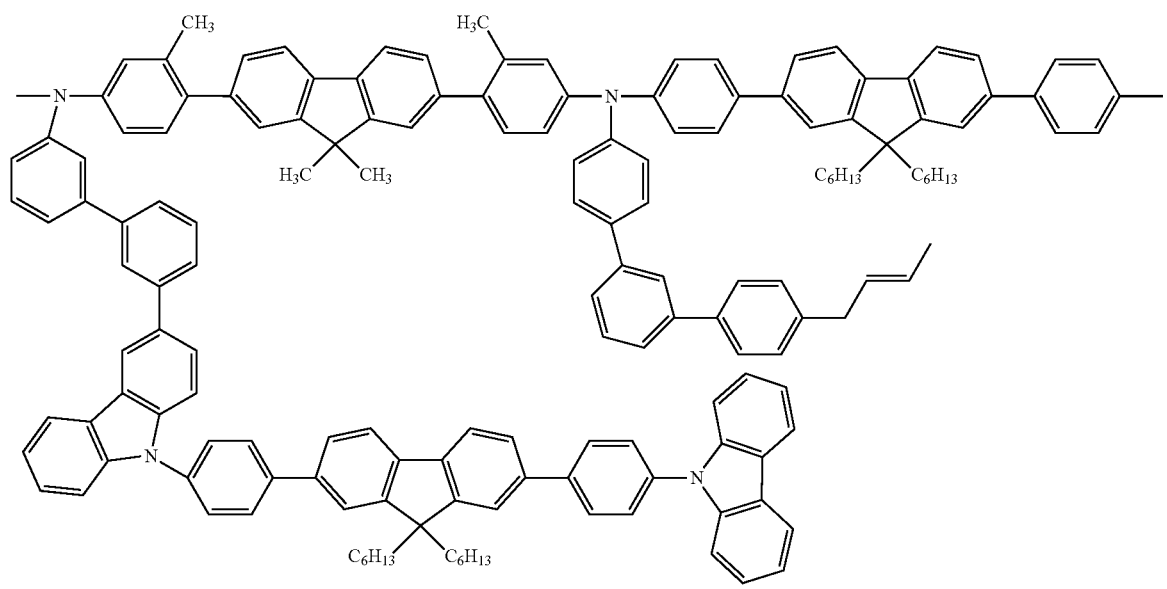

[Repeating Unit in which Formula (2) and Formula (4) are Linked]

In the polymer of the present embodiment, a combination of repeating units is not particularly restricted; however, from the standpoint of improving the charge transportability and the durability, the polymer preferably has a repeating unit represented by the following Formula (14) in which the repeating unit represented by Formula (2) and the repeating unit represented by Formula (4) wherein $Ar^4$ is Formula (5) are linked together. Further, when the polymer of the present embodiment contains the repeating unit represented by Formula (5), the mole ratio of the repeating unit represented by Formula (5) and the repeating unit represented Formula by (2) (Repeating unit represented by Formula (5)/Repeating unit represented by Formula (2)) is preferably 0.1 or higher, more preferably 0.3 or higher, still more preferably 0.5 or higher, yet still more preferably 0.9 or higher, particularly preferably 1.0 or higher, but preferably 2.0 or lower, more preferably 1.5 or lower, still more preferably 1.2 or lower.

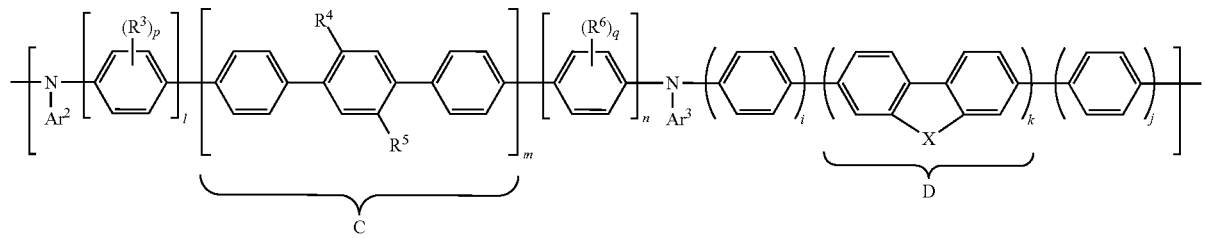

(14)

In Formula (14), $Ar^2$, $Ar^3$, X, $R^3$, $R^4$, $R^5$, $R^6$, p, q, i, j, k, l, m, and n are each the same as in Formula (2), Formula (4), or Formula (5).

Their preferred structures, ranges and the like are also the same as in Formula (2), Formula (4), or Formula (5).

More preferably, l=n=j=I, and k=1.

In Formula (14), when a structure which is linked with phenylenes having no substituent that is close to the phenylene having a substituent with a distorted structure, or the phenylenes having a substituent is denoted as "C" while a fluorene ring, a carbazole ring or a dihydrophenanthrene skeleton that is close to the phenylenes having no substituent is denoted as "D", the C having non-conjugated bonds with amines is not conjugated with the amines; therefore, LUMO is unlikely to be distributed therein, and the durability tends to be improved. Further, since the D conjugated with an amine has a broader conjugation, the hole transportability is improved and the polymer tends to be stable.

It is more preferred that X of the D be —C($R^7$)($R^8$)—, —N($R^9$)—, or —C($R^{11}$)($R^{12}$)—C($R^{13}$)($R^{14}$)—. In this case, $R^7$, $R^1$, $R^9$, $R^{11}$, $R^{12}$, $R^{13}$ and $R^{14}$ of the D may be the same or different.

When X of the D is —C($R^7$)($R^8$)—, —$NR^9$—, or —C($R^{11}$)($R^{12}$)—C($R^{13}$)($R^{14}$)—, the repeating core contained in the polymer are the same; therefore, it is believed that a level acting as a charge trap is unlikely to be generated, so that excellent charge transportability and excellent durability are attained.

Preferably, $Ar^2$ and $Ar^3$ are each independently the following Formula (15) or (16).

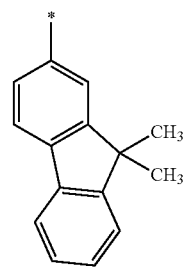

(15)

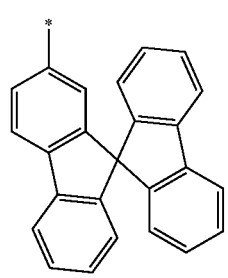

(16)

The structure represented by Formula (14) is not particularly restricted, and examples thereof include the following structures.

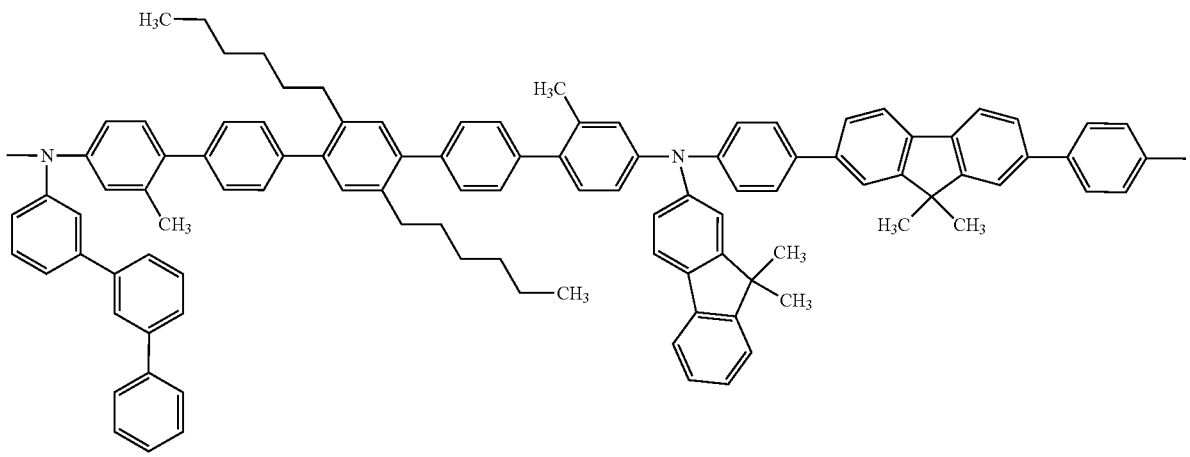

-continued
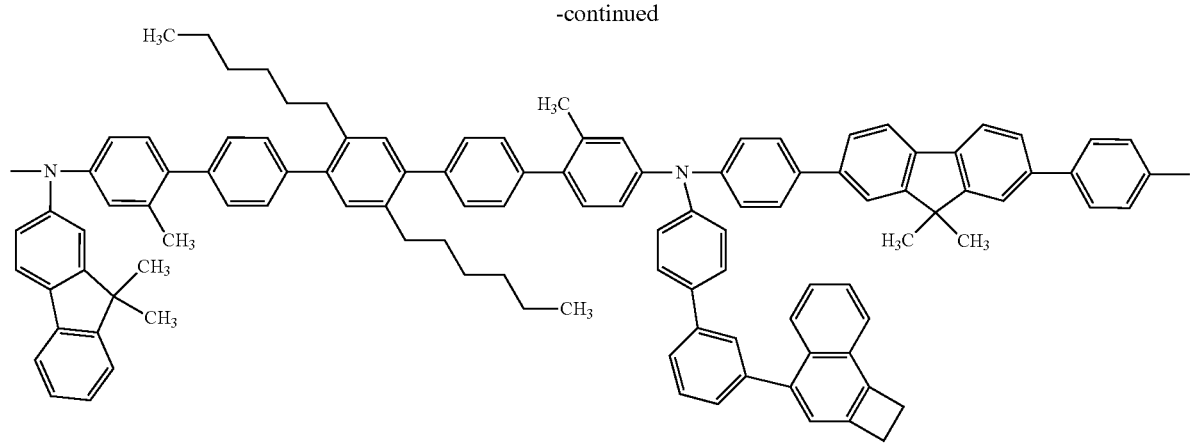
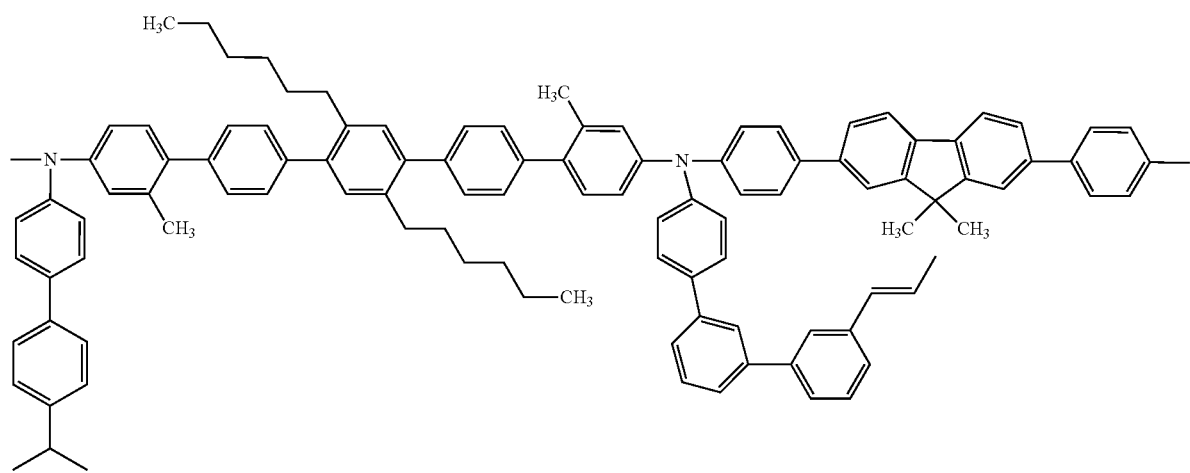
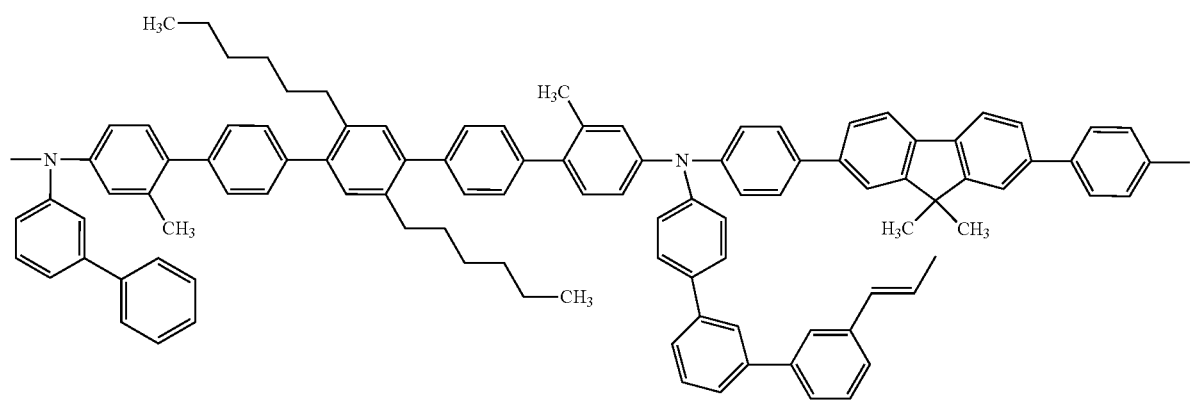

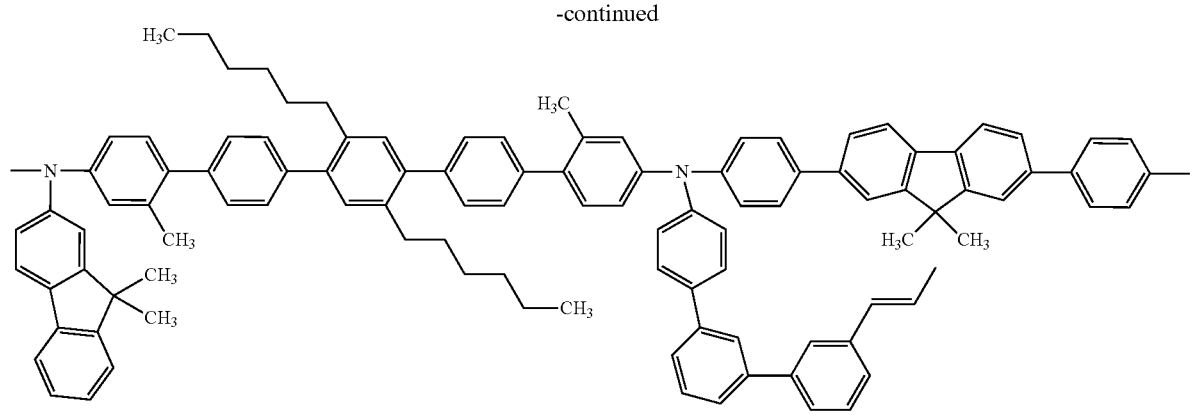
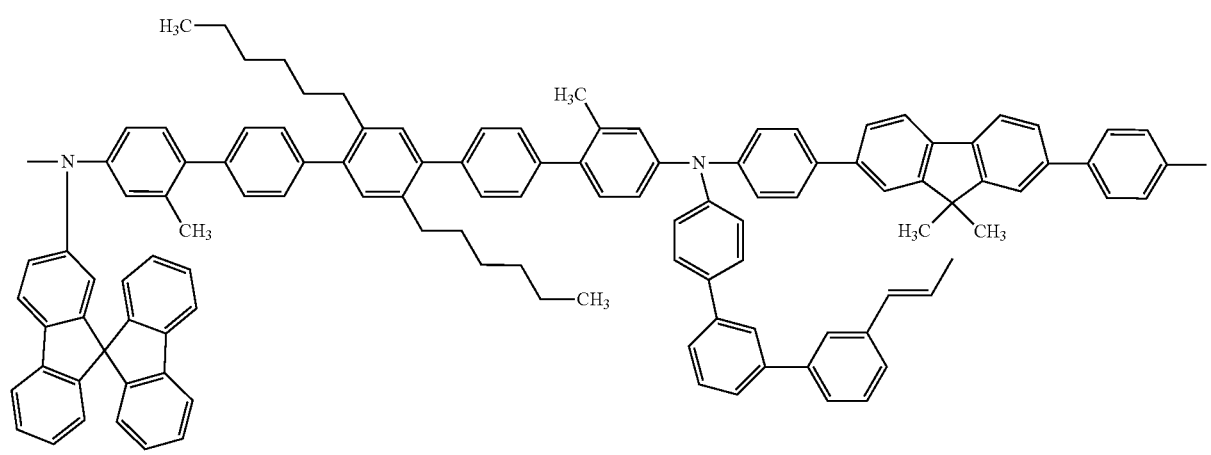
Examples of a repeating unit that contains the repeating unit represented by Formula (2) wherein $Ar^2$ is Formula (10) and the repeating unit represented by Formula (4) wherein $Ar^4$ is Formula (5) include, but not particularly limited to, the following structures.
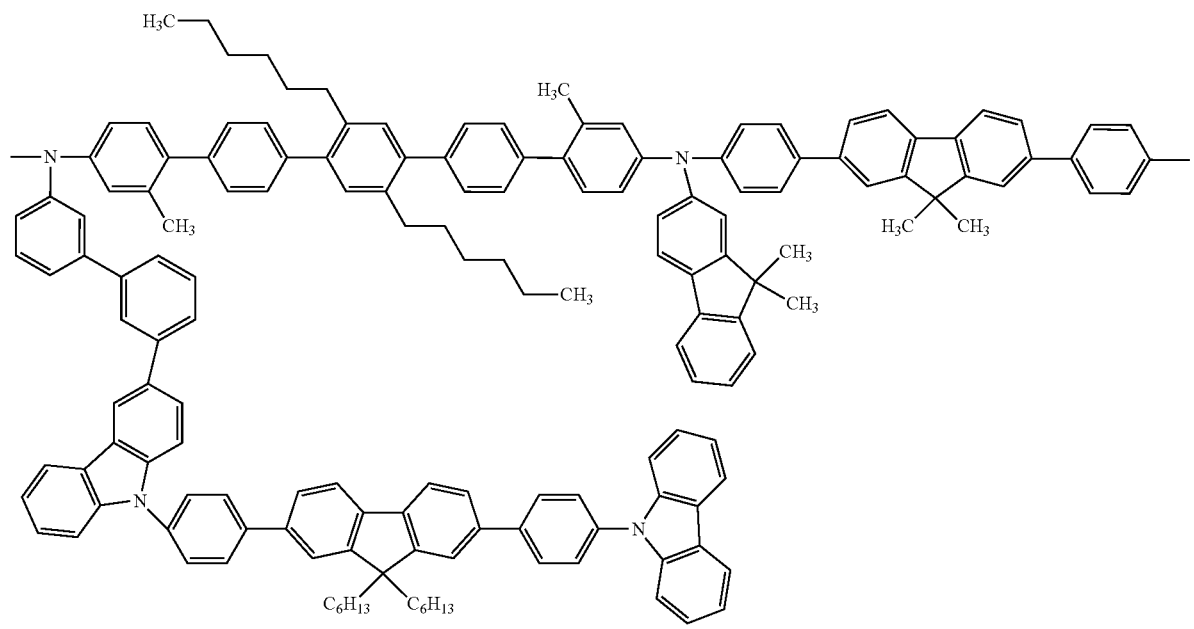

-continued
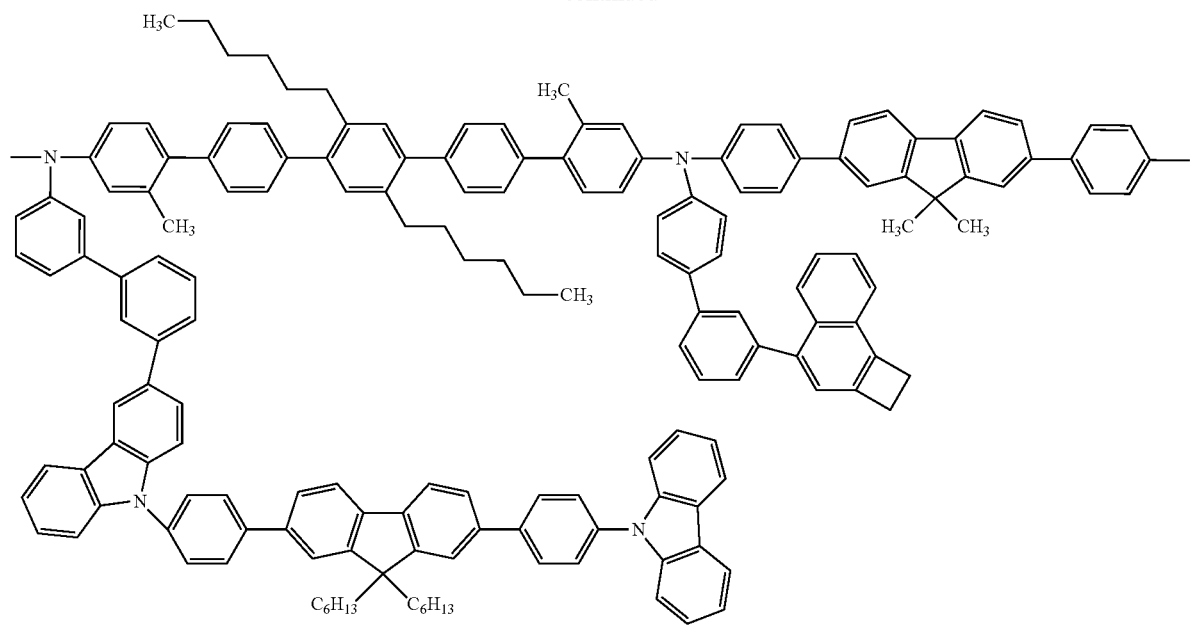
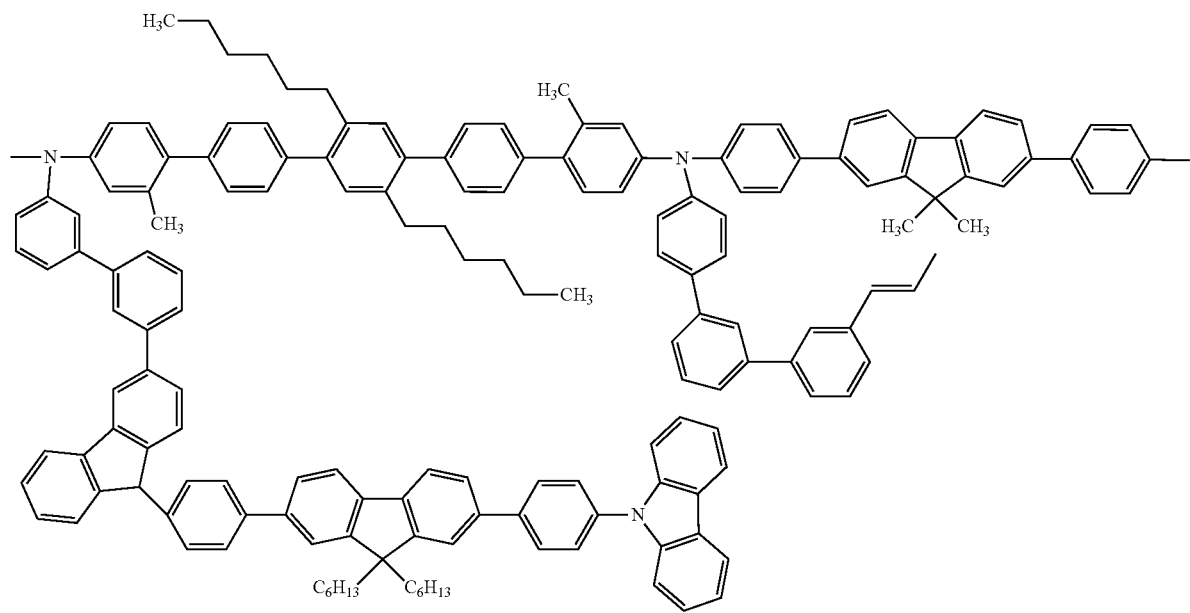

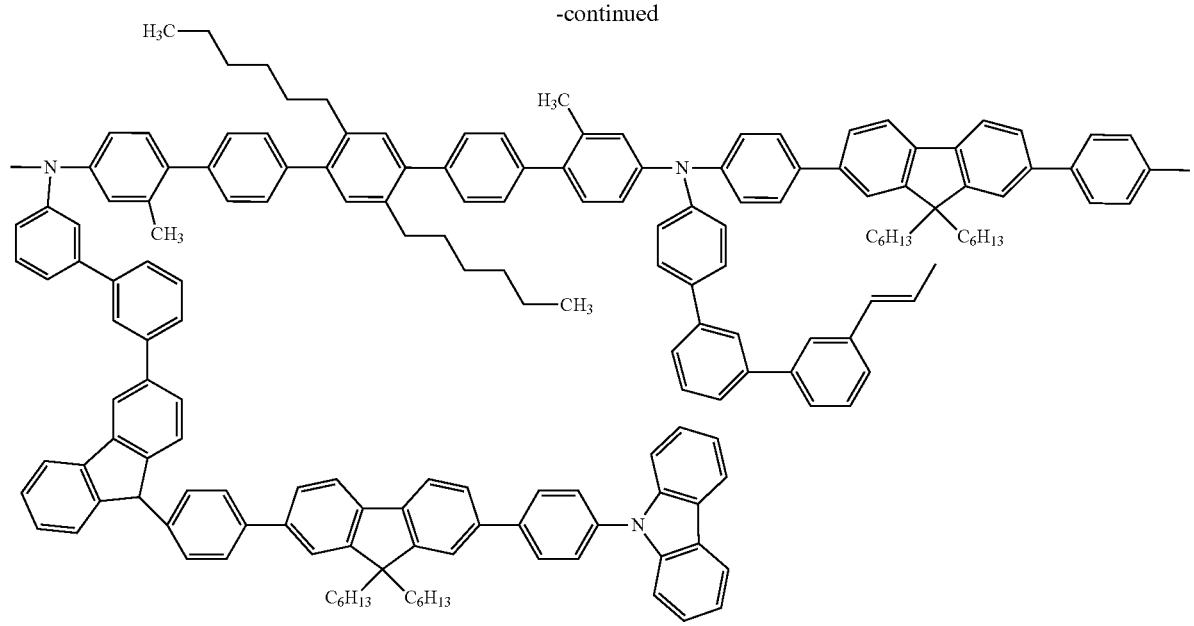

<Polymer According to Second Embodiment of Present Invention>
(Polymer Having Structure Represented by Formula (11) as Side Chain>

The polymer according to a second embodiment of the present invention is, for example, a polymer having a structure represented by the following Formula (11) as a side chain. In the structure represented by Formula (11), LUMO is distributed in an aromatic hydrocarbon group or an aromatic heterocyclic group between the nitrogen atoms of two carbazole structures, whereby the durability against electrons and excitons is believed to be improved.

From the above, the polymer of the present embodiment can exert a high effect when used in a layer adjacent to a light-emitting layer on the side of an anode.

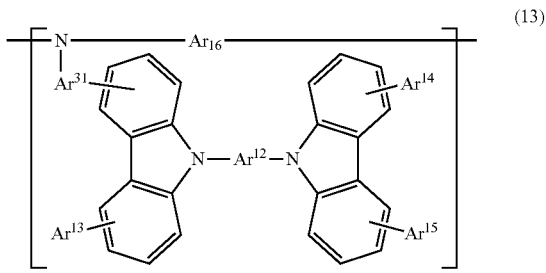

(11)

(wherein,
$Ar^{31}$ represents a divalent group linked with a main chain;
$Ar^{12}$ represents a divalent aromatic hydrocarbon group optionally having a substituent, or a divalent aromatic heterocyclic group optionally having a substituent;
$Ar^{13}$ to $Ar^{15}$ each independently represent a hydrogen atom or a substituent; and
* represents a position of binding with an atom constituting the main chain).

$Ar^{31}$ represents a divalent group linked with the main chain. $Ar^{31}$ is not particularly restricted; however, $Ar^{31}$ is preferably the same as $Ar^{11}$ of Formula (10), and its preferred range, optional substituent and the like are also the same. $Ar^{12}$ to $Ar^{15}$ are the same as $Ar^{12}$ to $Ar^{15}$ of Formula (10), and their preferred ranges, optional substituents and the like are also the same.

The above-described polymer having the structure represented by Formula (11) as a side chain is preferably a polymer having a structure represented by the following Formula (13).

(13)

(wherein,
$Ar^{12}$ to $Ar^{15}$ and $Ar^{31}$ are each the same as in Formula (11); and
$Ar^{16}$ represents a structure constituting the main chain of the polymer).

$(Ar^{16})$
$Ar^{16}$ is preferably the same as $Ar^4$ of Formula (4), more preferably the same as Formula (5).

<Other>
Preferred modes and the like that are common to the first and the second embodiments will now be described.

[Soluble Group]
The polymers according to the first and the second embodiments of the present invention preferably have a soluble group for exhibiting a solubility in a solvent. The soluble group in the present invention is a group containing a linear or branched alkyl or alkylene group, which has 3 to 24 carbon atoms, preferably not more than 12 carbon atoms. Among such groups, the soluble group is preferably an alkyl group, an alkoxy group or an aralkyl group, for example, an n-propyl group, a 2-propyl group, an n-butyl group, or an isobutyl group. The soluble group is more preferably an n-hexyl group or an n-octyl group. The soluble group optionally has a substituent.
(Number of Soluble Groups)

From the standpoint of the ease of obtaining a polymer solution that can be used in a wet film-forming method, the greater the number of soluble groups in the respective polymers of the present embodiments, the more preferred it is. On the other hand, from the standpoint of limiting a reduction in the film thickness, which is caused by dissolution of the resulting layer that occurs when another layer is formed thereon by a wet film-forming method, the smaller the number of soluble groups, the more preferred it is.

The number of soluble groups in the respective polymers of the present embodiments can be expressed in terms of the number of moles per 1 g of each polymer.

When the number of soluble groups in the respective polymers of the present embodiments is expressed in terms of the number of moles per 1 g of each polymer, the value thereof is usually 4.0 mmol or less, preferably 3.0 mmol or less, more preferably 2.0 mmol or less, but usually 0.1 mmol or more, preferably 0.5 mmol or more, per 1 g of each polymer.

With the number of soluble groups being in this range, the polymer easily dissolves in a solvent, so that a composition containing the polymer that is suitable for a wet film-forming method is easily obtained. In addition, since the density of soluble groups is moderate, the polymer is sufficiently insoluble in organic solvents after being heated and dried, so that a multilayer laminate structure can be formed by a wet film-forming method.

The number of soluble groups per 1 g of each polymer can be calculated from the molar ratio and the structural formulae of the monomers used for the synthesis of the polymer, excluding the terminal groups of the polymer.

For example, in the case of the polymer 1 synthesized in the below-described Example 1-1, the average molecular weight of the repeating units in the polymer 1 excluding the terminal groups is 650, and the average number of soluble groups per repeating unit is 1. Based on a simple proportional calculation, the number of soluble groups per molecular weight of 1 g is calculated to be 1.54 mmol.

[Crosslinkable Group]

The polymers according to the first and the second embodiments of the present invention may have a crosslinkable group. In the polymers of these embodiments, the crosslinkable group may exist in the repeating unit represented by Formula (1), or in a repeating unit other than the repeating unit represented by Formula (1). Particularly, the polymers preferably have the crosslinkable group in $Ar^1$, which is a side chain, since this facilitates the progress of a crosslinking reaction.

By allowing the polymers to have a crosslinkable group, the solubility in organic solvents can be made largely different before and after a reaction caused by irradiation with heat and/or an active energy ray (insolubilization reaction).

The term "crosslinkable group" used herein refers to a group which, upon being irradiated with heat and/or an active energy ray, reacts with a group constituting other molecule located near the crosslinkable group to generate a new chemical bond. In this case, the group with which the crosslinkable group reacts may be the same as or different from the crosslinkable group.

The crosslinkable group is preferably a group that contains a cyclobutene ring condensed with an aromatic ring and an alkenyl group bound to the aromatic ring, more preferably a group selected from the following crosslinkable groups T.

The crosslinkable group preferably further substitutes a substituent of any of the above-described structures.
(Crosslinkable Groups T)

The crosslinkable groups T are the following structures.

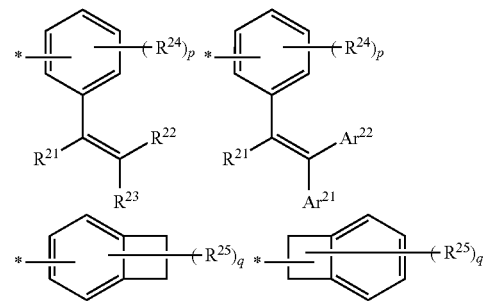

Polymer 1

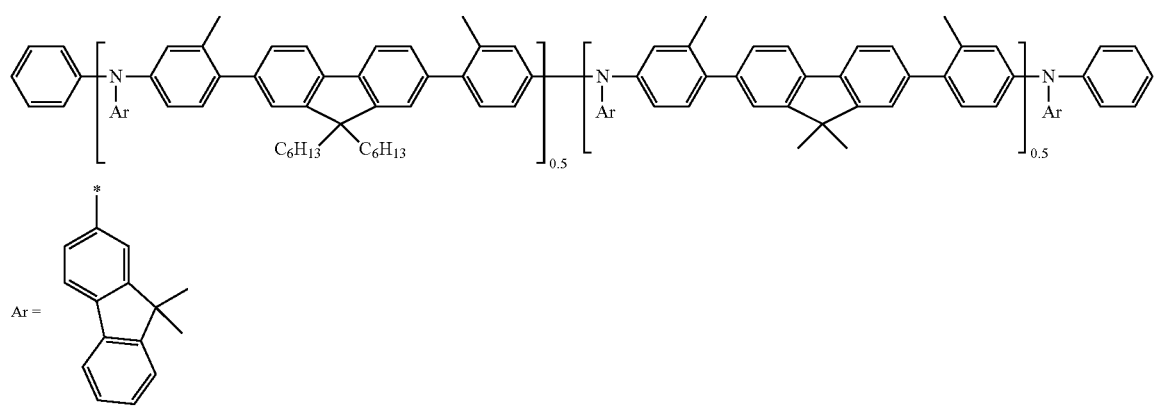

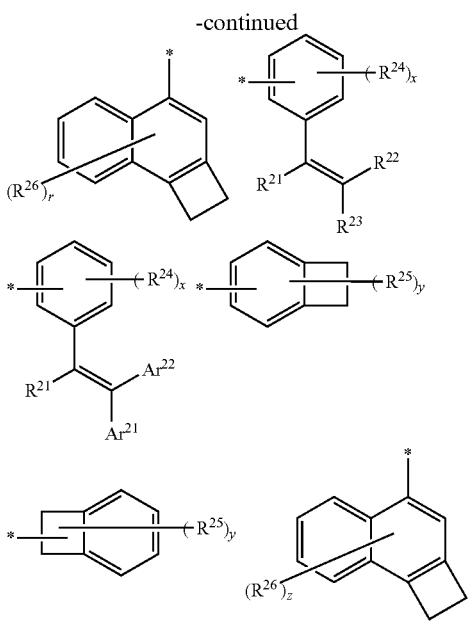

In the crosslinkable groups T, $R^{21}$ to $R^{23}$ each independently represent a hydrogen atom or an alkyl group; $R^{24}$ to $R^{26}$ each independently represent a hydrogen atom, an alkyl group, or an alkoxy group; x represents an integer of 1 to 4; y represents an integer of 1 to 5; and z represents an integer of 1 to 7.

When x is 2 or larger, plural $R^{24}$s may be the same or different, and adjacent $R^{24}$s may be bound with each other to form a ring.

When y is 2 or larger, plural $R^{25}$s may be the same or different, and adjacent $R^{25}$s may be bound with each other to form a ring.

When z is 2 or larger, plural $R^{26}$s may be the same or different.

$Ar^{21}$ and $Ar^{22}$ each represent an aromatic hydrocarbon group or an aromatic heterocyclic group, which optionally has a substituent.

The alkyl group represented by $R^{21}$ to $R^{26}$ is, for example, a linear or branched chain alkyl group having not more than 8 carbon atoms, preferably not more than 6 carbon atoms. Examples of the alkyl group include a methyl group, an ethyl group, an n-propyl group, a 2-propyl group, an n-butyl group, and an isobutyl group. The alkyl group is more preferably a methyl group or an ethyl group. When $R^{21}$ to $R^{26}$ each have 8 or less, preferably 6 or less carbon atoms, the crosslinking reaction is not sterically hindered, and the resulting film tends to be easily insolubilized.

The alkoxy group represented by $R^{24}$ to $R^{26}$ is, for example, a linear or branched chain alkoxy group having not more than 8 carbon atoms, preferably not more than 6 carbon atoms. Examples of the alkoxy group include a methoxy group, an ethoxy group, an n-propoxy group, a 2-propoxy group, and an n-butoxy group. The alkoxy group is more preferably a methoxy group or an ethoxy group. When $R^{24}$ to $R^{26}$ each have 8 or less, preferably 6 or less carbon atoms, the crosslinking reaction is not sterically hindered, and the resulting film tends to be easily insolubilized.

Examples of the aromatic hydrocarbon group represented by $Ar^{21}$ and $Ar^{22}$ which optionally has a substituent include 6-membered monocyclic or 2- to 5-fused-ring groups having one free valence, such as a benzene ring and a naphthalene ring. The aromatic hydrocarbon group is particularly preferably a benzene ring having one free valence.

$Ar^{22}$ may be a group formed by two or more aromatic hydrocarbon groups optionally having a substituent that are bound together. Examples of such a group include a biphenylene group and a terphenylene group, and a 4,4'-biphenylene group is preferred.

Substituents that may be taken by $Ar^{21}$ and $Ar^{22}$ are the same as the above-described substituents Z.

As the crosslinkable group, from the standpoint of further improving the electrochemical stability of an element, a group that undergoes a cycloaddition reaction, such as a cinnamoyl group (e.g., an arylvinyl carbonyl group), a benzocyclobutene ring having one free valence or a 1,2-dihydrocyclobuta[a]naphthalene ring having one free valence, is preferred.

Among the above-described crosslinkable group, from the standpoint of attaining a particularly stable crosslinked structure, groups that contain a cyclobutene ring condensed with an aromatic ring having one free valence or a 1,2-dihydrocyclobuta[a]naphthalene ring having one free valence are preferred and, thereamong, a benzocyclobutene ring and a 1,2-dihydrocyclobuta[a]naphthalene ring having one free valence are more preferred, and a 1,2-dihydrocyclobuta[a]naphthalene ring having one free valence is particularly preferred because of its low crosslinking temperature.

(Number of Crosslinkable Groups)

From the standpoint of sufficiently insolubilizing the polymer by crosslinking and thereby making it easier to form another layer thereon by a wet film-forming method, the greater the number of crosslinkable group(s) in the respective polymers of the present embodiments, the more preferred it is. On the other hand, the number of crosslinkable group(s) is preferably small from the standpoints of making cracking of the resulting film less likely to occur, reducing the amount of residual unreacted crosslinkable group(s), and extending the life of an organic electroluminescent element.

In the respective polymers of the present embodiments, the number of crosslinkable group(s) in a single polymer chain is preferably 1 or larger, more preferably 2 or larger, but preferably 200 or less, more preferably 100 or less.

The number of crosslinkable group(s) in the respective polymers of the present embodiments can be expressed in terms of the number per polymer molecular weight of 1,000.

When the number of crosslinkable group(s) in the respective polymers of the present embodiments is expressed in terms of the number per polymer molecular weight of 1,000, the number of crosslinkable group(s) is usually 3.0 or less, preferably 2.0 or less, more preferably 1.0 or less, but usually 0.01 or more, preferably 0.05 or more, per molecular weight of 1,000.

With the number of crosslinkable group(s) being in this range, cracking and the like of the polymer hardly occurs, so that a flat film is likely to be formed. In addition, since the crosslinking density is moderate, the amount of unreacted crosslinkable group(s) remaining in the resulting layer after a crosslinking reaction is small, and has little effect on the life of an element to be obtained.

Moreover, since it makes the polymer sufficiently insoluble in organic solvents after the crosslinking reaction, a multilayer laminate structure can be easily formed by a wet film-forming method.

The number of crosslinkable group(s) per molecular weight of 1,000 can be calculated from the molar ratio and the structural formulae of the monomers used for the synthesis of the polymer, excluding the terminal groups of the polymer.

For example, in the case of the polymer 3 synthesized in the below-described Example, the average molecular weight of the repeating units in the polymer 3 excluding the terminal groups is 868, and the number of crosslinkable group per repeating unit is 0.114. Based on a simple proportional calculation, the number of crosslinkable group per molecular weight of 1,000 is calculated to be 0.132.

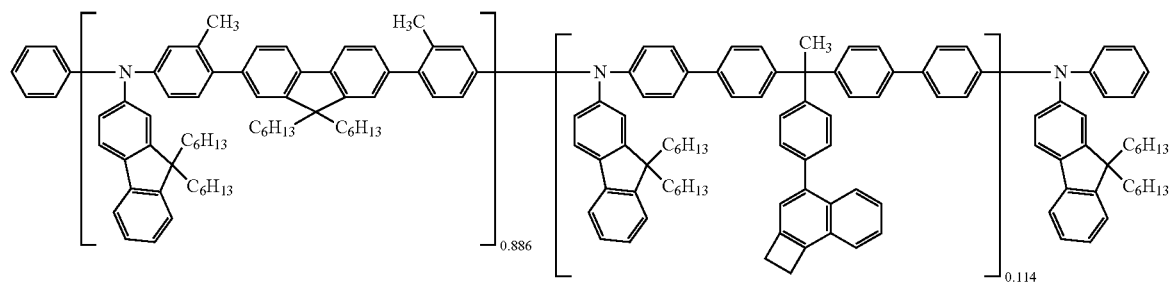

Polymer 3

Further, for example, in the case of the polymer 13 synthesized in the below-described Example, the average molecular weight of the repeating units in the polymer 13 excluding the terminal groups is 966.45, and the number of crosslinkable group(s) per repeating unit is 0.145. Based on a simple proportional calculation, the number of crosslinkable group(s) per molecular weight of 1,000 is calculated to be 0.15.

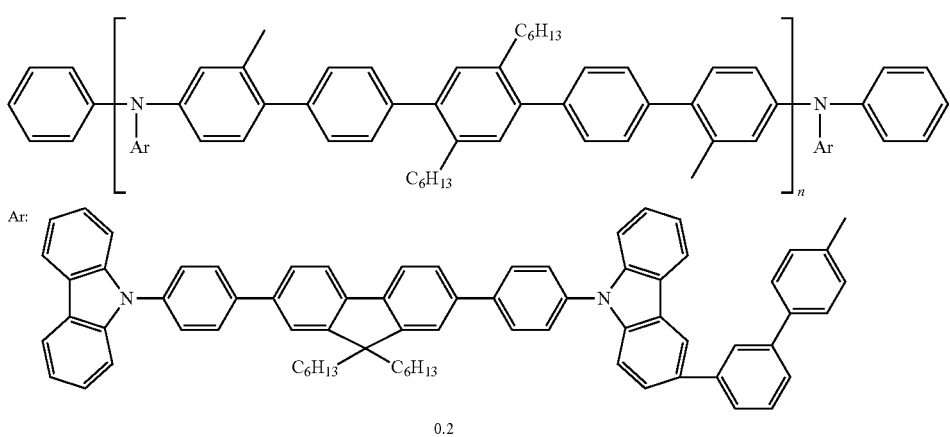

Polymer 13

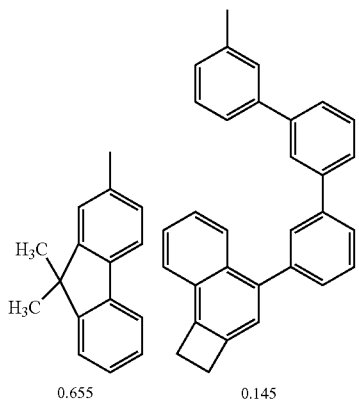

It is also preferred that the polymers according to the first and the second embodiments of the present invention have no crosslinkable group. Organic electroluminescent elements produced using the respective polymers of these embodiments that have no crosslinkable group tend to have an extended life.

The polymers of the present embodiments are insolubilized when made into a film by a wet film-forming method. In other words, the polymer of the present invention is insolubilized by dissolving it in a solvent to prepare a solution, applying this solution onto a substrate, removing the solvent, and then drying and baking the resultant by heating. Accordingly, when a hole transport layer is formed by a wet film-forming method using the polymer of the present invention, it is possible to continuously coat and form a light-emitting layer in contact with the hole transport layer in a laminated manner by a wet process. In this case, when the hole transport layer that is in contact with the light-emitting layer is composed of the polymer of the present invention that has no crosslinkable group, because of the absence of unreacted crosslinkable group, an intended reaction caused by an unreacted crosslinkable group does not take place during electrification and operation of the element to deteriorate a material. Therefore, the working life of the element is believed to be extended.

In addition, when each polymer of the present embodiments that has no crosslinkable group is used in combination with other polymer having no crosslinkable group, a thin film that is insoluble in solvents can be obtained. Therefore, the design range of a hole transport layer is expanded, making it easier to obtain a desired hole transport layer.

When each polymer of the present embodiments that has no crosslinkable group is used in combination with other polymer having no crosslinkable group, both of these polymers are dissolved in a solvent to prepare a solution, and this solution is applied onto a substrate, after which the solvent is removed and the resultant is dried and then baked by heating, whereby a thin film is formed.

In such a film formed from each polymer of the present embodiments that has no crosslinkable group and other polymer having no crosslinkable group, the content of the polymer of the present invention that has no crosslinkable group is not less than 10% by weight, preferably not less than 20% by weight, more preferably not less than 25% by weight, particularly preferably not less than 50% by weight, most preferably not less than 70% by weight. In order to obtain an effect of mixing the other polymer having no crosslinkable group, the content of the polymer of the present invention that has no crosslinkable group is 95% by weight or less, preferably 90% by weight or less, more preferably 85% by weight or less, particularly preferably 80% by weight or less. By controlling the content in this range, the resulting film is easily insolubilized, and the properties of the resulting element tend to be improved.

[Molecular Weight of Polymer]

The polymer of the present invention that contains the repeating unit represented by Formula (1) has a weight-average molecular weight of usually 3,000,000 or less, preferably 1,000,000 or less, more preferably 500,000 or less, still more preferably 200,000 or less, particularly preferably 100,000 or less, but usually 2,500 or higher, preferably 5,000 or higher, more preferably 10,000 or higher, still more preferably 20,000 or higher, particularly preferably 30,000 or higher.

When the weight-average molecular weight of the polymer is not higher than the above-described upper limit value, the polymer is soluble in solvents and tends to have excellent film-forming properties. Meanwhile, when the weight-average molecular weight of the polymer is not less than the above-described lower limit value, a reduction in the glass transition temperature, melting point and vaporization temperature of the polymer is inhibited, so that the heat resistance may be improved. In addition, after a crosslinking reaction, the resulting coating film may be sufficiently insoluble in organic solvents.

Further, the polymer of the present invention that contains the repeating unit represented by Formula (1) has a number-average molecular weight (Mn) of usually 2,500,000 or less, preferably 750,000 or less, more preferably 400,000 or less, particularly preferably 100,000 or less, but usually 2,000 or higher, preferably 4,000 or higher, more preferably 8,000 or higher, still more preferably 20,000 or higher.

Moreover, the polymer of the present invention that contains the repeating unit represented by Formula (1) has a degree of dispersion (Mw/Mn) of preferably 3.5 or lower, more preferably 2.5 or lower, particularly preferably 2.0 or lower. The lower the degree of dispersion, the more preferred it is, and the lower limit value is thus ideally 1. When the degree of dispersion of the polymer is not higher than the above-described upper limit value, the polymer is easy to purify and has good solubility in solvents as well as good charge transportability.

The polymer of the present invention that contains the repeating unit represented by Formula (2) has a weight-average molecular weight (Mw) of preferably 10,000 or higher, more preferably 20,000 or higher, still more preferably 40,000 or higher, but preferably 2,000,000 or less, more preferably 1,000,000 or less.

When this weight-average molecular weight is not higher than the above-described upper limit value, an increase in the molecular weight of impurities is inhibited, so that the polymer tends to be easily purified. Meanwhile, when the weight-average molecular weight is not less than the above-described lower limit value, a reduction in the glass transition temperature, melting point, vaporization temperature and the like is inhibited, so that the heat resistance tends to be improved.

Further, the polymer of the present invention that contains the repeating unit represented by Formula (2) has a number-average molecular weight (Mn) of preferably 1,000,000 or less, more preferably 800,000 or less, still more preferably 500,000 or less, but preferably 5,000 or higher, more preferably 10,000 or higher, still more preferably 20,000 or higher.

Moreover, the polymer of the present invention that contains the repeating unit represented by Formula (2) has a degree of dispersion (Mw/Mn) of preferably 3.5 or lower, more preferably 3 or lower, still more preferably 2.4 or lower, yet still more preferably 2.1 or lower, yet still more preferably 2 or lower, but preferably 1 or higher, more preferably 1.1 or higher, still more preferably 1.2 or higher. When the degree of dispersion is not higher than the above-described upper limit value, the polymer is easy to purify, and a reduction in the solubility in solvents and a reduction in the charge transportability tend to be inhibited.

The weight-average molecular weight and the number-average molecular weight of the polymer are usually determined by an SEC (size exclusion chromatography) analysis. In the SEC analysis, a component of a higher molecular weight has a shorter elution time, while a component of a lower molecular weight requires a longer elution time. Using a calibration curve determined from the elution time of a polystyrene (standard sample) having a known molecular weight, the elution time of a sample is converted into the molecular weight to calculate the weight-average molecular weight and the number-average molecular weight.

SPECIFIC EXAMPLES

Specific examples of the polymer of the present invention that contains the repeating unit represented by Formula (1) are shown below; however, the polymer of the present invention is not restricted thereto. In the following chemical formulae, each numerical value indicates the molar ratio of the corresponding repeating unit.

The following polymers may each be, for example, a random copolymer, an alternate copolymer, a block copolymer, or a graft copolymer, and are not restricted in terms of the sequence order of the monomers.

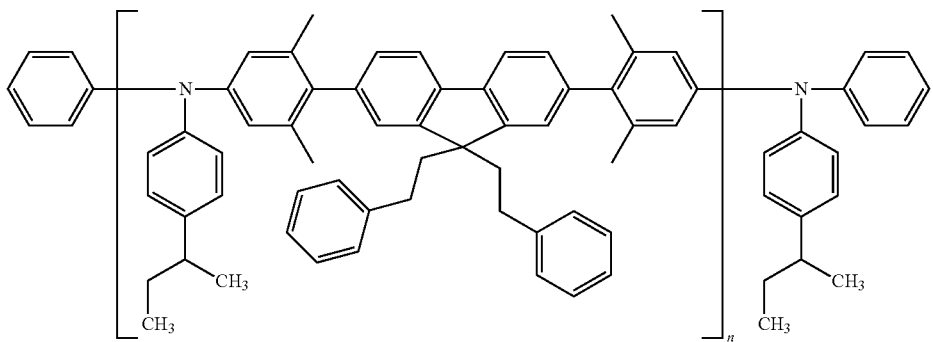

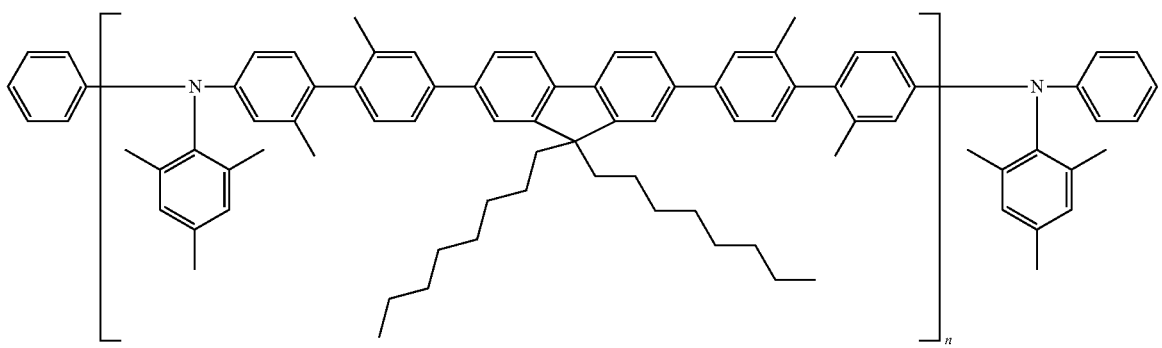

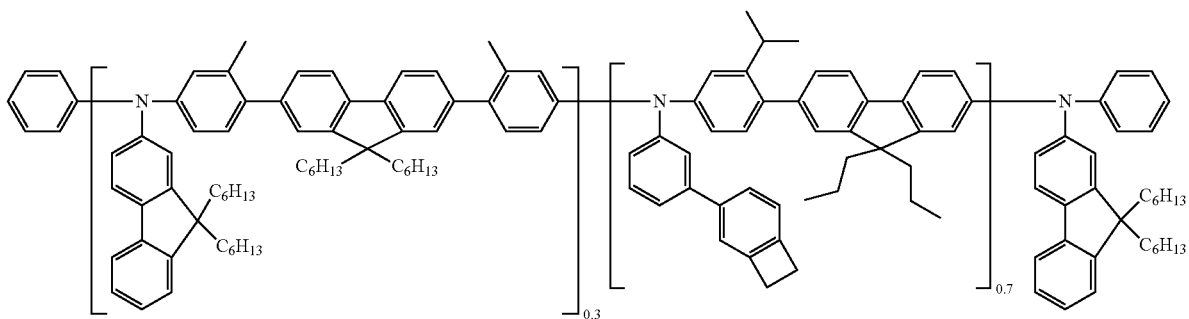

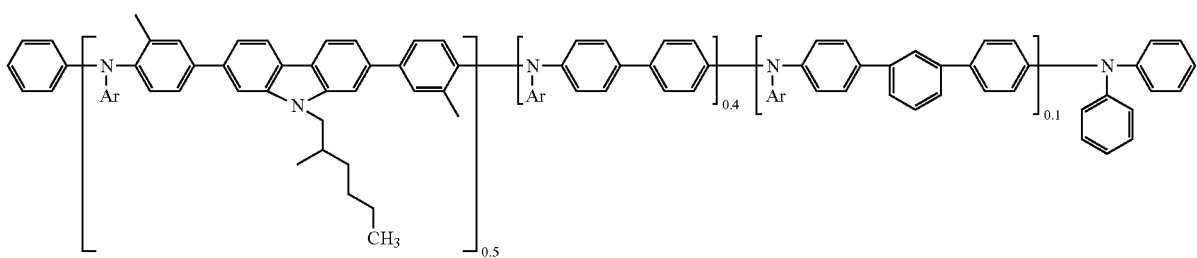

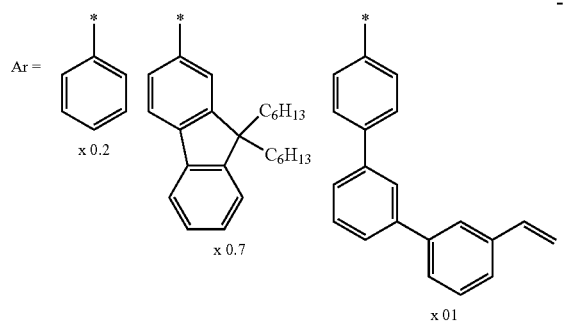

Specific examples of the polymer of the present invention that contains the repeating unit represented by Formula (2) and specific examples of the polymer of the present invention wherein Ar² of the repeating unit represented by Formula (2) has a structure represented by Formula (10) are shown below; however, the polymer of the present invention is not restricted thereto. In the following polymers, n and n' each represent the number of corresponding repeating units.

Further, each numerical value in the following chemical formulae indicates the molar ratio of the corresponding repeating unit.

The following polymers may each be, for example, a random copolymer, an alternate copolymer, a block copolymer, or a graft copolymer, and are not restricted in terms of the sequence order of the monomers.

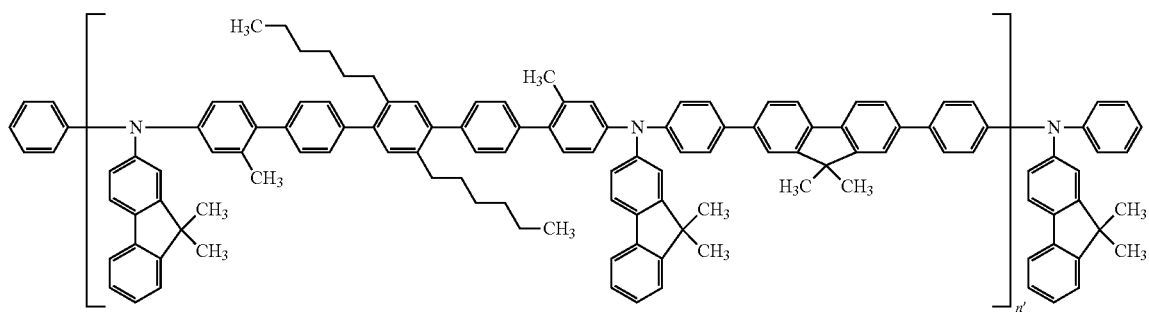

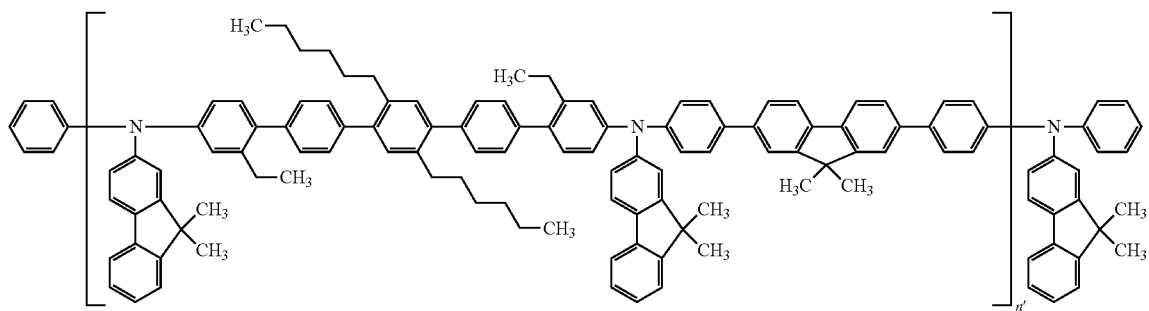

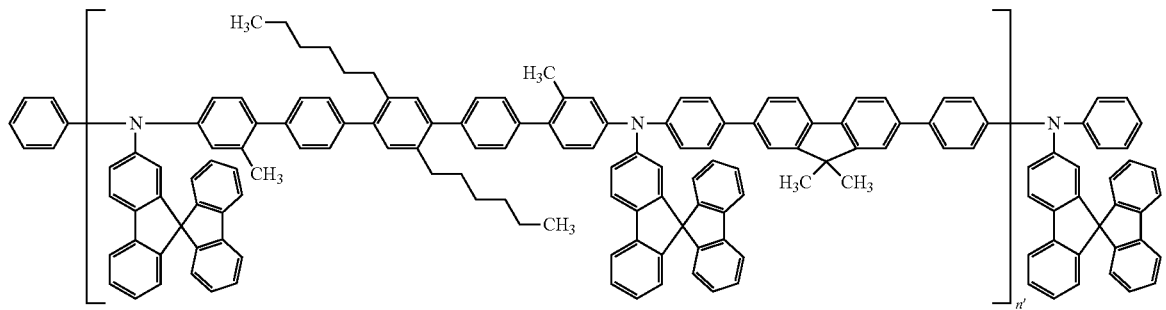

-continued
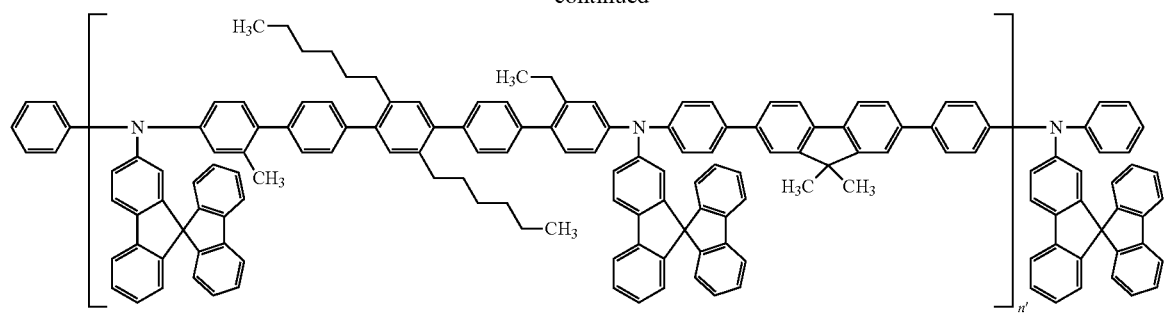
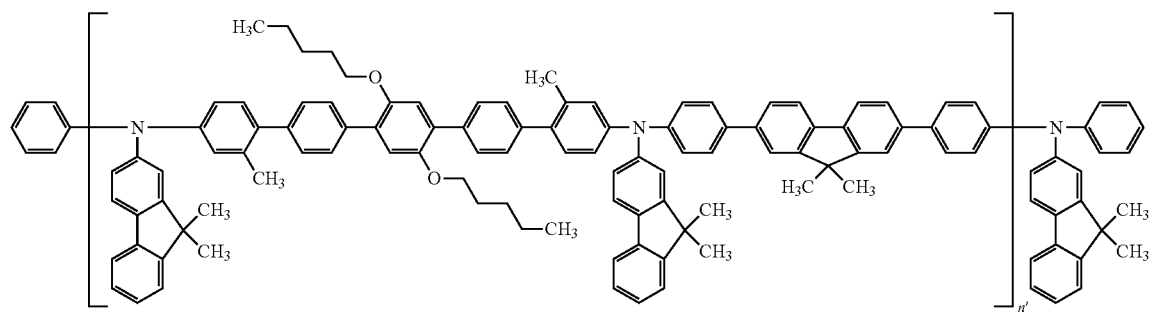
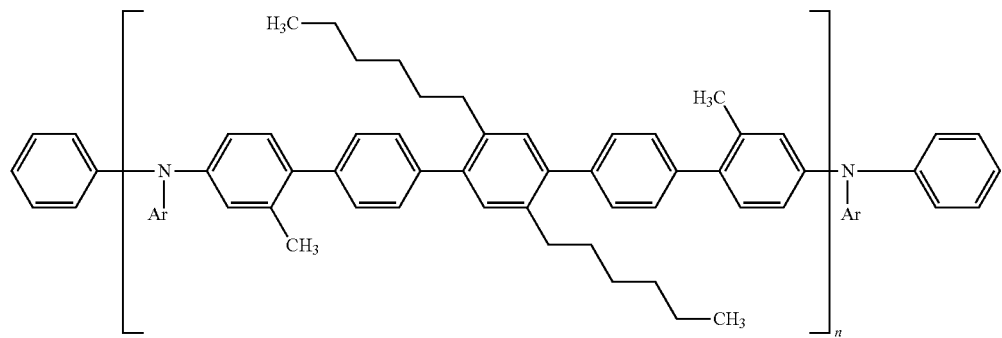
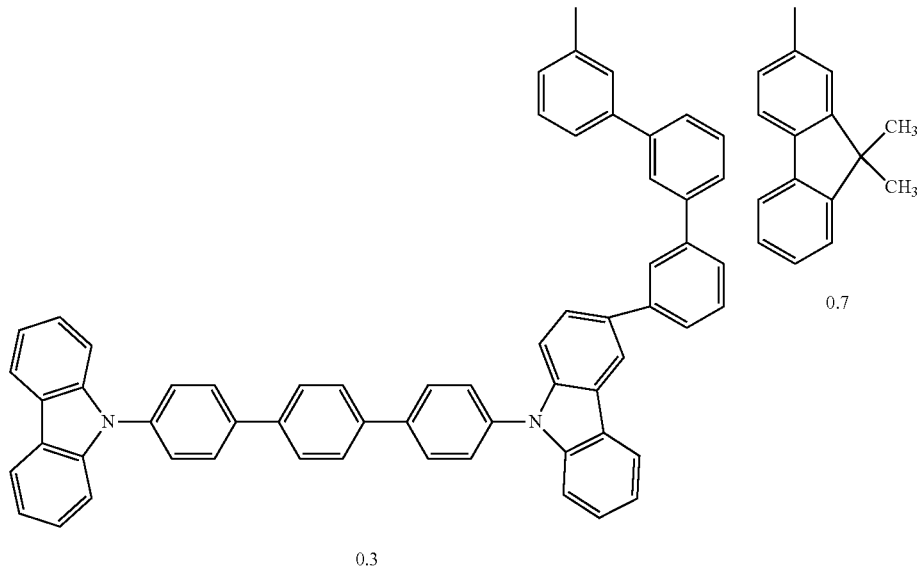

-continued
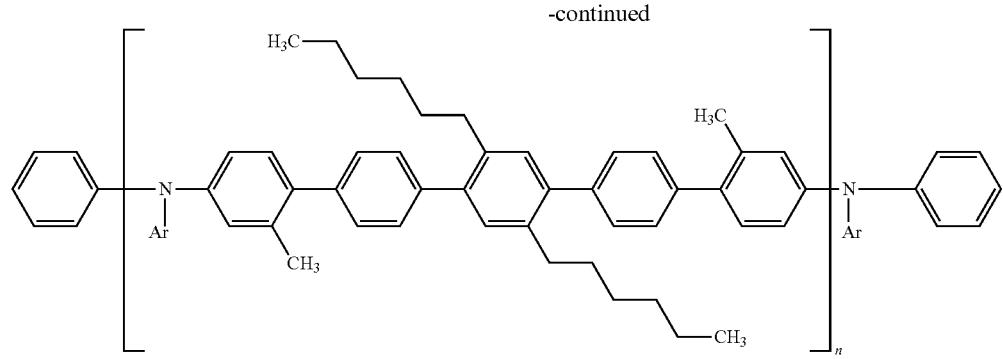
Ar:
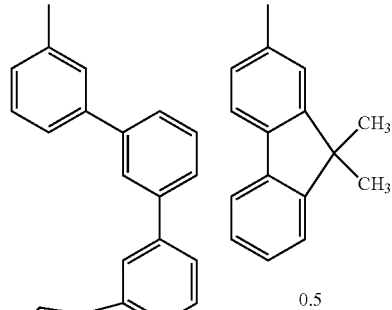
0.5
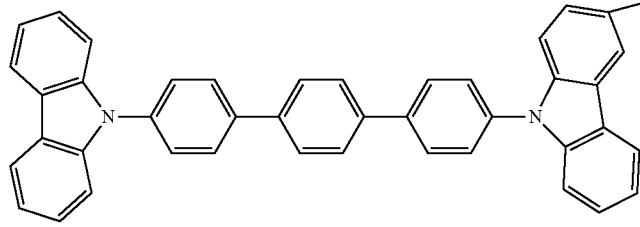
0.3
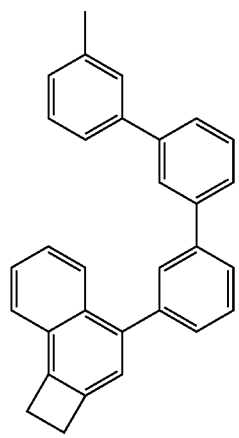
0.2
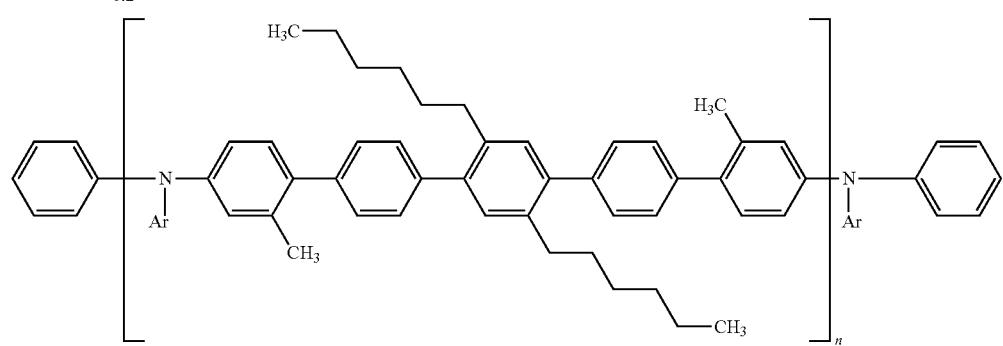

Ar:
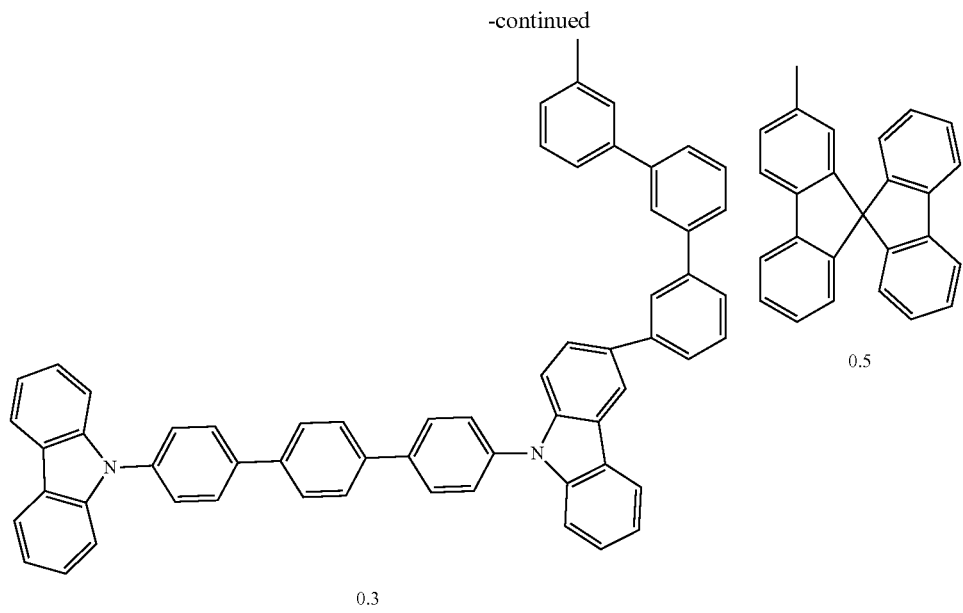
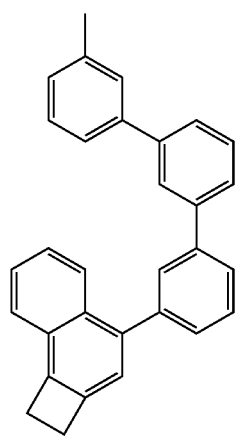
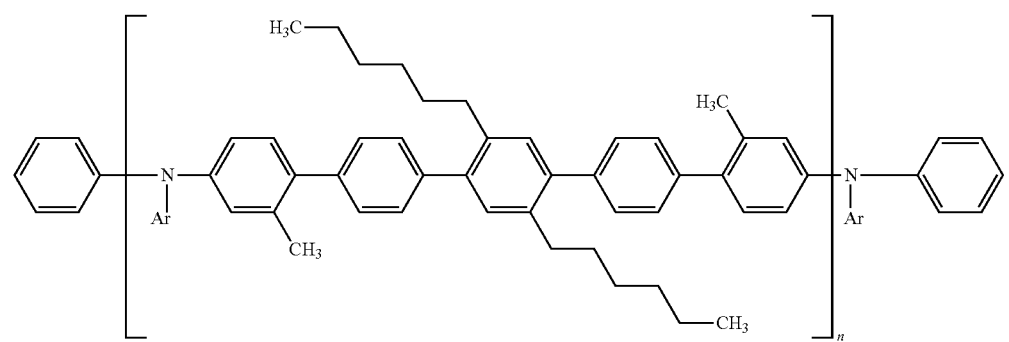

Ar:
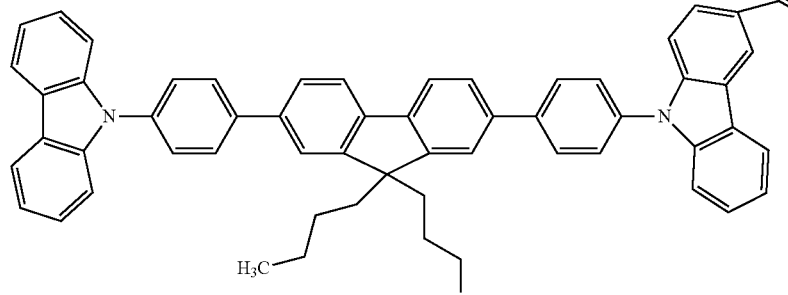
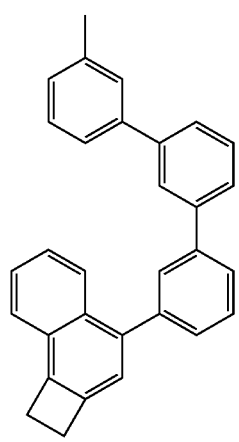
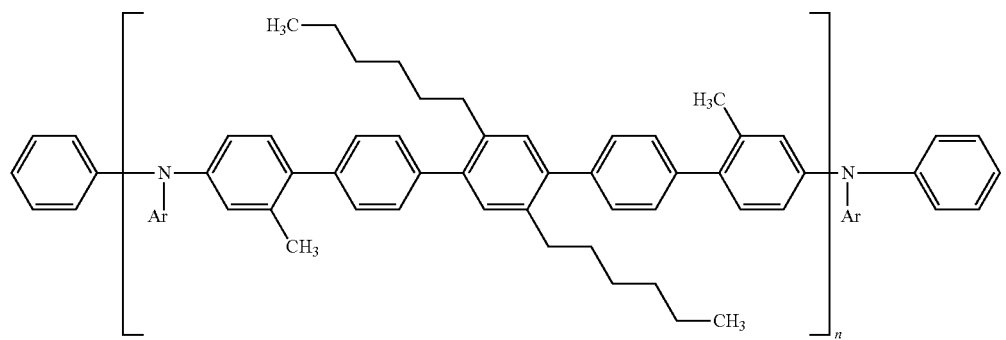

Ar:
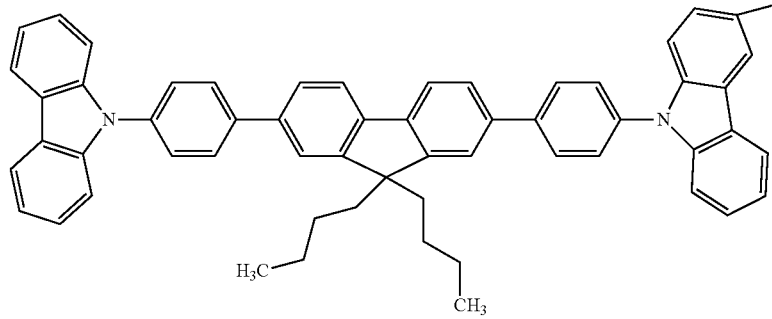
0.3
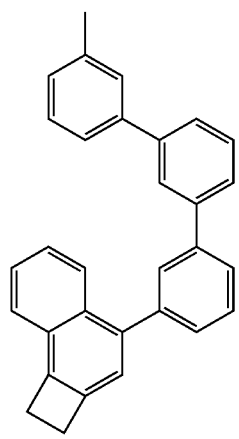
0.2
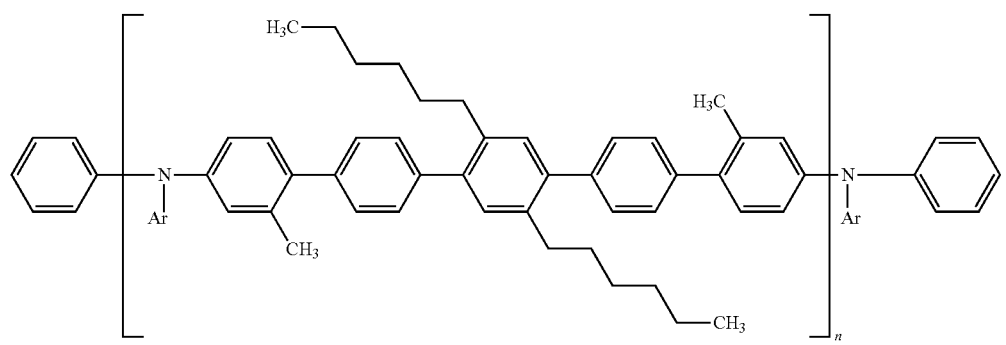

Ar:

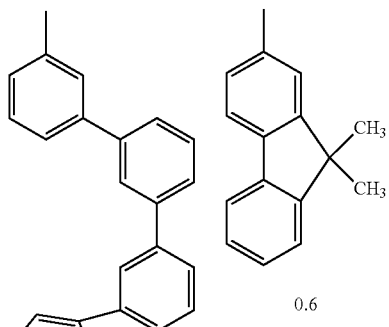

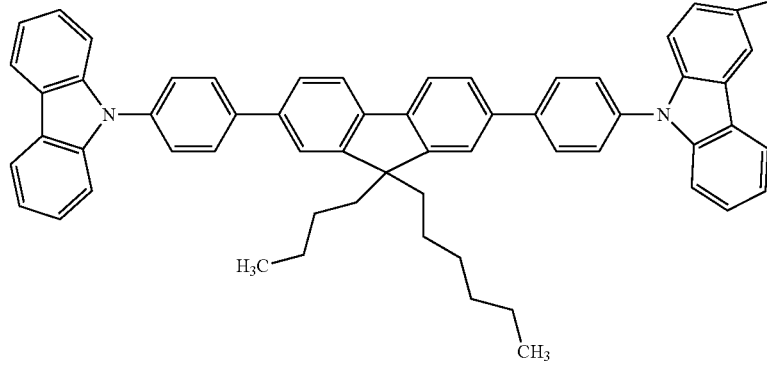

0.6

0.2

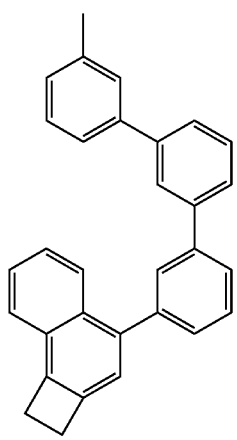

0.2

[Polymer Production Method]

A method of producing the polymer of the present embodiment is not particularly restricted, and any method may be employed as long as it yields the polymer of the present invention. The polymer of the present invention can be produced by, for example, a polymerization method based on the Suzuki reaction, a polymerization method based on the Grignard reaction, a polymerization method based on the Yamamoto reaction, a polymerization method based on the Ullmann reaction, or a polymerization method based on the Buchwald-Hartwig reaction.

In the cases of a polymerization method based on the Ullmann reaction and a polymerization method based on the Buchwald-Hartwig reaction, for example, the polymer of the present invention that contains the repeating unit represented by Formula (1) is synthesized by allowing a dihalogenated aryl represented by Formula (1a) (wherein, X represents a halogen atom such as I, Br, Cl, or F) and a primary aminoaryl represented by Formula (2b) to react with each other.

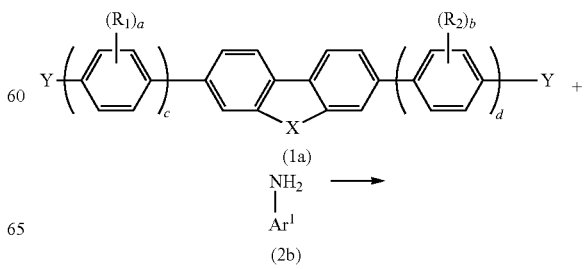

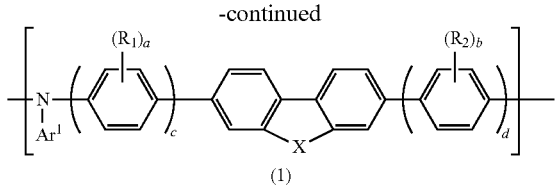

(1)

In the above formulae, Y represents a halogen atom, and $Ar^1$, $R^1$, $R^2$ and X are defined the same as in the above-described Formula (1).

Further, in the cases of a polymerization method based on the Ullmann reaction and a polymerization method based on the Buchwald-Hartwig reaction, for example, the polymer of the present embodiment that contains the repeating unit represented by Formula (2) is synthesized by allowing a dihalogenated aryl represented by Formula (2a) (wherein, X represents a halogen atom such as I, Br, Cl, or F) and a primary aminoaryl represented by Formula (2b) to react with each other.

When the polymer is used to form at least either one of a hole injection layer and a hole transport layer of an organic electroluminescent element, the content of the polymer in the hole injection layer or the hole transport layer is usually not less than 1% by mass and 100% by mass or less, preferably not less than 5% by mass and 100% by mass or less, more preferably not less than 10% by mass and 100% by mass or less. When the content of the polymer is in this range, the charge transportability of the hole injection layer or the hole transport layer is enhanced, so that the driving voltage is reduced and the working stability is improved, which is preferred.

When the content of the polymer in the hole injection layer or the hole transport layer is not 100% by mass, a component constituting the hole injection layer or the hole transport layer may be, for example, the below-described hole-transporting compound.

Further, from the standpoint of simply producing an organic electroluminescent element, the polymer is preferably used in an organic layer formed by a wet film-forming method.

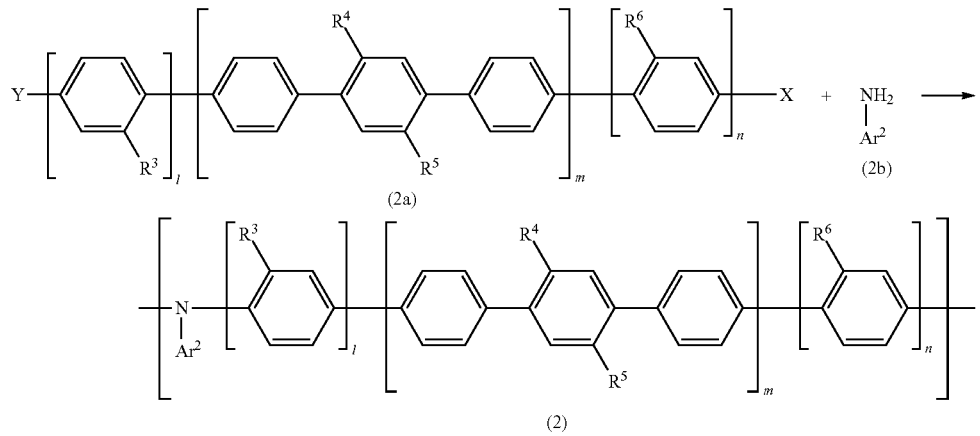

In the above formulae, $R^3$, $R^4$, $R^5$, $R^6$, and $Ar^2$ have the same meanings as in the above-described Formula (2).

In the above-described polymerization methods, the reaction that yields an N-aryl bond is usually performed in the presence of a base, such as potassium carbonate, tert-butoxy sodium, or triethylamine. This reaction can also be performed in the presence of a transition metal catalyst, such as copper or a palladium complex.

<Organic Electroluminescent Element Material>

The polymer according to one embodiment of the present invention can be particularly suitably used as an organic electroluminescent element material. In other words, the polymer is preferably used as an organic electroluminescent element material.

The polymer according to one embodiment of the present invention is usually incorporated between an anode and a light-emitting layer in an organic electroluminescent element. In other words, the polymer is preferably used as a material that constitutes at least either one of a hole injection layer and a hole transport layer, namely a charge transporting material.

When the polymer is used as a charge transporting material, the charge transporting material may contain a single kind of the polymer, or two or more kinds of the polymer in any combination at any ratio.

<Composition for Organic Electroluminescent Element>

The composition for an organic electroluminescent element according to one embodiment of the present invention contains the above-described polymer. In the composition for an organic electroluminescent element according to the present embodiment, the above-described polymer may be contained singly, or two or more kinds thereof may be contained in any combination at any ratio.

[Content of Polymer]

In the composition for an organic electroluminescent element according to the present embodiment, the content of the above-described polymer is usually not less than 0.01% by mass and 70% by mass or less, preferably not less than 0.1% by mass and 60% by mass or less, more preferably not less than 0.5% by mass and 50% by mass or less.

When the content of the above-described polymer is in this range, a defect and a thickness variation hardly occur in the resulting organic layer, which is preferred.

The composition for an organic electroluminescent element according to the present embodiment may contain a solvent and the like in addition to the above-described polymer.

[Solvent]

The composition for an organic electroluminescent element according to the present embodiment usually contains a solvent. This solvent is preferably one which dissolves the polymer of the present invention. Specifically, the solvent is preferably one which dissolves the polymer in an amount of usually not less than 0.05% by mass, preferably not less than 0.5% by mass, more preferably not less than 1% by mass, at room temperature.

Specific examples of the solvent include organic solvents, for example, aromatic solvents, such as toluene, xylene, mesitylene, and cyclohexylbenzene; halogen-containing solvents, such as 1,2-dichloroethane, chlorobenzene, and o-dichlorobenzene; ether-based solvents, such as aliphatic ethers (e.g., ethylene glycol dimethyl ether, ethylene glycol diethyl ether, and propylene glycol-1-monomethyl ether acetate (PGMEA)) and aromatic ethers (e.g., 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole); and ester-based solvents, such as aliphatic ester-based solvents (e.g., ethyl acetate, n-butyl acetate, ethyl lactate, and n-butyl lactate) and aromatic esters (e.g., phenyl acetate, phenyl propionate, methyl benzoate, ethyl benzoate, isopropyl benzoate, propyl benzoate, and n-butyl benzoate), as well as those organic solvents that are used in the below-described composition for the formation of hole injection layer and the below-described composition for the formation of hole transport layer.

These solvents may be used singly, or two or more thereof may be used in any combination at any ratio.

Thereamong, the solvent contained in the composition for an organic electroluminescent element according to the present embodiment is preferably one having a surface tension at 20° C. of usually less than 40 dyn/cm, preferably 36 dyn/cm or less, more preferably 33 dyn/cm or less.

When the composition for an organic electroluminescent element according to the present embodiment is used to form a coating film by a wet film-forming method and the above-described polymer is crosslinked to form an organic layer, the solvent preferably has a high affinity with an underlayer. This is because the uniformity of the resulting film greatly affects the uniformity and the stability of emission by an organic electroluminescent element. Accordingly, the composition for an organic electroluminescent element that is to be used in a wet film-forming method is required to have a low surface tension so that it can yield a uniform coating film with a high leveling property. The use of a solvent having such a low surface tension is thus preferred since it enables to form a uniform layer containing the above-described polymer, namely a uniform crosslinked layer.

Specific examples of the low-surface-tension solvent include: the above-mentioned aromatic solvents, such as toluene, xylene, mesitylene, and cyclohexylbenzene; ester-based solvents, such as ethyl benzoate; ether-based solvents, such as anisole; trifluoromethoxyanisole; pentafluoromethoxybenzene; 3-(trifluoromethyl)anisole; and ethyl (pentafluorobenzoate).

Further, the solvent contained in the composition for an organic electroluminescent element according to the present embodiment is preferably one having a vapor pressure at 25° C. of usually 10 mmHg or lower, preferably 5 mmHg or lower, but usually 0.1 mmHg or higher. The use of such a solvent makes it possible to prepare a composition for an organic electroluminescent element that is not only preferred for a process of producing an organic electroluminescent element by a wet film-forming method but also suited for the properties of the above-described polymer.

Specific examples of such a solvent include: the above-mentioned aromatic solvents, such as toluene, xylene, and metysilene; ether-based solvents; and ester-based solvents.

Incidentally, moisture can deteriorate the performance of an organic electroluminescent element and, particularly, may accelerate a reduction in the brightness during continuous operation. Therefore, in order to minimize the moisture remaining in the resulting wet-formed film, it is more preferred to use, among the above-described solvents, a solvent having a water solubility at 25° C. of preferably 1% by mass or less, more preferably 0.1% by mass or less.

In the composition for an organic electroluminescent element according to the present embodiment, the content of the solvent is usually not less than 10% by mass, preferably not less than 30% by mass, more preferably not less than 50% by mass, particularly preferably not less than 80% by mass. When the content of the solvent is not less than the above-described lower limit, the resulting layer can be provided with good flatness and good uniformity.

[Electron-Accepting Compound]

From the standpoint of reducing the resistance, the composition for an organic electroluminescent element according to the present embodiment preferably further contains an electron-accepting compound. Particularly, when the composition for an organic electroluminescent element according to the present embodiment is used for forming a hole injection layer, the composition preferably contains an electron-accepting compound.

As the electron-accepting compound, an oxidative compound capable of accepting an electron from the polymer of the present invention is preferred. Specifically, the electron-accepting compound is preferably a compound having an electron affinity of 4 eV or higher, more preferably a compound having an electron affinity of 5 eV or higher.

The electron-accepting compound is, for example, one or more compounds selected from the group consisting of triaryl boron compounds, halogenated metals, Lewis acids, organic acids, onium salts, salts of an arylamine and a halogenated metal, and salts of an arylamine and a Lewis acid.

Specific examples of the electron-accepting compound include onium salts substituted with an organic group, such as 4-isopropyl-4'-methyldiphenyliodonium tetrakis(pentafluorophenyl)borate and triphenylsulfonium tetrafluoroborate (WO 2005/089024 and WO 2017/164268); high-valence inorganic compounds, such as iron (III) chloride (Japanese Unexamined Patent Application Publication No. H11-251067) and ammonium peroxodisulfate; cyano compounds, such as tetracyanoethylene; aromatic boron compounds, such as tris(pentafluorophenyl)borane (Japanese Unexamined Patent Application Publication No. 2003-31365); fullerene derivatives; and iodine.

The composition for an organic electroluminescent element according to the present embodiment may contain any one of the above-described electron-accepting compounds singly, or two or more of the above-described electron-accepting compounds in any combination at any ratio.

When the composition for an organic electroluminescent element according to the present embodiment contains an electron-accepting compound, the content of the electron-accepting compound in the composition for an organic electroluminescent element according to the present invention is usually not less than 0.0005% by mass, preferably not less than 0.001% by mass, but usually 20% by mass or less, preferably 10% by mass or less. Further, the ratio of the electron-accepting compound with respect to the polymer of the present invention in the composition for an organic electroluminescent element is usually 0.5% by mass or higher, preferably 1% by mass or higher, more preferably 3% by mass or higher, but usually 80% by mass or lower, preferably 60% by mass or lower, still more preferably 40% by mass or lower.

The content of the electron-accepting compound in the composition for an organic electroluminescent element is preferably not less than the above-described lower limit since this allows an electron-accepting compound to accept an electron from the polymer and the resistance of the resulting organic layer is reduced, while the content of the electron-accepting compound is preferably not higher than the above-described upper limit since this makes a defect and a thickness variation unlikely to occur in the resulting organic layer.

[Cation Radical Compound]

The composition for an organic electroluminescent element according to the present embodiment may further contain a cation radical compound.

The cation radical compound is preferably an ionic compound composed of a cation radical, which is a chemical species formed by removing an electron from a hole-transporting compound, and a counter anion. It is noted here that, when the cation radical is derived from a hole-transporting polymer compound, the cation radical has a structure formed by removing an electron from a repeating unit of the polymer compound.

The cation radical is preferably a chemical species formed by removing a single electron from the below-described hole-transporting compound. From the standpoints of amorphousness, visible light transmittance, heat resistance, solubility and the like, the cation radical is suitably a chemical species formed by removing a single electron from a compound preferred as a hole-transporting compound.

The cation radical compound can be produced by mixing the below-described hole-transporting compound and the above-described electron-accepting compound. That is, mixing of the hole-transporting compound and the electron-accepting compound induces electron transfer from the hole-transporting compound to the electron-accepting compound, as a result of which a cationic compound composed of a cation radical of the hole-transporting compound and a counter anion is generated.

When the composition for an organic electroluminescent element according to the present embodiment contains a cation radical compound, the content of the cation radical compound in the composition for an organic electroluminescent element is usually 0.0005% by mass or higher, preferably 0.001% by mass or higher, but usually 40% by mass or less, preferably 20% by mass or less. The content of the cation radical compound is preferably not less than the above-described lower limit since the resistance of the resulting organic layer is thereby reduced, while the content of the cation radical compound is preferably not higher than the above-described upper limit since this makes a defect and a thickness variation unlikely to occur in the resulting organic layer.

In addition to the above-described components, the composition for an organic electroluminescent element according to the present embodiment may also contain components that are contained in the below-described composition for the formation of hole injection layer and the composition for the formation of hole transport layer in the below-described respective amounts.

<Materials of Light-Emitting Layer>

In an organic electroluminescent element in which the polymer according to one embodiment of the present invention is used as a charge transporting material constituting at least either one of a hole injection layer and a hole transport layer, a light-emitting layer contains a light-emitting material and a host material.

As the light-emitting material, a phosphorescent material or a fluorescent material can be used.

<Phosphorescent Layer>

In an organic electroluminescent element in which the polymer according to one embodiment of the present invention is used as a charge transporting material constituting at least either one of a hole injection layer and a hole transport layer, when a light-emitting layer is a phosphorescent layer, the following materials are preferred as a phosphorescent material.

<Phosphorescent Material>

The term "phosphorescent material" used herein refers to a material that emits light from an excited triplet state. Typical examples thereof include metal complex compounds containing Ir, Pt, Eu or the like, and the structure of the material preferably contains a metal complex.

Among metal complexes, examples of a phosphorescent organic metal complex that emits light through a triplet state include Werner-type complexes and organic metal complex compounds that contain, as a central metal, a metal selected from Groups 7 to 11 of the long-form Periodic Table (hereinafter, unless otherwise specified, "Periodic Table" refers to the long-form Periodic Table). As such a phosphorescent material, a compound represented by Formula (201) or a compound represented by Formula (205) is preferred, and a compound represented by Formula (201) is more preferred.

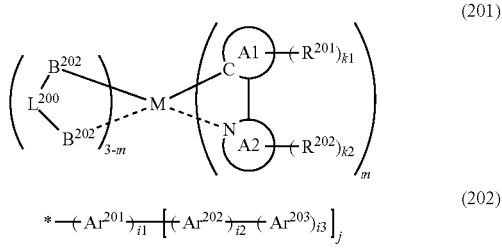

(201)

(202)

A ring A1 represents an aromatic hydrocarbon structure optionally having a substituent, or an aromatic heterocyclic structure optionally having a substituent.

A ring A2 represents an aromatic heterocyclic structure optionally having a substituent.

$R^{201}$ and $R^{202}$ each independently represent a structure represented by Formula (202), and * represents a bond formed with the ring A1 and/or the ring A2. $R^{201}$ and $R^{202}$ are optionally the same or different and, when there are plural $R^{201}$s and plural $R^{202}$s, the $R^{201}$s and the $R^{202}$s are each optionally the same or different.

$Ar^{201}$ and $Ar^{203}$ each independently represent an aromatic hydrocarbon structure optionally having a substituent, or an aromatic heterocyclic structure optionally having a substituent.

$Ar^{202}$ represents an aromatic hydrocarbon structure optionally having a substituent, an aromatic heterocyclic structure optionally having a substituent, or an aliphatic hydrocarbon structure optionally having a substituent.

Substituents bound to the ring A1, substituents bound to the ring A2, or a substituent bound to the ring A1 and a substituent bound to the ring A2, are optionally bound with each other to form a ring.

$B^{201}$-$L^{200}$-$B^{202}$ represents an anionic bidentate ligand. $B^{201}$ and $B^{202}$ each independently represent a carbon atom, an oxygen atom or a nitrogen atom, which optionally constitutes a ring. $L^{200}$ represents a single bond, or an atomic group constituting a bidentate ligand together with $B^{201}$ and $B^{202}$. When there are plural $B^{201}$-$L^{200}$-$B^{202}$ moieties, these moieties may be the same or different.

Further, i1 and i2 each independently represent an integer of 0 to 12;

i3 represents an integer of 0 or larger, with an upper limit thereof being the number of substituents that can be taken by $Ar^{202}$;

j represents an integer of 0 or larger, with an upper limit thereof being the number of substituents that can be taken by $Ar^{201}$;

k1 and k2 each independently represent an integer of 0 or larger, with an upper limit thereof being the number of substituents that can be taken by the ring A1 and the ring A2, respectively; and m represents an integer of 1 to 3.

Unless otherwise specified, the substituents are preferably selected from the following substituents Z'.

<Substituents Z'>
- alkyl groups, preferably alkyl groups having 1 to 20 carbon atoms, more preferably alkyl groups having 1 to 12 carbon atoms, still more preferably alkyl groups having 1 to 8 carbon atoms, particularly preferably alkyl groups having 1 to 6 carbon atoms
- alkoxy groups, preferably alkoxy groups having 1 to 20 carbon atoms, more preferably alkoxy groups having 1 to 12 carbon atoms, still more preferably alkoxy groups having 1 to 6 carbon atoms
- aryloxy groups, preferably aryloxy groups having 6 to 20 carbon atoms, more preferably aryloxy groups having 6 to 14 carbon atoms, still more preferably aryloxy groups having 6 to 12 carbon atoms, particularly preferably aryloxy groups having 6 carbon atoms
- heteroaryloxy groups, preferably heteroaryloxy groups having 3 to 20 carbon atoms, more preferably heteroaryloxy groups having 3 to 12 carbon atoms
- alkylamino groups, preferably alkylamino groups having 1 to 20 carbon atoms, more preferably alkylamino groups having 1 to 12 carbon atoms
- arylamino groups, preferably arylamino groups having 6 to 36 carbon atoms, more preferably arylamino groups having 6 to 24 carbon atoms
- aralkyl groups, preferably aralkyl groups having 7 to 40 carbon atoms, more preferably aralkyl groups having 7 to 18 carbon atoms, still more preferably aralkyl groups having 7 to 12 carbon atoms
- heteroaralkyl groups, preferably heteroaralkyl groups having 7 to 40 carbon atoms, more preferably heteroaralkyl groups having 7 to 18 carbon atoms
- alkenyl groups, preferably alkenyl groups having 2 to 20 carbon atoms, more preferably alkenyl groups having 2 to 12 carbon atoms, still more preferably alkenyl groups having 2 to 8 carbon atoms, particularly preferably alkenyl groups having 2 to 6 carbon atoms
- alkynyl groups, preferably alkynyl groups having 2 to 20 carbon atoms, more preferably alkynyl groups having 2 to 12 carbon atoms
- aryl groups, preferably aryl groups having 6 to 30 carbon atoms, more preferably aryl groups having 6 to 24 carbon atoms, still more preferably aryl groups having 6 to 18 carbon atoms, particularly preferably aryl groups having 6 to 14 carbon atoms
- heteroaryl groups, preferably heteroaryl groups having 3 to 30 carbon atoms, more preferably heteroaryl groups having 3 to 24 carbon atoms, still more preferably heteroaryl groups having 3 to 18 carbon atoms, particularly preferably heteroaryl groups having 3 to 14 carbon atoms
- alkylsilyl groups, preferably alkylsilyl groups whose alkyl groups have 1 to 20 carbon atoms, more preferably alkylsilyl groups whose alkyl groups have 1 to 12 carbon atoms
- arylsilyl groups, preferably arylsilyl groups whose aryl groups have 6 to 20 carbon atoms, more preferably arylsilyl groups whose alkyl groups have 6 to 14 carbon atoms
- alkylcarbonyl groups, preferably alkylcarbonyl groups having 2 to 20 carbon atoms
- arylcarbonyl groups, preferably arylcarbonyl groups having 7 to 20 carbon atoms In the above-described groups, one or more hydrogen atoms are optionally substituted with fluorine atoms or deuterium atoms.

Unless otherwise specified, "aryl" is an aromatic hydrocarbon, and "heteroaryl" is an aromatic heterocycle.

a hydrogen atom, a deuterium atom, a fluorine atom, a cyano group, and —$SF_5$.

(Preferred Groups in Substituents Z')

Among these substituents Z', alkyl groups, alkoxy group, an aryloxy group, an arylamino group, an aralkyl group, an alkenyl group, an aryl group, a heteroaryl group, an alkylsilyl group, an arylsilyl group, an and these groups in which one or more hydrogen atoms are substituted with fluorine atom(s), as well as a fluorine atom, a cyano group, and —$SF_5$ are preferred;

an alkyl group, an arylamino group, an aralkyl group, an alkenyl group, an aryl group, a heteroaryl group, an and these groups in which one or more hydrogen atoms are substituted with fluorine atom(s), as well as a fluorine atom, a cyano group, and —$SF_5$ are more preferred;

an alkyl group, an alkoxy group, an aryloxy group, an arylamino group, an aralkyl group, an alkenyl group, an aryl group, a heteroaryl group, an alkylsilyl group, an and arylsilyl groups are still more preferred;

an alkyl group, an arylamino group, an aralkyl group, an alkenyl group, an aryl group, and a heteroaryl group are particularly preferred; and an alkyl group, an arylamino group, an aralkyl group, an aryl group, an and a heteroaryl group are most preferred.

(Substituents Substituting Z')

These substituents Z' optionally further have a substituent selected from the substituents Z'. Preferred groups, more preferred groups, still more preferred groups, particularly preferred groups, and most preferred groups of the optional substituent are the same as those of the substituents Z'.

<Ring A1>

The ring A1 represents an aromatic hydrocarbon structure optionally having a substituent, or an aromatic heterocyclic structure optionally having a substituent.

(Aromatic Hydrocarbon)

The aromatic hydrocarbon of the ring A1 is preferably an aromatic hydrocarbon having 6 to 30 carbon atoms, specifically a benzene ring, a naphthalene ring, an anthracene ring, a triphenylenyl ring, an acenaphthene ring, a fluoranthene ring, or a fluorene ring.

(Aromatic Heterocycle)

The aromatic heterocycle of the ring A1 is preferably an aromatic heterocycle having 3 to 30 carbon atoms which contains any one of a nitrogen atom, an oxygen atom, and a sulfur atom as a hetero atom, more preferably a furan ring, a benzofuran ring, a thiophene ring, or a benzothiophene ring.

The ring A1 is still more preferably a benzene ring, a naphthalene ring, or a fluorene ring, particularly preferably a benzene ring or a fluorene ring, most preferably a benzene ring.

<Ring A2>

The ring A2 represents an aromatic heterocyclic structure optionally having a substituent.

(Aromatic Heterocycle)

The aromatic heterocycle of the ring A2 is preferably an aromatic heterocycle having 3 to 30 carbon atoms which contains any one of a nitrogen atom, an oxygen atom, and a sulfur atom as a hetero atom.

Specific examples of the aromatic heterocycle include a pyridine ring, a pyrimidine ring, a pyrazine ring, a triazine ring, an imidazole ring, an oxazole ring, a thiazole ring, a benzothiazole ring, a benzoxazole ring, a benzimidazole ring, a quinoline ring, an isoquinoline ring, a quinoxaline ring, a quinazoline ring, a naphthyridine ring, and a phenanthridine ring, and the aromatic heterocycle is more preferably a pyridine ring, a pyrazine ring, a pyrimidine ring, an imidazole ring, a benzothiazole ring, a benzoxazole ring, a quinoline ring, an isoquinoline ring, a quinoxaline ring, or a quinazoline ring, still more preferably a pyridine ring, an imidazole ring, a benzothiazole ring, a quinoline ring, an isoquinoline ring, a quinoxaline ring, or a quinazoline ring, most preferably a pyridine ring, an imidazole ring, a benzothiazole ring, a quinoline ring, a quinoxaline ring, or a quinazoline ring.

A preferred combination of the ring A1 and the ring A2, which is expressed as "(ring A1-ring A2)", is (benzene ring-pyridine ring), (benzene ring-quinoline ring), (benzene ring-quinoxaline ring), (benzene ring-quinazoline ring), (benzene ring-imidazole ring), or (benzene ring-benzothiazole ring).

(Substituents of Ring A1 and Ring A2)

The optional substituent of the ring A1 and that of the ring A2 can be selected arbitrarily; however, one or more selected from the above-described substituents Z' are preferred.

($Ar^{201}$ to $Ar^{203}$)

$Ar^{201}$ and $Ar^{203}$ each independently represent an aromatic hydrocarbon structure optionally having a substituent, or an aromatic heterocyclic structure optionally having a substituent.

$Ar^{202}$ represents an aromatic hydrocarbon structure optionally having a substituent, an aromatic heterocyclic structure optionally having a substituent, or an aliphatic hydrocarbon structure optionally having a substituent.

(Aromatic Hydrocarbon Rings of $Ar^{201}$, $Ar^{202}$ and $Ar^{203}$)

When any one of $Ar^{201}$, $Ar^{202}$ and $Ar^{203}$ is an aromatic hydrocarbon structure optionally having a substituent, the aromatic hydrocarbon structure is preferably an aromatic hydrocarbon ring having 6 to 30 carbon atoms, specifically a benzene ring, a naphthalene ring, an anthracene ring, a triphenylenyl ring, an acenaphthene ring, a fluoranthene ring, or a fluorene ring, more preferably a benzene ring, a naphthalene ring, or a fluorene ring, most preferably a benzene ring.

(9- and 9'-Positions of Fluorene)

When any one of $Ar^{201}$, $Ar^{202}$ and $Ar^{203}$ is a fluorene ring optionally having a substituent, it is preferred that the 9-position and the 9'-position of the fluorene ring each have a substituent or be bound with an adjacent structure.

(o- or m-phenylene)

When either of $Ar^{201}$ and $Ar^{202}$ is a benzene ring optionally having a substituent, it is preferred that at least one benzene ring be bound with an adjacent structure at the ortho-position or the meta-position, and it is more preferred that at least one benzene ring be bound with an adjacent structure at the meta-position.

(Aromatic Heterocycles of $Ar^{201}$, $Ar^{202}$ and $Ar^{203}$)

When any one of $Ar^{201}$, $Ar^{202}$ and $Ar^{203}$ is an aromatic heterocyclic structure optionally having a substituent, the aromatic heterocyclic structure is preferably an aromatic heterocycle having 3 to 30 carbon atoms which contains any one of a nitrogen atom, an oxygen atom, and a sulfur atom as a hetero atom.

Specific examples of the aromatic heterocyclic structure include a pyridine ring, a pyrimidine ring, a pyrazine ring, a triazine ring, an imidazole ring, an oxazole ring, a thiazole ring, a benzothiazole ring, a benzoxazole ring, a benzimidazole ring, a quinoline ring, an isoquinoline ring, a quinoxaline ring, a quinazoline ring, a naphthyridine ring, a phenanthridine ring, a carbazole ring, a dibenzofuran ring, and a dibenzothiophene ring, and the aromatic heterocyclic structure is more preferably a pyridine ring, a pyrimidine ring, a triazine ring, a carbazole ring, a dibenzofuran ring, or a dibenzothiophene ring.

(N-Position of Carbazole Ring)

When any one of $Ar^{201}$, $Ar^{202}$ and $Ar^{203}$ is a carbazole ring optionally having a substituent, it is preferred that the N-position of the carbazole ring have a substituent or be bound with an adjacent structure.

(Aliphatic Hydrocarbon)

When $Ar^{202}$ is an aliphatic hydrocarbon structure optionally having a substituent, the aliphatic hydrocarbon structure has a linear, branched or cyclic structure, and the number of carbon atoms thereof is:

preferably 1 to 24, more preferably 1 to 12, still more preferably 1 to 8.

(Preferred Ranges of i1 and i2 (Phenylene, Aralkyl, or Alkyl))

The i1 represents an integer of 0 to 12, preferably 1 to 12, more preferably 1 to 8, still more preferably 1 to 6. When the i1 is in this range, the solubility and the charge transportability are expected to be improved.

The i2 represents an integer of 0 to 12, preferably 1 to 12, more preferably 1 to 8, still more preferably 1 to 6. When the i2 is in this range, the solubility and the charge transportability are expected to be improved.
(Preferred Range of i3 (Terminal))
The i3 represents an integer of preferably 0 to 5, more preferably 0 to 2, still more preferably 0 or 1.
(Preferred Range of j (Substituent on Phenylene End))
The j represents an integer of preferably 0 to 2, more preferably 0 or 1.
(Preferred Ranges of k1 and k2 (Substituents of Rings A1 and A2))
The k1 and k2 each represent an integer of preferably 0 to 3, more preferably 1 to 3, still more preferably 1 or 2, particularly preferably 1.
(Preferred Substituents of $Ar^{201}$, $Ar^{202}$ and $Ar^{203}$)
The optional substituents of $Ar^{201}$, $Ar^{202}$ and $Ar^{203}$ can be selected arbitrarily; however, one or more selected from the above-described substituents Z are preferred, and preferred groups thereof are the same as those of the substituents Z. The optional substituents are each more preferably a hydrogen atom, an alkyl group or an aryl group, particularly preferably a hydrogen atom or an alkyl group, and it is most preferred that $Ar^{201}$, $Ar^{202}$ and $Ar^{203}$ be unsubstituted (the substituents are hydrogen atoms).
(Preferred Structure of Formula (201))
Among those structures represented by Formula (202), a material having the following structure is preferred.
(Phenylene Linked System)
Structure having a group in which benzene rings are linked
That is, $Ar^{201}$ is a benzene ring structure; i1 is 1 to 6; and at least one of the benzene rings is bound with its adjacent structure at the ortho-position or the meta-position.
By adopting this structure, the solubility and the charge transportability are expected to be improved.
((Phenylene)-Aralkyl(Alkyl))
Structure having an aromatic hydrocarbon group or an aromatic heterocyclic group, to which an alkyl group or an aralkyl group is bound, on the ring A1 or the ring A2
That is,
$Ar^{201}$ is an aromatic hydrocarbon structure or an aromatic heterocyclic structure, and i1 is 1 to 6;
$Ar^{202}$ is an aliphatic hydrocarbon structure, and i2 is 1 to 12, preferably 3 to 8; and
$Ar^{203}$ is a benzene ring structure, and i3 is 0 or 1.
$Ar^{201}$ is preferably the above-described aromatic hydrocarbon structure, more preferably a structure in which one to five benzene rings are linked together, more preferably a single benzene ring.

By adopting this structure, the solubility and the charge transportability are expected to be improved.
(Dendron)
Structure in which a dendron is bound to the ring A1 or the ring A2.
For example, a structure in which $Ar^{201}$ and $Ar^{202}$ are each a benzene ring structure, $Ar^{203}$ is a biphenyl or terphenyl structure, i1 and i2 are 1 to 6, i3 is 2, and j is 2.
By adopting this structure, the solubility and the charge transportability are expected to be improved.
($B^{201}$-$L^{200}$-$B^{202}$)
$B^{201}$-$L^{200}$-$B^{202}$ represents an anionic bidentate ligand. $B^{201}$ and $B^{202}$ each independently represent a carbon atom, an oxygen atom or a nitrogen atom, which optionally constitutes a ring. $L^{200}$ represents a single bond, or an atomic group constituting a bidentate ligand together with $B^{201}$ and $B^{202}$. When there are plural $B^{201}$-$L^{200}$-$B^{202}$ moieties, these moieties may be the same or different.
Among those structures represented by $B^{201}$-$L^{200}$-$B^{202}$, structures represented by the following Formula (203) or (204) are preferred.

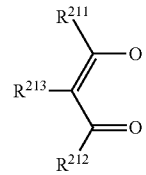

(203)

In Formula (203), $R^{211}$, $R^{212}$ and $R^{213}$ each represent a substituent.

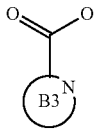

(204)

In Formula (204), a ring B3 represents a nitrogen atom-containing aromatic heterocyclic structure optionally having a substituent.
The ring B3 is preferably a pyridine ring.
The phosphorescent material represented by Formula (201) is not particularly restricted, and specific examples thereof include the following structures.

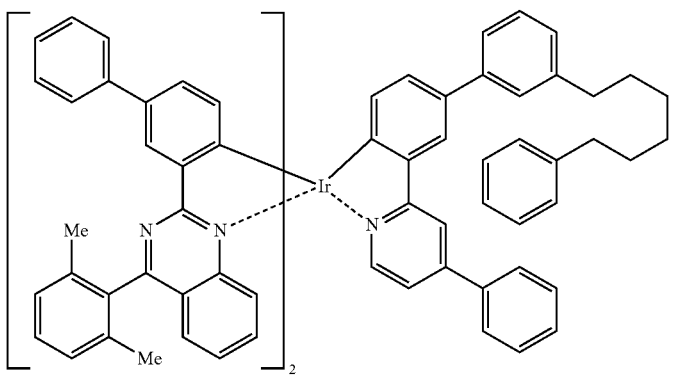

-continued
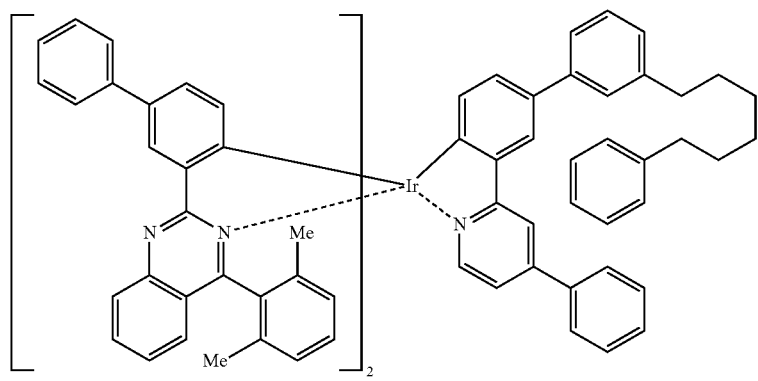
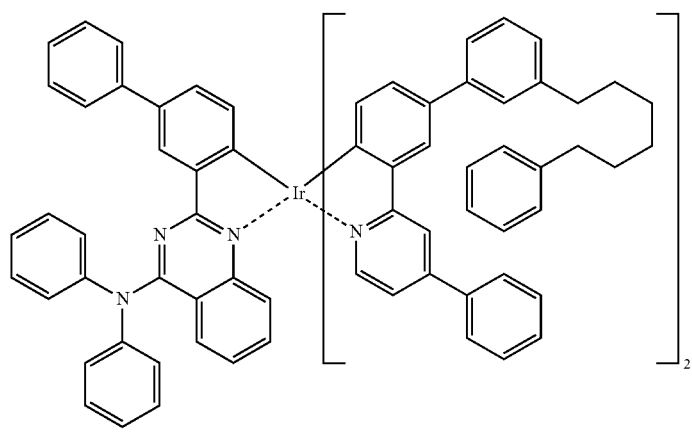
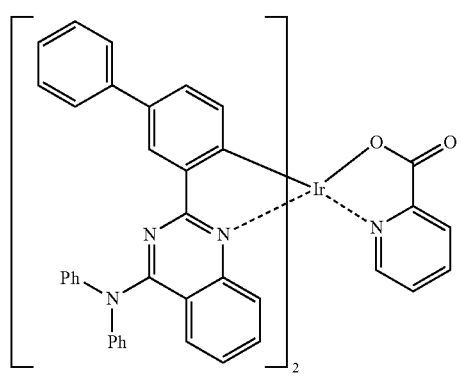
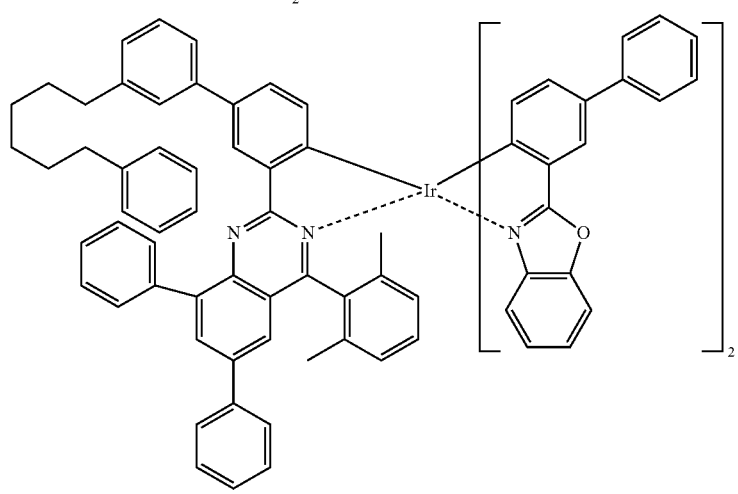

101
-continued
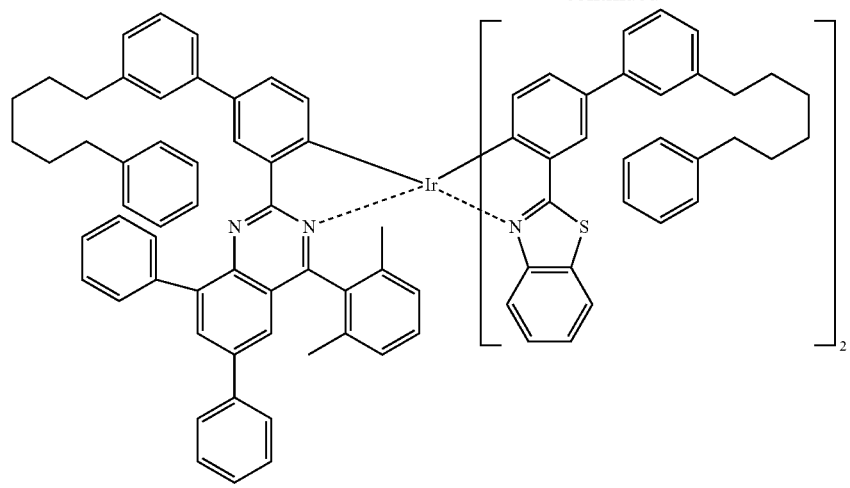
102
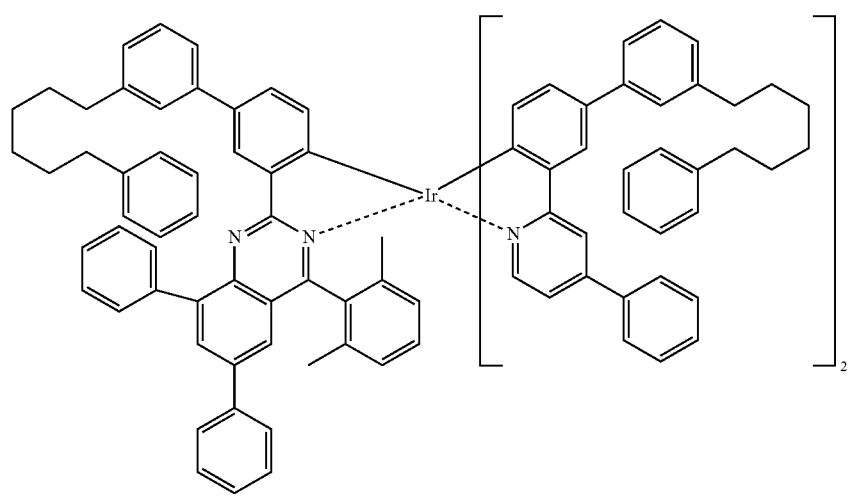
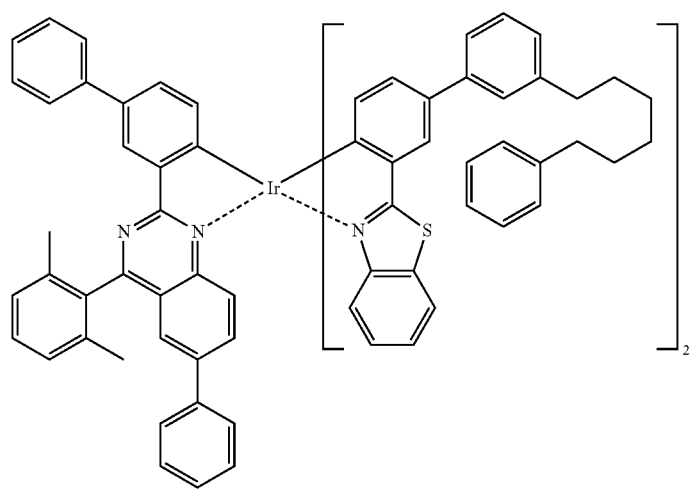

-continued
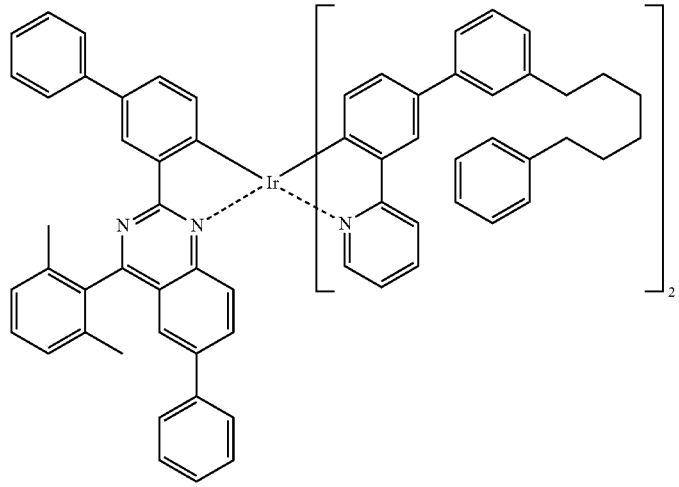
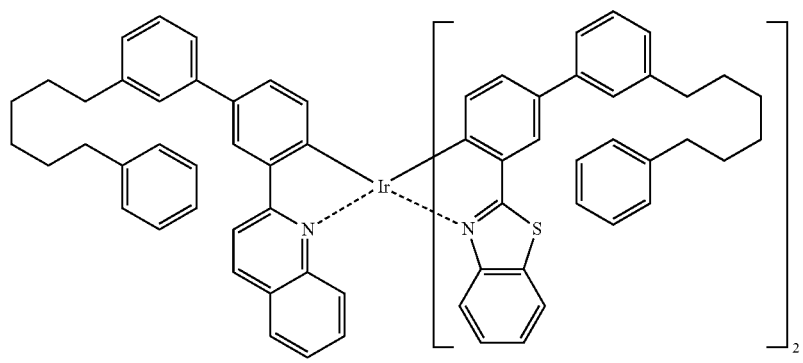
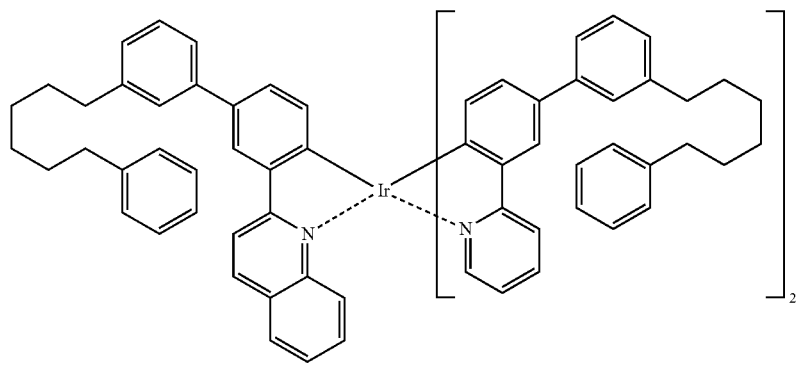
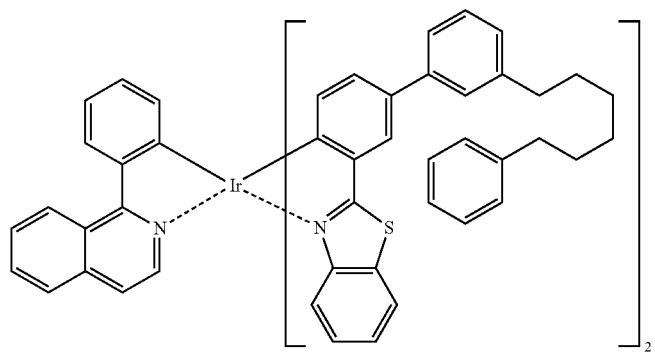

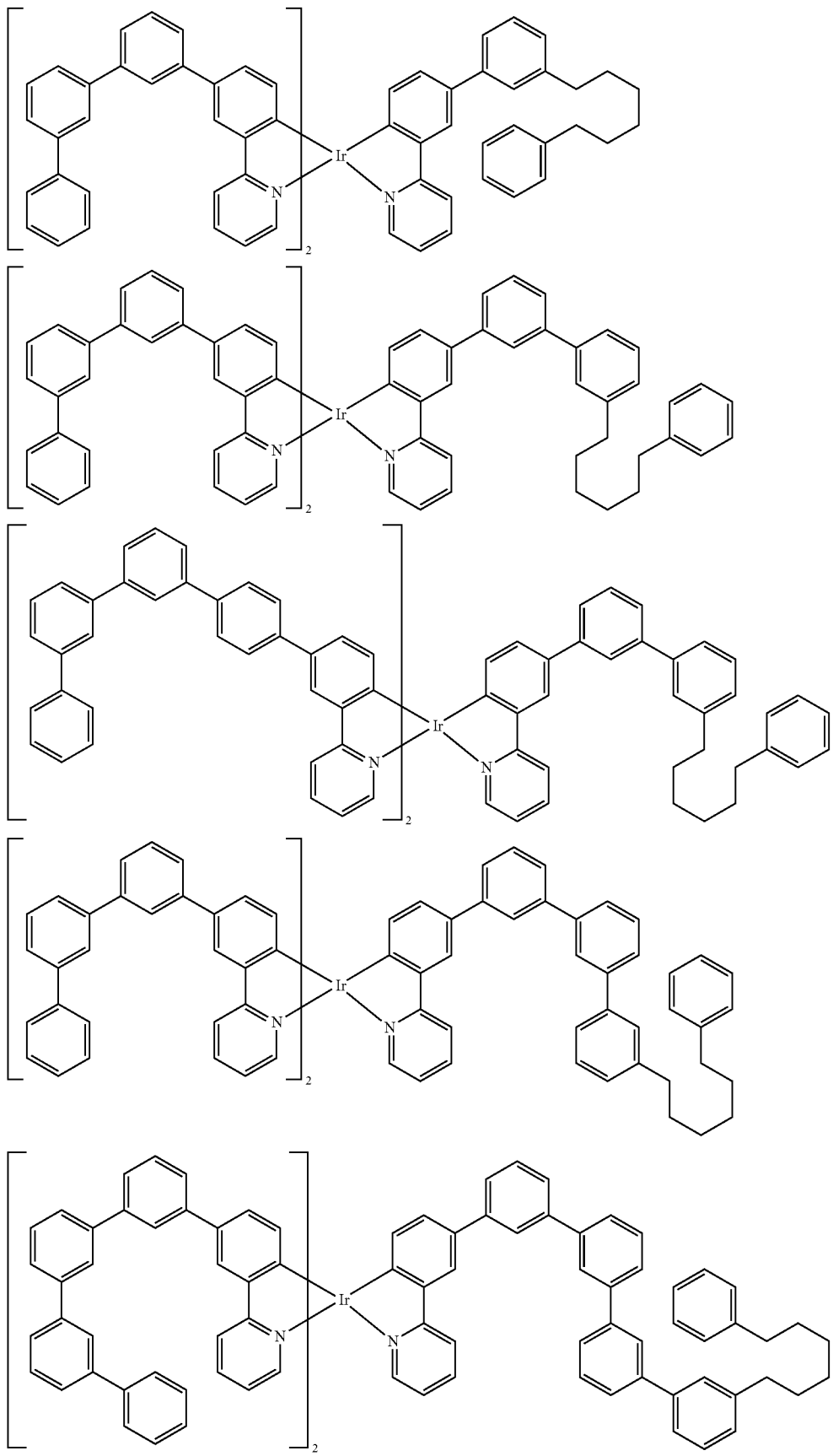

-continued
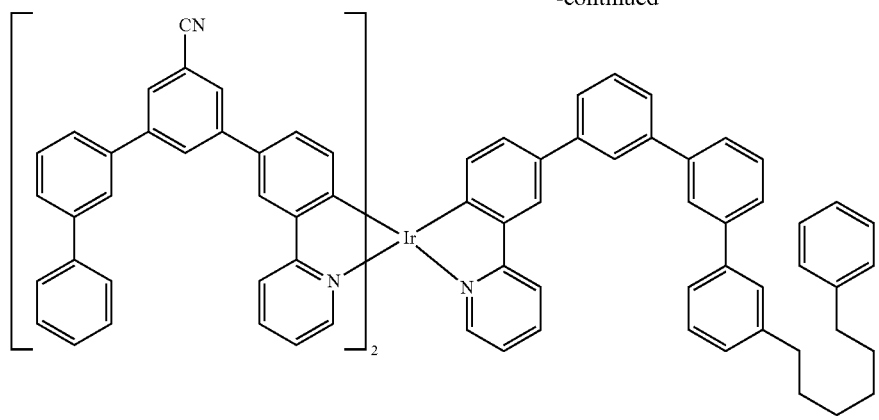
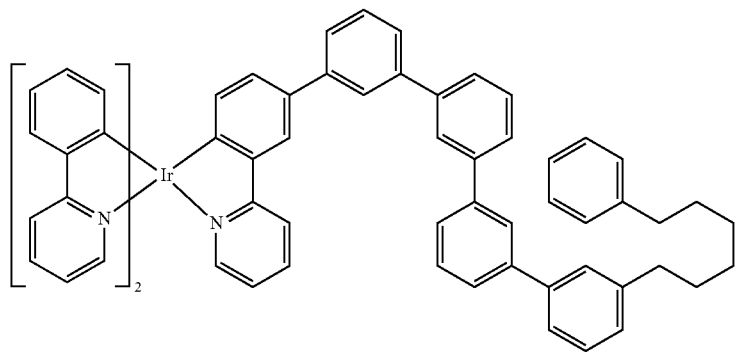
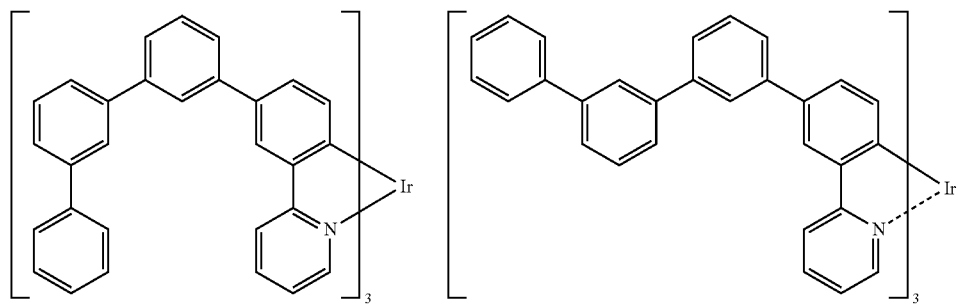
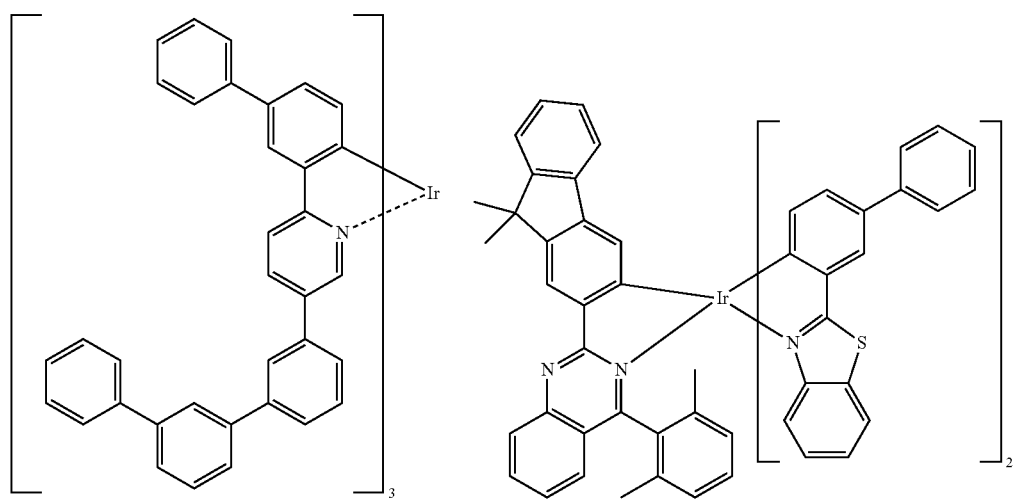

-continued
109
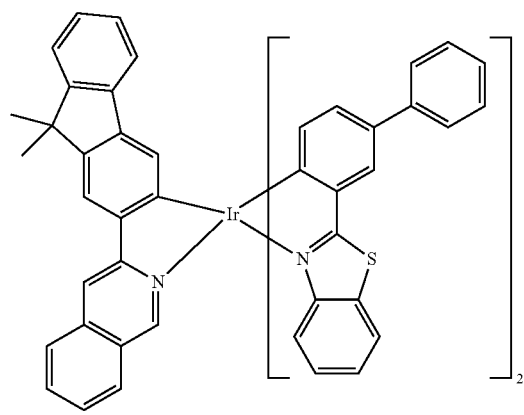
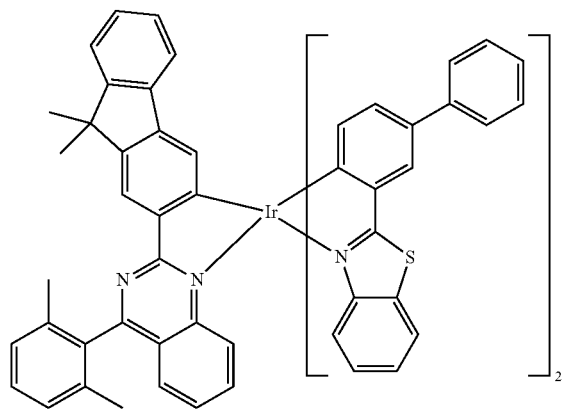
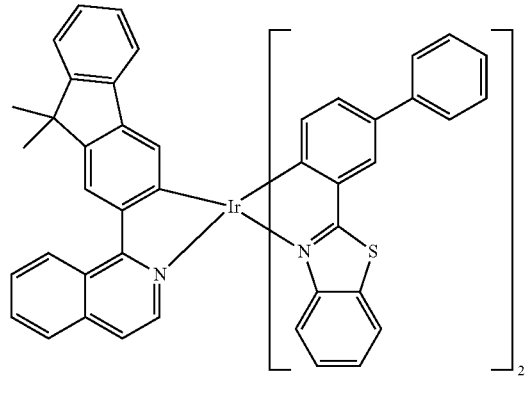
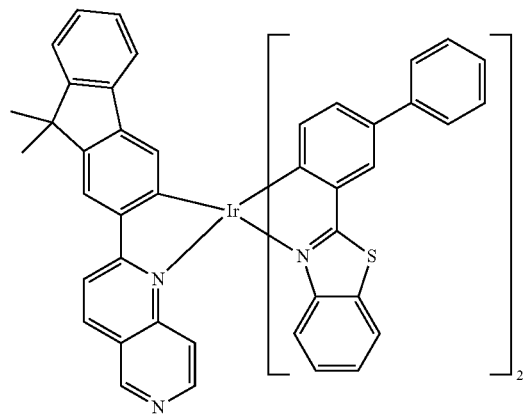
110
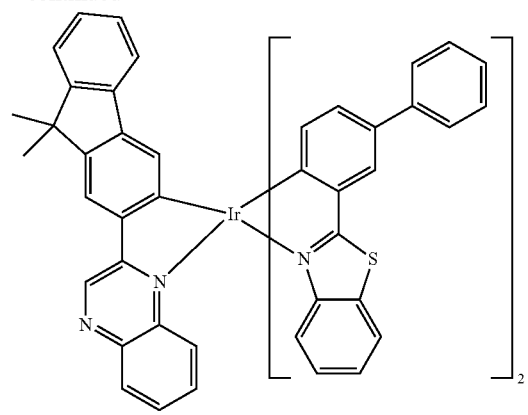
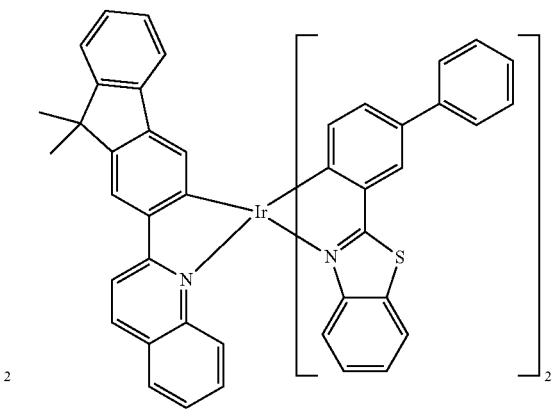
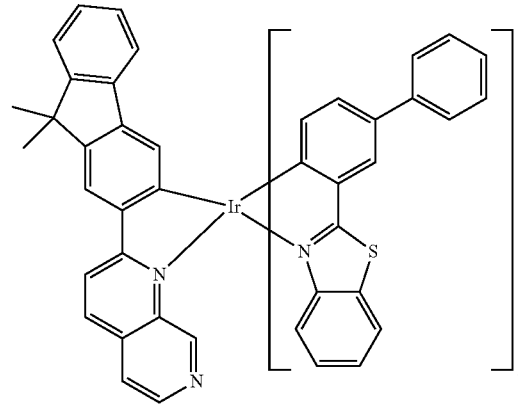
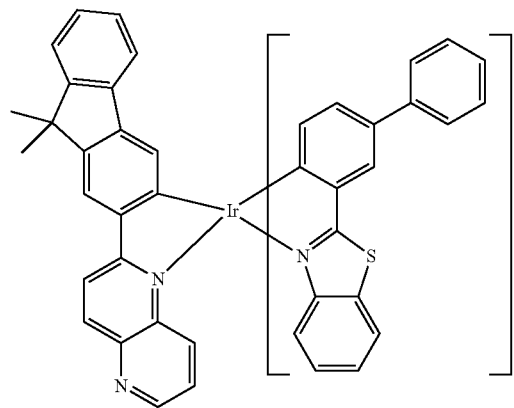

-continued
| 111 | 112 |
|---|---|
| 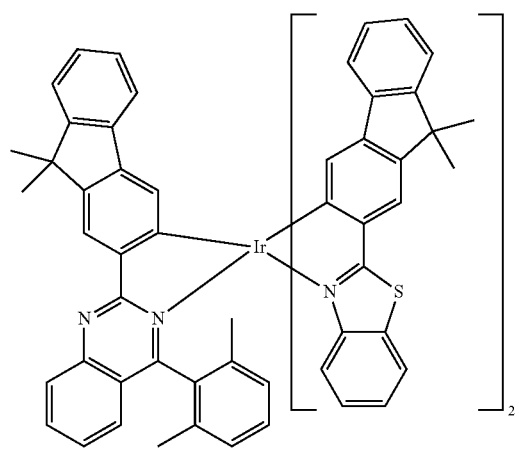 | 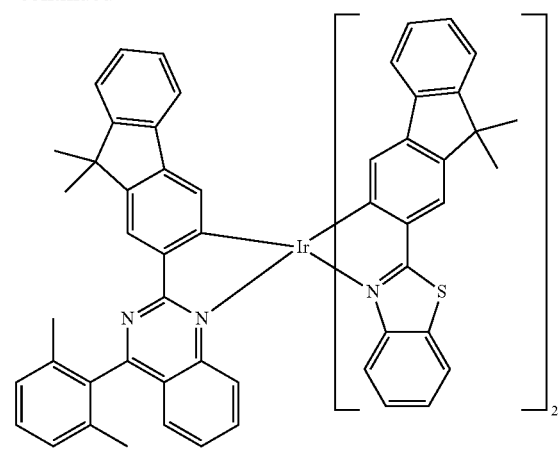 |
| 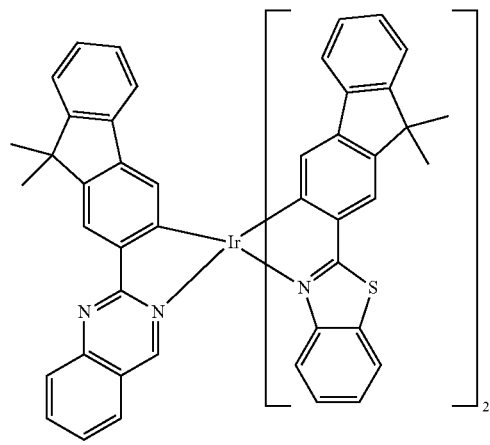 | 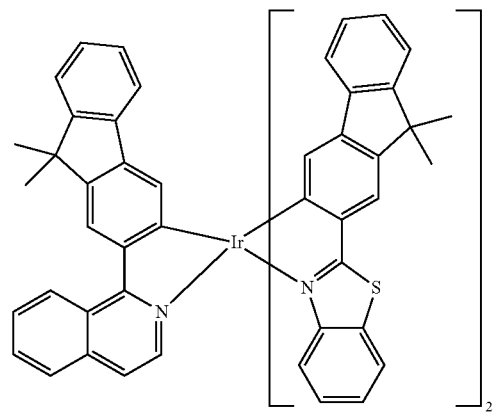 |
| 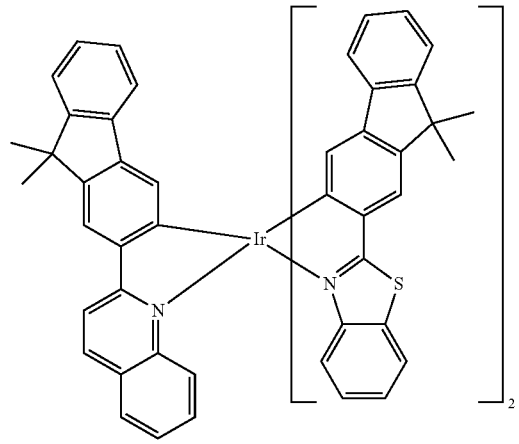 | 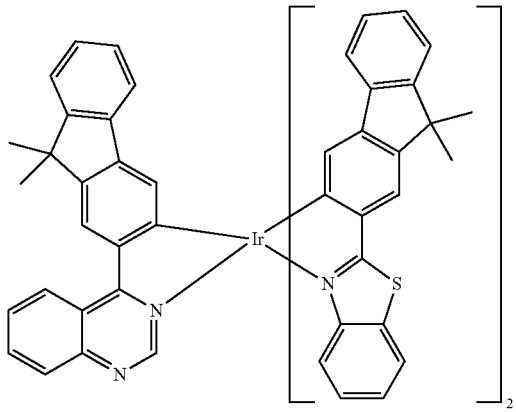 |

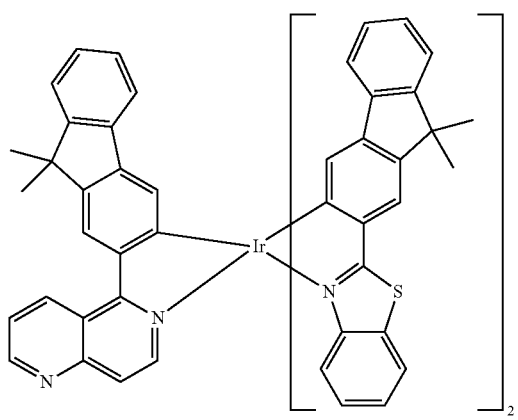
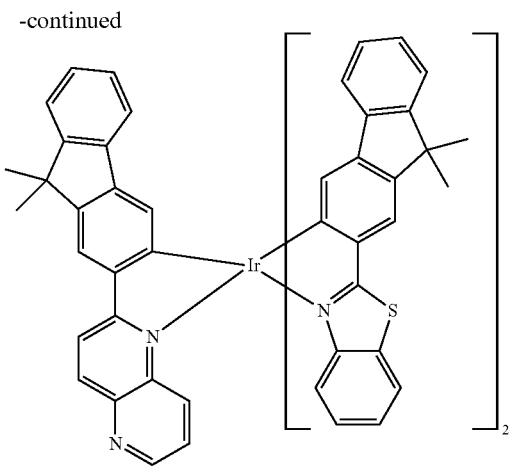
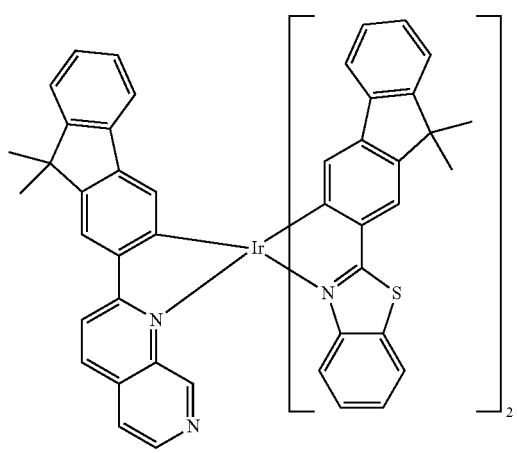
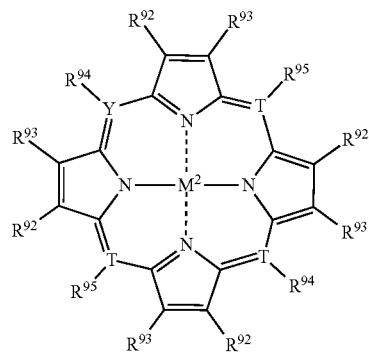

(205)

(In Formula (205), $M^2$ represents a metal; T represents a carbon atom or a nitrogen atom; and $R^{92}$ to $R^{95}$ each independently represent a substituent, with a proviso that, when T is a nitrogen atom, $R^{94}$ and $R^{95}$ do not exist)

In Formula (205), $M^2$ represents a metal. Specific examples thereof include those metals described above for the metal selected from Groups 7 to 11 of the Periodic Table. Thereamong, $M^2$ is, for example, preferably ruthenium, rhodium, palladium, silver, rhenium, osmium, iridium, platinum, or gold, particularly preferably a divalent metal, such as platinum or palladium.

Further, in Formula (205), $R^{92}$ and $R^{93}$ each independently represent a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamino group, a haloalkyl group, a hydroxy group, an aryloxy group, an aromatic hydrocarbon group, or an aromatic heterocyclic group.

When T is a carbon atom, $R^{94}$ and $R^{95}$ each independently represent any of the substituents exemplified above for $R^{92}$ and $R^{93}$. Meanwhile, when T is a nitrogen atom, there is neither $R^{94}$ nor $R^{95}$ that are directly bound to T. $R^{92}$ to $R^{95}$ each optionally further have a substituent. The optional substituent may be any of the above-exemplified substituents. Further, any two or more of $R^{92}$ to $R^{95}$ are optionally bound with each other to form a ring.

(Molecular Weight)

The molecular weight of the phosphorescent material is preferably 5,000 or less, more preferably 4,000 or less, particularly preferably 3,000 or less. Meanwhile, the molecular weight of the phosphorescent material in the present invention is usually 800 or higher, preferably 1,000 or higher, more preferably 1,200 or higher. By controlling the molecular weight in this range, it is believed that the phosphorescent material is uniformly mixed with a charge transporting material without aggregation, so that a light-emitting layer having a high luminous efficiency can be obtained.

The molecular weight of the phosphorescent material is preferably high not only because it provides a high Tg, a high melting point, a high decomposition temperature and the like and imparts excellent heat resistance to the phosphorescent material and a light-emitting layer formed therefrom, but also because it makes, for example, a reduction in the film quality caused by gas generation, recrystallization, molecule migration and the like, and an increase in the impurity concentration due to thermal decomposition of materials unlikely to occur. On the other hand, the molecular weight of the phosphorescent material is preferably low from the standpoint of the ease of purifying an organic compound.

(Host Material)

In an organic electroluminescent element in which the polymer of the present invention is used as a charge transporting material constituting at least either one of a hole injection layer and a hole transport layer, when a light-emitting layer is composed of a phosphorescent material, a host material thereof is preferably the following material.

<Host Material>

The host material of the light-emitting layer is a material having a skeleton with excellent charge transportability, which is preferably selected from electron transporting materials, hole transporting materials, and bipolar materials capable of transporting both electrons and holes.

(Skeleton with Excellent Charge Transportability)

Specific examples of the skeleton with excellent charge transportability include an aromatic structure, an aromatic amine structure, a triarylamine structure, a dibenzofuran structure, a naphthalene structure, a phenanthrene structure, a phthalocyanine structure, a porphyrin structure, a thiophene structure, a benzylphenyl structure, a fluorene structure, a quinacridone structure, a triphenylene structure, a carbazole structure, a pyrene structure, an anthracene structure, a phenanthroline structure, a quinoline structure, a pyridine structure, a pyrimidine structure, a triazine structure, an oxadiazole structure, and an imidazole structure.

(Electron Transporting Material)

From the standpoint of using a material having a relatively stable structure with excellent electron transportability, the electron transporting material is more preferably a compound having a pyridine structure, a pyrimidine structure, or a triazine structure, still more preferably a compound having a pyrimidine structure or a triazine structure.

(Hole Transporting Material)

The hole transporting material is a compound having a skeleton with excellent hole transportability and, among the above-exemplified principal skeletons with excellent charge transportability, the skeleton with excellent hole transportability is preferably a carbazole structure, a dibenzofuran structure, a triarylamine structure, a naphthalene structure, a phenanthrene structure, or a pyrene structure, more preferably a carbazole structure, a dibenzofuran structure, or a triarylamine structure.

(Fused Ring Structure of Three or More Rings)

The host material of the light-emitting layer preferably has a fused ring structure of three or more rings, and it is more preferred that the host material be a compound having two or more fused ring structures of three or more rings, or a compound having at least one fused ring structure of five or more rings. When the host material is any of these compounds, the molecular rigidity is increased, so that an effect of reducing the extent of molecular motion occurring in response to heat is likely to be obtained. Further, from the standpoint of the charge transportability and the durability of the material, the fused ring structure of three or more rings and the fused ring structure of five or more rings preferably contain an aromatic hydrocarbon ring or an aromatic heterocyclic ring.

Specific examples of the fused ring structure of three or more rings include an anthracene structure, a phenanthrene structure, a pyrene structure, a chrysene structure, a naphthacene structure, a triphenylene structure, a fluorene structure, a benzofluorene structure, an indenofluorene structure, an indolofluorene structure, a carbazole structure, an indenocarbazole structure, an indolocarbazole structure, a dibenzofuran structure, and a dibenzothiophene structure. From the standpoints of the charge transportability and the solubility, at least one selected from the group consisting of a phenanthrene structure, a fluorene structure, an indenofluorene structure, a carbazole structure, an indenocarbazole structure, an indolocarbazole structure, a dibenzofuran structure, and a dibenzothiophene structure is preferred, and a carbazole structure or an indolocarbazole structure is more preferred from the standpoint of the durability against a charge.

(Triazine, Pyrimidine)

In the present invention, from the standpoint of the durability of the organic electroluminescent element against a charge, at least one host material of the light-emitting layer is preferably a material having a pyrimidine skeleton or a triazine skeleton.

(Range of Molecular Weight)

The host material of the light-emitting layer is preferably a high-molecular-weight material because of its excellent flexibility. A light-emitting layer formed from such a material having excellent flexibility is preferred as a light-emitting layer of an organic electroluminescent element formed on a flexible substrate. When the host material contained in the light-emitting layer is a high-molecular-weight material, the weight-average molecular weight thereof is preferably 5,000 or higher and 1,000,000 or less, more preferably 10,000 or higher and 500,000 or less, still more preferably 10,000 or higher and 100,000 or less.

Meanwhile, from the standpoints of the ease of synthesis and purification, the ease of designing the electron transport performance and the hole transport performance, and the ease of adjusting the viscosity when the light-emitting layer is dissolved in a solvent, the host material of the light-emitting layer preferably has a low molecular weight. When the host material contained in the light-emitting layer is a low-molecular-weight material, the molecular weight thereof is preferably 5,000 or less, more preferably 4,000 or less, particularly preferably 3,000 or less, most preferably 2,000 or less, but usually 300 or higher, preferably 350 or higher, more preferably 400 or higher.

(Blue Fluorescent Layer)

In an organic electroluminescent element in which the polymer of the present invention is used as a charge transporting material constituting at least either one of a hole injection layer and a hole transport layer, when a light-emitting layer is composed of a fluorescent material, the fluorescent material is preferably the following blue fluorescent material.

(Blue Fluorescent Material)

A light-emitting material for a blue fluorescent layer is not particularly restricted; however, it is preferably a material represented by the following Formula (211).

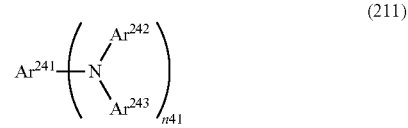

(211)

In Formula (211), $Ar^{241}$ represents an aromatic hydrocarbon fused-ring structure optionally having a substituent;

$Ar^{242}$ and $Ar^{243}$ each independently represent an alkyl group or an aromatic hydrocarbon group, which optionally has a substituent, or a group formed by these groups that are bound with each other; and n41 represents 1 to 4.

$Ar^{241}$ preferably represents an aromatic hydrocarbon fused-ring structure having 10 to 30 carbon atoms, and specific examples thereof include naphthalene, acenaphthene, fluorene, anthracene, phenanthrene, fluoranthene, pyrene, tetracene, chrysene, and perylene structures.

$Ar^{241}$ is more preferably an aromatic hydrocarbon fused-ring structure having 12 to 20 carbon atoms, and specific examples thereof include acenaphthene, fluorene, anthracene, phenanthrene, fluoranthene, pyrene, tetracene, chrysene, and perylene structures.

$Ar^{241}$ is still more preferably an aromatic hydrocarbon fused-ring structure having 16 to 18 carbon atoms, and specific examples thereof include fluoranthene, pyrene, and chrysene structures.

Further, n41 is 1 to 4, preferably 1 to 3, more preferably 1 to 2, most preferably 2.

(Substituents of $Ar^{241}$, $Ar^{242}$ and $Ar^{243}$)

The optional substituents of $Ar^{241}$, $Ar^{242}$ and $Ar^{243}$ are each preferably a group selected from the above-described substituents Z, more preferably a hydrocarbon group included in the substituents Z, still more preferably a hydrocarbon group preferred among the substituents Z.

(Host Material for Blue Fluorescent Layer)

In an organic electroluminescent element in which the polymer of the present invention is used as a charge transporting material constituting at least either one of a hole injection layer and a hole transport layer, when a light-emitting layer is composed of a fluorescent material, a host material thereof is preferably the following material.

The host material for the blue fluorescent layer is not particularly restricted; however, it is preferably a material represented by the following Formula (212).

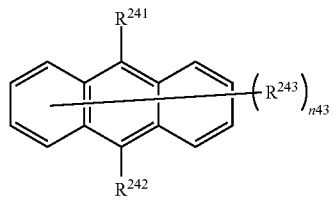

(212)

In Formula (212), $R^{241}$ and $R^{242}$ each independently represent a structure represented by Formula (213);

$R^{243}$ represents a substituent and, when there are plural $R^{243}$s, the $R^{243}$ are optionally the same or different; and n43 represents 0 to 8.

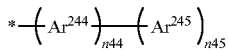

(213)

$Ar^{244}$ and $Ar^{245}$ each independently represent an aromatic hydrocarbon structure optionally having a substituent, or an aromatic heterocyclic structure optionally having a substituent, when there are plural $Ar^{244}$s and plural $Ar^{245}$s, the $Ar^{244}$s and the $Ar^{245}$s are each optionally the same or different, n44 represents 1 to 5, and n45 represents 0 to 5.

$Ar^{244}$ is preferably a monocyclic or fused-ring aromatic hydrocarbon structure having 6 to 30 carbon atoms which optionally has a substituent, more preferably a monocyclic or fused-ring aromatic hydrocarbon structure having 6 to 12 carbon atoms which optionally has a substituent.

$Ar^{245}$ is preferably a monocyclic or fused-ring aromatic hydrocarbon structure having 6 to 30 carbon atoms which optionally has a substituent, or a fused-ring aromatic heterocyclic structure having 6 to 30 carbon atoms which optionally has a substituent, more preferably a monocyclic or fused-ring aromatic hydrocarbon structure having 6 to 12 carbon atoms which optionally has a substituent, or a fused-ring aromatic heterocyclic structure having 12 carbon atoms which optionally has a substituent.

Further, n44 is preferably 1 to 3, more preferably 1 or 2, and n45 is preferably 0 to 3, more preferably 0 to 2.

(Substituents of $R^{243}$, $Ar^{244}$ and $Ar^{245}$)

The optional substituents of $Ar^{243}$, $Ar^{244}$ and $Ar^{245}$ are each preferably a group selected from the above-described substituents Z, more preferably a hydrocarbon group included in the substituents Z, still more preferably a hydrocarbon group preferred among the substituents Z.

(Molecular Weight)

The molecular weight of the light-emitting material for the blue fluorescent layer and that of the host material for the blue fluorescent layer are preferably 5,000 or less, more preferably 4,000 or less, particularly preferably 3,000 or less, most preferably 2,000 or less, but usually 300 or higher, preferably 350 or higher, more preferably 400 or higher.

<Organic Electroluminescent Element>

The organic electroluminescent element of the present invention is an organic electroluminescent element including, on a substrate: an anode; a cathode; and organic layers between the anode and the cathode, wherein the organic layer includes a layer formed by a wet film-forming method using the composition for an organic electroluminescent element according to the present invention that contains the polymer of the present invention.

In the organic electroluminescent element of the present invention, the layer formed by the wet film-forming method is preferably at least one of a hole injection layer and a hole transport layer and, particularly, the organic layers preferably include a hole injection layer, a hole transport layer, and a light-emitting layer, all of which are formed by a wet film-forming method.

In the present invention, the term "wet film-forming method" refers to a film formation method, namely a method of forming a film by a wet process in which a coating method, such as spin coating, dip coating, die coating, bar coating, blade coating, roll coating, spray coating, capillary coating, ink-jet coating, nozzle printing, screen printing, gravure printing or flexographic printing, is employed, and the resulting coating film is subsequently dried. Among such film formation methods, for example, spin coating, spray coating, ink-jet coating, and nozzle printing are preferred.

As one example of the structure of the organic electroluminescent element of the present invention, the FIGURE is a schematic view (cross-section) illustrating a structural example of an organic electroluminescent element 8. In the FIGURE, the symbols 1, 2, 3, 4, 5, 6, and 7 represent a substrate, an anode, a hole injection layer, a hole transport layer, a light-emitting layer, an electron transport layer, and a cathode, respectively.

One exemplary embodiment of the organic electroluminescent element of the present invention, including the layer constitution and general formation methods of the respective layers, will now be described referring to the FIGURE.

[Substrate]

The substrate 1 serves as a support of the organic electroluminescent element and usually, for example, a plate of quartz or glass, a metal plate, a metal foil, or a plastic film or sheet is used. Particularly, the substrate 1 is preferably a glass plate, or a transparent plate of a synthetic resin, such as polyester, polymethacrylate, polycarbonate, or polysulfone. The substrate is preferably made of a material having excellent gas barrier properties since such a material makes the organic electroluminescent element unlikely to be deteriorated by the ambient air. Thus, particularly in the case of using a substrate made of a material having poor gas barrier properties such as a synthetic resin substrate, it is preferred to improve the gas barrier properties by arranging a dense silicon oxide film or the like on at least one side of the substrate.

[Anode]

The anode 2 bears a function of injecting holes into a layer on the side of a light-emitting layer 5.

The anode 2 is usually composed of, for example, a metal such as aluminum, gold, silver, nickel, palladium, or platinum; a metal oxide, such as an oxide of indium and/or tin; a metal halide, such as copper iodide; or a conductive polymer, such as carbon black, poly(3-methylthiophene), polypyrrole, or polyaniline.

The anode 2 is usually formed by a dry method, such as sputtering or vacuum vapor deposition, in many cases. When a material such as metal fine particles of silver or the like, fine particles of copper iodide or the like, carbon black, conductive metal oxide fine particles, or conductive polymer fine powder is used for the formation of the anode, the anode can be formed by dispersing the material in an appropriate binder resin solution and applying the resultant onto the substrate. Further, when a conductive polymer is used, the anode can be formed by directly forming a thin film on the substrate through electrolytic polymerization, or by applying the conductive polymer onto the substrate (*Appl. Phys. Lett.*, Vol. 60, p. 2711, 1992).

The anode 2 usually has a single-layer structure; however, the anode 2 may have a laminated structure as appropriate. When the anode 2 has a laminated structure, a different conductive material may be laminated on the anode that is the first layer.

The thickness of the anode 2 may be decided in accordance with the required transparency, material and the like. When a particularly high transparency is required, the anode 2 has such a thickness that provides a visible light transmittance of preferably 60% or higher, more preferably 80% or higher. The thickness of the anode 2 is usually 5 nm or greater, preferably 10 nm or greater, but usually 1,000 nm or less, preferably 500 nm or less. Meanwhile, when transparency is not required, the anode 2 may have any thickness in accordance with the required strength and the like and, in this case, the anode 2 may have the same thickness as the substrate.

In cases where other layer is formed on the surface of the anode 2, it is preferred that, prior to the formation of the layer, the anode 2 be treated with UV/ozone, oxygen plasma, argon plasma or the like so as not only to remove impurities from the surface of the anode 2, but also to adjust the ionization potential and thereby improve the hole injection properties.

[Hole Injection Layer]

A layer that bears a function of transporting holes from the side of the anode 2 to the side of the light-emitting layer 5 is usually referred to as "hole injection/transport layer" or "hole transport layer". When there are two or more layers each having the function of transporting holes from the side of the anode 2 to the side of the light-emitting layer 5, the layer closest to the anode may be referred to as "hole injection layer 3". The hole injection layer 3 is preferably formed since it enhances the function of transporting holes from the anode 2 to the side of the light-emitting layer 5. When the hole injection layer 3 is formed, it is usually formed on the anode 2.

The thickness of the hole injection layer 3 is usually 1 nm or greater, preferably 5 nm or greater, but usually 1,000 nm or less, preferably 500 nm or less.

As a method of forming the hole injection layer, a vacuum vapor deposition method or a wet film-forming method may be employed. The hole injection layer is preferably formed by a wet film-forming method because of its excellent film-forming properties.

The hole injection layer 3 preferably contains a hole-transporting compound, more preferably contains both a hole-transporting compound and an electron-accepting compound. Further, the hole injection layer preferably contains a cation radical compound, more preferably contains both a cation radical compound and a hole-transporting compound.

A general method of forming the hole injection layer is described below; however, in the organic electroluminescent element of the present embodiment, the hole injection layer is preferably formed by a wet film-forming method using the above-described composition for an organic electroluminescent element according to one embodiment of the present invention.

[Hole-Transporting Compound]

The composition for the formation of hole injection layer usually contains a hole-transporting compound that yields the hole injection layer 3. In the case of employing a wet film-forming method, the composition usually further contains a solvent. The composition for the formation of hole injection layer preferably has excellent hole transportability and is capable of efficiently transporting the holes injected thereinto. Therefore, it is preferred that the composition have a high hole mobility and be unlikely to generate impurities acting as a trap during the production, use and the like. It is also preferred that the composition have excellent stability, a low ionization potential, and a high transparency to visible light. Particularly, when the hole injection layer is in contact with the light-emitting layer, the composition is preferably one that does not cause quenching of the light emitted from the light-emitting layer, or one that does not reduce the luminous efficiency by forming an exciplex with the light-emitting layer.

From the standpoint of a charge injection barrier between the anode and the hole injection layer, the hole-transporting compound is preferably a compound having an ionization potential of 4.5 eV to 6.0 eV. Examples of the hole-transporting compound include aromatic amine compounds, phthalocyanine compounds, porphyrin compounds, oligothiophene compounds, polythiophene compounds, benzylphenyl compounds, compounds containing a tertiary amine linked via a fluorene group, hydrazone compounds, silazane compounds, and quinacridone compounds.

Among the above-exemplified compounds, from the standpoints of the amorphousness and the visible light transmittance, an aromatic amine compound is preferred, and an aromatic tertiary amine compound is particularly preferred. It is noted here that the term "aromatic tertiary amine compound" used herein refers to a compound having an aromatic tertiary amine structure, and encompasses compounds having a group derived from an aromatic tertiary amine.

The type of the aromatic tertiary amine compound is not particularly restricted; however, it is preferred to use a polymer compound having a weight-average molecular weight of 1,000 or higher and 1,000,000 or less (polymerized compound having a series of repeating units) since, because of its surface-smoothing effect, uniform light emission is likely to be attained.

The hole injection layer 3 preferably contains the above-described electron-accepting compound and the above-described cation radical compound since this can improve the electroconductivity of the hole injection layer by oxidation of the hole-transporting compound.

A cation radical compound derived from a polymer compound, such as PEDOT/PSS (*Adv. Mater.* 2000, Vol. 12, p. 481) or emeraldine hydrochloride (*J. Phys. Chem.*, 1990, Vol. 94, p. 7716), can also be generated by oxidative polymerization (dehydrogenation polymerization).

The term "oxidative polymerization" used herein refers to chemical or electrochemical oxidation of a monomer in an acidic solution using peroxodisulfate or the like. In this oxidative polymerization (dehydrogenation polymerization), the monomer is polymerized through oxidation, and a cation radical, whose counter anion is an anion derived from the acidic solution, is generated by removal of an electron from a repeating unit of the resulting polymer.

[Formation of Hole Injection Layer by Wet Film-Forming Method]

In the case of forming the hole injection layer 3 by a wet film-forming method, usually, the hole injection layer 3 is formed by mixing a material yielding the hole injection layer with a solvent capable of dissolving the material (solvent for hole injection layer) to prepare a film-forming composition (composition for the formation of hole injection layer), applying the thus obtained composition for the formation of hole injection layer onto a layer (usually, the anode) that corresponds to the underlayer of the resulting hole injection layer, and subsequently drying the composition.

In the composition for the formation of hole injection layer, the hole-transporting compound may have any concentration as long as the effects of the present invention are not markedly impaired; however, a lower concentration is more preferred from the standpoint of the thickness uniformity, while a higher concentration is more preferred from the standpoint of preventing a defect from occurring in the hole injection layer. Specifically, the concentration of the hole-transporting compound is preferably 0.01% by mass or higher, more preferably 0.1% by mass or higher, particularly preferably 0.5% by mass or higher, but preferably 70% by mass or lower, more preferably 60% by mass or lower, particularly preferably 50% by mass or lower.

Examples of the solvent include ether-based solvents, ester-based solvents, aromatic hydrocarbon-based solvents, and amide-based solvents.

Examples of the ether-based solvents include: aliphatic ethers, such as ethylene glycol dimethyl ether, ethylene glycol diethyl ether, and propylene glycol-1-monomethyl ether acetate (PGMEA); and aromatic ethers, such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole.

Examples of the ester-based solvents include aromatic esters, such as phenyl acetate, phenyl propionate, methyl benzoate, ethyl benzoate, propyl benzoate, and n-butyl benzoate.

Examples of the aromatic hydrocarbon-based solvents include toluene, xylene, cyclohexylbenzene, 3-isopropylbiphenyl, 1,2,3,4-tetramethylbenzene, 1,4-diisopropylbenzene, and methylnaphthalene.

Examples of the amide-based solvents include N,N-dimethylformamide and N,N-dimethylacetamide. In addition to the above-described solvents, dimethyl sulfoxide and the like can be used as well.

The formation of the hole injection layer 3 by a wet film-forming method is usually performed by preparing the composition for the formation of hole injection layer, subsequently applying the composition onto a layer (usually, the anode 2) that corresponds to the underlayer of the resulting hole injection layer 3, and then drying the composition.

The hole injection layer 3 is, after being formed, usually dried as a coating film by heating, vacuum drying, or the like.

[Formation of Hole Injection Layer by Vacuum Vapor Deposition Method]

In the case of forming the hole injection layer 3 by a vacuum vapor deposition method, usually, one or more constituent materials of the hole injection layer 3 (e.g., the above-described hole-transporting compound and electron-accepting compound) are placed in a crucible that is arranged inside a vacuum vessel (when two or more materials are used, the materials are usually placed in individual crucibles), and the inside of the vacuum vessel is evacuated to about $10^{-4}$ Pa using a vacuum pump, after which the crucible is heated (when two or more materials are used, each of the crucibles is usually heated individually) to evaporate the materials in the crucible while controlling the evaporation amount of the materials (when two or more materials are used, the materials are usually each independently evaporated while controlling the evaporation amount), whereby the hole injection layer is formed over the anode on the substrate that is placed facing the crucible. When two or more materials are used, it is also possible to form the hole injection layer by placing a mixture of the materials in a crucible and subsequently heating and evaporating the mixture.

The degree of vacuum during the vapor deposition is not restricted as long as the effects of the present invention are not markedly impaired; however, it is usually $0.1 \times 10^{-6}$ Torr ($0.13 \times 10^{-4}$ Pa) or higher and $9.0 \times 10^{-6}$ Torr ($12.0 \times 10^{-4}$ Pa) or lower. The vapor deposition rate is also not restricted as long as the effects of the present invention are not markedly impaired; however, it is usually 0.1/sec or more and 5.0 Å/sec or less. The film-forming temperature in the vapor deposition is also not restricted as long as the effects of the present invention are not markedly impaired; however, it is preferably 10° C. or higher and 50° C. or lower.

The hole injection layer 3 may be crosslinked in the same manner as the below-described hole transport layer 4.

[Hole Transport Layer]

The hole transport layer 4 is a layer that bears a function of transporting holes from the side of the anode 2 to the side of the light-emitting layer 5. In the organic electroluminescent element of the present invention, the hole transport layer 4 is not an indispensable layer; however, this layer is preferably formed from the standpoint of enhancing the function of transporting holes from the anode 2 to the light-emitting layer 5. When the hole transport layer 4 is formed, it is usually formed between the anode 2 and the light-emitting layer 5. In the presence of the above-described hole injection layer 3, the hole transport layer 4 is formed between the hole injection layer 3 and the light-emitting layer 5.

The thickness of the hole transport layer 4 is usually 5 nm or greater, preferably 10 nm or greater, but usually 300 nm or less, preferably 100 nm or less.

As a method of forming the hole transport layer 4, a vacuum vapor deposition method or a wet film-forming method may be employed. The hole transport layer 4 is preferably formed by a wet film-forming method because of its excellent film-forming properties.

A general method of forming the hole transport layer is described below; however, in the organic electroluminescent element of the present embodiment, the hole transport layer is preferably formed by a wet film-forming method using the above-described composition for an organic electroluminescent element.

The hole transport layer 4 usually contains a hole-transporting compound. The hole-transporting compound contained in the hole transport layer 4 is preferably the polymer of the present invention or, when the polymer of the present invention has a crosslinkable group, a polymer obtained by crosslinking the polymer of the present invention. Examples of preferred hole-transporting compound include, in addition to the polymer of the present invention: the above-exemplified hole-transporting compounds; aromatic diamines which contain two or more tertiary amines and in which two or more fused aromatic rings are substituted with nitrogen atoms, such as 4,4'-bis[N-(1-naphthyl)-N-phenylamino]biphenyl (Japanese Unexamined Patent Application Publication No. H5-234681); aromatic amine compounds having a starburst structure, such as 4,4',4''-tris(1-naphthylphenylamino)triphenylamine (J. Lumin., Vol. 72-74, p. 985, 1997); aromatic amine compounds composed of a tetramer of triphenylamine (Chem. Commun., p. 2175, 1996); spiro compounds, such as 2,2',7,7'-tetrakis-(diphenylamino)-9,9'-spirobifluorene (Synth. Metals, Vol. 91, p. 209, 1997); and carbazole derivatives, such as 4,4'-N,N-dicarbazolebiphenyl. The hole transport layer 4 may also contain, for example, a polyvinylcarbazole, a polyvinyltriphenylamine (Japanese Unexamined Patent Application Publication No. H7-53953), or a polyarylene ether sulfone containing tetraphenylbenzidine (Polym. Adv. Tech., Vol. 7, p. 33, 1996).

[Formation of Hole Transport Layer by Wet Film-Forming Method]

In the case of forming the hole transport layer by a wet film-forming method, the hole transport layer is usually formed in the same manner as in the above-described case of forming the hole injection layer by a wet film-forming method, except that a composition for the formation of hole transport layer is used in place of the composition for the formation of hole injection layer.

When a wet film-forming method is employed to form the hole transport layer, usually, the composition for the formation of hole transport layer further contains a solvent. As the solvent used in the composition for the formation of hole transport layer, the same solvent as the one used in the composition for the formation of hole injection layer can be used.

The concentration of the hole-transporting compound in the composition for the formation of hole transport layer may be in the same range as the concentration of the hole-transporting compound in the composition for the formation of hole injection layer.

The formation of the hole transport layer by a wet film-forming method can be performed in the same manner as in the above-described method of forming the hole injection layer.

[Formation of Hole Transport Layer by Vacuum Vapor Deposition Method]

Also in the case of forming the hole transport layer by a vacuum vapor deposition method, the hole transport layer is usually formed in the same manner as in the above-described case of forming the hole injection layer by a vacuum vapor deposition method, except that the composition for the formation of hole transport layer is used in place of the composition for the formation of hole injection layer. The film-forming conditions in the vapor deposition, such as the degree of vacuum, the vapor deposition rate and the temperature, can be the same as those conditions in the above-described vacuum vapor deposition of the hole injection layer.

[Light-Emitting Layer]

The light-emitting layer 5 is a layer that bears a function of emitting light upon being excited by recombination of holes injected from the anode 2 and electrons injected from the cathode 7 when an electric field is applied to a pair of electrodes. The light-emitting layer 5 is a layer formed between the anode 2 and the cathode 7. In the presence of a hole injection layer on the anode, the light-emitting layer is formed between the hole injection layer and the cathode and, in the presence of a hole transport layer on the anode, the light-emitting layer is formed between the hole transport layer and the cathode.

The light-emitting layer 5 may have any thickness as long as the effects of the present invention are not markedly impaired; however, a larger thickness is more preferred from the standpoint of preventing a defect from occurring in the layer, while a smaller thickness is more preferred from the standpoint of lowering the driving voltage. Accordingly, the thickness of the light-emitting layer 5 is preferably 3 nm or greater, more preferably 5 nm or greater, but usually preferably 200 nm or less, more preferably 100 nm or less.

The light-emitting layer 5 contains at least a material having a light-emitting property (light-emitting material), and preferably contains a host material.

Light-emitting materials and host materials that are preferred in the organic electroluminescent element of the present invention are as described above.

[Formation of Light-Emitting Layer by Wet Film-Forming Method]

As a method of forming the light-emitting layer, a vacuum vapor deposition method or a wet film-forming method may be employed; however, a wet film-forming method is preferred because of its excellent film-forming properties, and a spin-coating method or an ink-jet method is more preferred. It is particularly preferred to employ a wet film-forming method since lamination is easily performed by a wet film-forming method when a hole injection layer or a hole transport layer is formed as an underlayer of the light-emitting layer using the above-described composition for an organic electroluminescent element. In the case of forming the light-emitting layer by a wet film-forming method, the light-emitting layer is usually formed in the same manner as in the above-described case of forming the hole injection layer by a wet film-forming method, except that a composition for the formation of light-emitting layer, which is prepared by mixing a material yielding the light-emitting layer with a solvent capable of dissolving the material (solvent for light-emitting layer), is used in place of the composition for the formation of hole injection layer.

Examples of the solvent include ether-based solvents, ester-based solvents, aromatic hydrocarbon-based solvents and amide-based solvents, which are exemplified above in relation to the formation of the hole injection layer, as well as alkane-based solvents, halogenated aromatic hydrocarbon-based solvents, aliphatic alcohol-based solvents, alicyclic alcohol-based solvents, aliphatic ketone-based solvents, and alicyclic ketone-based solvents. Specific examples of the solvent are described below; however, the solvent is not restricted thereto as long as the effects of the present invention are not impaired.

Specific examples of the solvent include: aliphatic ether-based solvents, such as ethylene glycol dimethyl ether, ethylene glycol diethyl ether, and propylene glycol-1-monomethyl ether acetate (PGMEA); aromatic ether-based solvents, such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic ester-based solvents, such as phenyl acetate, phenyl propionate, methyl benzoate, ethyl benzoate, propyl benzoate, and n-butyl benzoate; aromatic hydrocarbon-based solvents, such as toluene, xylene, mesitylene, cyclohexylbenzene, tetralin, 3-isopropylbiphenyl, 1,2,3,4-tetramethylbenzene, 1,4-diisopropylbenzene, and methylnaphthalene; amide-based solvents, such as N,N-dimethylformamide and N,N-dimethylacetamide; alkane-based solvents, such as n-decane, cyclohexane, ethylcyclohexane, decalin, and bicyclohexane; halogenated aromatic hydrocarbon-based solvents, such as chlorobenzene, dichlorobenzene, and trichlorobenzene; aliphatic alcohol-based solvents, such as butanol and hexanol; alicyclic alcohol-based solvents, such as cyclohexanol and cyclooctanol; aliphatic ketone-based solvents, such as methyl ethyl ketone and dibutyl ketone; and alicyclic ketone-based solvents, such as cyclohexanone, cyclooctanone, and fenchone. Among these solvents, alkane-based solvents and aromatic hydrocarbon-based solvents are particularly preferred.

[Hole-Blocking Layer]

The hole-blocking layer may be arranged between the light-emitting layer 5 and the below-described electron injection layer. The hole-blocking layer is a layer that is laminated on the light-emitting layer 5, in contact with the interface of the light-emitting layer 5 on the side of the cathode 7.

The hole-blocking layer has a role of preventing holes moving from the anode 2 from reaching the cathode 7 as well as a role of efficiently transporting electrons injected from the cathode 7 toward the light-emitting layer 5. As for the physical properties required for a material constituting the hole-blocking layer, the material is required to have, for example, a high electron mobility, a low hole mobility, a large energy gap (difference between HOMO and LUMO), and a high excited triplet level ($T_1$).

Examples of the material of the hole-blocking layer that satisfies these conditions include: mixed ligand complexes, such as bis(2-methyl-8-quinolinolato)(phenolate)aluminum and bis(2-methyl-8-quinolinolato)(triphenylsilanolato)aluminum; metal complexes, such as a bis(2-methyl-8-quinolinolato)aluminum-µ-oxo-bis(2-methyl-8-quinolinolato)aluminum binuclear metal complex; styryl compounds, such as distyryl biphenyl derivatives (Japanese Unexamined Patent Application Publication No. H11-242996); triazole derivatives, such as 3-(4-biphenylyl)-4-phenyl-5-(4-tert-butylphenyl)-1,2,4-triazole (Japanese Unexamined Patent Application Publication No. H7-41759); and phenanthroline derivatives, such as bathocuproin (Japanese Unexamined Patent Application Publication No. H10-79297). Further, the compounds described in WO 2005/022962 which have at least one pyridine ring substituted at the 2-, 4-, and 6-positions are also preferred as the material of the hole-blocking layer.

A method of forming the hole-blocking layer is not restricted. Therefore, the hole-blocking layer can be formed by a wet film-forming method, a vapor deposition method, or any other method.

The hole-blocking layer may have any thickness as long as the effects of the present invention are not markedly impaired; however, the thickness of the hole-blocking layer is usually 0.3 nm or greater, preferably 0.5 nm or greater, but usually 100 nm or less, preferably 50 nm or less.

[Electron Transport Layer]

The electron transport layer 6 is arranged between the light-emitting layer 5 and the electron injection layer for the purpose of further improving the current efficiency of the element.

The electron transport layer 6 is composed of a compound that is capable of efficiently transporting electrons injected from the cathode 7 toward the light-emitting layer 5 between electrodes to which an electric field applied. An electron-transporting compound used in the electron transport layer 6 is required to be a compound that allows highly efficient electron injection from the cathode 7 or the electron injection layer, has a high electron mobility, and is capable of efficiently transporting injected electrons.

Specific examples of the electron-transporting compound used in the electron transport layer include metal complexes such as an aluminum complex of 8-hydroxyquinoline (Japanese Unexamined Patent Application Publication No. S59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzothiazole metal complexes, trisbenzimidazolyl benzene (U.S. Pat. No. 5,645,948), quinoxaline compounds (Japanese Unexamined Patent Application Publication No. H6-207169), phenanthroline derivatives (Japanese Unexamined Patent Application Publication No. H5-331459), 2-t-butyl-9,10-N,N-dicyanoanthraquinonediimine, n-type hydrogenated amorphous silicon carbide, n-type zinc sulfide, and n-type zinc selenide.

The thickness of the electron transport layer 6 is usually 1 nm or greater, preferably 5 nm or greater, but usually 300 nm or less, preferably 100 nm or less.

The electron transport layer 6 is laminated on the hole-blocking layer by a wet film-forming method or a vacuum vapor deposition method in the same manner as described above. Usually, a vacuum vapor deposition method is employed.

[Electron Injection Layer]

The electron injection layer has a role of efficiently injecting electrons injected thereto from the cathode 7 into the electron transport layer 6 or the light-emitting layer 5.

For efficient electron injection, the material constituting the electron injection layer is preferably a metal having a low work function. Examples thereof include: alkali metals, such as sodium and cesium; and alkaline earth metals, such as barium and calcium. Usually, the thickness of the electron injection layer is preferably 0.1 nm or greater and 5 nm or less.

Further, it is also preferred to dope an organic electron transport material typified by a nitrogen-containing heterocyclic compound (e.g., bathophenanthroline) or a metal complex (e.g., an aluminum complex of 8-hydroxyquinoline) with an alkali metal such as sodium, potassium, cesium, lithium, or rubidium (as described in, for example, Japanese Unexamined Patent Application Publication No. H10-270171, Japanese Unexamined Patent Application Publication No. 2002-100478, or Japanese Unexamined Patent Application Publication No. 2002-100482) since this allows the electron injection layer to have both an improved electron injection/transport capacity and excellent film quality.

The thickness of the electron injection layer is in a range of usually 5 nm or greater, preferably 10 nm or greater, but usually 200 nm or less, preferably 100 nm or less.

The electron injection layer is formed by a wet film-forming method or a vacuum vapor deposition method through lamination on the light-emitting layer 5, or on the hole-blocking layer or the electron transport layer 6 that is formed on the light-emitting layer 5.

The details of the wet film-forming method are the same as those described above for the light-emitting layer.

In some cases, the hole-blocking layer, the electron transport layer, and the electron injection layer may be formed into a single layer by an operation of co-doping with an electron transport material and a lithium complex.

[Cathode]

The cathode 7 has a role of injecting electrons into a layer on the side of the light-emitting layer 5 (e.g., the electron injection layer or the light-emitting layer).

As a material of the cathode 7, the material used for the above-described anode 2 can be used; however, from the standpoint of attaining efficient electron injection, it is preferred to use a metal having a low work function and, for example, a metal such as tin, magnesium, indium, calcium, aluminum or silver, or an alloy of these metals is used. Specific examples of the cathode 7 include low-work-function alloy electrodes made of a magnesium-silver alloy, a magnesium-indium alloy, an aluminum-lithium alloy, or the like.

From the standpoint of the stability of the element, it is preferred to protect the cathode made of a low-work-function metal by laminating thereon a metal layer that has a high work function and is stable in the atmosphere.

Examples of the metal to be laminated include aluminum, silver, copper, nickel, chromium, gold, and platinum.

The thickness of the cathode is usually the same as that of the anode.

[Other Layers]

The organic electroluminescent element of the present invention may further include other layers as long as the effects of the present invention are not markedly impaired. In other words, other arbitrary layers may be arranged between the anode and the cathode.

[Other Element Configuration]

The organic electroluminescent element of the present invention may have a structure that is opposite to the one descried above. That is, on the substrate, the cathode, the electron injection layer, the electron transport layer, the hole-blocking layer, the light-emitting layer, the hole transport layer, the hole injection layer, and the anode may be sequentially laminated in the order mentioned.

When the organic electroluminescent element of the present invention is applied to an organic electroluminescent device, the organic electroluminescent element of the present invention may be used as a single organic electroluminescent element, or may be used in a configuration in which plural organic electroluminescent elements are arranged in an array, or a configuration in which an anode and a cathode are arranged in an X-Y matrix form.

<Organic EL Display Device>

The organic EL display device (organic electroluminescent element display device) of the present invention includes the above-described organic electroluminescent element of the present invention. The organic EL display device of the present invention is not particularly restricted in terms of model and structure, and can be assembled in accordance with a conventional method using the organic electroluminescent element of the present invention.

The organic EL display device of the present invention can be assembled by, for example, the method described in "Organic EL Display" (Ohmsha, Ltd., published on Aug. 20, 2004, written by Shizuo Tokito, Chihaya Adachi, and Hideyuki Murata).

<Organic EL Lighting>

The organic EL lighting (organic electroluminescent element lighting) of the present invention includes the above-described organic electroluminescent element of the present invention. The organic EL lighting of the present invention is not particularly restricted in terms of model and structure, and can be assembled in accordance with a conventional method using the organic electroluminescent element of the present invention.

EXAMPLES

The present invention will now be described more concretely by way of Examples thereof. The present invention is, however, not restricted to the below-described Examples, and any modification can be made without departing from the gist of the present invention.

<Synthesis of Intermediates>

[Synthesis of Compound 5]

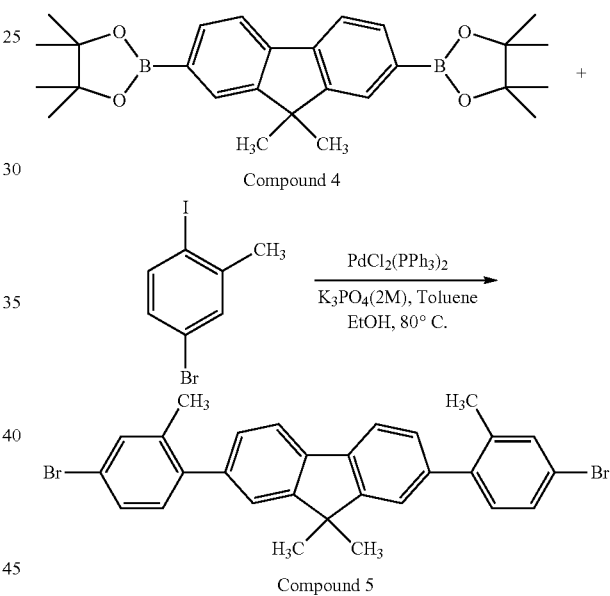

In a 1-L flask, a solution containing 270 ml of toluene, 135 ml of ethanol, 20.0 g (44.8 mmol) of the compound 4 (manufactured by FUJIFILM Wako Pure Chemical Corporation), 50.72 g (179.3 mmol) of 1-bromo-4-iodobenzene, and 191 ml of an aqueous potassium phosphate solution (2M, i.e. concentration=2 mol/L) was vacuum-degassed, and the flask was purged with nitrogen. The solution was heated in a nitrogen stream and stirred for 30 minutes. Subsequently, 0.63 g (0.90 mmol) of bis(triphenylphosphine)palladium (II) dichloride was added, and the resultant was refluxed for 6 hours. Water was added to this reaction solution, followed by extraction with toluene and treatment with $MgSO_4$ and activated earth. The resulting toluene solution was heated to reflux, and insoluble matter was subsequently removed by filtration, after which the solution was recrystallized to obtain the compound 5 as a colorless solid (amount: 14.2 g, yield: 60.2%).

[Synthesis of Compound 7]

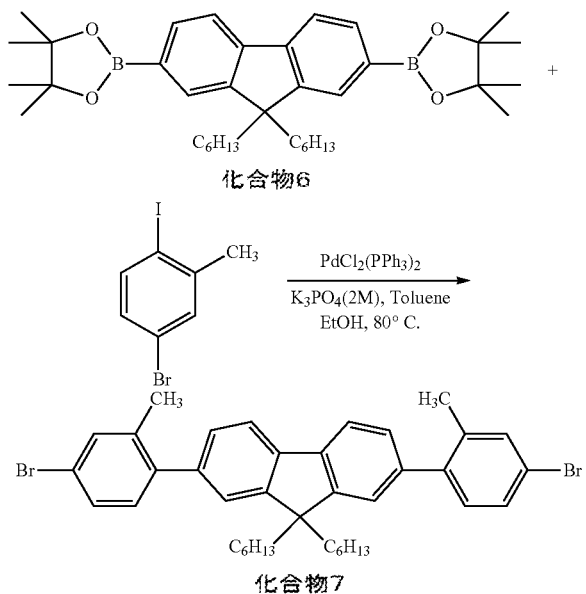

Compound 6

Compound 7

The compound 7 was synthesized in the same manner as the compound 5, except that the compound 6 (manufactured by Tokyo Chemical Industry Co., Ltd.) was used in place of the compound 4.

[Synthesis of Compound 9]

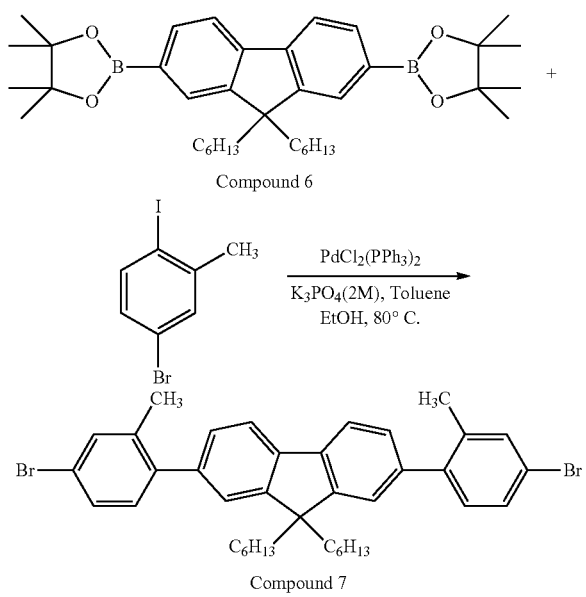

Compound 8

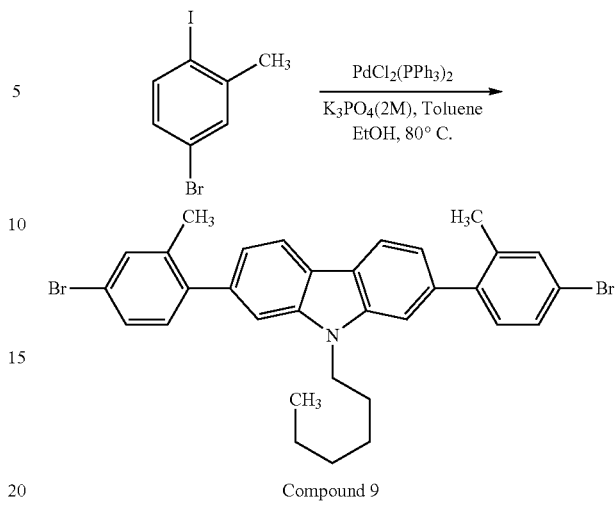

Compound 9

The compound 9 was synthesized in the same manner as the compound 5, except that the compound 8 (manufactured by Tokyo Chemical Industry Co., Ltd.) was used in place of the compound 4.

[Synthesis of Compound 10]

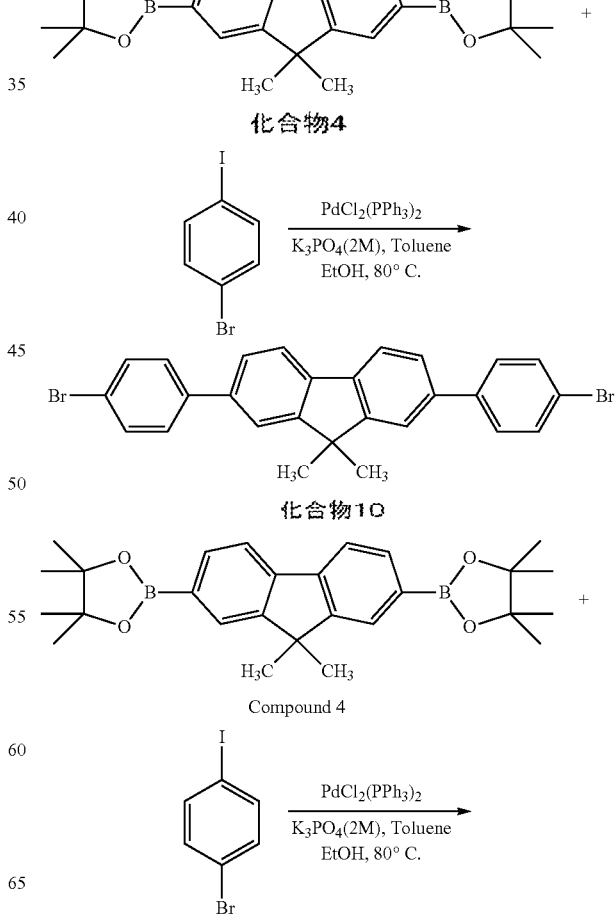

Compound 4

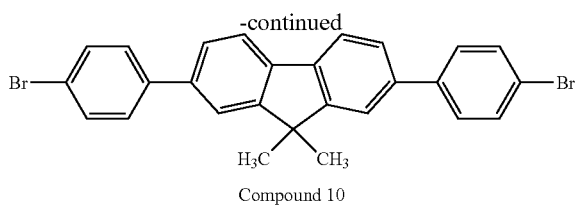

Compound 10

The compound 10 was synthesized in the same manner as the compound 5, except that 1-bromo-4-iodobenzene was used in place of 5-bromo-2-iodotoluene.

[Synthesis of Compound 11]

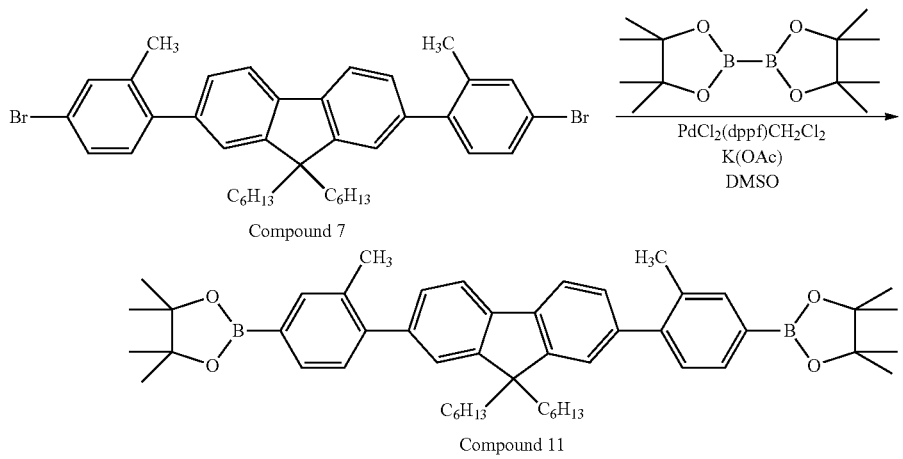

In a nitrogen stream, 100 ml of dimethyl sulfoxide, the compound 7 (5.0 g, 7.43 mmol), bis(pinacolato)diboron (5.66 g, 22.29 mmol), and potassium acetate (4.4 g, 44.58 mmol) were added to a 300-ml flask and stirred at 60° C. for 30 minutes.

Subsequently, 1,1'-bis(diphenylphosphino)ferrocene-palladium (II) dichloride-dichloromethane [PdCl$_2$(dppf) CH$_2$Cl$_2$] (0.60 g, 0.74 mmol) was added, and the resulting mixture was allowed to react at 85° C. for 3 hours. This reaction solution was vacuum-filtered, and the resulting filtrate was extracted with toluene, dried over anhydrous magnesium sulfate, and then partially purified with activated earth. The thus obtained partial purification product was further purified by column chromatography (developer: hexane/ethyl acetate=95/5), whereby the compound 11 (4.5 g) was obtained.

[Synthesis of Compound 12]

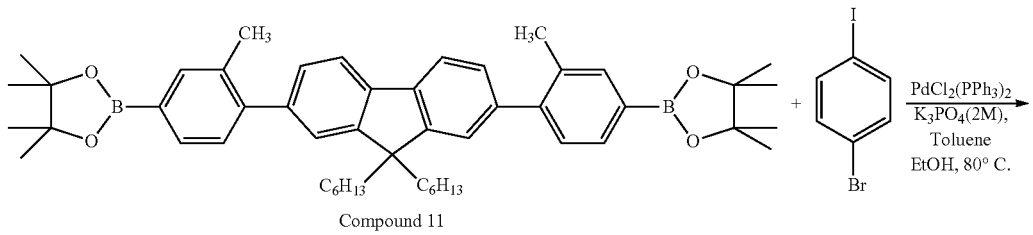

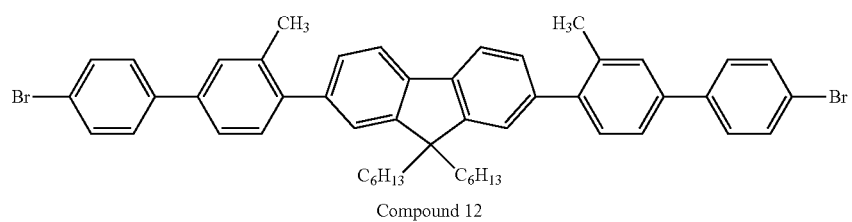

Compound 12

The compound 12 was synthesized in the same manner as the compound 10, except that the compound 11 was used in place of the compound 4.

[Synthesis of Compound 13]

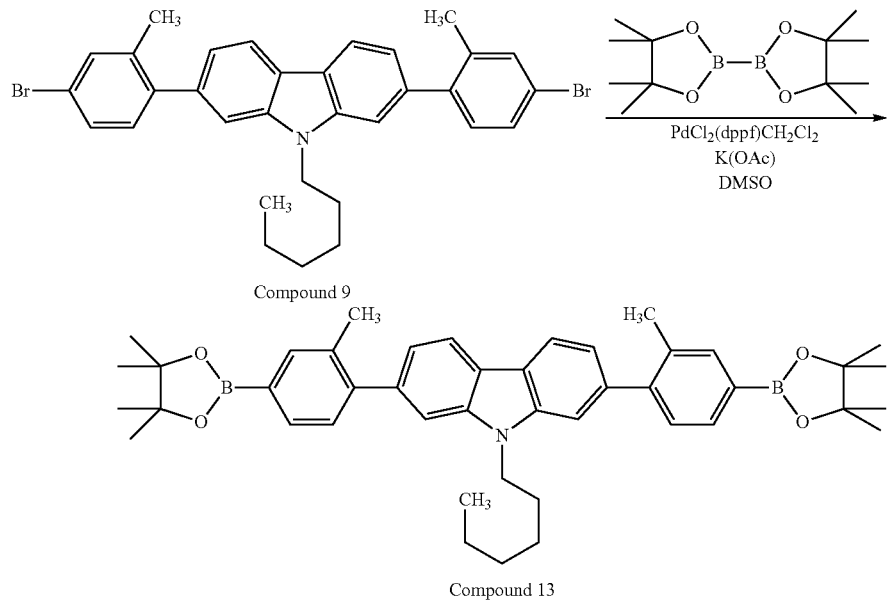

The compound 13 was synthesized in the same manner as the compound 11, except that the compound 9 was used in place of the compound 7.

[Synthesis of Compound 14]

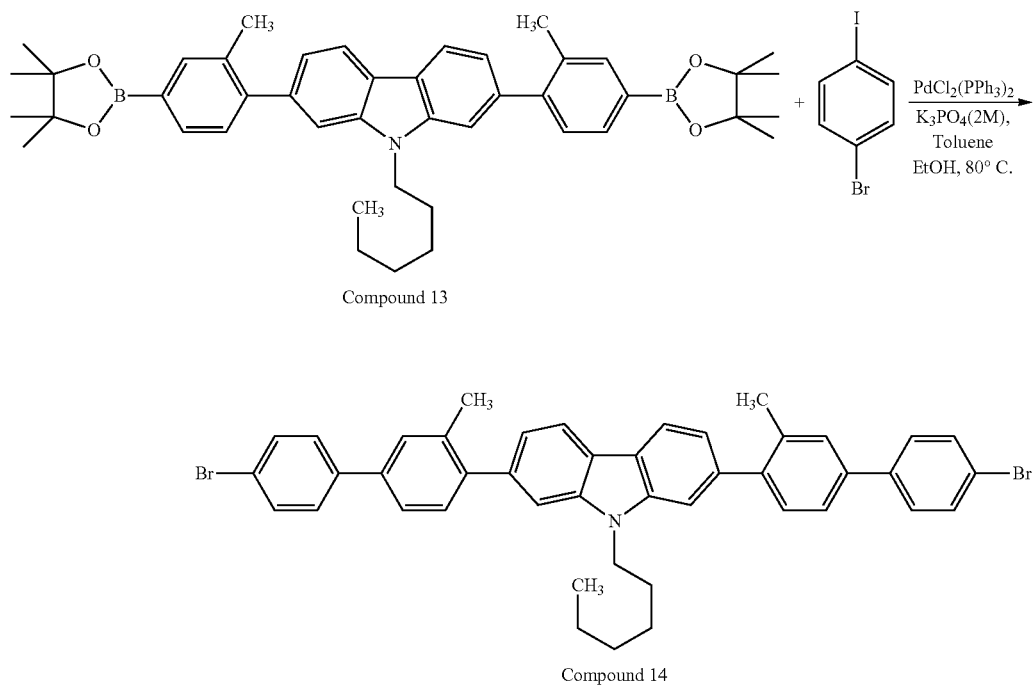

The compound 14 was synthesized in the same manner as the compound 10, except that the compound 13 was used in place of the compound 4.

[Synthesis of Compound 16]

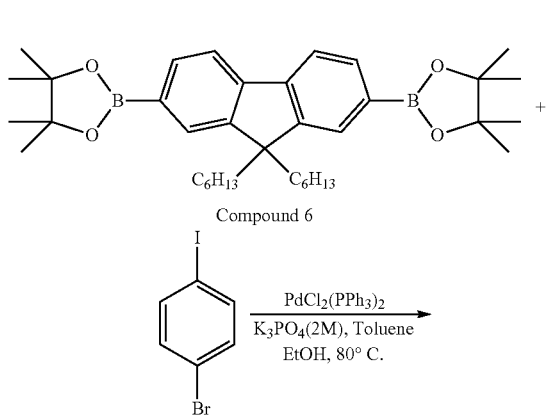

Compound 6

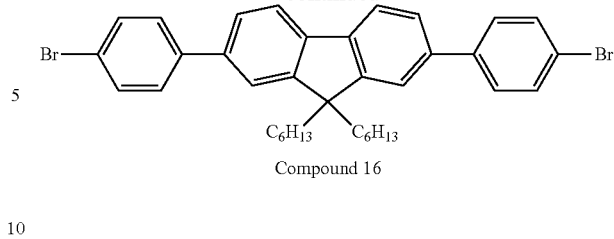

Compound 16

The compound 16 was synthesized in the same manner as the compound 10, except that the compound 6 (manufactured by Tokyo Chemical Industry Co., Ltd.) was used in place of the compound 4.

[Synthesis of Compound 17]

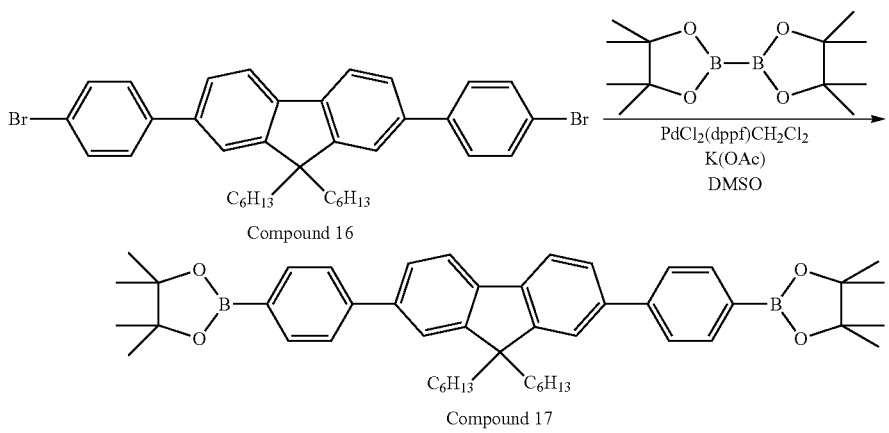

The compound 17 was synthesized in the same manner as the compound 11, except that the compound 16 was used in place of the compound 7.

[Synthesis of Compound 18]

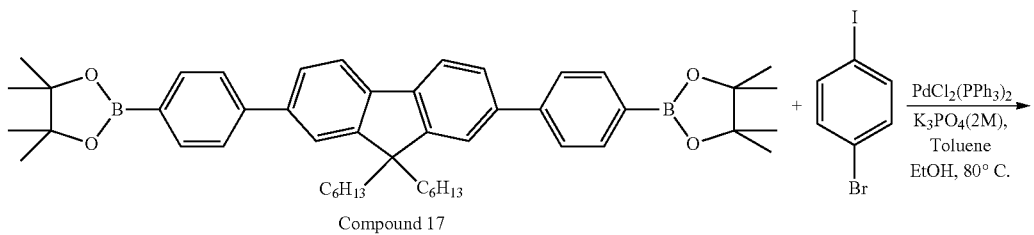

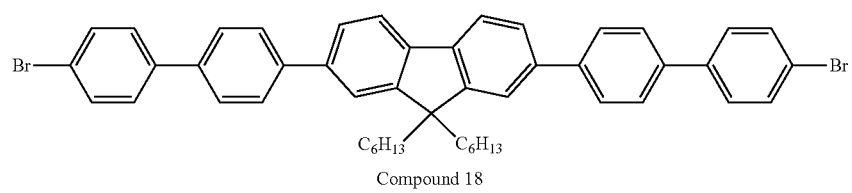

Compound 18

The compound 18 was synthesized in the same manner as the compound 10, except that the compound 17 was used in place of the compound 4.

[Synthesis of Compound 22]

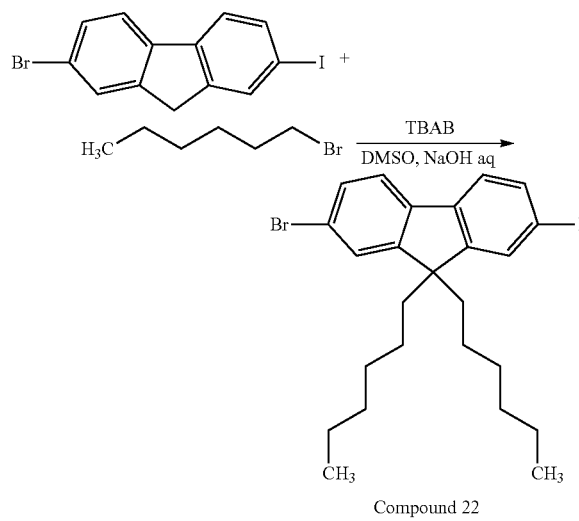

Compound 22

In a nitrogen stream, 22 ml of an aqueous solution containing 13.6 g of sodium hydroxide was slowly added dropwise to 2-bromo-7-iodo-fluorene (25.3 g, 68.19 mmol) manufactured by Tokyo Chemical Industry Co., Ltd., 1-bromohexane (33.8 g, 204.57 mmol) manufactured by Tokyo Chemical Industry Co., Ltd., dimethyl sulfoxide (560 ml) and tetrabutyl ammonium bromide (5.5 g), and the resulting mixture was allowed to react at 55° C. for 3 hours. This mixture was cooled to room temperature, and pure water (400 ml) was slowly added thereto, followed by 15-minute stirring, after which methylene chloride (400 ml) was further added, and the resultant was subjected to liquid separation. The thus formed aqueous layer was extracted with methylene chloride (200 ml x twice), and the extract was combined with an organic layer, dried over magnesium sulfate, and then concentrated. Thereafter, the resulting concentrate was purified by silica gel column chromatography (n-hexane/methylene chloride=850/150) to obtain the compound 22 (30.8 g) as a colorless solid.

[Synthesis of Compound 23]

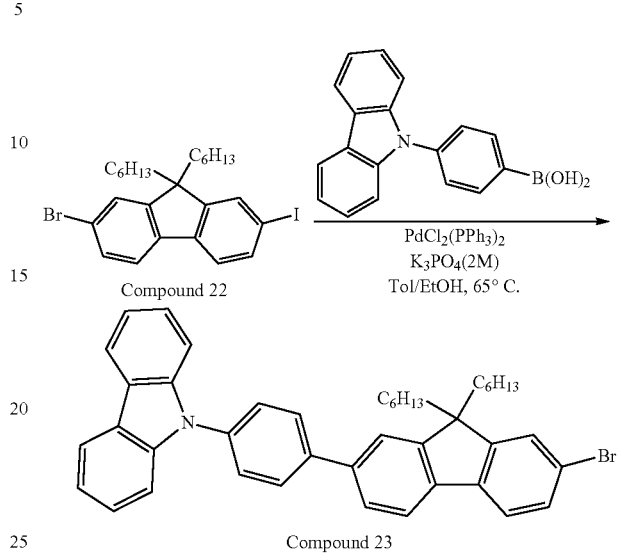

Compound 23

In a nitrogen stream, the compound 22 (17.8 g, 33.0 mmol), 4-(9H-carbazol-9-yl)phenyl boronic acid (9.5 g, 33.0 mmol), potassium phosphate (21.0 g, 99.0 mmol), toluene (100 ml), ethanol (50 ml), and water (50 ml) were added to a flask, and this system was sufficiently purged with nitrogen and heated to 65° C.

Bis(triphenylphosphine)palladium (II) dichloride (0.12 g, 0.17 mmol) was added thereto, and the resultant was stirred at 65° C. for 3 hours. Water was added to this reaction solution, which was subsequently extracted with toluene. The resulting organic layer was dried over anhydrous magnesium sulfate and then partially purified with activated earth. The thus obtained partial purification product was further purified by column chromatography (developer: hexane/methylene chloride=80/20), whereby the compound 23 (18.4 g, yield: 85.2%) was obtained.

[Synthesis of Compound 24]

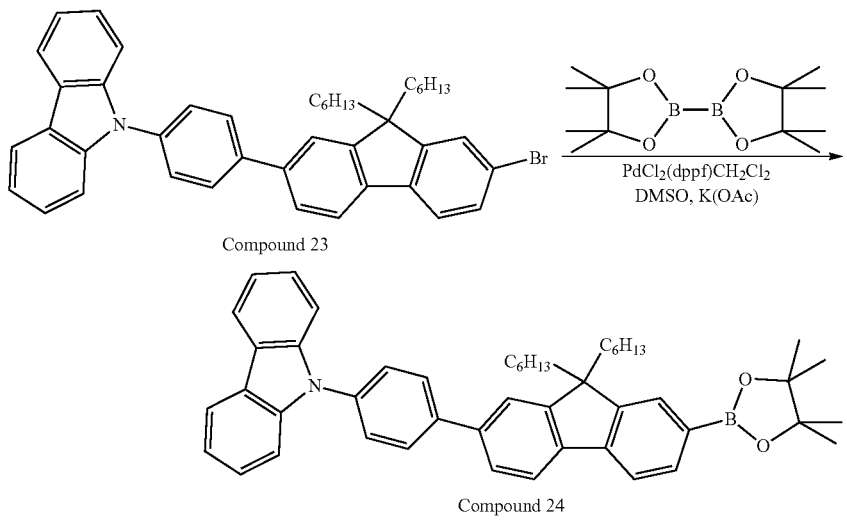

Compound 24

In a nitrogen stream, 100 ml of dimethyl sulfoxide, the compound 23 (18.2 g, 27.8 mmol), bis(pinacolato)diboron (10.6 g, 41.7 mmol), and potassium acetate (8.2 g, 83.4 mmol) were added to a 300-ml flask and stirred at 60° C. for 30 minutes. Subsequently, 1,1'-bis(diphenylphosphino)ferrocene-palladium (II) dichloride-dichloromethane [PdCl$_2$(dppf)CH$_2$Cl$_2$] (2.3 g, 2.78 mmol) was added, and the resulting mixture was allowed to react at 85° C. for 4.5 hours.

This reaction solution was vacuum-filtered, and the resulting filtrate was extracted with toluene, dried over anhydrous magnesium sulfate, and then partially purified with activated earth. The thus obtained partial purification product was further purified by column chromatography (developer: hexane/ethyl acetate=90/10), whereby the compound 24 (17.7 g, yield: 90.7%) was obtained.

[Synthesis of Compound 25]

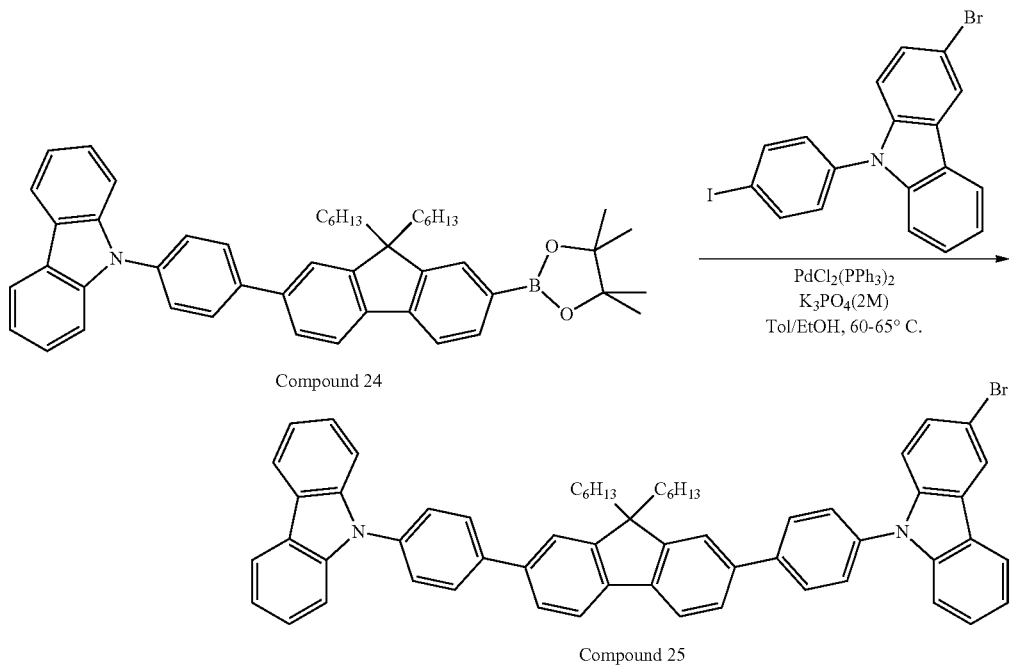

Subsequently, the compound 24 (5.3 g, 7.49 mmol), 3-bromo-9-(4-iodophenyl)-9H-carbazole (3.3 g, 7.34 mmol), potassium phosphate (4.2 g, 19.82 mmol), toluene (30 ml), ethanol (15 ml), and water (10 ml) were added to a flask, and this system was sufficiently purged with nitrogen and heated to 65° C.

Bis(triphenylphosphine)palladium (II) dichloride (0.052 g, 0.073 mmol) was added thereto, and the resultant was stirred at 65° C. for 3 hours. Water was added to this reaction solution, which was subsequently extracted with toluene. The resulting organic layer was dried over anhydrous magnesium sulfate and then partially purified with activated earth. The thus obtained partial purification product was further purified by column chromatography (developer: hexane/methylene chloride=75/25), whereby the compound 25 (4.8g, yield: 76.0%) was obtained.

[Synthesis of Compound 27]

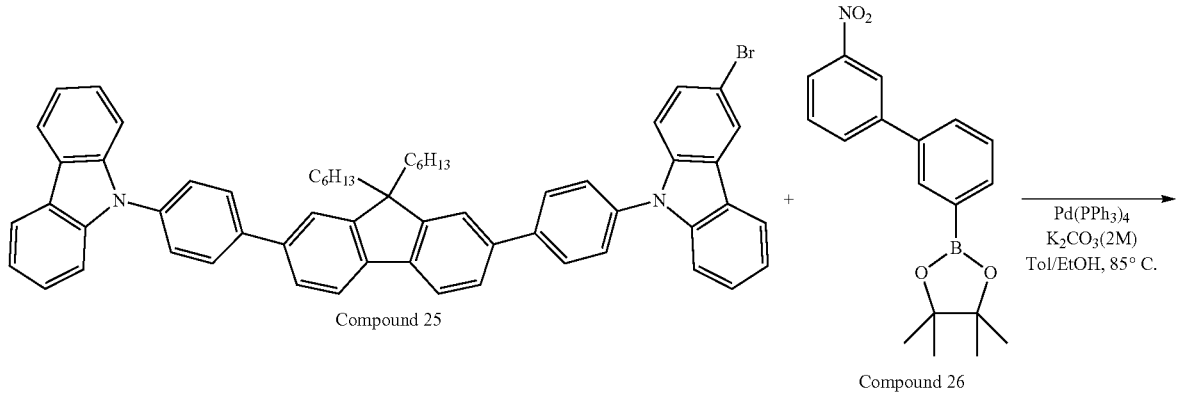

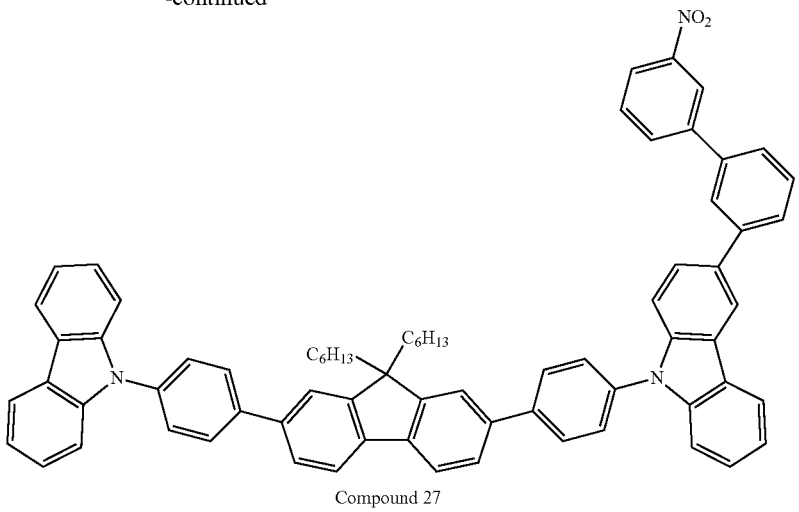
Compound 27

Subsequently, the compound 25 (4.6 g, 5.13 mmol), the compound 26 (2.2 g, 6.67 mmol), potassium carbonate (2.1 g, 15.4 mmol), toluene (24 ml), ethanol (8 ml), and water (8 ml) were added to a flask, and this system was sufficiently purged with nitrogen and heated to 60° C. Tetrakis(triphenylphosphine)palladium (0) (0.18 g, 0.154 mmol) was added thereto, and the resultant was stirred at 85° C. for 3.5 hours. Water was added to this reaction solution, which was subsequently extracted with toluene. The resulting organic layer was dried over anhydrous magnesium sulfate and then partially purified with activated earth. The thus obtained partial purification product was further purified by column chromatography (developer: hexane/methylene chloride=60/40), whereby the compound 27 (3.9 g, yield: 74.9%) was obtained.

[Synthesis of Compound 28]

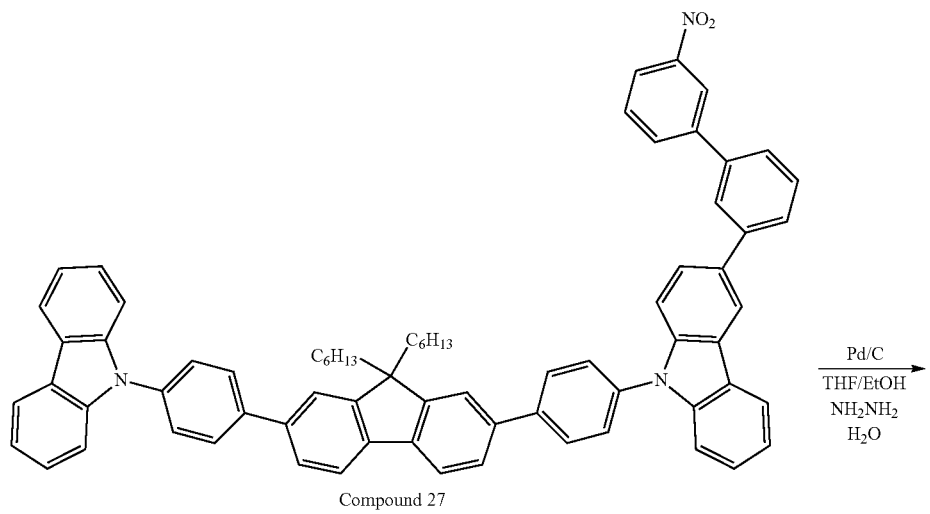
Compound 27

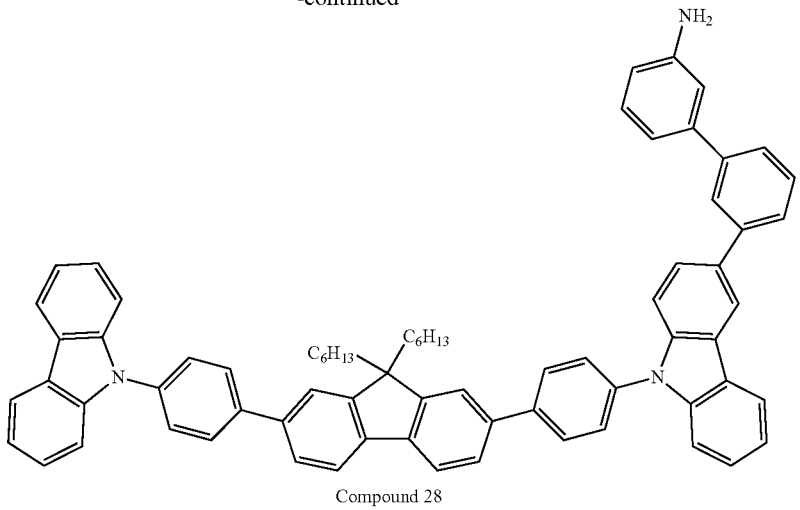

Compound 28

In a nitrogen stream, 40 ml of tetrahydrofuran, 40 ml of ethanol, the compound 27 (3.9 g, 3.84 mmol), and palladium/carbon (10%, about 55%-hydrated product, 0.29 g) were added to a 300-ml flask and stirred at 52° C. for 10 minutes. Subsequently, hydrazine monohydrate (1.3 g) was slowly added thereto dropwise, and the resulting mixture was allowed to react at this temperature for 5 hours.

This reaction solution was vacuum-filtered with wet celite, and the resulting filtrate was concentrated and then purified by recrystallization with ethanol, whereby the compound 28 (3.3 g, yield: 87.2%) was obtained.

[Synthesis of Compound 33]

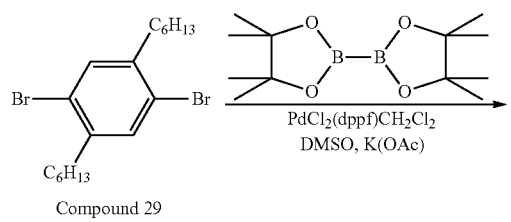

Compound 29

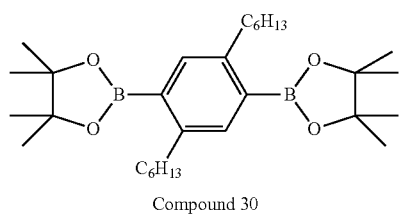

Compound 30

In a nitrogen stream, 200 ml of dimethyl sulfoxide, the compound 29 (15.5 g, 38.34 mmol), bis(pinacolato)diboron (24.3 g, 95.81 mmol), and potassium acetate (22.6 g, 230.0 mmol) were added to a 500-ml flask and stirred at 60° C. for 30 minutes. Subsequently, 1,1'-bis(diphenylphosphino)ferrocene-palladium (II) dichloride-dichloromethane [PdCl$_2$(dppf)CH$_2$Cl$_2$] (3.1 g, 3.83 mmol) was added, and the resulting mixture was allowed to react at 85° C. for 3 hours. This reaction solution was vacuum-filtered, and the resulting filtrate was extracted with toluene, dried over anhydrous magnesium sulfate, and then partially purified with activated earth. The thus obtained partial purification product was further purified by column chromatography (developer: hexane/ethyl acetate=95/5), whereby the compound 30 (9.2 g, yield: 48%) was obtained.

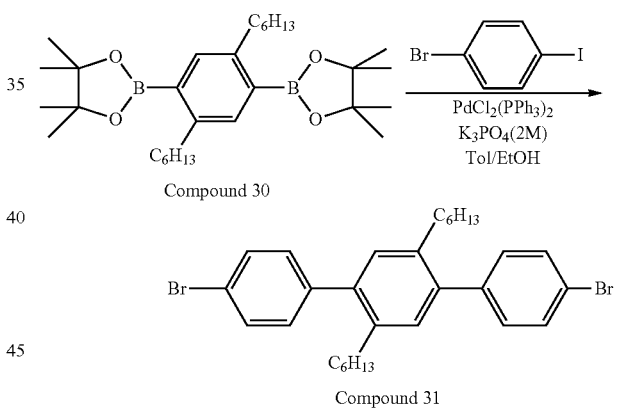

Compound 30

Compound 31

Subsequently, the compound 30 (6.1 g, 12.24 mmol), 1-bromo-4-iodobenzene (13.85 g, 48.96 mmol), potassium phosphate (15.6 g, 73.44 mmol), toluene (80 ml), ethanol (40 ml), and water (37 ml) were added to a flask, and this system was sufficiently purged with nitrogen and heated to 65° C. Bis(triphenylphosphine)palladium (II) dichloride (0.17 g, 0.25 mmol) was added thereto, and the resultant was stirred at 65° C. for 3 hours. Water was added to this reaction solution, which was subsequently extracted with toluene. The resulting organic layer was dried over anhydrous magnesium sulfate and then partially purified with activated earth. The thus obtained partial purification product was further purified by column chromatography (developer: hexane/methylene chloride=98/2), whereby the compound 31 (5.2 g, yield: 76.3%) was obtained.

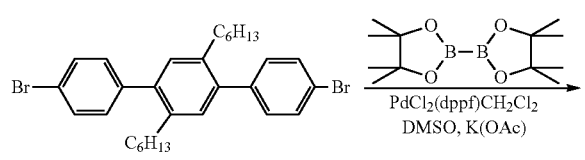

Compound 31

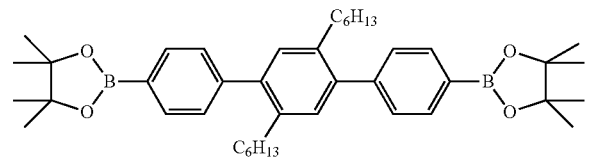

Compound 32

In a nitrogen stream, 100 ml of dimethyl sulfoxide, the compound 31 (5.2 g, 9.35 mmol), bis(pinacolato)diboron (7.1 g, 28.04 mmol), and potassium acetate (5.5 g, 56.1 mmol) were added to a 300-ml flask and stirred at 60° C. for 30 minutes. Subsequently, 1,1'-bis(diphenylphosphino)ferrocene-palladium (II) dichloride-dichloromethane [PdCl$_2$(dppf)CH$_2$Cl$_2$] (0.77 g, 0.94 mmol) was added, and the resulting mixture was allowed to react at 85° C. for 3 hours. This reaction solution was vacuum-filtered, and the resulting filtrate was extracted with toluene, dried over anhydrous magnesium sulfate, and then partially purified with activated earth. The thus obtained partial purification product was further purified by column chromatography (developer: hexane/ethyl acetate=95/5), whereby the compound 32 (5.1 g, yield: 85%) was obtained.

Subsequently, the compound 32 (5.1 g, 7.84 mmol), 2-iodo-5-bromotoluene (9.3 g, 31.36 mmol), potassium phosphate (10.0 g, 47.04 mmol), toluene (50 ml), ethanol (25 ml), and water (23 ml) were added to a flask, and this system was sufficiently purged with nitrogen and heated to 65° C. Bis(triphenylphosphine)palladium (II) dichloride (0.11 g, 0.16 mmol) was added thereto, and the resultant was stirred at 65° C. for 3 hours. Water was added to this reaction solution, which was subsequently extracted with toluene. The resulting organic layer was dried over anhydrous magnesium sulfate and then partially purified with activated earth. The thus obtained partial purification product was further purified by column chromatography (developer: hexane/methylene chloride=98/2), whereby the compound 33 (4.8 g, yield: 83.1%) was obtained.

Example 1-1

[Synthesis of Polymer 1]

A polymer 1 was synthesized in accordance with the following reaction scheme.

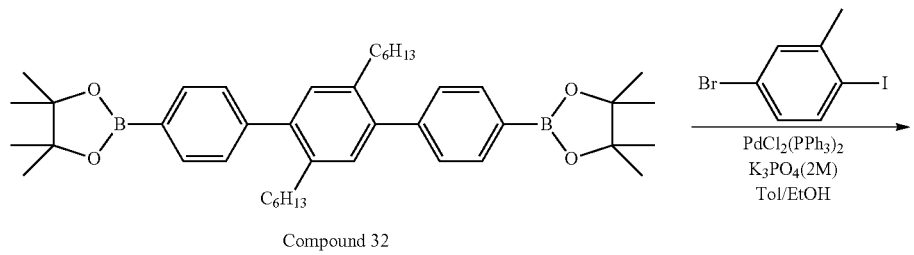

Compound 32

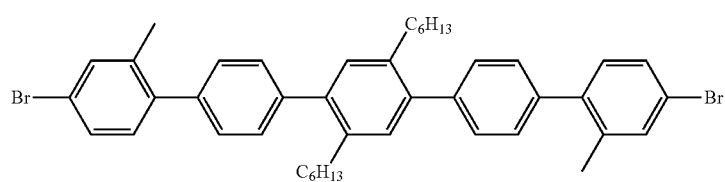

Compound 33

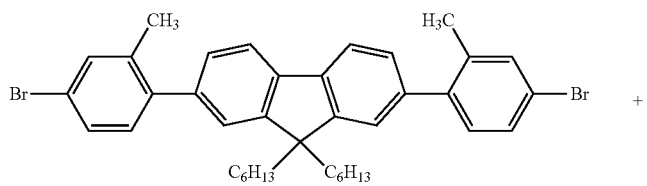

Compound 7

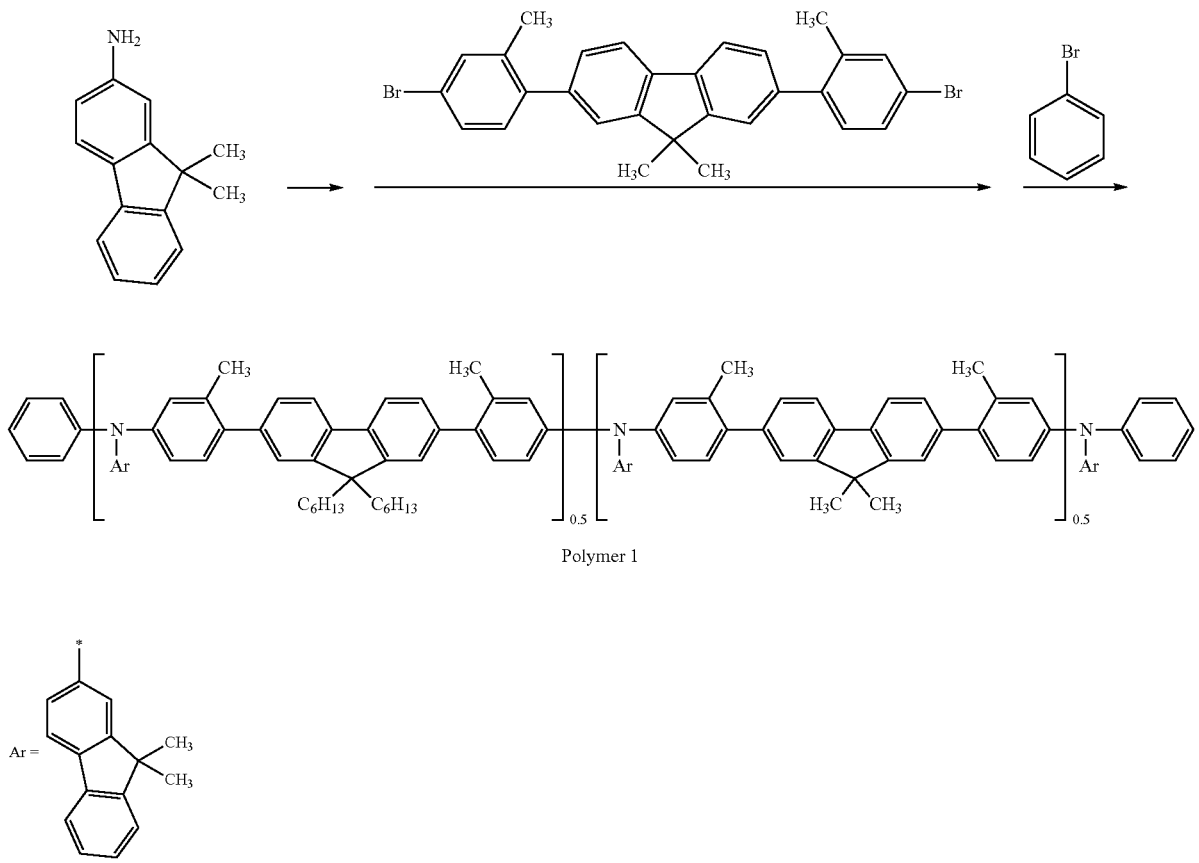

Polymer 1

The compound 7 (2.00 g, 3.0 mmol), 2-amino-9,9-dimethylfluorene (1.24 g, 6.00 mmol), tert-butoxy sodium (2.20 g, 22.9 mmol), and toluene (60 g) were added to a flask, and this system was sufficiently purged with nitrogen and heated to 60° C. (solution A). To 3.1 g of a toluene solution of a tris(dibenzylidene acetone)dipalladium complex (0.054 g, 0.059 mmol) that had been prepared in a separate flask, [4-(N,N-dimethylamino)phenyl]di-tert-butyl phosphine (0.13 g, 0.48 mmol) was added, and the resultant was heated to 60° C. (solution B). In a nitrogen stream, the solution B was added to the solution A, and they were allowed to react for 1.0 hour with heating to reflux. After confirming that the monomers had disappeared, the compound 5 (1.440 g, 2.71 mmol) was added. The resultant was heated to reflux for 1 hour, and bromobenzene (0.467 g, 2.97 mmol) was subsequently added thereto, followed by 2 hours of heating to reflux. This reaction solution was allowed to cool and, after an addition of 50 ml of toluene thereto, the reaction solution was added dropwise to an ethanol/water (200 ml/40 ml) solution to obtain a crude polymer.

This crude polymer was dissolved in toluene and reprecipitated with acetone, and the thus precipitated polymer was dissolved again in toluene, followed by washing with diluted hydrochloric acid and reprecipitation with ammonia-containing ethanol. The resulting polymer was recovered by filtration and then purified by column chromatography to obtain the polymer 1 (1.1 g). The thus obtained polymer 1 had the following molecular weight and degree of dispersion.

Weight-average molecular weight (Mw)=55,540
Number-average molecular weight (Mn)=38,040
Degree of dispersion (Mw/Mn)=1.46

Example 1-2

[Synthesis of Polymer 3]

A polymer 3 was synthesized in the same manner as the polymer 1 in accordance with the following reaction scheme.

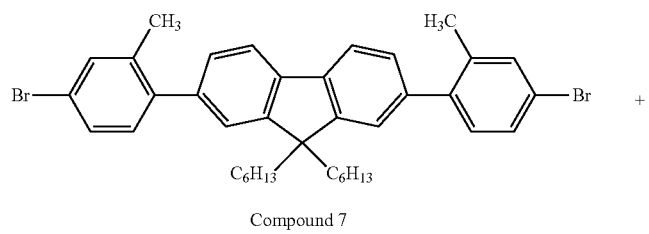
Compound 7
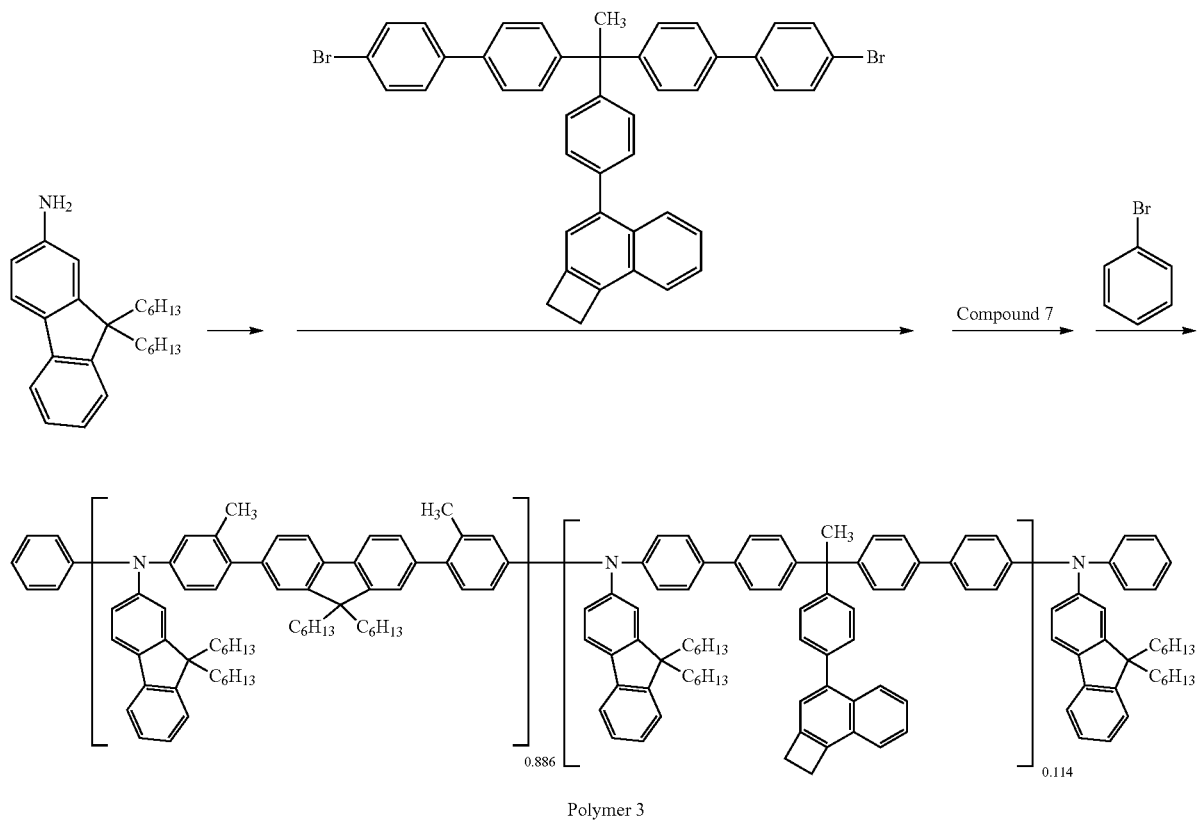
Polymer 3
Weight-average molecular weight (Mw)=41,900
Number-average molecular weight (Mn)=31,500
Degree of dispersion (Mw/Mn)=1.33
Example 1-3
[Synthesis of Polymer 4]
A polymer 4 was synthesized in the same manner as the polymer 1 in accordance with the following reaction scheme.
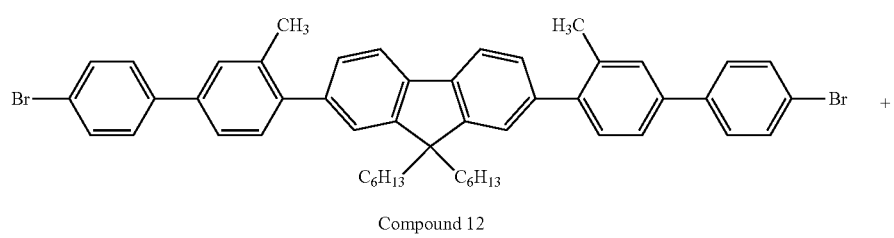
Compound 12

-continued
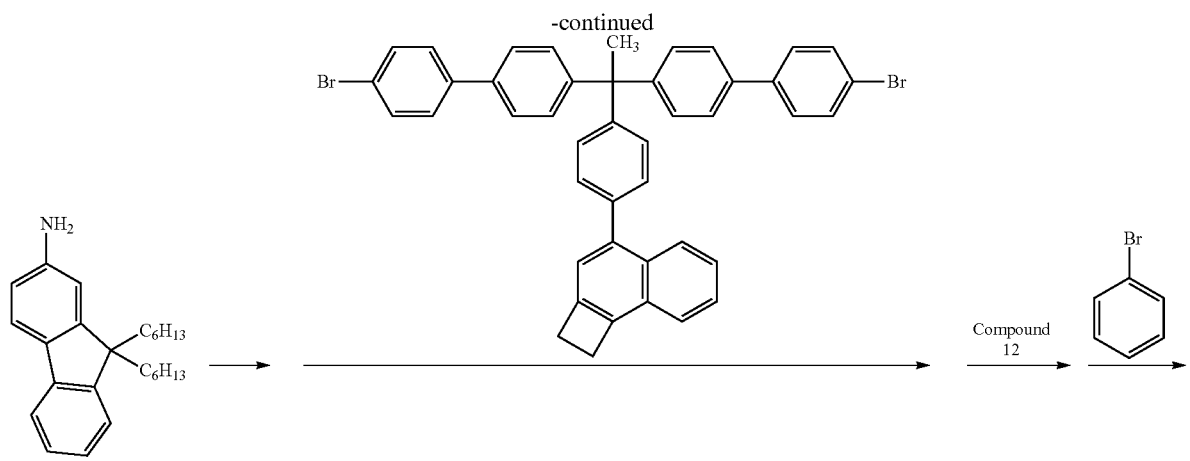
Compound 12
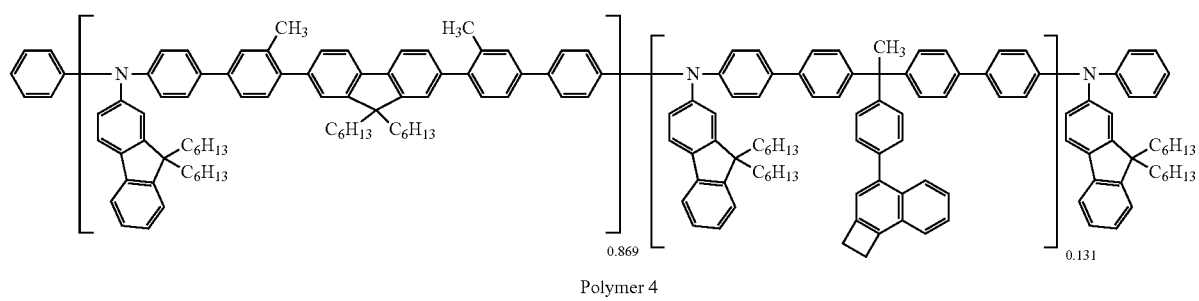
Polymer 4
Weight-average molecular weight (Mw)=41,300
Number-average molecular weight (Mn)=28,650
Degree of dispersion (Mw/Mn)=1.44
Example 1-4
[Synthesis of Polymer 5]
A polymer 5 was synthesized in the same manner as the polymer 1 in accordance with the following reaction scheme.
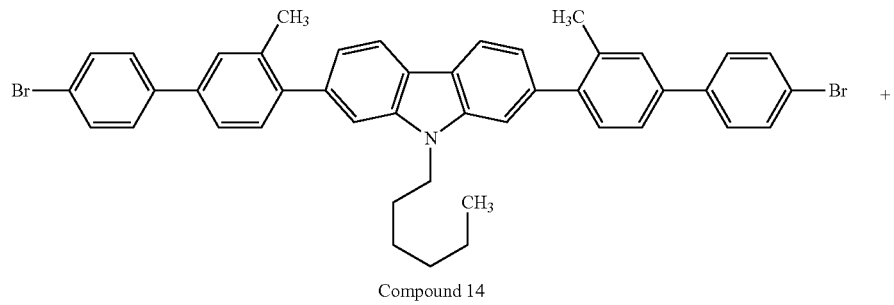
Compound 14

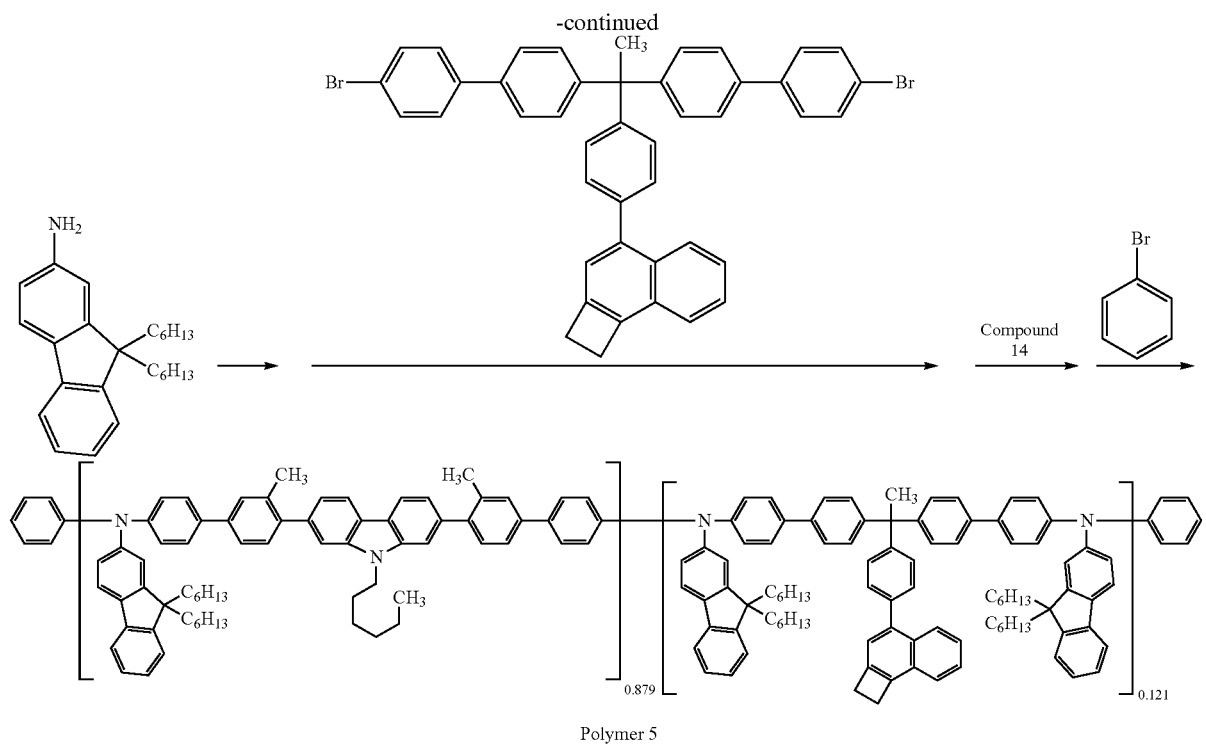
Polymer 5
Weight-average molecular weight (Mw)=38,380
Number-average molecular weight (Mn)=26,840
Degree of dispersion (Mw/Mn)=1.43
Example 1-5
[Synthesis of Polymer 6]
A polymer 6 was synthesized in the same manner as the polymer 1 in accordance with the following reaction scheme.
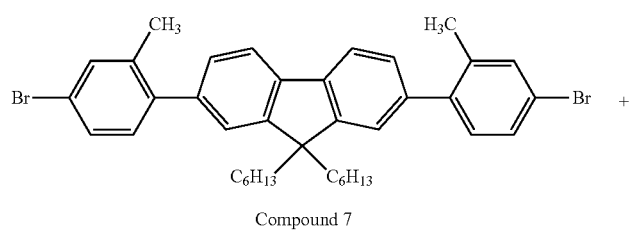
Compound 7
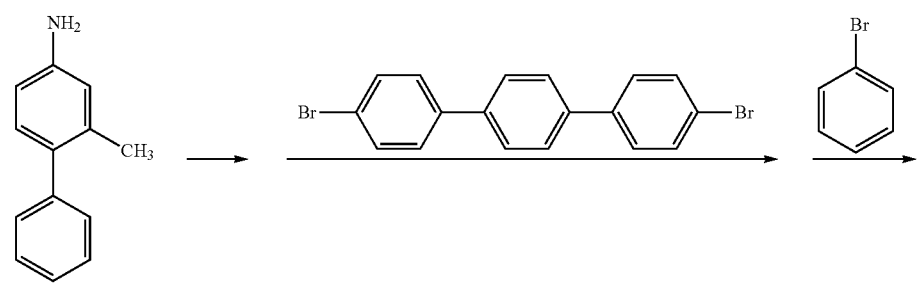

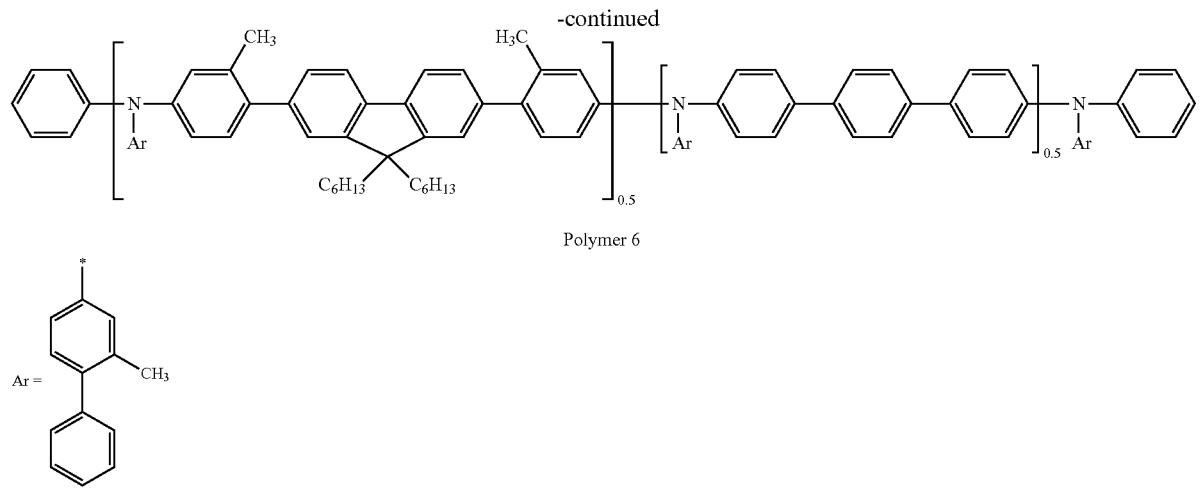
Polymer 6
Weight-average molecular weight (Mw)=74,160
Number-average molecular weight (Mn)=50,100
Degree of dispersion (Mw/Mn)=1.48
Comparative Example 1-1
[Synthesis of Polymer 10]
A polymer 10 for comparison was synthesized in the same manner as the polymer 1 in accordance with the following reaction scheme.
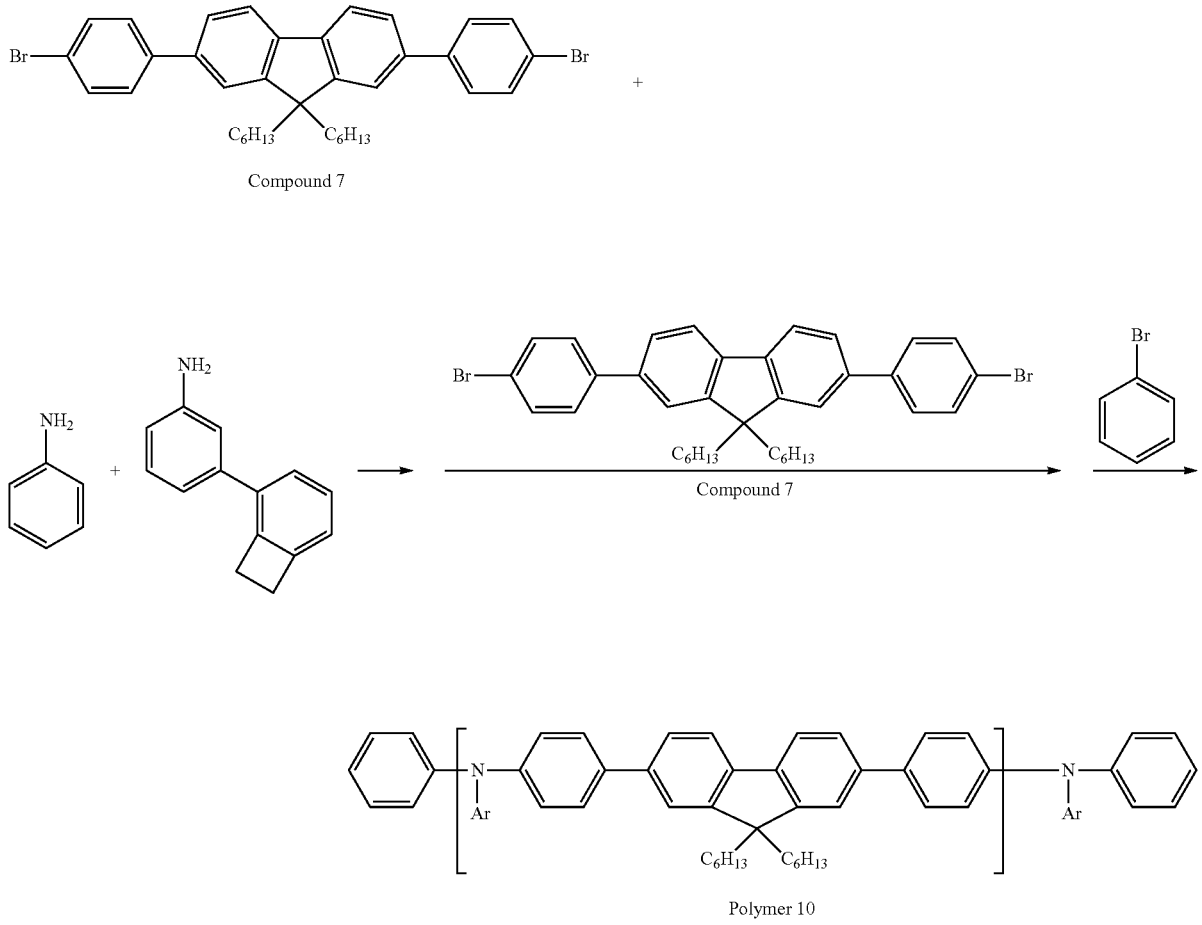
Polymer 10

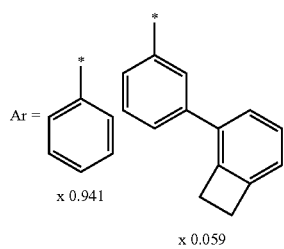
Weight-average molecular weight (Mw)=51,300
Number-average molecular weight (Mn)=35,380
(Mw/Mn)=1.45
Comparative Example 1-2
[Synthesis of Polymer 11]
A polymer 11 for comparison was synthesized in the same manner as the polymer 1 in accordance with the following reaction scheme.
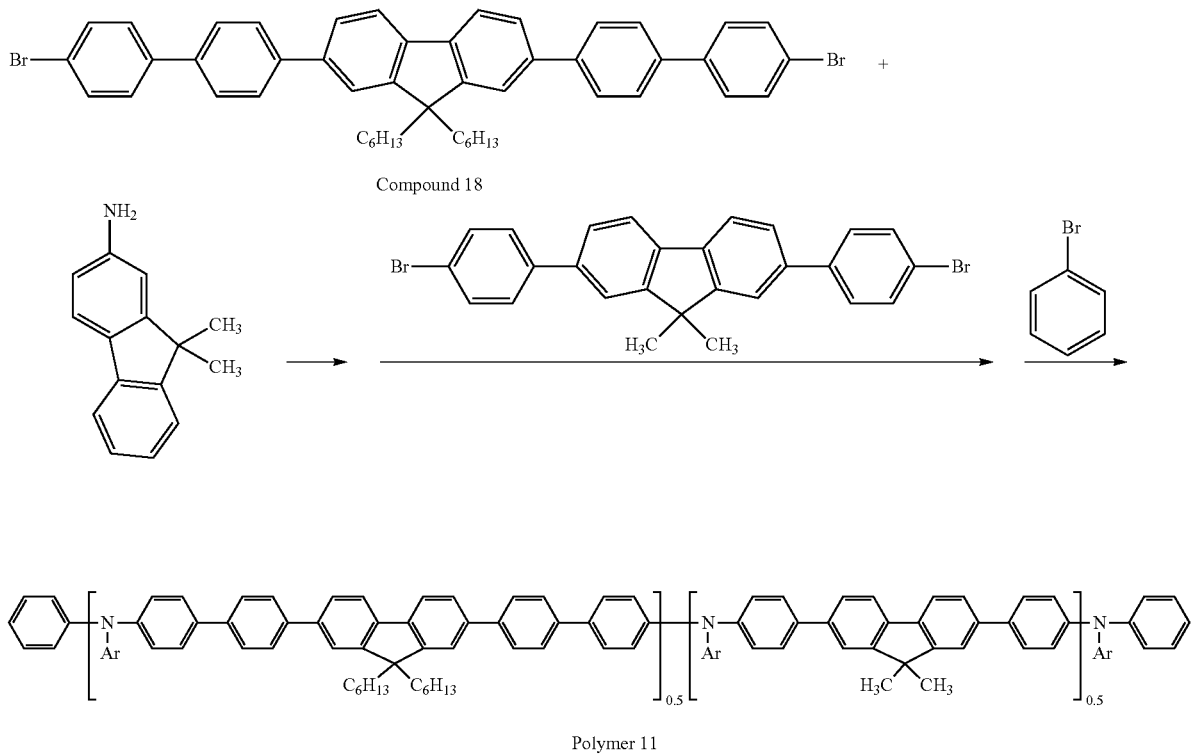
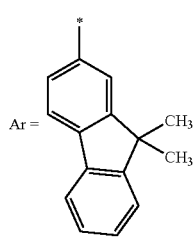

Weight-average molecular weight (Mw)=39,840
Number-average molecular weight (Mn)=30,180
(Mw/Mn)=1.32
Comparative Example 1-3
[Synthesis of Polymer 12]
A polymer 12 for comparison was synthesized in the same manner as the polymer 1 in accordance with the following reaction scheme.
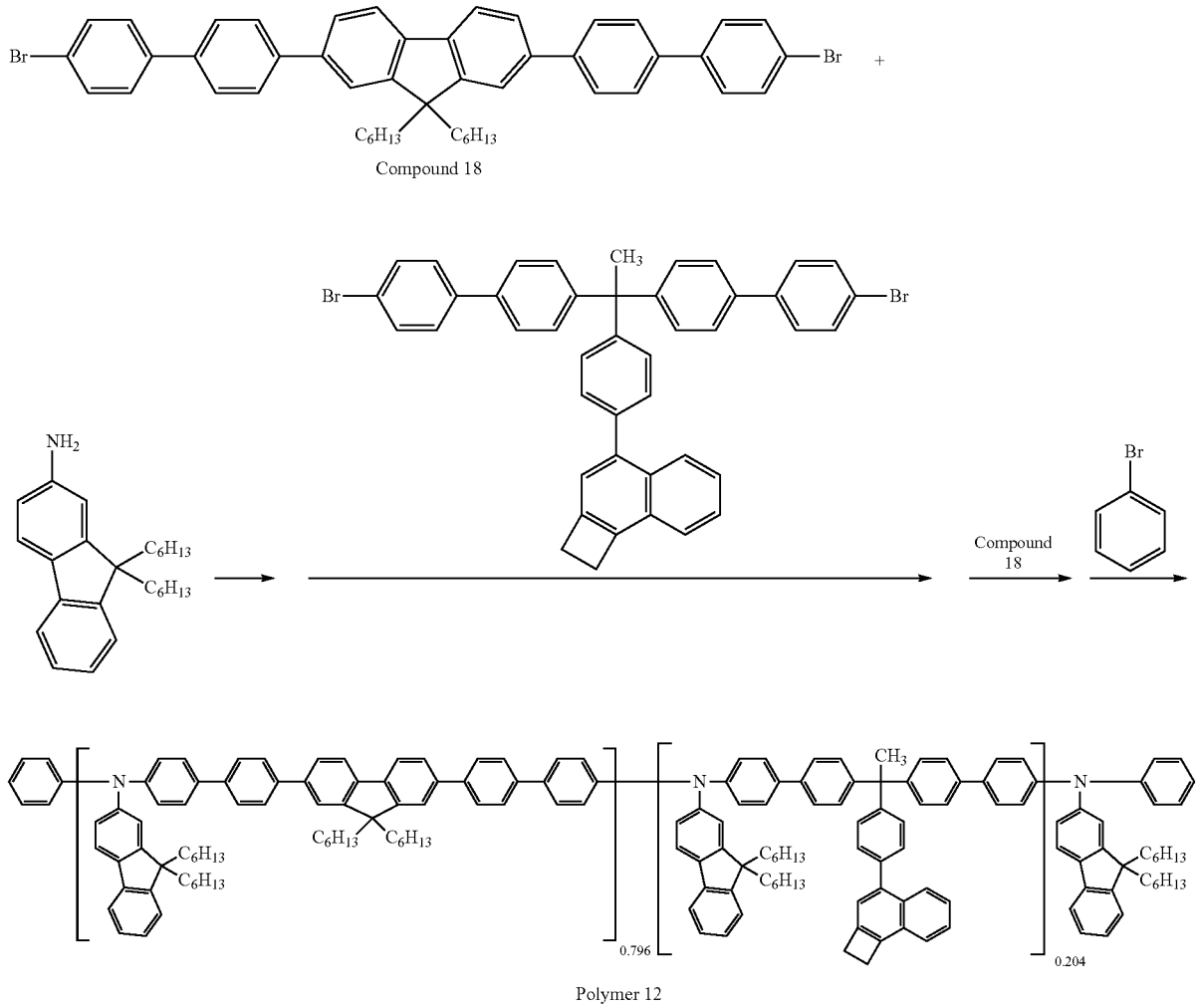
Example 1-6
[Synthesis of Polymer 7]
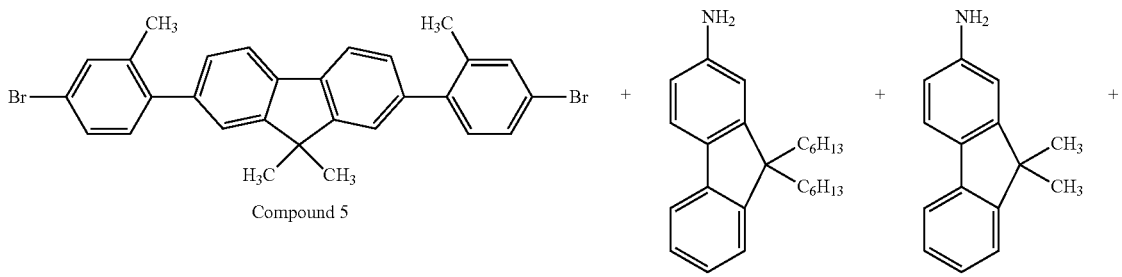

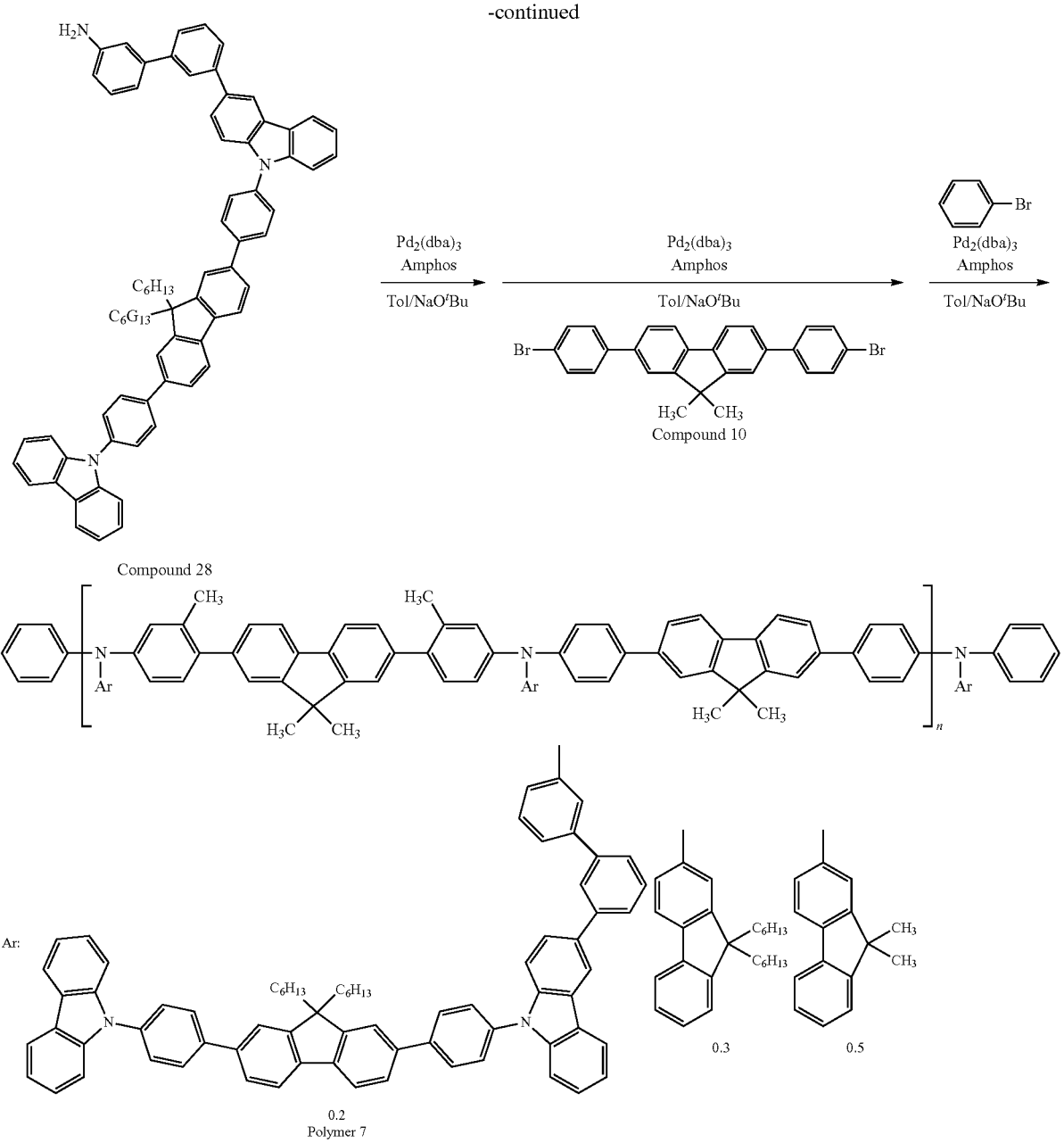

The compound 5 (1.5 g, 2.8 mmol), 2-amino-9,9-dihexylfluorene (0.59 g, 1.7 mmol), 2-amino-9,9-dimethylfluorene (0.59 g, 2.8 mmol), the compound 28 (1.11 g, 1.1 mmol), tert-butoxy sodium (2.09 g, 21.7 mmol), and toluene (24 g, 27.7 ml) were added, and the system was sufficiently purged with nitrogen and heated to 60° C. (solution A1).

To 3.3 ml of a toluene solution of a tris(dibenzylideneacetone)dipalladium complex (0.052 g, 0.06 mmol), [4-(N,N-dimethylamino)phenyl]di-tert-butyl phosphine (Amphos) (0.12 g, 0.5 mmol) was added, and the resultant was heated to 60° C. (solution B1).

In a nitrogen stream, the solution B1 was added to the solution A1, and they were allowed to react for 1.0 hour with heating to reflux. After confirming that the compound 5 had disappeared, the compound 10 (1.30 g, 2.6 mmol) was added. The resultant was heated to reflux for 2 hours, and bromobenzene (0.44 g, 2.8 mmol) was subsequently added thereto, followed by 2 hours of reaction with heating to reflux. This reaction solution was allowed to cool and, after an addition of 40 ml of toluene thereto, the reaction solution was added dropwise to an ethanol/water (500 ml/90 ml) solution to obtain an end-capped crude polymer.

This end-capped crude polymer was dissolved in toluene and reprecipitated in acetone, and the thus precipitated polymer was recovered by filtration. The thus obtained polymer was dissolved in toluene, washed with diluted hydrochloric acid, and reprecipitated with ammonia-containing ethanol. The resulting polymer was recovered by filtration and then purified by column chromatography to obtain a polymer 7 of interest (1.7 g). The molecular weight and the like of the thus obtained polymer 7 were as follows.

Weight-average molecular weight (Mw)=40,000
Number-average molecular weight (Mn)=29,600
Degree of dispersion (Mw/Mn)=1.35

Example 1-7

[Synthesis of Polymer 8]

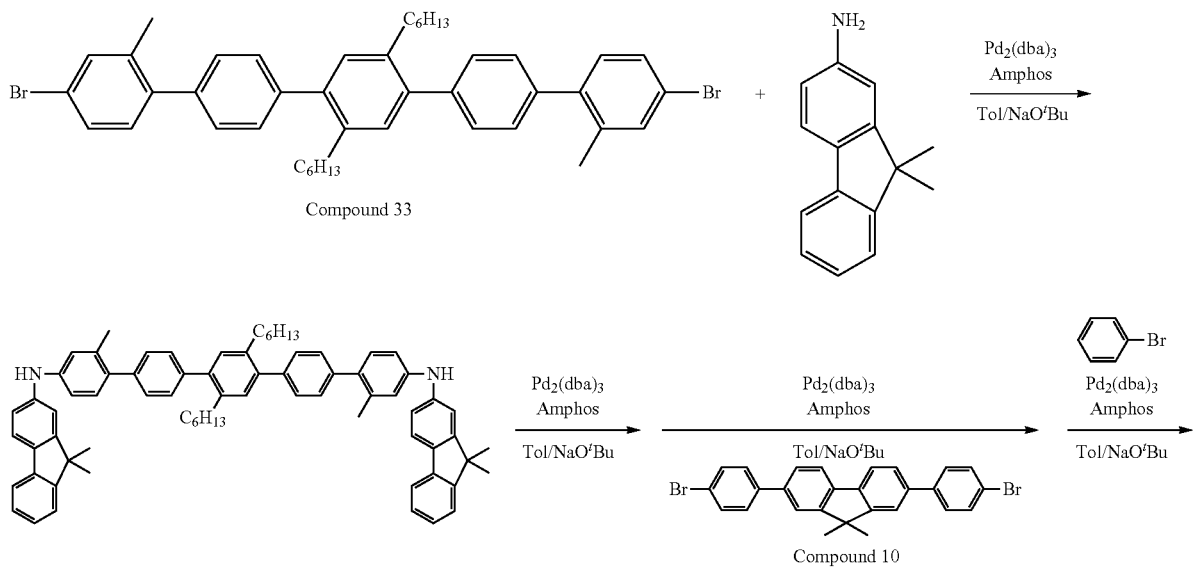

Compound 33

Compound 10

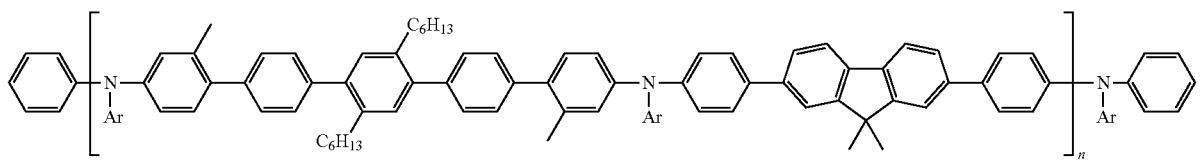

Polymer 8

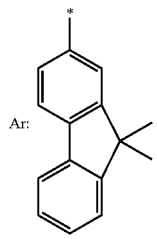

Ar:

The compound 33 (1.35 g, 1.8 mmol), 2-amino-9,9-dimethylfluorene (0.767 g, 3.7 mmol), tert-butoxy sodium (1.36 g, 14.1 mmol), and toluene (41 ml) were added, and the system was sufficiently purged with nitrogen and heated to 60° C. (solution A). To 5 ml of a toluene solution of a tris(dibenzylidene acetone)dipalladium complex (0.034 g, 0.04 mmol), [4-(N,N-dimethylamino)phenyl]di-tert-butyl phosphine (Amphos) (0.078 g, 0.30 mmol) was added, and the resultant was heated to 60° C. (solution B). In a nitrogen stream, the solution B was added to the solution A, and they were allowed to react for 1.0 hour with heating to reflux. After confirming that the compound 33 had disappeared, the compound 10 (0.892 g, 1.77 mmol) was added. The resultant was heated to reflux for 2 hours, and bromobenzene (0.2 g, 1.3 mmol) was subsequently added thereto, followed by 2 hours of reaction with heating to reflux. This reaction solution was allowed to cool and, after an addition of 40 ml of toluene thereto, the reaction solution was added dropwise to an ethanol/water (500 ml/90 ml) solution to obtain an end-capped crude polymer.

This end-capped crude polymer was dissolved in toluene and reprecipitated in acetone, and the thus precipitated polymer was recovered by filtration. The thus obtained polymer was dissolved in toluene, washed with diluted hydrochloric acid, and reprecipitated with ammonia-containing ethanol. The resulting polymer was recovered by filtration and then purified by column chromatography to obtain a polymer 8 of interest (0.8 g). The molecular weight and the like of the thus obtained polymer 8 were as follows.

Weight-average molecular weight (Mw)=61,500
Number-average molecular weight (Mn)=48,000
Degree of dispersion (Mw/Mn)=1.28

Example 1-8

[Synthesis of Polymer 9]

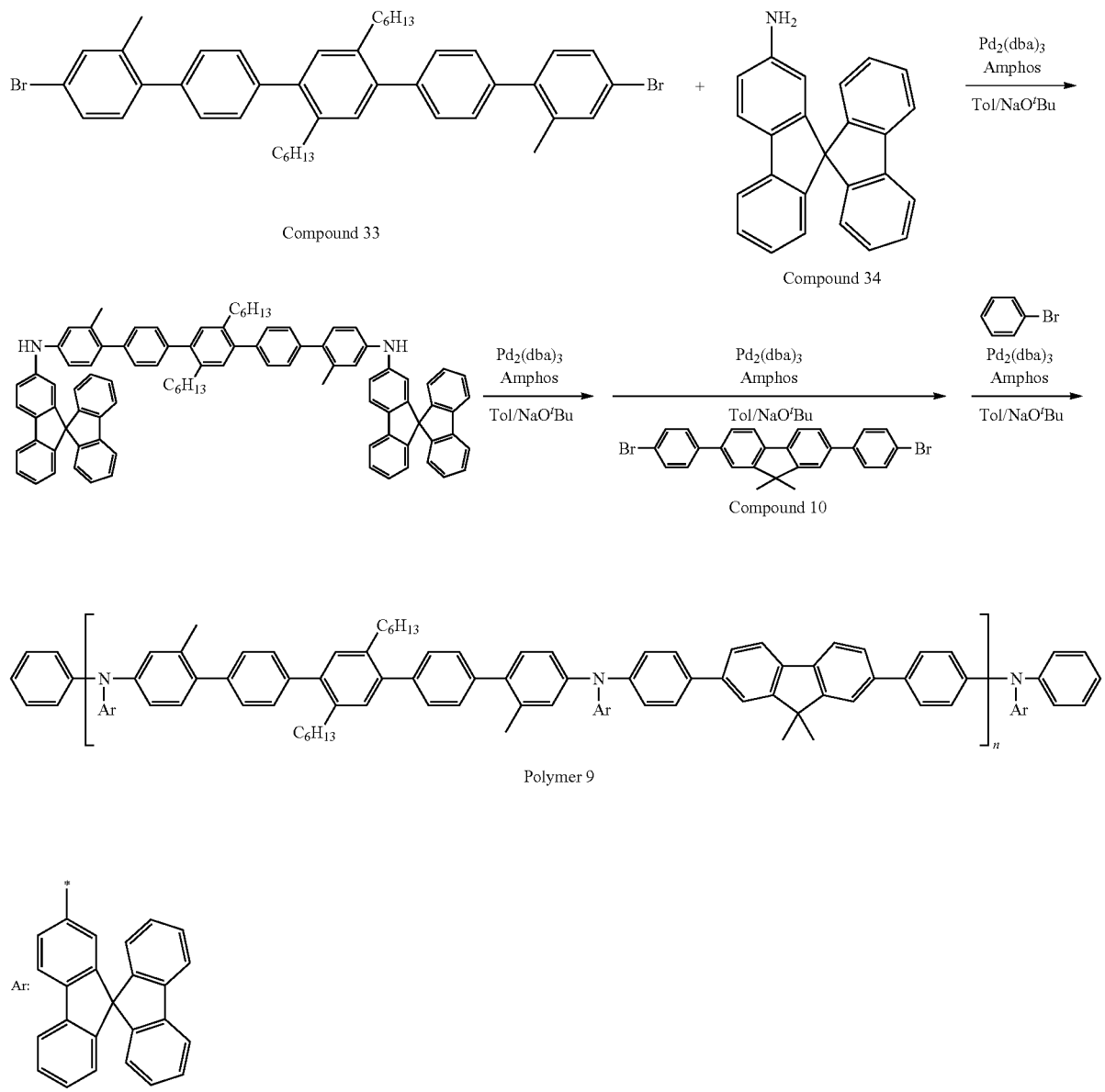

The compound 33 (0.9 g, 1.2 mmol), the compound 34 (0.81 g, 2.4 mmol), tert-butoxy sodium (0.91 g, 9.4 mmol), and toluene (27 ml) were added, and this system was sufficiently purged with nitrogen and heated to 60° C. (solution A). To 5 ml of a toluene solution of a tris(dibenzylidene acetone)dipalladium complex (0.022 g, 0.02 mmol), [4-(N,N-dimethylamino)phenyl]di-tert-butyl phosphine (Amphos) (0.052 g, 0.20 mmol) was added, and the resultant was heated to 60° C. (solution B). In a nitrogen stream, the solution B was added to the solution A, and they were allowed to react for 1.0 hour with heating to reflux. After confirming that the compound 33 had disappeared, the compound 10 (0.558 g, 1.1 mmol) was added. The resultant was heated to reflux for 2 hours, and bromobenzene (0.36 g, 2.3 mmol) was subsequently added thereto, followed by 2 hours of reaction with heating to reflux. This reaction solution was allowed to cool and, after an addition of 26 ml of toluene thereto, the reaction solution was added dropwise to an ethanol/water (400 ml/90 ml) solution to obtain an end-capped crude polymer.

This end-capped crude polymer was dissolved in toluene and reprecipitated in acetone, and the thus precipitated polymer was recovered by filtration. The thus obtained polymer was dissolved in toluene, washed with diluted hydrochloric acid, and reprecipitated with ammonia-containing ethanol. The resulting polymer was recovered by filtration and then purified by column chromatography to obtain a polymer 9 of interest (0.3 g). The molecular weight and the like of the thus obtained polymer 9 were as follows.

Weight-average molecular weight (Mw)=81,300

Number-average molecular weight (Mn)=63,000

Degree of dispersion (Mw/Mn)=1.29

Example 1-9
(Synthesis of Polymer 13)
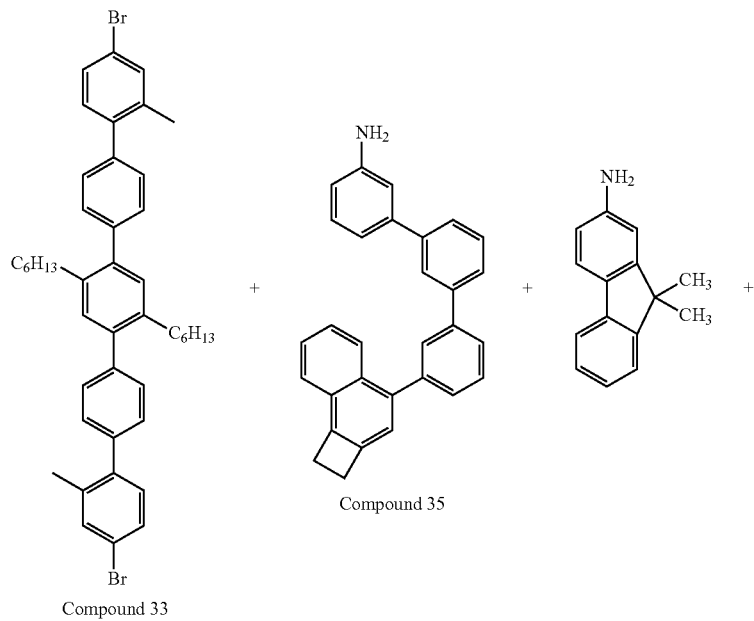
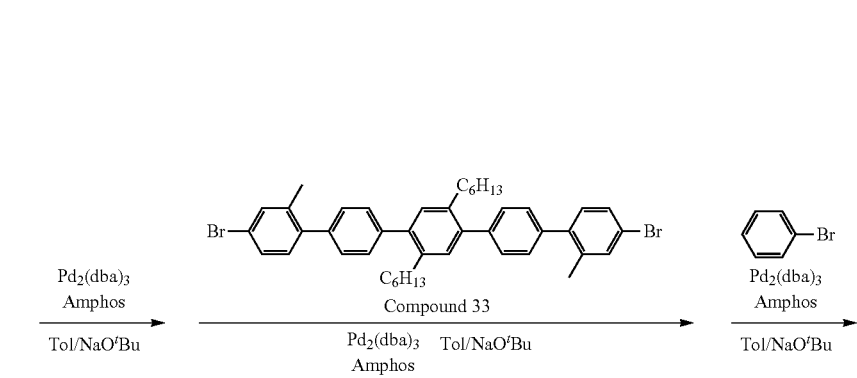

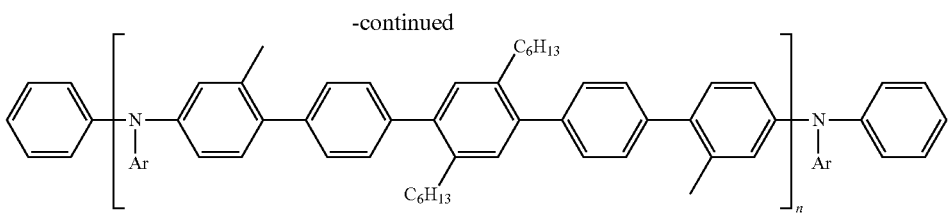

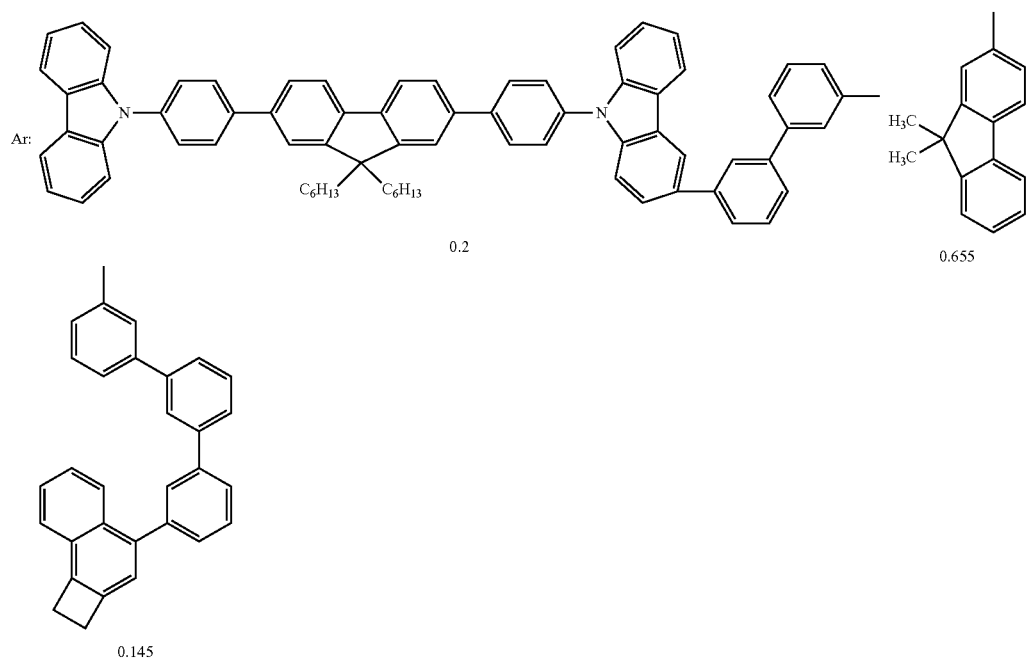

The compound 33 (1.2 g, 1.6 mmol), the compound 35 (0.179 g, 0.5 mmol), 2-amino-9,9-dimethylfluorene (0.447 g, 2.1 mmol), the compound 28 (0.641 g, 0.7 mmol), tert-butoxy sodium (1.21 g, 12.6 mmol), and toluene (21.6 g, 25 ml) were added, and the system was sufficiently purged with nitrogen and heated to 60° C. (solution A1).

To 5.0 ml of a toluene solution of a tris(dibenzylidene acetone)dipalladium complex (0.0298 g, 0.03 mmol), [4-(N,N-dimethylamino)phenyl]di-tert-butyl phosphine (Amphos) (0.069 g, 0.3 mmol) was added, and the resultant was heated to 60° C. (solution B1).

In a nitrogen stream, the solution B1 was added to the solution A1, and they were allowed to react for 1.0 hour with heating to reflux. After confirming that the compound 33 had disappeared, the compound 33 (0.954 g, 1.29 mmol) was added. The resultant was heated to reflux for 2 hours, and bromobenzene (0.26 g, 1.7 mmol) was subsequently added thereto, followed by 2 hours of reaction with heating to reflux. This reaction solution was allowed to cool and, after an addition of 41 ml of toluene thereto, the reaction solution was added dropwise to an ethanol/water (235 ml/30 ml) solution to obtain an end-capped crude polymer.

This end-capped crude polymer was dissolved in toluene and reprecipitated in acetone, and the thus precipitated polymer was recovered by filtration. The thus obtained polymer was dissolved in toluene, washed with diluted hydrochloric acid, and reprecipitated with ammonia-containing ethanol. The resulting polymer was recovered by filtration and then purified by column chromatography to obtain a polymer 13 of interest (1.7 g). The molecular weight and the like of the thus obtained polymer 13 were as follows.

Weight-average molecular weight (Mw)=42,300
Number-average molecular weight (Mn)=29,375
Degree of dispersion (Mw/Mn)=1.44

Example 1-10
(Synthesis of Polymer 14)
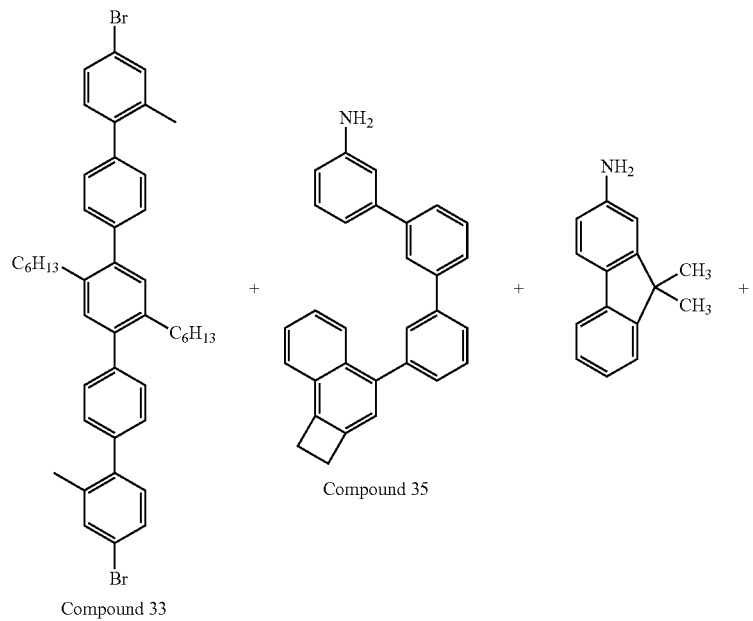
Compound 33
Compound 35
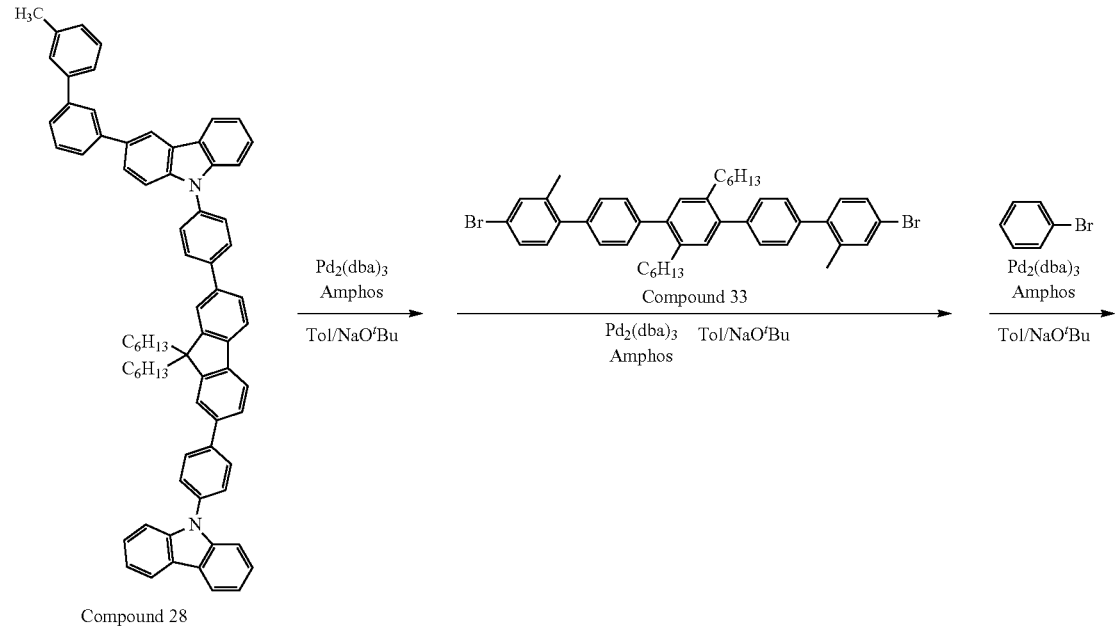
Compound 28
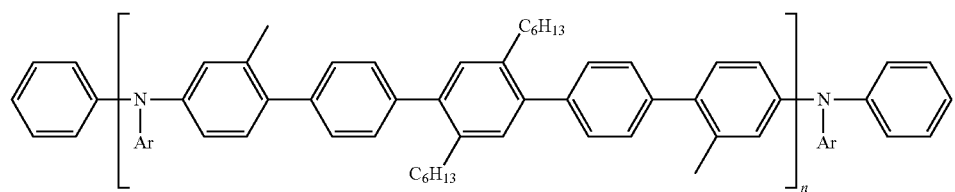

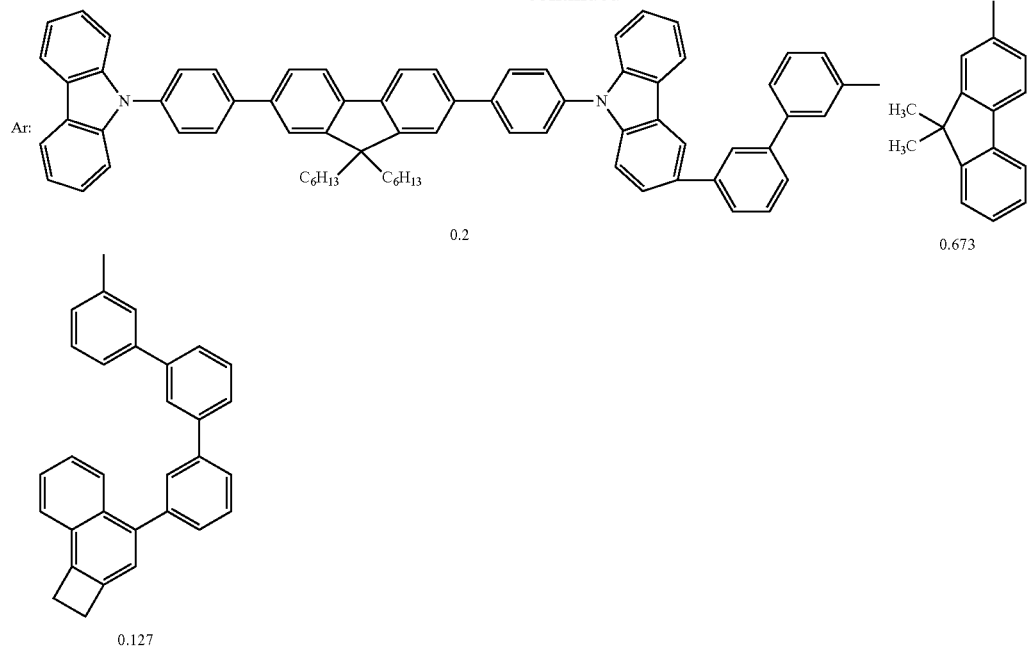

The compound 33 (1.4 g, 1.9 mmol), the compound 35 (0.183 g, 0.5 mmol), 2-amino-9,9-dimethylfluorene (0.535 g, 2.6 mmol), the compound 28 (0.748 g, 0.8 mmol), tert-butoxy sodium (1.41 g, 14.7 mmol), and toluene (25.2 g, 29 ml) were added, and the system was sufficiently purged with nitrogen and heated to 60° C. (solution A1).

To 6.0 ml of a toluene solution of a tris(dibenzylideneacetone)dipalladium complex (0.0348 g, 0.04 mmol), [4-(N,N-dimethylamino)phenyl]di-tert-butyl phosphine (Amphos) (0.081 g, 0.3 mmol) was added, and the resultant was heated to 60° C. (solution B1).

In a nitrogen stream, the solution B1 was added to the solution A1, and they were allowed to react for 1.0 hour with heating to reflux. After confirming that the compound 33 had disappeared, the compound 33 (1.21 g, 1.6 mmol) was added. The resultant was heated to reflux for 2 hours, and bromobenzene (0.21 g, 1.3 mmol) was subsequently added thereto, followed by 2 hours of reaction with heating to reflux. This reaction solution was allowed to cool and, after an addition of 80 ml of toluene thereto, the reaction solution was added dropwise to an ethanol/water (380 ml/35 ml) solution to obtain an end-capped crude polymer.

This end-capped crude polymer was dissolved in toluene and reprecipitated in acetone, and the thus precipitated polymer was recovered by filtration. The thus obtained polymer was dissolved in toluene, washed with diluted hydrochloric acid, and reprecipitated with ammonia-containing ethanol. The resulting polymer was recovered by filtration and then purified by column chromatography to obtain a polymer 14 of interest (1.4 g). The molecular weight and the like of the thus obtained polymer 14 were as follows.

Weight-average molecular weight (Mw)=37,500
Number-average molecular weight (Mn)=28,625
Degree of dispersion (Mw/Mn)=1.31

[Measurement of Excited Singlet Energy Level ($S_1$) and Excited Triplet Energy Level ($T_1$) of Polymers]

Each polymer was dissolved in 2-methyltetrahydrofuran to prepare a 1%-by-mass solution. For this solution sample, the fluorescence emission spectrum and the phosphorescence emission spectrum were measured using a fluorescence spectrophotometer (F-4500, manufactured by Hitachi, Ltd.) at an excitation wavelength of 350 nm under a liquid nitrogen cooling condition. On the thus obtained fluorescence emission spectrum and phosphorescence emission spectrum, the $S_1$ level and the $T_1$ level were determined from the peak-top wavelength of an emission peak closest to the short-wavelength side.

The measurement results are shown in Table 1.

TABLE 1

|  | S1 level (nm) | T1 level (nm) |
|---|---|---|
| Polymer 1 | 418 | 517 |
| Polymer 3 | 411 | 517 |
| Polymer 4 | 416 | 524 |
| Polymer 5 | 415 | 519 |
| Polymer 6 | 428 | 534 |
| Polymer 10 | 437 | 563 |
| Polymer 11 | 436 | 564 |
| Polymer 12 | 442 | 562 |

It was demonstrated that, as compared to the polymers of Comparative Examples 1-1 to 1-3, the polymers of Examples 1-1 to 1-6 had higher $S_1$ and $T_1$ energy levels and were less likely to cause quenching in an organic electroluminescent element due to energy transfer from a light-emitting exciton to each polymer.

[Insolubilization Experiment]

Using the polymers of Examples, insolubilization experiments in cyclohexylbenzene and butyl benzoate were conducted. The polymers 1, 3 to 7, 8 and 9 were each dissolved in anisole to prepare coating compositions. These coating compositions were each spin-coated on a glass slide substrate to form a film having a thickness of 110 nm to 130 nm. The thus formed film was subsequently heat-treated at 230° C. for 30 minutes. Then, the thickness of each film was measured at room temperature.

Further, each film was rinsed with cyclohexyl benzene or butyl benzoate. This rinsing treatment was performed by dropping 130 μl of the solvent onto the coating film, leaving the film to stand for 90 seconds, and then spinning the substrate. After heat-treating the whole glass slide substrate having the thus rinsed film, the thickness of the film remaining on the glass slide substrate was measured. The film thickness ratio before and after the rinsing treatment (insolubilization rate) is shown in Table 2.

TABLE 2

|  | Insolubilization rate (%) | |
| --- | --- | --- |
|  | Cyclohexylbenzene | Butyl benzoate |
| Polymer 1 | >95% | >95% |
| Polymer 3 | >95% | >95% |
| Polymer 4 | >95% | >95% |
| Polymer 5 | >95% | >95% |
| Polymer 6 | >95% | >95% |
| Polymer 7 | 100% |  |
| Polymer 8 | >95% | >95% |
| Polymer 9 | >95% | >95% |

As shown in Table 2, it was demonstrated that the organic films of the polymers 1, 3 to 7, 8 and 9 did not dissolved in cyclohexylbenzene and butyl benzoate after being heat-treated and, therefore, can be formed by a wet process.

<Solubility Test>

For the polymer 8 synthesized above, the solubility in toluene was tested at room temperature (25° C.). As a result, the polymer 8 was found to have a solubility of not less than 5% by mass in toluene at room temperature (25° C.).

Example 2-1

An organic electroluminescent element having the configuration illustrated in the FIGURE was produced in the following manner.

On a glass substrate 1 on which a transparent conductive film of indium-tin oxide (ITO) had been deposited at a thickness of 70 nm (sputtered film article, manufactured by Sanyo Vacuum Industries Co., Ltd.), 2 mm-wide stripes were patterned by a combination of an ordinary photolithography technique and hydrochloric acid etching to form an anode 2, whereby an ITO substrate was obtained.

This pattern-formed ITO substrate was sequentially subjected to ultrasonic washing with an aqueous surfactant solution, washing with ultrapure water, ultrasonic washing with ultrapure water, and then washing with ultrapure water, after which the ITO substrate was dried with compressed air and cleaned with UV/ozone at last.

First, 100 parts by mass of a charge transporting polymer compound having the following structural formula (P-1) and 10 parts by mass of an electron-accepting compound having the following structure (A1) were weighed and dissolved in butyl benzoate to prepare a 3.0%-by-weight solution.

This solution was spin-coated onto the above-described substrate in the atmosphere, and the resultant was dried in a 240° C. clean oven in the atmosphere for 60 minutes to form a 60 nm-thick uniform thin film as a hole injection layer 3.

Next, 100 parts by mass of a charge transporting polymer compound containing the polymer 8 was dissolved in cyclohexylbenzene to prepare a 2.5%-by-weight solution.

In a nitrogen glove box, this solution was spin-coated onto the hole injection layer that had been formed on the substrate, and the resultant was dried on a 230° C. hot plate for 60 minutes in the nitrogen glove box to form a 20 nm-thick uniform thin film as a hole transport layer 4.

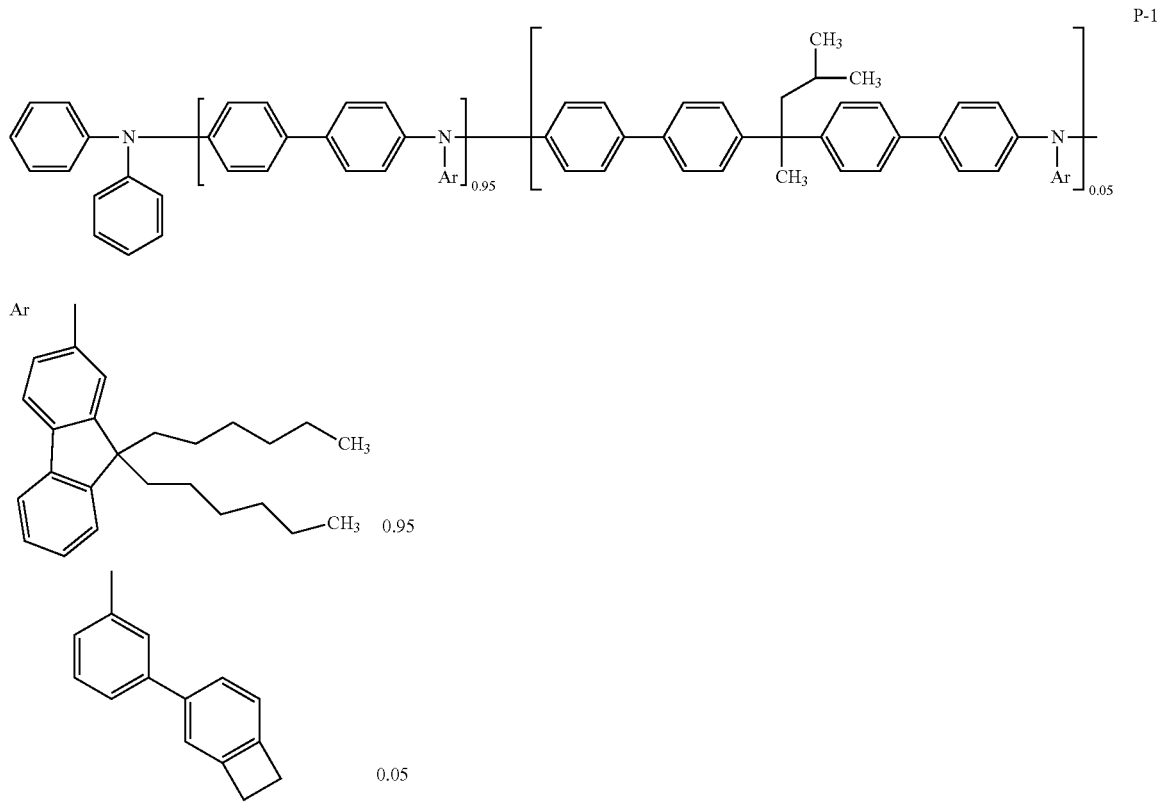

-continued

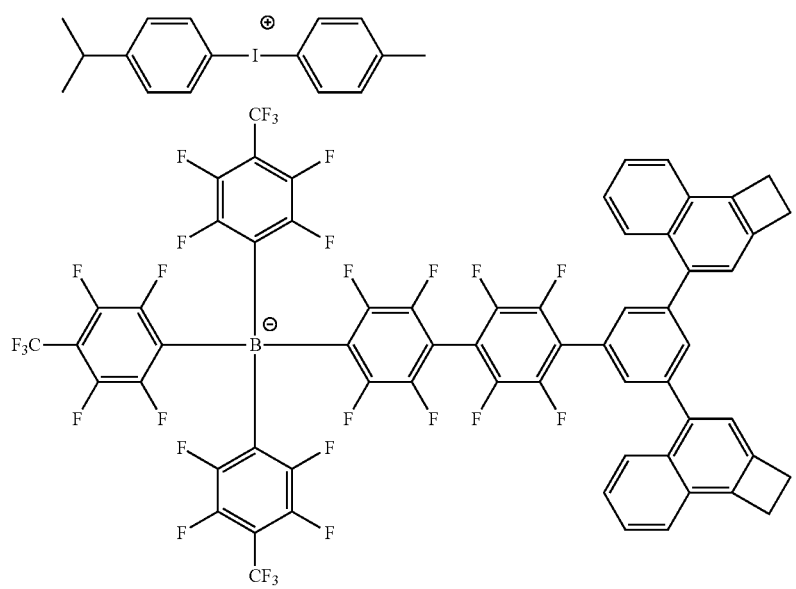

A1

Subsequently, for the formation of a light-emitting layer 5, 65 parts by mass of a compound (RH-1) represented by the following structural formula, 35 parts by mass of a compound (RH-2) represented by the following structural formula, and 20 parts by mass of a compound (RD-1) represented by the following structural formula were weighed and dissolved in cyclohexylbenzene to prepare a 7.2%-by-weight solution.

In a nitrogen glove box, this solution was spin-coated onto the hole transport layer that had been formed on the substrate, and the resultant was dried on a 130° C. hot plate for 20 minutes in the nitrogen glove box to form a 80 nm-thick uniform thin film as the light-emitting layer 5.

-continued

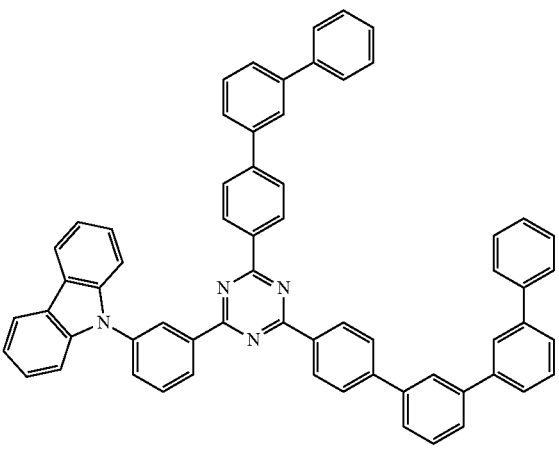

RH-2

RH-1

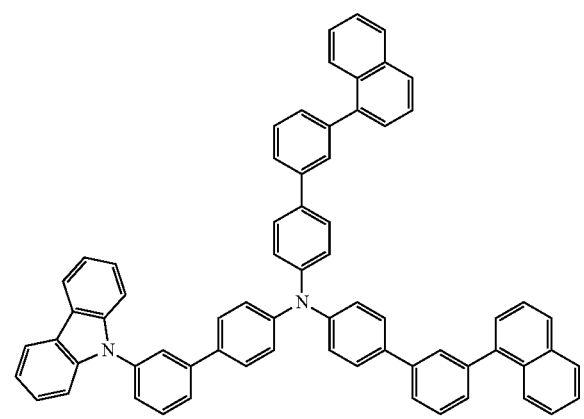

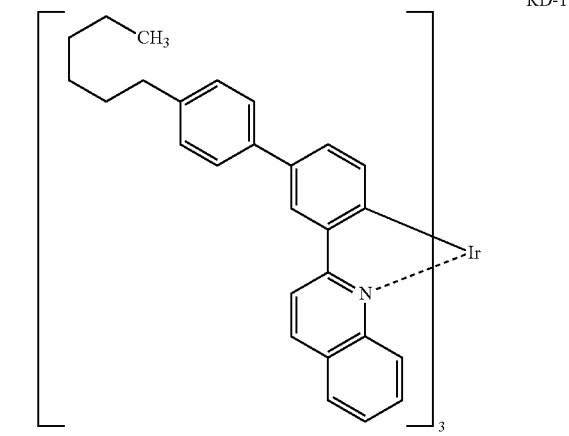

RD-1

The substrate on which up to the light-emitting layer 5 had been thus formed was transferred into a vacuum vapor deposition apparatus, and the inside of this apparatus was evacuated to a degree of vacuum of $1.3 \times 10^{-4}$ Pa or lower, after which 40 parts by mass of a compound (ET-1) represented by the following structural formula and 60 parts by mass of a compound (liq) represented by the following structural formula were vapor-deposited on the light-emitting layer 5 by a co-vapor deposition method to form an electron transport layer 6. During this vapor deposition, the degree of vacuum was controlled at $1.3 \times 10^{-4}$ Pa and the vapor deposition rate was controlled in a range of 1.6 to 1.8 Å/sec, and the thus obtained electron transport layer 6 had a thickness of 30 nm.

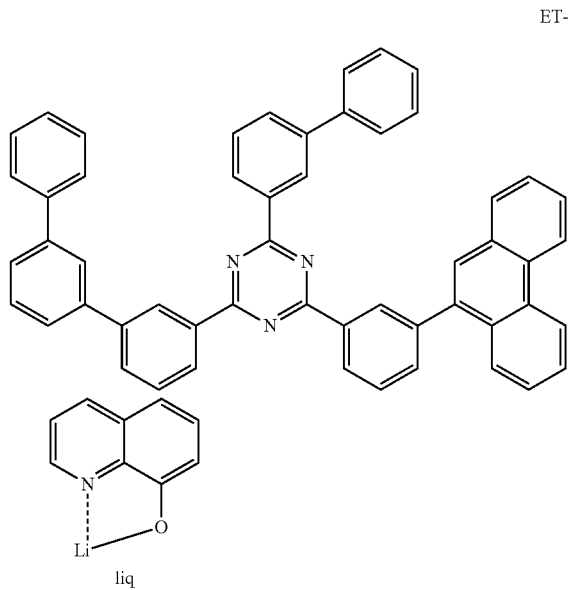

ET-1 liq

At this point, the substrate on which up to the vapor deposition of the electron transport layer 6 had been completed was taken out and set in another vapor deposition apparatus. As a mask for cathode vapor deposition, a striped shadow mask having 2 mm-wide stripes was tightly attached to the substrate in such a manner that the stripes were arranged perpendicular to the ITO stripes of the anode 2, and the inside of the apparatus was evacuated to a degree of vacuum of $2.3 \times 10^{-4}$ Pa or lower.

Next, as a cathode 7, aluminum was heated in a molybdenum boat, and an 80 nm-thick aluminum layer was formed in the same manner while controlling the vapor deposition rate in a range of 1.0 to 4.9 Å/sec. During this vapor deposition, the degree of vacuum was $2.6 \times 10^{-4}$ Pa.

Subsequently, in order to prevent deterioration of the resulting organic electroluminescent element by the moisture and the like in the atmosphere during storage, a sealing treatment was performed by the following method.

In a nitrogen glove box, a photocurable resin 30Y-437 (manufactured by ThreeBond Holdings Co., Ltd.) was applied to the periphery of a 23 mm×23 mm glass plate at a width of about 1 mm, and a moisture getter sheet (manufactured by Dynic Corporation) was placed on the center of the glass plate. The substrate on which the cathode formation had been completed was pasted thereon such that the vapor-deposited surface faced the desiccant sheet. Thereafter, UV light was irradiated only to the region coated with the photocurable resin so as to cure the resin.

In the above-described manner, an organic electroluminescent element having a light-emitting area of 2 mm×2 mm in size was produced.

Comparative Example 2-1

An organic electroluminescent element illustrated in FIG. 1 was produced in the same manner as in Example 2-1, except that a comparative polymer 1 represented by the following P-2 was used in place of the polymer 8.

P-2

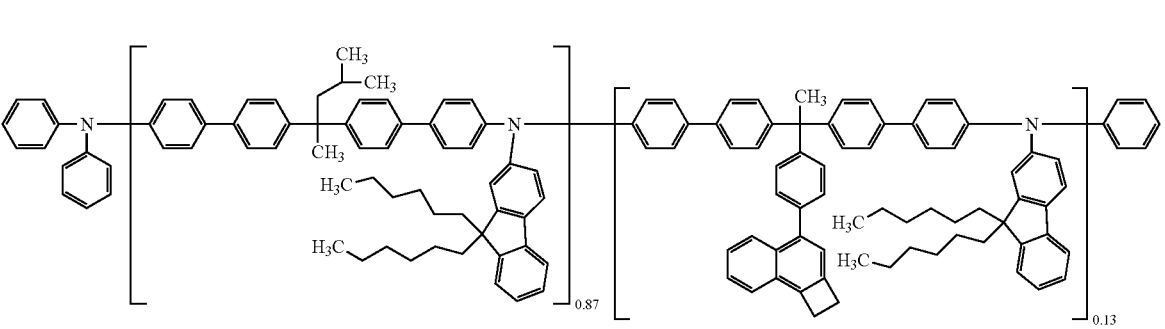

<Evaluation of Current-Voltage Characteristics of Organic Electroluminescent Elements>

Table 3 shows the results of evaluating the voltage characteristics and the working life for the organic electroluminescent elements produced in Example 2-1 and Comparative Example 2-1. The voltage was measured when each organic electroluminescent element was illuminated at a brightness of 1,000 cd/m², and, using the voltage of the element of Comparative Example 2-1 as a reference, the difference between the voltage of the element of Example 2-1 and the voltage of the element of Comparative Example 2-1 was determined as relative voltage [V]. As for the working life, each element was driven at a constant current of 50 mA/cm², and the 5% decay life (LT95, hr) was measured based on an initial brightness of 3,000 cd/m², and the relative value thereof (hereinafter, referred to as "relative life") was determined, taking the LT95 (hr) of Comparative Example 2-1 as 1.

TABLE 3

|  | Hole transport layer | Relative voltage (V) | LT95 relative life |
|---|---|---|---|
| Comparative Example 2-1 | P-2 | 0.0 | 1 |
| Example 2-1 | Polymer 8 | −0.3 | >34 |

As shown in Table 3, it is seen that the organic electroluminescent element produced using the polymer of the present invention had a low driving voltage and an extended working life.

Example 2-2

In the production of an electroluminescent element, the processes up to the formation of the charge transport layer was performed in the same manner as in Example 2-1, except that the polymer 8 was changed to the polymer 7. Subsequently, for the formation of a light-emitting layer 5, 55 parts by mass of the compound (RH-1), 45 parts by mass of the compound (RH-2), and 20 parts by mass of the compound (RD-1) were weighed and dissolved in cyclohexylbenzene to prepare a 7.2%-by-weight solution.

In a nitrogen glove box, this solution was spin-coated onto the hole transport layer that had been formed on the substrate, and the resultant was dried on a 130° C. hot plate for 20 minutes in the nitrogen glove box to form a 80 nm-thick uniform thin film as the light-emitting layer 5. Thereafter, an organic electroluminescent element was produced in the same manner as in Example 2-1.

Comparative Example 2-2

An electroluminescent element was produced in the same manner as in Example 2-2, except that the polymer 1 was changed to the polymer P-3.

The external quantum efficiency and the working life were evaluated for the organic electroluminescent elements obtained in Example 2-2 and Comparative Example 2-2. In this process, Comparative Example 2-2 was used as a reference. The voltage was measured when each organic electroluminescent element was illuminated at a brightness of 1,000 cd/m² and, using the voltage of the element of Comparative Example 2-2 as a reference, the difference between the voltage of the element of Example 2-2 and the voltage of the element of Comparative Example 2-2 was determined as relative voltage [V]. As for the external quantum efficiency, the value was measured when each organic electroluminescent element was illuminated at a brightness of 1,000 cd/m², and the ratio thereof was determined as a relative value, taking the external quantum efficiency of Comparative Example 2-2 as 1. As for the working life, each element was driven at a constant current of 40 mA/cm², and the 5% decay life (LT95, hr) was measured based on an initial brightness of 1,000 cd/m², and the relative value thereof (hereinafter, referred to as "relative life") was determined, taking the LT95 (hr) of Comparative Example 2-2 as 1. The results thereof are shown in Table 4.

TABLE 4

|  | Hole transport layer | Relative voltage (V) | External quantum efficiency (relative value) | LT95 relative life |
|---|---|---|---|---|
| Comparative Example 2-2 | P-3 | 0.0 | 1.00 | 1.00 |
| Example 2-2 | Polymer 7 | −0.6 | 1.08 | >1.25 |

As shown in Table 4, it is seen that the organic electroluminescent element produced using the polymer of the present invention had a low driving voltage, a high external quantum efficiency, and an extended working life.

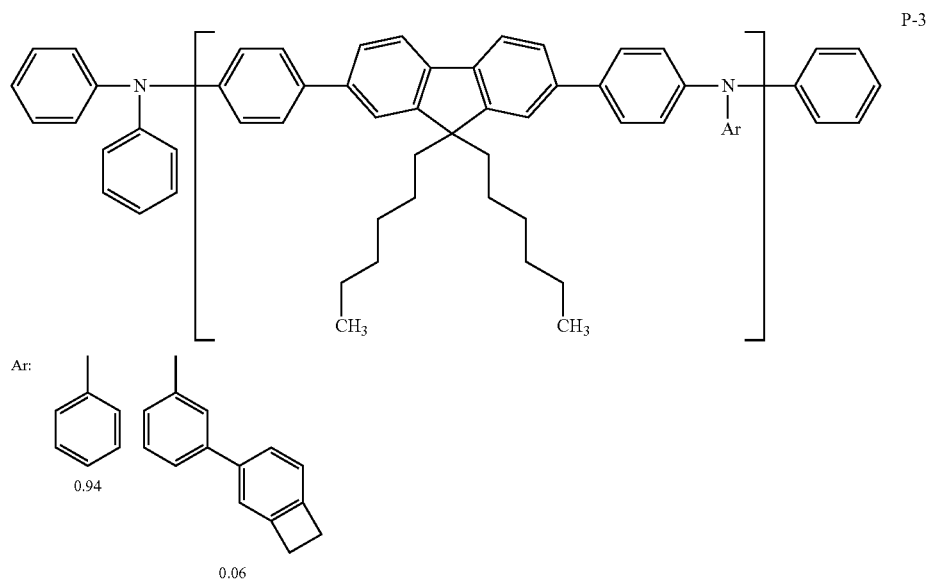

Example 2-3

In the production of an organic electroluminescent element, the processes up to the formation of the hole transport layer 4 was performed in the same manner as in Example 2-2. Subsequently, 100 parts by mass of a compound (H-1) represented by the following structural formula and 10 parts by mass of a compound (BD-1) represented by the following structural formula were weighed and dissolved in cyclohexylbenzene to prepare a 3.9%-by-weight solution.

In a nitrogen glove box, this solution was spin-coated onto the hole transport layer that had been formed on the substrate, and the resultant was dried on a 130° C. hot plate for 20 minutes in the nitrogen glove box to form a 40 nm-thick uniform thin film as a light-emitting layer 5. Thereafter, an electroluminescent element was produced in the same manner as in Example 2-1.

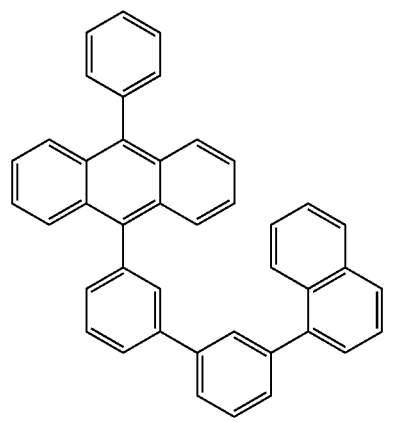

H-1

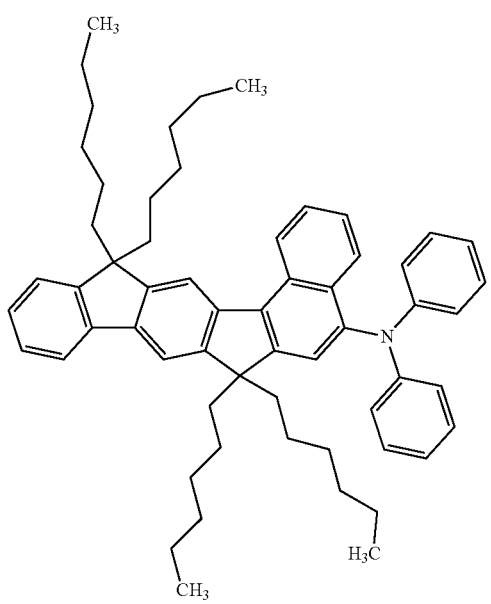

BD-1

Example 2-4

An electroluminescent element was produced in the same manner as in Examples 2-3, except that the polymer 1 was changed to the polymer 7.

Comparative Example 2-3

An electroluminescent element was produced in the same manner as in Examples 2-3, except that the polymer 1 was changed to the polymer P-3.

For the organic electroluminescent elements obtained in Examples 2-3 and 2-4 and Comparative Example 2-3, the voltage and the external quantum efficiency were evaluated in the same manner as in Example 2-1 and Comparative Example 2-1. In this process, Comparative Example 2-3 was used as a reference. As for the working life, each element was driven at a constant current of 15 mA/cm², and the 5% decay life (LT95, hr) was measured based on an initial brightness of 1,000 cd/m², and the relative value thereof (hereinafter, referred to as "relative life") was determined, taking the LT95 (hr) of Comparative Example 2-3 as 1. The results thereof are shown in Table 5.

TABLE 5

| | Hole transport layer | Relative voltage (V) | External quantum efficiency (relative value) | LT95 relative life |
|---|---|---|---|---|
| Comparative Example 2-3 | P-3 | 0.0 | 1.00 | 1.0 |
| Example 2-3 | Polymer 1 | 0.0 | 3.55 | 4.5 |
| Example 2-4 | Polymer 7 | −0.2 | 2.73 | 7.5 |

As shown in Table 5, it is seen that the organic electroluminescent elements produced using the polymer of the present invention tended to have a low voltage and exhibited a high external quantum efficiency and an extended working life.

Example 3-1

Using a composition composed of the polymer of the present invention and a solvent, a film was formed by the following method.

A glass substrate was sequentially subjected to ultrasonic washing with an aqueous surfactant solution, washing with ultrapure water, ultrasonic washing with ultrapure water, and then washing with ultrapure water, after which the glass substrate was dried and cleaned with UV/ozone at last.

A polymer compound having the structure of the polymer 1 was dissolved in anisole to prepare a 3.75%-by-weight solution.

This solution was spin-coated onto the glass substrate in a glove box under the atmosphere, and the resultant was dried on a 230° C. hot plate for 30 minutes in a clean booth to form a film.

[Evaluation of Film Insolubilization]

The thickness of the thus obtained film was measured using a stylus-type profiler manufactured by KLA-Tencor Technologies Corporation. Subsequently, 130 µl of cyclohexylbenzene (CHB) was applied dropwise onto the film and left to stand for 90 seconds, after which the substrate was spun using a spin coater to remove CHB. Thereafter, the substrate was dried on a 130° C. for 20 minutes. The thickness was measured again for the CHB-applied part of the thus treated thin film.

The film thickness prior to the application of CHB and the film thickness after the CHB treatment were defined as T1 and T2, respectively, and the insolubilization rate was calculated by the following equation:

$T2/T1 \times 100 =$ (insolubilization rate)

The insolubilization rate of the film is shown in Table 6.

Example 3-2

A polymer compound having the structure of the polymer 8 was dissolved in anisole to prepare a 3.75%-by-weight solution and, after forming a film in the same manner as in Example 3-1, the insolubilization rate was determined. The insolubilization rate of the thus obtained film is shown in Table 6.

Comparative Example 3-1

A polymer compound having the structure represented by the following Formula P-4 was dissolved in anisole to prepare a 3.75%-by-weight solution and, after forming a film in the same manner as in Example 3-1, the insolubilization rate was determined. The insolubilization rate of the thus obtained film is shown in Table 6.

when mixed with the polymer of the present invention that had no crosslinkable group. This is useful for expanding the range of compounds that can be used in the production of an organic electroluminescent element by a wet process.

TABLE 6

|  | Insolubilization rate [%] |
|---|---|
| Comparative Example 3-1 | 86 |
| Example 3-1 | 100 |
| Example 3-2 | 100 |
| Example 3-3 | 100 |
| Example 3-4 | 99 |

P-4

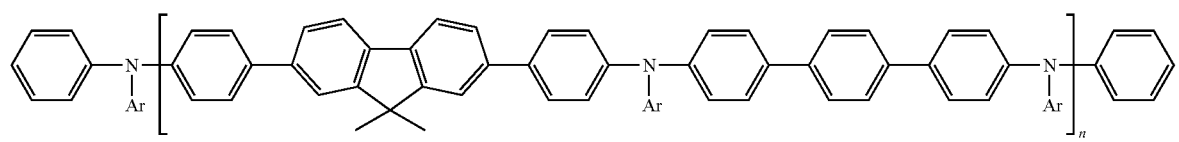

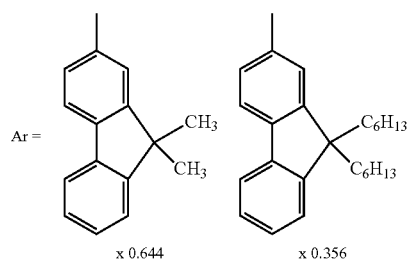

Example 3-3

A polymer compound having the structure of the polymer 1 and a polymer compound having the structure of Formula (P-4) were weighed in an amount of 75 parts by weight and 25 parts by weight, respectively (polymer 1: (P-4)=75:25), and these polymer compounds were dissolved in anisole to prepare a 3.75%-by-weight solution, after which a film was formed in the same manner as in Example 3-1, and the insolubilization rate was determined. The insolubilization rate of the thus obtained film is shown in Table 6.

Example 3-4

A solution was prepared and a film was formed in the same manner as in Example 3-3, except that the polymer 1 was changed to the polymer 8, after which the insolubilization rate was determined. The insolubilization rate of the thus obtained film is shown in Table 6.

As shown in Table 6, it is seen that the thin films formed from the polymer of the present invention were insolubilized in the solvent even when the polymer of the present invention did not have a crosslinkable group. Further, even a polymer that had no crosslinkable group and thus would not yield an insolubilized thin film by itself was insolubilized

INDUSTRIAL APPLICABILITY

The present invention can be preferably applied to various fields where an organic electroluminescent element is used, such as flat panel displays (e.g., flat panel displays for OA computers and wall-mounted televisions), light sources utilizing the features of a planar light emitter (e.g., light sources of copying machines, and backlight sources of liquid-crystal displays and instruments), sign boards, and marker lamps.

REFERENCE SIGNS LIST

1: substrate
2: anode
3: hole injection layer
4: hole transport layer
5: light-emitting layer
6: electron transport layer
7: cathode
8: organic electroluminescent element

The invention claimed is:
1. A polymer, comprising a repeating unit represented by the following Formula (2):

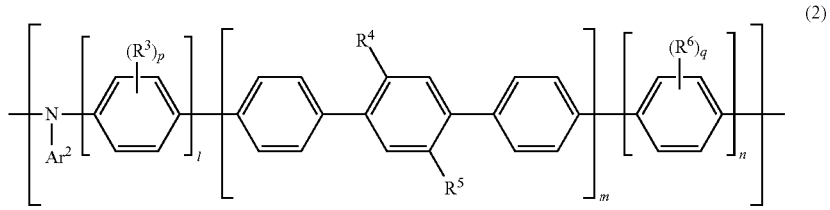

wherein, in Formula (2),
Ar² represents an aromatic hydrocarbon group optionally having a substituent, or an aromatic heterocyclic group optionally having a substituent;
at least one Ar² is represented by the following Formula (10);
R³ and R⁶ each independently represent an alkyl group optionally having a substituent;
R⁴ and R⁵ each independently represent an alkyl group optionally having a substituent, an alkoxy group optionally having a substituent, or an aralkyl group optionally having a substituent;
l represents 0 or 1;
m represents 1 or 2;
n represents 0 or 1;
p represents 0 or 1;
q represents 0 or 1; and
p and q are not 0 simultaneously;

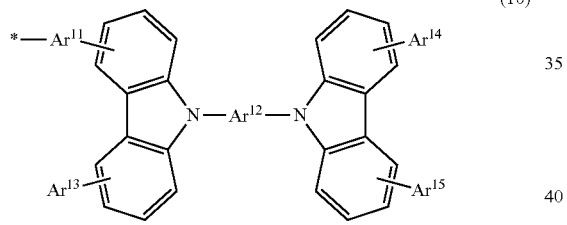

wherein, in Formula (10),
Ar¹¹ and Ar¹² each independently represent a divalent aromatic hydrocarbon group optionally having a substituent, or an aromatic heterocyclic group optionally having a substituent;
Ar¹³ to Ar¹⁵ each independently represent a hydrogen atom or a substituent; and
* represents a binding position.

2. The polymer according to claim 1, wherein
at least one Ar² is a 2-fluorenyl group optionally having a substituent.

3. The polymer according to claim 1, wherein
Ar¹² is a divalent group or a group constituted by a plurality of the divalent group that are linked together,
the divalent group is at least one group selected from the group consisting of a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, a fluorene ring, a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, and a quinazolinone ring.

4. The polymer according to claim 1, wherein
Ar¹² is a 1,4-phenylene group in which benzene rings are linked at two positions of 1 and 4, a 2,7-fluorenylene group in which fluorene rings are linked at two positions of 2 and 7, or a group constituted by a plurality of these groups that are linked together.

5. The polymer according to claim 1, wherein
Ar¹² is a group that contains a 1,4-phenylene group, a 2,7-fluorenylene group, and a 1,4-phenylene group-.

6. The polymer according to claim 1, wherein
Ar¹³ to Ar¹⁵ are hydrogen atoms.

7. The polymer according to claim 1, wherein
at least one of Ar¹³ to Ar¹⁵ is a substituent group containing a crosslinkable group.

8. The polymer according to claim 1, wherein
Ar¹¹ is a 5- or 6-membered monocyclic or 2 to 4-fused-ring divalent group or a group constituted by a plurality of the divalent group that are linked together,
the divalent group is at least one group selected from the group consisting of a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, a fluorene ring, a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a perimidine ring, a quinazoline ring, and a quinazolinone ring.

9. The polymer according to claim 1, wherein
Ar¹¹ contains a 1,3-phenylene group, or a group that contains a substituent and has a distorted structure due to a steric effect of the substituent.

10. The polymer according to claim 1, further comprising a repeating unit represented by the following Formula (4):

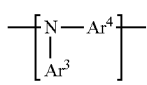

(4)

wherein,

Ar³ represents an aromatic hydrocarbon group optionally having a substituent, or an aromatic heterocyclic group optionally having a substituent; and Ar⁴ represents a divalent aromatic hydrocarbon group optionally having a substituent, a divalent aromatic heterocyclic group optionally having a substituent, or a divalent group formed by plural aromatic hydrocarbon groups optionally having a substituent and/or plural aromatic heterocyclic groups optionally having a substituent that are linked together directly or via a linking group.

11. The polymer according to claim 10, wherein at least one Ar³ is represented by the following Formula (10):

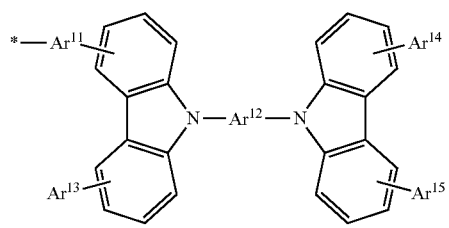

(10)

wherein,

Ar¹¹ and Ar¹² each independently represent a divalent aromatic hydrocarbon group optionally having a substituent, or an aromatic heterocyclic group optionally having a substituent;

Ar¹³ to Ar¹⁵ each independently represent a hydrogen atom or a substituent; and

* represents a binding position.

12. The polymer according to claim 11, wherein Ar¹² is a group that contains -1,4-phenylene group-2,7-fluorenylene group-1,4-phenylene group-.

13. The polymer according to claim 11, wherein Ar¹³ to Ar¹⁵ are hydrogen atoms.

14. The polymer according to claim 11, wherein at least one of Ar¹³ to Ar¹⁵ is a substituent group containing a crosslinkable group.

15. The polymer according to claim 11, wherein Ar¹¹ contains a 1,3-phenylene group, or a group that contains a substituent and has a distorted structure due to a steric effect of the substituent.

16. The polymer according to claim 10, wherein at least one Ar³ is a 2-fluorenyl group optionally having a substituent.

17. The polymer according to claim 10, further comprising a repeating unit represented by the following Formula (5):

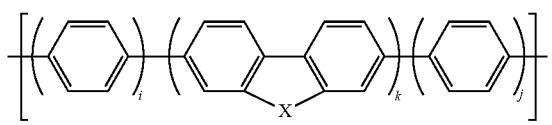

(5)

wherein, i and j each independently represent an integer of 0 to 3;

(i+j) is 1 or larger;

k represents 0 or 1;

X represents $-C(R^7)(R^8)-$, $-N(R^9)-$, or $-C(R^{11})(R^{12})-C(R^{13})(R^{14})-$; and R⁷ to R⁹ and R¹¹ to R¹⁴ each independently represent hydrogen, an alkyl group optionally having a substituent, an aralkyl group optionally having a substituent, or an aromatic hydrocarbon group optionally having a substituent.

18. The polymer according to claim 17, wherein

Ar⁴ in Formula (4) is the repeating unit represented by Formula (5) wherein k is 1, and the repeating unit represented by Formula (5) is linked with N in Formula (4).

19. The polymer according to claim 17, comprising a repeating unit represented by the following Formula (14):

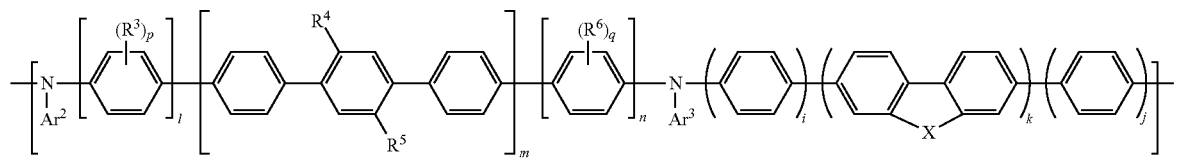

(14)

wherein, Ar², R³, R⁴, R⁵, R⁶, p, q, l, m, n, Ar³, X, i, j, and k are each the same as in Formula (2), (4) or (5).

20. The polymer according to claim 19, wherein, in Formula (14),

X is $-C(CH_3)(CH_3)-$, i=j=k=1, and

Ar² and Ar³ are each independently the following Formula (15) or the following Formula (16), with a proviso that Formulae (15) and (16) each optionally have a substituent and * represents a bond with N in Formula (14):

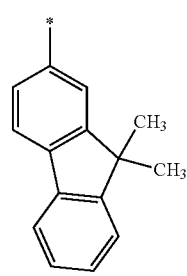

(15)

(16)

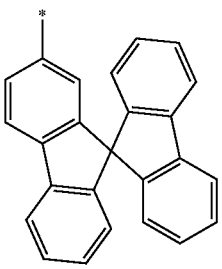

21. The polymer according to claim 20, wherein Formula (15) or (16) has a substituent that is at least one selected from substituents Z and a crosslinkable group, Substituents Z: an alkyl group, an alkenyl group, an alkynyl group, an alkoxy group, an aryloxy group, a heteroaryloxy group, an alkoxycarbonyl group, a dialkylamino group, a diarylamino group, an arylalkylamino group, an acyl group, a halogen atom, haloalkyl group, an alkylthio group, an arylthio group, an silyl group, an siloxy group, a cyano group, an aromatic hydrocarbon group and an aromatic heterocyclic group; these substituents optionally contain a linear, branched, or cyclic structure.

22. The polymer according to claim 1, further comprising a repeating unit represented by the following Formula (6):

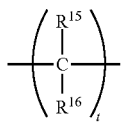

(6)

wherein, t represents an integer of 1 to 10;

$R^{15}$ and $R^{16}$ each independently represent a hydrogen atom, an alkyl group optionally having a substituent, an aromatic hydrocarbon group optionally having a substituent, or an aromatic heterocyclic group optionally having a substituent; and when there are plural $R^{15}$s and $R^{16}$s, the $R^{15}$s and the $R^{16}$s are optionally the same or different.

23. The polymer according to claim 1, further comprising a repeating unit represented by the following Formula (7):

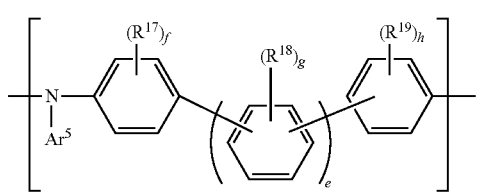

(7)

wherein, $Ar^5$ represents an aromatic hydrocarbon group optionally having a substituent, or an aromatic heterocyclic group optionally having a substituent;

$R^{17}$ to $R^{19}$ each independently represent an alkyl group optionally having a substituent, an alkoxy group optionally having a substituent, an aralkyl group optionally having a substituent, an aromatic hydrocarbon group optionally having a substituent, or an aromatic heterocyclic group optionally having a substituent;

f, g, and h each independently represent an integer of 0 to 4, with (f+g+h) being 1 or larger; and e represents an integer of 0 to 3.

24. The polymer according to claim 23, wherein the repeating unit represented by the following Formula (7) is a repeating unit represented by the following Formula (8):

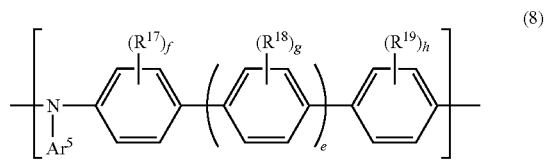

(8)

where, $Ar^5$, $R^{17}$ to $R^{19}$, f, g, h and e are same as the Formula (7).

25. The polymer according to claim 24, wherein the repeating unit represented by the following Formula (8) is a repeating unit represented by the following Formula (9):

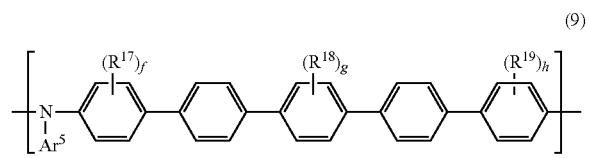

(9)

where, $Ar^5$, $R^{17}$ to $R^{19}$, f, g, and h are same as the Formula (7).

26. The polymer according to claim 1, wherein a terminal group of the polymer is an aromatic hydrocarbon group optionally having a substituent composed of a hydrocarbon.

27. The polymer according to claim 1, comprising a crosslinkable group as a substituent.

28. The polymer according to claim 27, wherein the crosslinkable group is a group that comprises a cyclobutene ring condensed with an aromatic ring, or an alkenyl group bound to an aromatic ring.

29. The polymer according to claim 1, having a weight-average molecular weight (Mw) of not less than 10,000, and a degree of dispersion (Mw/Mn) of 3.5 or lower.

30. A composition for an organic electroluminescent element, comprising the polymer according to claim 1.

31. A composition for an organic electroluminescent element, comprising:
    the polymer according to claim 1; and
    an organic solvent.

32. A method of producing an organic electroluminescent element that comprises, on a substrate: an anode; a cathode; and organic layers between the anode and the cathode,
    wherein the method comprises the step of forming at least one of the organic layers by a wet film-forming method using the composition for an organic electroluminescent element according to claim 31.

33. The method of producing an organic electroluminescent element according to claim 32, wherein a layer formed by the wet film-forming method is at least one of a hole injection layer and a hole transport layer.

34. The method of producing an organic electroluminescent element according to claim 32, wherein
   the organic electroluminescent element comprises a hole injection layer, a hole transport layer, and a light-emitting layer between the anode and the cathode, and
   the hole injection layer, the hole transport layer, and the light-emitting layer are all formed by the wet film-forming method.

35. An organic electroluminescent element, comprising a layer that comprises the polymer according to claim 1, or a polymer obtained by crosslinking the polymer when the polymer contains a crosslinkable group.

36. An organic EL display device, comprising the organic electroluminescent element according to claim 35.

37. An organic EL lighting, comprising the organic electroluminescent element according to claim 35.

\* \* \* \* \*